United States Patent
Gatineau et al.

(10) Patent No.: US 11,242,597 B2
(45) Date of Patent: Feb. 8, 2022

(54) LANTHANIDE PRECURSORS AND DEPOSITION OF LANTHANIDE-CONTAINING FILMS USING THE SAME

(71) Applicant: L'Air Liquide, Societe Anonyme pour l'Etude et l'Exploitation des Procedes Georges Claude, Paris (FR)

(72) Inventors: Satoko Gatineau, Seoul (KR); Daehyeon Kim, Seoul (KR); Wontae Noh, Seoul (KR); Jean-Marc Girard, Versailles (FR)

(73) Assignee: L'Air Liquide, Societe Anonyme pour l'Etude et l'Exploitation des Procédés Georges Claude, Paris (FR)

( * ) Notice: Subject to any disclaimer, the term of this patent is extended or adjusted under 35 U.S.C. 154(b) by 0 days.

(21) Appl. No.: 16/747,129

(22) Filed: Jan. 20, 2020

(65) Prior Publication Data

US 2020/0149156 A1    May 14, 2020

Related U.S. Application Data

(62) Division of application No. 15/396,221, filed on Dec. 30, 2016, now abandoned.

(51) Int. Cl.
  *C23C 16/18* (2006.01)
  *C07F 5/00* (2006.01)
  *C23C 16/455* (2006.01)

(52) U.S. Cl.
  CPC .............. *C23C 16/18* (2013.01); *C07F 5/00* (2013.01); *C23C 16/45553* (2013.01)

(58) Field of Classification Search
  None
  See application file for complete search history.

(56) References Cited

U.S. PATENT DOCUMENTS

| | | |
|---|---|---|
| 5,621,127 A | 4/1997 | Langhauser et al. |
| 2009/0074965 A1 | 3/2009 | Xu et al. |
| 2013/0066082 A1 | 3/2013 | Norman et al. |

FOREIGN PATENT DOCUMENTS

WO    WO 2009 149372    12/2009

OTHER PUBLICATIONS

Edelmann, F.T., Lanthanide amidinates and guanidinates: from laboratory curiosities to efficient homogeneous catalysts and precursors for rare-earth oxide thin films, Chem. Soc. Rev., Apr. 8, 2009, 38, 2253-2268.

Fedushkin, I.L. et al., "Organometallic compounds of the lanthanides. 141. Synthesis, molecular structure, and solution behavior of some lanthanum(III) and ytterbium(II) complexes containing new tridentate 1,2- and 1,3-bis(2-(dimethylamino)ethyl) cyclopentadienyl ligands," Organometallics 2000, 19, 4066-4-76.

Piers, W.E. et al., "Coping with extreme Lewis acidity: strategies for the synthesis of stable, mononuclear organometallic derivatives of scandium," Synlett Feb. 1990, 74-84.

Riken Research Institute, New Catalysts for Regio- and Stereospecific Polymerization—Downloaded Jan. 11, 17 from www.riken. jplabwwworganometallicenglresearch_1_e.html.

Siemeling, U., Chelate complexes of cyclopentadienyl ligands bearing pendant o-donors, Chem. Rev. 2000, 100, 1495-1526.

Trifonov, A.A. et al., Yttrium hydrido complexes that contain a less 'constrained geometry' ligand: synthesis, structure, and efficient hydrosilylation catalysis, Organometallics 2001, 20, 4869-4874.

International Search Report and Written Opinion for corresponding PCT/IB2017/001721, dated May 30, 2018.

*Primary Examiner* — Clinton A Brooks
(74) *Attorney, Agent, or Firm* — Allen E. White; Yan Jiang

(57) ABSTRACT

Lanthanide-containing film forming compositions comprising Lanthanide precursors having the general formulae:

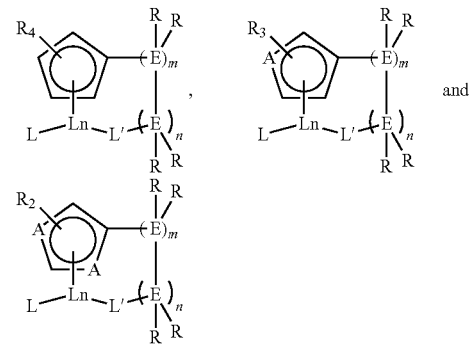

wherein Ln is a Lanthanide; A is independently N, Si, B, P or O; each E is independently C, Si, B or P; m and n are independently 0, 1 or 2; m+n>1; each R is independently an H or a $C_1$-$C_4$ hydrocarbyl group; L is a −1 anionic ligand selected from the group consisting of $NR'_2$, $OR'$, Cp, amidinate, β-diketonate, or keto-iminate, wherein R' is an H or a $C_1$-$C_4$ hydrocarbon group; and L' is $NR''$ or O, wherein R" is an H or a $C_1$-$C_4$ hydrocarbon group. Also disclosed are methods of synthesizing and using the disclosed precursors to deposit Lanthanide-containing films on one or more substrates via vapor deposition processes.

10 Claims, No Drawings

LANTHANIDE PRECURSORS AND DEPOSITION OF LANTHANIDE-CONTAINING FILMS USING THE SAME

CROSS REFERENCE TO RELATED APPLICATIONS

This application is a divisional of U.S. patent application Ser. No. 15/396,221, filed Dec. 30, 2016, the entire contents of which are incorporated herein by reference.

TECHNICAL FIELD

Disclosed are lanthanide-containing film forming compositions comprising Lanthanide precursors having the general formulae, L-Ln-C$_5$R$_4$—[(ER$_2$)$_m$-(ER$_2$)$_n$-L']-, L-Ln-C$_4$AR$_3$-3-[(ER$_2$)$_m$-(ER$_2$)$_n$-L']-, L-Ln-C$_3$(m-A$_2$)R$_2$-4-[(ER$_2$)$_m$-(ER$_2$)$_n$-L']-, wherein Ln is selected from Lanthanide elements consisting of La, Y, Sc, Ce, Pr, Nd, Sm, Eu, Gd, Tb, Dy, Ho, Er, Tm, Yb and Lu bonded in an $\eta^5$ bonding mode to the aromatic ring group; A is independently N, Si, B, P or O; each E is independently C, Si, B or P; m and n are independently 0, 1 or 2; m+n>1; each R is independently an H or a C$_1$-C$_4$ hydrocarbyl group; adjacent Rs may be joined to form a hydrocarbyl ring; L is a −1 anionic ligand selected from the group consisting of NR'$_2$, OR', Cp, amidinate, β-diketonate, or keto-iminate, wherein R' is an H or a C$_1$-C$_4$ hydrocarbon group; adjacent R's may be joined to form a hydrocarbyl ring; and L' is NR'' or O, wherein R'' is an H or a C$_1$-C$_4$ hydrocarbon group. Also disclosed are methods of synthesizing and using the disclosed precursors to deposit Lanthanide-containing films on one or more substrates via vapor deposition processes.

BACKGROUND

One of the challenges the industry faces is developing new gate dielectric materials for Dynamic Random Access Memory (DRAM) and capacitors. For decades, silicon dioxide (SiO$_2$) was a reliable dielectric, but as transistors have continued to shrink and the technology moved from "Full Si" transistor to "Metal Gate/High-k" transistors, the reliability of the SiO$_2$-based gate dielectric is reaching its physical limits. The need for new high dielectric constant material and processes is increasing and becoming more and more critical as the size for current technology is shrinking. New generations of oxides especially based on Lanthanide-containing materials are thought to give significant advantages in capacitance compared to conventional dielectric materials.

Nevertheless, deposition of Lanthanide-containing layers is difficult and new material and processes are increasingly needed. For instance, atomic layer deposition (ALD) has been identified as an important thin film growth technique for microelectronics manufacturing, relying on sequential and saturating surface reactions of alternatively applied precursors, separated by inert gas purging. The surface-controlled nature of ALD enables the growth of thin films having high conformality and uniformity with an accurate thickness control. The need to develop new ALD processes for rare earth materials is obvious.

Unfortunately, the successful integration of compounds into deposition processes has proven to be difficult. Three classes of molecules are typically proposed in the case of Lanthanum: beta-diketonates, bis(trimethylsilyl)amide and cyclopentadienyls. The two first families of compounds are stable, but the melting points may exceed 90° C., making them impractical. Lanthanum 2,2-6,6-tetramethylheptane-dionate's [La(tmhd)$_3$] melting point is as high as 230° C., and the Lanthanum tris(bis(trimethylsilyl)amido) [La(tmsa)$_3$] melting point is 150° C., Additionally, the delivery efficiency of those precursors is very difficult to control. Non-substituted cyclopentadienyl compounds also exhibit low volatility with a high melting point. Molecule design may both help improve volatility and reduce the melting point. However, in process conditions, these classes of materials have been proven to have limited use. For instance, La(iPrCp)$_3$ does not allow an ALD regime above 225° C.

Commonly owned PCT Patent Application Publication No. WO 2009/149372 discloses rare earth metal precursors containing cyclopentadienyl and amidinate ligands. However, the examples reveal that synthesis of La(Etcp)$_2$(N$^{iPr}$-amd), La(Etcp)(N$^{iPr}$-amd)$_2$, La(iPrCp)$_2$(N$^{iPr}$-amd), and La(iPrCp)(N$^{iPr}$-amd)$_2$ failed.

Some Cp bridged Y and Lu compounds are synthesized and may be used for catalysts or precursors for rare-earth oxide thin films. For example, F Edelmann discloses the Cp-one ligand bridged Y compound Me$_4$Cp-SiMe$_2$-N(ph)-Y—(F Edelmann, "Lanthanide Aamidinates and guanidinates: from laboratory curiosities to efficient homogeneous catalysts and precursors for rare-earth oxide thin films", Chem. Soc. Rev., 2009, 38, p 2253-2268). The web pages of Japan RIKEN research institute (www.riken.jp/lab-www/organometallic/engl/research_1_e.html) disclose the synthesis of Me$_4$Cp-SiMe$_2$-N(Ar)—Lu— for use as organometallic catalysts.

Some of the Lanthanide precursors currently available present many drawbacks when used in a deposition process. Consequently, there exists a need for alternate precursors for deposition of Lanthanide-containing films.

SUMMARY

Disclosed herein are Lanthanide-containing film forming compositions comprising Lanthanide precursors having the general formulae:

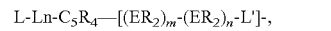

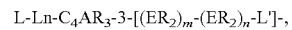

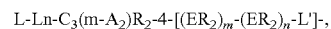

referring to the following structure formula, respectively:

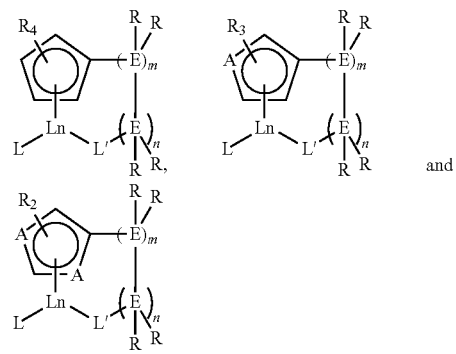

wherein Ln is selected from Lanthanide elements consisting of La, Y, Sc, Ce, Pr, Nd, Sm, Eu, Gd, Tb, Dy, Ho, Er, Tm, Yb and Lu bonded in an $\eta^5$ bonding mode to the aromatic ring group; A is independently N, Si, B, P or O; each E is independently C, Si, B or P; m and n are independently 0, 1 or 2; m+n>1; each R is independently an H or a $C_1$-$C_4$ hydrocarbyl group; adjacent Rs may be joined to form a hydrocarbyl ring; L is a −1 anionic ligand selected from the group consisting of $NR'_2$, OR', Cp, amidinate, β-diketonate, or keto-iminate, wherein R' is an H or a $C_1$-$C_4$ hydrocarbon group; adjacent R's may be joined to form a hydrocarbyl ring; and L' is NR" or O, wherein R" is an H or a $C_1$-$C_4$ hydrocarbon group.

The disclosed Lanthanide-containing film forming compositions may further include one or more of the following aspects;

Ln being La;
Ln being Y;
Ln being Sc;
Ln being Ce;
Ln being Pr;
Ln being Nd;
Ln being Sm;
Ln being Eu;
Ln being Gd;
Ln being Tb;
Ln being Dy;
Ln being Ho;
Ln being Er;
Ln being Tm;
Ln being Yb;
Ln being Lu
Each A being N, Si, B, P or O;
A being N;
A being Si;
A being B;
A being P;
A being O;
Each E being C, Si, B or P;
E being C;
E being Si;
E being B;
E being P;
m being 0, 1, or 2;
m being 0;
m being 1;
m being 2;
n being 0, 1, or 2;
n being 0;
n being 1;
n being 2;
m+n being >1;
m being 1 and n being 1;
m being 2 and n being 1;
Each R independently being H, Me, Et, $^n$Pr, $^i$Pr, $^n$Bu, $^s$Bu, $^i$Bu, or $^t$Bu;
R being H;
R being Me;
R being Et;
R being $^n$Pr;
R being $^i$Pr;
R being $^n$Bu;
R being $^i$Bu;
R being $^s$Bu;
R being $^t$Bu;
L being $NH_2$;
L being $NMe_2$;
L being $NEt_2$;
L being $N^nPr_2$;
L being $N^iPr_2$;
L being $N^nBu_2$;
L being $N^iBu_2$;
L being $N^sBu_2$;
L being $N^tBu_2$;
L being NHMe;
L being NHEt;
L being NH$^n$Pr;
L being NH$^i$Pr;
L being NH$^n$Bu;
L being NH$^i$Bu;
L being NH$^s$Bu;
L being NH$^t$Bu;
L being NMeEt;
L being NMe$^n$Pr;
L being NMe$^i$Pr;
L being NMe$^n$Bu;
L being NMe$^i$Bu;
L being NMe$^s$Bu;
L being NMe$^t$Bu;
L being NEt$^n$Pr;
L being NEt$^i$Pr;
L being NEt$^n$Bu;
L being NEt$^i$Bu;
L being NEt$^s$Bu;
L being NEt$^t$Bu;
L being N$^n$Pr$^i$Pr;
L being N$^n$Pr$^n$Bu;
L being N$^n$Pr$^i$Bu;
L being N$^n$Pr$^s$Bu;
L being N$^n$Pr$^t$Bu;
L being N$^i$Pr$^n$Bu;
L being N$^i$Pr$^i$Bu;
L being N$^i$Pr$^s$Bu;
L being N$^i$Pr$^t$Bu;
L being N$^n$Bu$^i$Bu;
L being N$^n$Bu$^s$Bu;
L being N$^n$Bu$^t$Bu;
L being N$^i$Bu$^s$Bu;
L being N$^i$Bu$^t$Bu;
L being N$^s$Bu$^t$Bu;
L being OH;
L being OMe;
L being OEt;
L being O$^n$Pr;
L being O$^i$Pr;
L being O$^n$Bu;
L being O$^i$Bu;
L being O$^s$Bu;
L being O$^t$Bu;
L being Cp;
L being amidinate;
L being β-diketonate;
L being keto-iminate;
L' being NH;
L' being NMe;
L' being NEt;
L' being N$^n$Pr;
L' being N$^i$Pr;
L' being N$^n$Bu;
L' being N$^i$Bu;
L' being N$^s$Bu;
L' being N$^t$Bu;
L' being O;
the aromatic group containing two As at 1,2 positions;
the aromatic group containing two As at 1,3 positions;
the aromatic group being a heterocyclic group containing N, Si, B, P or O;

the aromatic group being a heterocyclic group having a symmetric or asymmetric structure;
the aromatic group being pyrrole;
the aromatic group being pyrazole;
the aromatic group being imidazole;
the aromatic group being silacyclopentadienide;
the aromatic group being borole;
the aromatic group being phosphole;
the aromatic group being a methyl substituted pyrrole;
the aromatic group being an isopropyl substituted pyrrole;
the aromatic group being a tertbutyl substituted pyrrole;
the aromatic group being a methyl substituted pyrazole;
the aromatic group being an isopropyl substituted pyrazole;
the aromatic group being a tertbutyl substituted pyrazole;
the aromatic group being a methyl substituted imidazole;
the aromatic group being an isopropyl substituted imidazole;
the aromatic group being a tertbutyl substituted imidazole;
the aromatic group being a methyl substituted silacyclopentadienide;
the aromatic group being an isopropyl substituted silacyclopentadienide;
the aromatic group being a tertbutyl substituted silacyclopentadienide;
the aromatic group being a methyl substituted borole;
the aromatic group being an isopropyl substituted borole;
the aromatic group being a tertbutyl substituted borole;
the aromatic group being a methyl substituted phosphole;
the aromatic group being an isopropyl substituted phosphole;
the aromatic group being a tertbutyl substituted phosphole;
the Lanthanide precursor being $(Me_2N)$—La—$C_5H_3$-1-Me-3-$[(CH_2)_2$—NMe]-;
the Lanthanide precursor being $(Me_2N)$—Y—$C_5H_3$-1-Me-3-$[(CH_2)_2$—NMe]-;
the Lanthanide precursor being $(Me_2N)$—Sc—$C_5H_3$-1-Me-3-$[(CH_2)_2$—NMe]-;
the Lanthanide precursor being $(Me_2N)$—Ce—$C_5H_3$-1-Me-3-$[(CH_2)_2$—NMe]-;
the Lanthanide precursor being $(Me_2N)$—Pr—$C_5H_3$-1-Me-3-$[(CH_2)_2$—NMe]-;
the Lanthanide precursor being $(Me_2N)$—Nd—$C_5H_3$-1-Me-3-$[(CH_2)_2$—NMe]-;
the Lanthanide precursor being $(Me_2N)$—Sm—$C_5H_3$-1-Me-3-$[(CH_2)_2$—NMe]-;
the Lanthanide precursor being $(Me_2N)$—Eu—$C_5H_3$-1-Me-3-$[(CH_2)_2$—NMe]-;
the Lanthanide precursor being $(Me_2N)$—Gd—$C_5H_3$-1-Me-3-$[(CH_2)_2$—NMe]-;
the Lanthanide precursor being $(Me_2N)$—Tb—$C_5H_3$-1-Me-3-$[(CH_2)_2$—NMe]-;
the Lanthanide precursor being $(Me_2N)$—Dy—$C_5H_3$-1-Me-3-$[(CH_2)_2$—NMe]-;
the Lanthanide precursor being $(Me_2N)$—Ho—$C_5H_3$-1-Me-3-$[(CH_2)_2$—NMe]-;
the Lanthanide precursor being $(Me_2N)$—Er—$C_5H_3$-1-Me-3-$[(CH_2)_2$—NMe]-;
the Lanthanide precursor being $(Me_2N)$—Tm—$C_5H_3$-1-Me-3-$[(CH_2)_2$—NMe]-;
the Lanthanide precursor being $(Me_2N)$—Yb—$C_5H_3$-1-Me-3-$[(CH_2)_2$—NMe]-;
the Lanthanide precursor being $(Me_2N)$—Lu—$C_5H_3$-1-Me-3-$[(CH_2)_2$—NMe]-;
the Lanthanide precursor being $(Me_2N)$—La—$C_5H_3$-1-Me-3-$[(CH_2)_2$—O]—;
the Lanthanide precursor being $(Me_2N)$—Y—$C_5H_3$-1-Me-3-$[(CH_2)_2$—O]—;
the Lanthanide precursor being $(Me_2N)$—Sc—$C_5H_3$-1-Me-3-$[(CH_2)_2$—O]—;
the Lanthanide precursor being $(Me_2N)$—Ce—$C_5H_3$-1-Me-3-$[(CH_2)_2$—O]—;
the Lanthanide precursor being $(Me_2N)$—Pr—$C_5H_3$-1-Me-3-$[(CH_2)_2$—O]—;
the Lanthanide precursor being $(Me_2N)$—Nd—$C_5H_3$-1-Me-3-$[(CH_2)_2$—O]—;
the Lanthanide precursor being $(Me_2N)$—Sm—$C_5H_3$-1-Me-3-$[(CH_2)_2$—O]—;
the Lanthanide precursor being $(Me_2N)$—Eu—$C_5H_3$-1-Me-3-$[(CH_2)_2$—O]—;
the Lanthanide precursor being $(Me_2N)$—Gd—$C_5H_3$-1-Me-3-$[(CH_2)_2$—O]—;
the Lanthanide precursor being $(Me_2N)$—Tb—$C_5H_3$-1-Me-3-$[(CH_2)_2$—O]—;
the Lanthanide precursor being $(Me_2N)$—Dy—$C_5H_3$-1-Me-3-$[(CH_2)_2$—O]—;
the Lanthanide precursor being $(Me_2N)$—Ho—$C_5H_3$-1-Me-3-$[(CH_2)_2$—O]—;
the Lanthanide precursor being $(Me_2N)$—Er—$C_5H_3$-1-Me-3-$[(CH_2)_2$—O]—;
the Lanthanide precursor being $(Me_2N)$—Tm—$C_5H_3$-1-Me-3-$[(CH_2)_2$—O]—;
the Lanthanide precursor being $(Me_2N)$—Yb—$C_5H_3$-1-Me-3-$[(CH_2)_2$—O]—;
the Lanthanide precursor being $(Me_2N)$—Lu—$C_5H_3$-1-Me-3-$[(CH_2)_2$—O]—;
the Lanthanide precursor being Cp-La—$C_5H_3$-1-Me-3-$[(CH_2)_2$—NMe]-;
the Lanthanide precursor being Cp-Y—$C_5H_3$-1-Me-3-$[(CH_2)_2$—NMe]-;
the Lanthanide precursor being Cp-Sc—$C_5H_3$-1-Me-3-$[(CH_2)_2$—NMe]-:
the Lanthanide precursor being Cp-Ce—$C_5H_3$-1-Me-3-$[(CH_2)_2$—NMe]-;
the Lanthanide precursor being Cp-Pr—$C_5H_3$-1-Me-3-$[(CH_2)_2$—NMe]-;
the Lanthanide precursor being Cp-Nd—$C_5H_3$-1-Me-3-$[(CH_2)_2$—NMe]-;
the Lanthanide precursor being Cp-Sm—$C_5H_3$-1-Me-3-$[(CH_2)_2$—NMe]-;
the Lanthanide precursor being Cp-Eu—$C_5H_3$-1-Me-3-$[(CH_2)_2$—NMe]-;
the Lanthanide precursor being Cp-Gd—$C_5H_3$-1-Me-3-$[(CH_2)_2$—NMe]-;
the Lanthanide precursor being Cp-Tb—$C_5H_3$-1-Me-3-$[(CH_2)_2$—NMe]-;
the Lanthanide precursor being Cp-Dy—$C_5H_3$-1-Me-3-$[(CH_2)_2$—NMe]-;
the Lanthanide precursor being Cp-Ho—$C_5H_3$-1-Me-3-$[(CH_2)_2$—NMe]-;
the Lanthanide precursor being Cp-Er—$C_5H_3$-1-Me-3-$[(CH_2)_2$—NMe]-;
the Lanthanide precursor being Cp-Tm—$C_5H_3$-1-Me-3-$[(CH_2)_2$—NMe]-;
the Lanthanide precursor being Cp-Yb—$C_5H_3$-1-Me-3-$[(CH_2)_2$—NMe]-;
the Lanthanide precursor being Cp-Lu—$C_5H_3$-1-Me-3-$[(CH_2)_2$—NMe]-;
the Lanthanide precursor being Cp-La—$C_5H_3$-1-Me-3-$[(CH_2)_2$—O]—;

the Lanthanide precursor being Cp-Y—$C_5H_3$-1-Me-3-[$(CH_2)_2$—O]—;
the Lanthanide precursor being Cp-Sc—$C_5H_3$-1-Me-3-[$(CH_2)_2$—O]—;
the Lanthanide precursor being Cp-Ce—$C_5H_3$-1-Me-3-[$(CH_2)_2$—O]—;
the Lanthanide precursor being Cp-Pr—$C_5H_3$-1-Me-3-[$(CH_2)_2$—O]—;
the Lanthanide precursor being Cp-Nd—$C_5H_3$-1-Me-3-[$(CH_2)_2$—O]—;
the Lanthanide precursor being Cp-Sm—$C_5H_3$-1-Me-3-[$(CH_2)_2$—O]—;
the Lanthanide precursor being Cp-Eu—$C_5H_3$-1-Me-3-[$(CH_2)_2$—O]—;
the Lanthanide precursor being Cp-Gd—$C_5H_3$-1-Me-3-[$(CH_2)_2$—O]—;
the Lanthanide precursor being Cp-Tb—$C_5H_3$-1-Me-3-[$(CH_2)_2$—O]—;
the Lanthanide precursor being Cp-Dy—$C_5H_3$-1-Me-3-[$(CH_2)_2$—O]—;
the Lanthanide precursor being Cp-Ho—$C_5H_3$-1-Me-3-[$(CH_2)_2$—O]—;
the Lanthanide precursor being Cp-Er—$C_5H_3$-1-Me-3-[$(CH_2)_2$—O]—;
the Lanthanide precursor being Cp-Tm—$C_5H_3$-1-Me-3-[$(CH_2)_2$—O]—;
the Lanthanide precursor being Cp-Yb—$C_5H_3$-1-Me-3-[$(CH_2)_2$—O]—; or
the Lanthanide precursor being Cp-Lu—$C_5H_3$-1-Me-3-[$(CH_2)_2$—O]—.

Also disclosed are methods for depositing Lanthanide-containing films on semiconductor substrates. The Lanthanide precursors disclosed above are introduced into a reactor having a substrate disposed therein. At least part of the Lanthanide precursor is deposited onto the substrate to form the Lanthanide-containing film on the substrate using a vapor deposition process. The disclosed method may optionally include one or more of the following aspects:

depositing the Lanthanide-containing film on the substrate at a temperature between about 150° C. and about 600° C.;
depositing the Lanthanide-containing film on the substrate at a pressure between about 0.5 mTorr and about 20 Torr;
the substrate being a $GeO_2$ film;
the substrate being a high k gate dielectric film;
the Lanthanide precursor being a liquid at a temperature below 70° C.;
the Lanthanide precursor being a liquid at a temperature below 40° C.;
the Lanthanide-containing film being selected from the group consisting of $Ln_2O_3$, $(LnLn')O_3$, $Ln_2O_3$-$Ln'_2O_3$, $LnSi_xO_y$, $LnGe_xO_y$, (Al, Ga, Mn)$LnO_3$, $HfLnO_x$, and $ZrLnO_x$, $LnSrCoO_4$, $LnSrMnO_4$, wherein Ln' is a different Lanthanide from Ln and x and y are each a number selected from 1-5 inclusive;
annealing the Lanthanide-containing film.
introducing a reactant species into the reactor;
the reactant species being selected from the group consisting $O_2$, $O_3$, $H_2O$, $H_2O_2$, acetic acid, formalin, para-formaldehyde, and combinations thereof;
the reactant species being $O_3$;
the reactant species being $H_2O$;
introducing the Lanthanide precursor and the reactant species at least partially simultaneously, as in a chemical vapor deposition process;
introducing the Lanthanide precursor and the reactant species sequentially, as in an atomic layer deposition process;
introducing a precursor into the reactor, wherein the precursor is different than the Lanthanide precursor, and depositing at least part of the precursor to form the Lanthanide-containing layer on the one or more substrates;
the precursor containing an element selected from the group consisting of Hf, Si, Al, Ga, Mn, Ti, Ta, Bi, Zr, Pb, Nb, Mg, Sr, Ba, Ca, and combinations thereof;
the precursor containing Ge;
the precursor containing Hf;
the vapor deposition process being a chemical vapor deposition process;
the vapor deposition process being an atomic layer deposition process;
the vapor deposition process being a spatial ALD process;
the vapor deposition process including a plasma process;
the vapor deposition process not including a plasma process; and
the vapor deposition process being a thermal process.

Also disclosed are Lanthanide-containing film coated substrates comprising the product of the disclosed methods.

Notation and Nomenclature

Certain abbreviations, symbols, and terms are used throughout the following description and claims and include:

As used in the disclosed embodiments, the indefinite article "a" or "an" means one or more.

As used in the disclosed embodiments, "about" or "around" or "approximately" in the text or in a claim means±10% of the value stated.

As used in the disclosed embodiments, the term "independently" when used in the context of describing R groups should be understood to denote that the subject R group is not only independently selected relative to other R groups bearing the same or different subscripts or superscripts, but is also independently selected relative to any additional species of that same R group. For example in the formula $MR^1_x(NR^2R^3)_{(4-x)}$, where x is 2 or 3, the two or three $R^1$ groups may, but need not be identical to each other or to $R^2$ or to $R^3$. Further, it should be understood that unless specifically stated otherwise, values of R groups are independent of each other when used in different formulas.

As used in the disclosed embodiments, the term "hydrocarbyl group" refers to a functional group containing carbon and hydrogen; the term "alkyl group" refers to saturated functional groups containing exclusively carbon and hydrogen atoms. The hydrocarbyl group may be saturated or unsaturated. Either term refers to linear, branched, or cyclic groups. Examples of linear alkyl groups include without limitation, methyl groups, ethyl groups, propyl groups, butyl groups, etc. Examples of branched alkyls groups include without limitation, t-butyl. Examples of cyclic alkyl groups include without limitation, cyclopropyl groups, cyclopentyl groups, cyclohexyl groups, etc.

As used in the disclosed embodiments, the abbreviation "Me" refers to a methyl group; the abbreviation "Et" refers to an ethyl group; the abbreviation "Pr" refers to a propyl group; the abbreviation "$^n$Pr" refers to a "normal" or linear propyl group; the abbreviation "$^i$Pr" refers to an isopropyl group; the abbreviation "Bu" refers to a butyl group; the abbreviation "$^n$Bu" refers to a "normal" or linear butyl group; the abbreviation "$^t$Bu" refers to a tert-butyl group, also known as 1,1-dimethylethyl; the abbreviation "$^s$Bu" refers to a sec-butyl group, also known as 1-methylpropyl; the abbreviation "$^i$Bu" refers to an iso-butyl group, also known as 2-methylpropyl; the abbreviation "Cp" refers to cyclopentadienyl; the abbreviation "Cp*" refers to pentamethylcyclopentadienyl.

As used in the disclosed embodiments, the abbreviation "ortho-" or "o-" refers to an aromatic ring having carbon replacements at 1,2 positions; the abbreviation "meta-" or "m-" refers to an aromatic ring having carbon replacements at 1,3 positions; the abbreviation "para-" or "p-" refers to an six-memebered aromatic ring having carbon replacements at 1,4 positions. For example, the compounds shown in following structure formula are represented by $(Me_2N)—La—C_3(m-A_2)H_2-4-(CH_2—CH_2—NMe)-$,

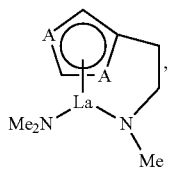

wherein La is bonded in an $\eta^5$ bonding mode to the aromatic ring group; A is independently N, Si, B or P. Herein the $\eta^5$ is the hapticity of the above precursors representing five contiguous atoms of the aromatic ring group bonded to the La atom.

As used in the disclosed embodiments, the chemical formula, $L-Ln-C_5R_4—[(ER_2)_m-(ER_2)_n-L']-$, $L-Ln-C_4AR_3-3-[(ER_2)_m-(ER_2)_n-L']-$ and $L-Ln-C_3(m-A_2)R_2-4-[(ER_2)_m-(ER_2)_n-L']-$, refer to the compounds having the following structure formula, respectively:

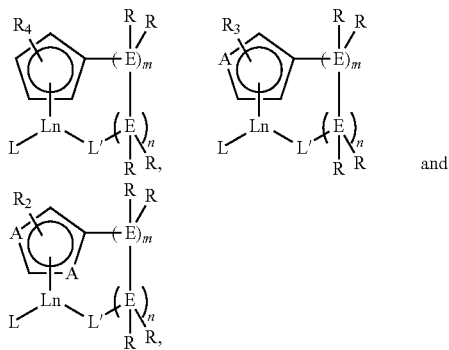

wherein Ln is selected from Lanthanide elements consisting of La, Y, Sc, Ce, Pr, Nd, Sm, Eu, Gd, Tb, Dy, Ho, Er, Tm, Yb and Lu bonded in an $\eta^5$ bonding mode to the aromatic ring group; A is independently N, Si, B, P or O; each E is independently C, Si, B or P; m and n are independently 0, 1 or 2; m+n>1; each R is independently an H or a $C_1$-$C_4$ hydrocarbyl group; and adjacent Rs may be joined to form a hydrocarbyl ring; each L is independently a −1 anionic ligand selected from the group consisting of NR'$_2$, OR', Cp, amidinate, β-diketonate, or keto-iminate, wherein R' is an H or a $C_1$-$C_4$ hydrocarbon group; and adjacent R's may be joined to form a hydrocarbyl ring; and each L' is independently NR" or O, wherein R' is an H or a $C_1$-$C_4$ hydrocarbon group and adjacent R"s may be joined to form a hydrocarbyl ring. Herein the $\eta^5$ is the hapticity of the above precursors representing five contiguous atoms of the aromatic ring group bonded to the Ln atom.

As used herein, the abbreviation "Ln" refers to the Lanthanide group, which includes the following elements: lanthanum ("La"), yttrium ("Y"), scandium ("Sc"), cerium ("Ce"), praseodymium ("Pr"), neodymium ("Nd"), samarium ("Sm"), europium ("Eu"), gadolinium ("Gd"), terbium ("Tb"), dysprosium ("Dy"), holmium ("Ho"), erbium ("Er"), thulium ("Tm"), ytterbium ("Yb"), or lutetium ("Lu"); the abbreviation "Cp" refers to cyclopentadienyl; the abbreviation "Å" refers to angstroms; prime ("'") is used to indicate a different component than the first, for example $(LnLn')O_3$ refers to a Lanthanide oxide containing two different Lanthanide elements; the term "aliphatic group" refers to a $C_1$-$C_4$ linear or branched chain alkyl group; the term "alkyl group" refers to saturated functional groups containing exclusively carbon and hydrogen atoms; the abbreviation "CVD" refers to chemical vapor deposition; the abbreviation "LPCVD" refers to low pressure chemical vapor deposition; the abbreviation "ALD" refers to atomic layer deposition; the abbreviation "P-CVD" refers to pulsed chemical vapor deposition; the abbreviation "PE-ALD" refers to plasma enhanced atomic layer deposition; the abbreviation "MIM" refers to Metal Insulator Metal (a structure used in capacitors); the abbreviation "DRAM" refers to dynamic random access memory; the abbreviation "FeRAM" refers to ferroelectric random access memory; the abbreviation "CMOS" refers to complementary metal-oxide-semiconductor; the abbreviation "THF" refers to tetrahydrofuran; the abbreviation "TGA" refers to thermogravimetric analysis; and the abbreviation "TMA" refers to trimethyl aluminum.

The standard abbreviations of the elements from the periodic table of elements are used herein. It should be understood that elements may be referred to by these abbreviations (e.g., La refers to Lanthanum, N refers to nitrogen, O refers to oxygen, C refers to carbon, etc.). Additionally, Group 3 refers to Group 3 of the Periodic Table (i.e., Sc, Y, La, or Ac). Similarly, Group 4 refers to Group 4 of the Periodic Table (i.e., Ti, Zr, or Hf) and Group 5 refers to Group 5 of the Periodic Table (i.e., V, Nb, or Ta).

Any and all ranges recited in the disclosed embodiments are inclusive of their endpoints (i.e., x=1 to 4 or x ranges from 1 to 4 includes x=1, x=4, and x=any number in between), irrespective of whether the term "inclusively" is used.

Please note that the films or layers deposited, such as silicon oxide or silicon nitride, may be listed throughout the specification and claims without reference to their proper stoichiometry. The layers may include pure (Si) layers, carbide ($Si_oC_p$) layers, nitride ($Si_kN_l$) layers, oxide ($Si_nO_m$) layers, or mixtures thereof, wherein k, l, m, n, o, and p inclusively range from 1 to 6. For instance, silicon oxide is $Si_nO_m$, wherein n ranges from 0.5 to 1.5 and m ranges from 1.5 to 3.5. More preferably, the silicon oxide layer is $SiO_2$. These films may also contain Hydrogen, typically from 0 at % to 15 at %. However, since not routinely measured, any film compositions given ignore their H content, unless explicitly stated otherwise.

DESCRIPTION OF PREFERRED EMBODIMENTS

Lanthanide-containing film forming compositions are disclosed. The Lanthanide-containing film forming compositions comprise Lanthanide precursors having the general formulae,

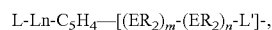

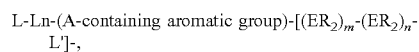

wherein Ln is selected from Lanthanide elements consisting of La, Y, Sc, Ce, Pr, Nd, Sm, Eu, Gd, Tb, Dy, Ho, Er, Tm, Yb and Lu bonded in an η⁵ bonding mode to the aromatic group; A-containing aromatic group contains one or two As wherein the two As are at ortho- or meta-positions; A is independently N, Si, B, P or O; each E is independently C, Si, B or P; m and n are independently 0, 1 or 2; m+n>1; each R is independently an H or a $C_1$-$C_4$ hydrocarbyl group; adjacent Rs may be joined to form a hydrocarbyl ring; each L is independently a −1 anionic ligand selected from the group consisting of $NR'_2$, OR', Cp, amidinate, β-diketonate, or keto-iminate, wherein R' is an H or a $C_1$-$C_4$ hydrocarbon group; adjacent R's may joined to form a hydrocarbyl ring; and each L' is independently NR'' or O, wherein R'' is an H or a $C_1$-$C_4$ hydrocarbon group; and adjacent R''s may joined to form a hydrocarbyl ring. One of ordinary skill in the art would recognize that the A-containing aromatic group is a heterocyclic cyclic group containing N, Si, B, P or O and may have a symmetric or asymmetric structure.

The Lanthanide-containing film forming compositions further comprise the Lanthanide precursors having the following formulae:

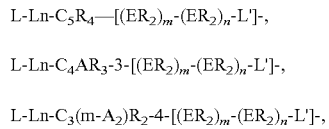

referring to the following structure formula, respectively:

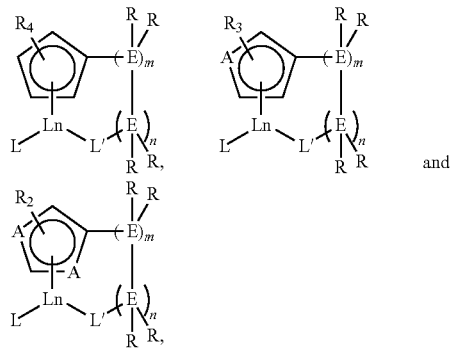

wherein Ln is selected from Lanthanide elements consisting of La, Y, Sc, Ce, Pr, Nd, Sm, Eu, Gd, Tb, Dy, Ho, Er, Tm, Yb and Lu bonded in an η⁵ bonding mode to the aromatic group; A is independently N, Si, B, P or O; each E is independently C, Si, B or P; m and n are independently 0, 1 or 2; m+n>1; each R is independently an H or a $C_1$-$C_4$ hydrocarbyl group; and adjacent Rs may be joined to form a hydrocarbyl ring; each L is independently a −1 anionic ligand selected from the group consisting of $NR'_2$, OR', Cp, amidinate, β-diketonate, or keto-iminate, wherein R' is an H or a $C_1$-$C_4$ hydrocarbon group; and adjacent R's may be joined to form a hydrocarbyl ring; and each L' is independently NR'' or O, wherein R'' is an H or a $C_1$-$C_4$ hydrocarbon group and adjacent R''s may be joined to form a hydrocarbyl ring.

Exemplary Ln-containing precursors wherein E is C; A is N; m+n=2; and each R is independently hydrogen or a hydrocarbon group having up to 4 carbon atoms include but are not limited to $(H_2N)$-Ln-$C_5H_4$—[$(CH_2)_2$—NH]—, $(Me_2N)$-Ln-$C_5H_4$—[$(CH_2)_2$—NH]—, $(Et_2N)$-Ln-$C_5H_4$—[$(CH_2)_2$—NH]—, ($^nPr_2N$)-Ln-$C_5H_4$—[$(CH_2)_2$—NH]—, ($^iPr_2N$)-Ln-$C_5H_4$—[$(CH_2)_2$—NH]—, ($^nBu_2N$)-Ln-$C_5H_4$—[$(CH_2)_2$—NH]—, ($^iBu_2N$)-Ln-$C_5H_4$—[$(CH_2)_2$—NH]—, ($^sBu_2N$)-Ln-$C_5H_4$—[$(CH_2)_2$—NH]—, ($^tBu_2N$)-Ln-$C_5H_4$—[$(CH_2)_2$—NH]—, (Cp)-Ln-$C_5H_4$—[$(CH_2)_2$—NH]—, (HO)-Ln-$C_5H_4$—[$(CH_2)_2$—NH]—, (MeO)-Ln-$C_5H_4$—[$(CH_2)_2$—NH]—, (EtO)-Ln-$C_5H_4$—[$(CH_2)_2$—NH]—, ($^nPrO$)-Ln-$C_5H_4$—[$(CH_2)_2$—NH]—, ($^iPrO$)-Ln-$C_5H_4$—[$(CH_2)_2$—NH]—, ($^nBuO$)-Ln-$C_5H_4$—[$(CH_2)_2$—NH]—, ($^iBuO$)-Ln-$C_5H_4$—[$(CH_2)_2$—NH]—, ($^sBuO$)-Ln-$C_5H_4$—[$(CH_2)_2$—NH]—, ($^tBuO$)-Ln-$C_5H_4$—[$(CH_2)_2$—NH]—, $(H_2N)$-Ln-$C_5H_4$—[$(CH_2)_2$—NMe]-, $(Me_2N)$-Ln-$C_5H_4$—[$(CH_2)_2$—NMe]-, $(Et_2N)$-Ln-$C_5H_4$—[$(CH_2)_2$—NMe]-, ($^nPr_2N$)-Ln-$C_5H_4$—[$(CH_2)_2$—NMe]-, ($^iPr_2N$)-Ln-$C_5H_4$—[$(CH_2)_2$—NMe]-, ($^nBu_2N$)-Ln-$C_5H_4$—[$(CH_2)_2$—NMe]-, ($^iBu_2N$)-Ln-$C_5H_4$—[$(CH_2)_2$—NMe]-, ($^sBu_2N$)-Ln-$C_5H_4$—[$(CH_2)_2$—NMe]-, ($^tBu_2N$)-Ln-$C_5H_4$—[$(CH_2)_2$—NMe]-, (Cp)-Ln-$C_5H_4$[$(CH_2)_2$—NMe]-, (HO)-Ln-$C_5H_4$—[$(CH_2)_2$—NMe]-, (MeO)-Ln-$C_5H_4$—[$(CH_2)_2$—NMe]-, (EtO)-Ln-$C_5H_4$—[$(CH_2)_2$—NMe]-, ($^nPrO$)-Ln-$C_5H_4$—[$(CH_2)_2$—NMe]-, ($^iPrO$)-Ln-$C_5H_4$—[$(CH_2)_2$—NMe]-, ($^nBuO$)-Ln-$C_5H_4$—[$(CH_2)_2$—NMe]-, ($^iBuO$)-Ln-$C_5H_4$—[$(CH_2)_2$—NMe]-, ($^sBuO$)-Ln-$C_5H_4$—[$(CH_2)_2$—NMe]-, ($^tBuO$)-Ln-$C_5H_4$—[$(CH_2)_2$—NMe]-, $(H_2N)$-Ln-$C_5H_4$—[$(CH_2)_2$—NEt]-, $(Me_2N)$-Ln-$C_5H_4$—[$(CH_2)_2$—NEt]-, $(Et_2)$-Ln-$C_5H_4$—[$(CH_2)_2$—NEt]-, ($^nPr_2$)-Ln-$C_5H_4$—[$(CH_2)_2$—NEt]-, ($^iPr_2N$)-Ln-$C_5H_4$—[$(CH_2)_2$—NEt]-, ($^nBu_2N$)-Ln-$C_5H_4$—[$(CH_2)_2$—NEt]-, ($^iBu_2N$)-Ln-$C_5H_4$—[$(CH_2)_2$—NEt]-, ($^sBu_2N$)-Ln-$C_5H_4$—[$(CH_2)_2$—NEt]-, ($^tBu_2N$)-Ln-$C_5H_4$—[$(CH_2)_2$—NEt]-, (Cp)-Ln-$C_5H_4$—[$(CH_2)_2$—NEt]-, (HO)-Ln-$C_5H_4$—[$(CH_2)_2$—NEt]-, (MeO)-Ln-$C_5H_4$—[$(CH_2)_2$—NEt]-, (EtO)-Ln-$C_5H_4$—[$(CH_2)_2$—NEt]-, ($^nPrO$)-Ln-$C_5H_4$—[$(CH_2)_2$—NEt]-, ($^iPrO$)-Ln-$C_5H_4$—[$(CH_2)_2$—NEt]-, ($^nBuO$)-Ln-$C_5H_4$—[$(CH_2)_2$—NEt]-, ($^iBuO$)-Ln-$C_5H_4$—[$(CH_2)_2$—NEt]-, ($^sBuO$)-Ln-$C_5H_4$—[$(CH_2)_2$—NEt]-, ($^tBuO$)-Ln-$C_5H_4$—[$(CH_2)_2$—NEt]-, $(H_2N)$-Ln-$C_5H_4$—[$(CH_2)_2$—N$^n$Pr]—, $(Me_2N)$-Ln-$C_5H_4$—[$(CH_2)_2$—N$^n$Pr]—, $(Et_2N)$-Ln-$C_5H_4$—[$(CH_2)_2$—N$^n$Pr]—, ($^nPr_2N$)-Ln-$C_5H_4$—[$(CH_2)_2$—N$^n$Pr]—, ($^iPr_2N$)-Ln-$C_5H_4$—[$(CH_2)_2$—N$^n$Pr]—, ($^nBu_2N$)-Ln-$C_5H_4$—[$(CH_2)_2$—N$^n$Pr]—, ($^iBu_2N$)-Ln-$C_5H_4$—[$(CH_2)_2$—N$^n$Pr]—, ($^sBu_2N$)-Ln-$C_5H_4$—[$(CH_2)_2$—N$^n$Pr]—, ($^tBu_2N$)-Ln-$C_5H_4$—[$(CH_2)_2$—N$^n$Pr]—, (Cp)-Ln-$C_5H_4$—[$(CH_2)_2$—N$^n$Pr]—, (HO)-Ln-$C_5H_4$—[$(CH_2)_2$—N$^n$Pr]—, (MeO)-Ln-$C_5H_4$—[$(CH_2)_2$—N$^n$Pr]—, (EtO)-Ln-$C_5H_4$—[$(CH_2)_2$—N$^n$Pr]—, ($^nPrO$)-Ln-$C_5H_4$—[$(CH_2)_2$—N$^n$Pr]—, ($^iPrO$)-Ln-$C_5H_4$—[$(CH_2)_2$—N$^n$Pr]—, ($^nBuO$)-Ln-$C_5H_4$—[$(CH_2)_2$—N$^n$Pr]—, ($^iBuO$)-Ln-$C_5H_4$—[$(CH_2)_2$—N$^n$Pr]—, ($^sBrO$)-Ln-$C_5H_4$—[$(CH_2)_2$—N$^n$Pr]—, ($^tBuO$)-Ln-$C_5H_4$—[$(CH_2)_2$—N$^n$Pr]—, $(H_2N)$-Ln-$C_5H_4$—[$(CH_2)_2$—N$^i$Pr]—, $(Me_2N)$-Ln-$C_5H_4$—[$(CH_2)_2$—N$^i$Pr]—, $(Et_2N)$-Ln-$C_5H_4$—[$(CH_2)_2$—N$^i$Pr]—, ($^nPr_2N$)-Ln-$C_5H_4$—[$(CH_2)_2$—N$^i$Pr]—, ($^iPr_2N$)-Ln-$C_5H_4$—[$(CH_2)_2$—N$^i$Pr]—, ($^nBu_2N$)-Ln-$C_5H_4$—[$(CH_2)_2$—N$^i$Pr]—, ($^iBu_2N$)-Ln-$C_5H_4$—[$(CH_2)_2$—N$^i$Pr]—, ($^sBu_2N$)-Ln-$C_5H_4$—[$(CH_2)_2$—N$^i$Pr]—, ($^tBu_2$)-Ln-$C_5H_4$—[$(CH_2)_2$—N$^i$Pr]—, (CP)-Ln-$C_5H_4$—[$(CH_2)_2$—N$^i$Pr]—, (HO)-Ln-$C_5H_4$—[$(CH_2)_2$—N$^i$Pr]—, (MeO)-Ln-$C_5H_4$—[$(CH_2)_2$—N$^i$Pr]—, (EtO)-Ln-$C_5H_4$—[$(CH_2)_2$—N$^i$Pr]—, ($^nPrO$)-Ln-$C_5H_4$—[$(CH_2)_2$—N$^i$Pr]—, ($^iPrO$)-Ln-$C_5H_4$—[$(CH_2)_2$—N$^i$Pr]—, ($^nBuO$)-Ln-$C_5H_4$—[$(CH_2)_2$—N$^i$Pr]—, ($^iBuO$)-Ln-$C_5H_4$—[$(CH_2)_2$—N$^i$Pr]—, ($^sBuO$)-Ln-$C_5H_4$—[$(CH_2)_2$—N$^i$Pr]—, ($^tBuO$)-Ln-$C_5H_4$—[$(CH_2)_2$—N$^i$Pr]—, $(H_2N)$-Ln-$C_5H_4$—[$(CH_2)_2$—N$^n$Bu]-, $(Me_2N)$-Ln-$C_5H_4$—[$(CH_2)_2$—N$^n$Bu]-, $(Et_2N)$-Ln-$C_5H_4$—[$(CH_2)_2$—N$^n$Bu]-, ($^nPr_2N$)-Ln-$C_5H_4$—[$(CH_2)_2$—N$^n$Bu ]-, ($^iPr_2N$)-Ln-$C_5H_4$—[$(CH_2)_2$—N$^n$Bu]-, ($^nBu_2N$)-Ln-$C_5H_4$—[$(CH_2)_2$—N$^n$Bu]-, ($^iBu_2N$)-Ln-$C_5H_4$—[$(CH_2)_2$—N$^n$Bu]-, ($^sBu_2N$)-Ln-$C_5H_4$—[$(CH_2)_2$—N$^n$Bu]-, ($^tBu_2N$)-Ln-$C_5H_4$—[$(CH_2)_2$—N$^n$Bu]-, (Cp)-Ln-$C_5H_4$—[$(CH_2)_2$—N$^n$Bu]-, (HO)-Ln-$C_5H_4$—[$(CH_2)_2$—N$^n$Bu]-, (MeO)-Ln-$C_5H_4$—[$(CH_2)_2$—N$^n$Bu]-, (EtO)-Ln-$C_5H_4$—[$(CH_2)_2$—N$^n$Bu]-, ($^nPrO$)-Ln-$C_5H_4$—[$(CH_2)_2$—

N"Bu]-, (ⁱPrO)-Ln-C₅H₄—[(CH₂)₂—N"Bu]-, ("BuO)-Ln-C₅H₄—[(CH₂)₂—N"Bu]-, (ⁱBuO)-Ln-C₅H₄—[(CH₂)₂—N"Bu]-, (ˢBuO)-Ln-C₅H₄—[(CH₂)₂—N"Bu]-, (ᵗBuO)-Ln-C₅H₄—[(CH₂)₂—N"Bu]-, (H₂N)-Ln-C₅H₄—[(CH₂)₂—NⁱBu]-, (Me₂N)-Ln-C₅H₄—[(CH₂)₂—NⁱBu]-, (Et₂N)-Ln-C₅H₄—[(CH₂)₂—NⁱBu]-, ("Pr₂)-Ln-C₅H₄—[(CH₂)₂—NⁱBu]-, (ⁱPr₂N)-Ln-C₅H₄—[(CH₂)₂—NⁱBu]-, ("Bu₂N)-Ln-C₅H₄—[(CH₂)₂—NⁱBu]-, (ⁱBu₂N)-Ln-C₅H₄—[(CH₂)₂—NⁱBu]-, (ˢBu₂N)-Ln-C₅H₄—[(CH₂)₂—NⁱBu]-, (ᵗBu₂N)-Ln-C₅H₄—[(CH₂)₂—NⁱBu]-, (Cp)-Ln-C₅H₄—[(CH₂)₂—NⁱBu]-, (HO)-Ln-C₅H₄—[(CH₂)₂—NⁱBu]-, (MeO)-Ln-C₅H₄—[(CH₂)₂—NⁱBu]-, (EtO)-Ln-C₅H₄—[(CH₂)₂—NⁱBu]-, ("PrO)-Ln-C₅H₄—[(CH₂)₂—NⁱBu]-, (ⁱPrO)-Ln-C₅H₄—[(CH₂)₂—NⁱBu]-, ("BuO)-Ln-C₅H₄—[(CH₂)₂—NⁱBu]-, (ⁱBuO)-Ln-C₅H₄—[(CH₂)₂—NⁱBu]-, (ˢBuO)-Ln-C₅H₄—[(CH₂)₂—NⁱBu]-, (ᵗBuO)-Ln-C₅H₄—[(CH₂)₂—NⁱBu]-, (H₂N)-Ln-C₅H₄—[(CH₂)₂—NˢBu]-, (Me₂N)-Ln-C₅H₄—[(CH₂)₂—NˢBu]-, (Et₂N)-Ln-C₅H₄—[(CH₂)₂—NˢBu]-, ("Pr₂N)-Ln-C₅H₄—[(CH₂)₂—NˢBu]-, (ⁱPr₂N)-Ln-C₅H₄—[(CH₂)₂—NˢBu]-, ("Bu₂N)-Ln-C₅H₄—[(CH₂)₂—NˢBu]-, (ⁱBu₂N)-Ln-C₅H₄—[(CH₂)₂—NˢBu]-, (ˢBu₂N)-Ln-C₅H₄—[(CH₂)₂—NˢBu]-, (ᵗBu₂N)-Ln-C₅H₄—[(CH₂)₂—NˢBu]-, (Cp)-Ln-C₅H₄—[(CH₂)₂—NˢBu]-, (HO)-Ln-C₅H₄—[(CH₂)₂—NˢBu]-, (MeO)-Ln-C₅H₄—[(CH₂)₂—NˢBu]-, (EtO)-Ln-C₅H₄—[(CH₂)₂—NˢBu]-, ("PrO)-Ln-C₅H₄—[(CH₂)₂—NˢBu]-, (ⁱPrO)-Ln-C₅H₄—[(CH₂)₂—NˢBu]-, ("BuO)-Ln-C₅H₄—[(CH₂)₂—NˢBu]-, (ⁱBuO)-Ln-C₅H₄—[(CH₂)₂—NˢBu]-, (ˢBuO)-Ln-C₅H₄—[(CH₂)₂—NˢBu]-, (ᵗBuO)-Ln-C₅H₄—[(CH₂)₂—NˢBu]-, (H₂N)-Ln-C₅H₄—[(CH₂)₂—NᵗBu]-, (Me₂N)-Ln-C₅H₄—[(CH₂)₂—NᵗBu]-, (Et₂N)-Ln-C₅H₄—[(CH₂)₂—NᵗBu]-, ("Pr₂N)-Ln-C₅H₄—[(CH₂)₂—NᵗBu]-, (ⁱPr₂N)-Ln-C₅H₄—[(CH₂)₂—NᵗBu]-, ("Bu₂N)-Ln-C₅H₄—[(CH₂)₂—NᵗBu]-, (ⁱBu₂N)-Ln-C₅H₄—[(CH₂)₂—NᵗBu]-, (ˢBu₂N)-Ln-C₅H₄—[(CH₂)₂—NᵗBu]-, (ᵗBu₂N)-Ln-C₅H₄—[(CH₂)₂—NᵗBu]-, (Cp)-Ln-C₅H₄—[(CH₂)₂—NᵗBu]-, (HO)-Ln-C₅H₄—[(CH₂)₂—NᵗBu]-, (MeO)-Ln-C₅H₄—[(CH₂)₂—NᵗBu]-, (EtO)-Ln-C₅H₄—[(CH₂)₂—NᵗBu]-, ("PrO)-Ln-C₅H₄—[(CH₂)₂—NᵗBu]-, (ⁱPrO)-Ln-C₅H₄—[(CH₂)₂—NᵗBu]-, ("BuO)-Ln-C₅H₄—[(CH₂)₂—NᵗBu]-, (ⁱBuO)-Ln-C₅H₄—[(CH₂)₂—NᵗBu]-, (ˢBuO)-Ln-C₅H₄—[(CH₂)₂—NᵗBu]-, (ᵗBuO)-Ln-C₅H₄—[(CH₂)₂—NᵗBu]-, (H₂N)-Ln-C₅H₄—[(CH₂)₂—O]—, (Me₂N)-Ln-C₅H₄—[(CH₂)₂—O]—, (Et₂N)-Ln-C₅H₄—[(CH₂)₂—O]—, ("Pr₂N)-Ln-C₅H₄—[(CH₂)₂—O]—, (ⁱPr₂N)-Ln-C₅H₄—[(CH₂)₂—O]—, ("Bu₂N)-Ln-C₅H₄—[(CH₂)₂—O]—, (ⁱBu₂N)-Ln-C₅H₄—[(CH₂)₂—O]—, (ˢBu₂N)-Ln-C₅H₄—[(CH₂)₂—O]—, (ᵗBu₂N)-Ln-C₅H₄—[(CH₂)₂—O]—, (Cp)-Ln-C₅H₄—[(CH₂)₂—O]—, (HO)-Ln-C₅H₄—[(CH₂)₂—O]—, (MeO)-Ln-C₅H₄—[(CH₂)₂—O]—, (EtO)-Ln-C₅H₄—[(CH₂)₂—O]—, ("PrO)-Ln-C₅H₄—[(CH₂)₂—O]—, (ⁱPrO)-Ln-C₅H₄—[(CH₂)₂—O]—, ("BuO)-Ln-C₅H₄—[(CH₂)₂—O]—, (ⁱBuO)-Ln-C₅H₄—[(CH₂)₂—O]—, (ˢBuO)-Ln-C₅H₄—[(CH₂)₂—O]—, (ᵗBuO)-Ln-C₅H₄—[(CH₂)₂—O]—, (H₂N)-Ln-C₅H₄—[(CMe₂)₂-NH]—, (Me₂N)-Ln-C₅H₄—[(CMe₂)₂-NH]—, (Et₂N)-Ln-C₅H₄—[(CMe₂)₂-NH]—, ("Pr₂N)-Ln-C₅H₄—[(CMe₂)₂-NH]—, (ⁱPr₂N)-Ln-C₅H₄—[(CMe₂)₂-NH]—, ("Bu₂N)-Ln-C₅H₄—[(CMe₂)₂-NH]—, (ⁱBu₂N)-Ln-C₅H₄—[(CMe₂)₂-NH]—, (ˢBu₂N)-Ln-C₅H₄—[(CMe₂)₂-NH]—, (ᵗBu₂N)-Ln-C₅H₄—[(CMe₂)₂-NH]—, (Cp)-Ln-C₅H₄—[(CMe₂)₂-NH]—, (HO)-Ln-C₅H₄—[(CMe₂)₂-NH]—, (MeO)-Ln-C₅H₄—[(CMe₂)₂-NH]—, (EtO)-Ln-C₅H₄—[(CMe₂)₂-NH]—, ("PrO)-Ln-C₅H₄—[(CMe₂)₂-NH]—, (ⁱPrO)-Ln-C₅H₄—[(CMe₂)₂-NH]—, ("BuO)-Ln-C₅H₄—[(CMe₂)₂-NH]—, (ⁱBuO)-Ln-C₅H₄—[(CMe₂)₂-NH]—, (ˢBuO)-Ln-C₅H₄—[(CMe₂)₂-NH]—, (ᵗBuO)-Ln-C₅H₄—[(CMe₂)₂-NH]—, (H₂N)-Ln-C₅H₄—[(CMe₂)₂-NMe]—, (Me₂N)-Ln-C₅H₄—[(CMe₂)₂-NMe]-, (Et₂N)-Ln-C₅H₄—[(CMe₂)₂-NMe]-, ("Pr₂N)-Ln-C₅H₄—[(CMe₂)₂-NMe]-, (ⁱPr₂N)-Ln-C₅H₄—[(CMe₂)₂-NMe]-, ("Bu₂N)-Ln-C₅H₄—[(CMe₂)₂-NMe]-, (ⁱBu₂N)-Ln-C₅H₄—[(CMe₂)₂-NMe]-, (ˢBu₂N)-Ln-C₅H₄—[(CMe₂)₂-NMe]-, (ᵗBu₂N)-Ln-C₅H₄—[(CMe₂)₂-NMe]-, (Cp)-Ln-C₅H₄—[(CMe₂)₂-NMe]-, (HO)-Ln-C₅H₄—[(CMe₂)₂-NMe]-, (MeO)-Ln-C₅H₄—[(CMe₂)₂-NMe]-, (EtO)-Ln-C₅H₄—[(CMe₂)₂-NMe]-, ("PrO)-Ln-C₅H₄—[(CMe₂)₂-NMe]-, (ⁱPrO)-Ln-C₅H₄—[(CMe₂)₂-NMe]-, ("BuO)-Ln-C₅H₄—[(CMe₂)₂-NMe]-, (ⁱBuO)-Ln-C₅H₄—[(CMe₂)₂-NMe]-, (ˢBuO)-Ln-C₅H₄—[(CMe₂)₂-NMe]-, (ᵗBuO)-Ln-C₅H₄—[(CMe₂)₂-NMe]-, (H₂N)-Ln-C₅H₄—[(CMe₂)₂-NEt]-, (Me₂N)-Ln-C₅H₄—[(CMe₂)₂-NEt]-, (Et₂N)-Ln-C₅H₄—[(CMe₂)₂-NEt]-, ("Pr₂N)-Ln-C₅H₄—[(CMe₂)₂-NEt]-, (ⁱPr₂N)-Ln-C₅H₄—[(CMe₂)₂-NEt]-, ("Bu₂N)-Ln-C₅H₄—[(CMe₂)₂-NEt]-, (ⁱBu₂N)-Ln-C₅H₄—[(CMe₂)₂-NEt]-, (ˢBu₂N)-Ln-C₅H₄—[(CMe₂)₂-NEt]-, (ᵗBu₂N)-Ln-C₅H₄—[(CMe₂)₂-NEt]-, (Cp)-Ln-C₅H₄—[(CMe₂)₂-NEt]-, (HO)-Ln-C₅H₄—[(CMe₂)₂-NEt]-, (MeO)-Ln-C₅H₄—[(CMe₂)₂-NEt]-, (EtO)-Ln-C₅H₄—[(CMe₂)₂-NEt]-, ("PrO)-Ln-C₅H₄—[(CMe₂)₂-NEt]-, (ⁱPrO)-Ln-C₅H₄—[(CMe₂)₂-NEt]-, ("BuO)-Ln-C₅H₄—[(CMe₂)₂-NEt]-, (ⁱBuO)-Ln-C₅H₄—[(CMe₂)₂-NEt]-, (ˢBuO)-Ln-C₅H₄—[(CMe₂)₂-NEt]-, (ᵗBuO)-Ln-C₅H₄—[(CMe₂)₂-NEt]-, (H₂N)-Ln-C₅H₄—[(CMe₂)₂-N"Pr]—, (Me₂N)-Ln-C₅H₄—[(CMe₂)₂-N"Pr]—, (Et₂N)-Ln-C₅H₄—[(CMe₂)₂-N"Pr]-, ("Pr₂N)-Ln-C₅H₄—[(CMe₂)₂-N"Pr]—, (ⁱPr₂N)-Ln-C₅H₄—[(CMe₂)₂-N"Pr]—, ("Bu₂N)-Ln-C₅H₄—[(CMe₂)₂-N"Pr]-, (ⁱBu₂N)-Ln-C₅H₄—[(CMe₂)₂-N"Pr]—, (ˢBu₂N)-Ln-C₅H₄—[(CMe₂)₂-N"Pr]—, (ᵗBu₂N)-Ln-C₅H₄—[(CMe₂)₂-N"Pr]—, (Cp)-Ln-C₅H₄—[(CMe₂)₂-N"Pr]—, (HO)-Ln-C₅H₄—[(CMe₂)₂-N"Pr]—, (MeO)-Ln-C₅H₄—[(CMe₂)₂-N"Pr]—, (EtO)-Ln-C₅H₄—[(CMe₂)₂-N"Pr]—, ("PrO)-Ln-C₅H₄—[(CMe₂)₂-N"Pr]—, (ⁱPrO)-Ln-C₅H₄—[(CMe₂)₂-N"Pr]—, ("BuO)-Ln-C₅H₄—[(CMe₂)₂-N"Pr]—, (ⁱBuO)-Ln-C₅H₄—[(CMe₂)₂-N"Pr]—, (ˢBuO)-Ln-C₅H₄—[(CMe₂)₂-N"Pr]—, (ᵗBuO)-Ln-C₅H₄—[(CMe₂)₂- N"Pr]—, (H₂N)-Ln-C₅H₄—[(CMe₂)₂-NⁱPr]—, (Me₂N)-Ln-C₅H₄—[(CMe₂)₂-NⁱPr]—, (Et₂N)-Ln-C₅H₄—[(CMe₂)₂-NⁱPr]—, ("Pr₂N)-Ln-C₅H₄—[(CMe₂)₂-NⁱPr]—, (ⁱPr₂N)-Ln-C₅H₄—[(CMe₂)₂-NⁱPr]—, ("Bu₂N)-Ln-C₅H₄—[(CMe₂)₂-NⁱPr]—, (ⁱBu₂N)-Ln-C₅H₄—[(CMe₂)₂-NⁱPr]—, (ˢBu₂N)-Ln-C₅H₄—[(CMe₂)₂-NⁱPr]—, (ᵗBu₂N)-Ln-C₅H₄—[(CMe₂)₂-NⁱPr]—, (Cp)-Ln-C₅H₄—[(CMe₂)₂-NⁱPr]—, (HO)-Ln-C₅H₄—[(CMe₂)₂-NⁱPr]—, (MeO)-Ln-C₅H₄—[(CMe₂)₂-NⁱPr]—, (EtO)-Ln-C₅H₄—[(CMe₂)₂-NⁱPr]—, ("PrO)-Ln-C₅H₄—[(CMe₂)₂-NⁱPr]—, (ⁱPrO)-Ln-C₅H₄—[(CMe₂)₂- NⁱPr]—, ("BuO)-Ln-C₅H₄—[(CMe₂)₂-NⁱPr]—, (ⁱBuO)-Ln-C₅H₄—[(CMe₂)₂-NⁱPr]—, (ˢBuO)-Ln-C₅H₄—[(CMe₂)₂-NⁱPr]—, (ᵗBuO)-Ln-C₅H₄—[(CMe₂)₂-NⁱPr]—, (H₂N)-Ln-C₅H₄—[(CMe₂)₂-N"Bu]-, (Me₂N)-Ln-C₅H₄—[(CMe₂)₂-N"Bu]-, (Et₂N)-Ln-C₅H₄—[(CMe₂)₂-N"Bu]-, ("Pr₂N)-Ln-C₅H₄—[(CMe₂)₂-N"Bu]-, (ⁱPr₂N)-Ln-C₅H₄—[(CMe₂)₂-N"Bu]-, ("Bu₂N)-Ln-C₅H₄—[(CMe₂)₂-N"Bu]-, (ⁱBu₂N)-Ln-C₅H₄—[(CMe₂)₂-N"Bu]-, (ˢBu₂N)-Ln-C₅H₄—[(CMe₂)₂-N"Bu]-, (ᵗBu₂N)-Ln-C₅H₄—[(CMe₂)₂-N"Bu]-, (Cp)-Ln-C₅H₄—[(CMe₂)₂-N"Bu]-, (HO)-Ln-C₅H₄—[(CMe₂)₂-N"Bu]-, (MeO)-Ln-C₅H₄—[(CMe₂)₂-N"Bu]-, (EtO)-Ln-C₅H₄—[(CMe₂)₂-N"Bu]-, ("PrO)-Ln-C₅H₄—[(CMe₂)₂-N"Bu]-, (ⁱPrO)-Ln-C₅H₄—[(CMe₂)₂-N"Bu]-, ("BuO)-Ln-C₅H₄—[(CMe₂)₂-N"Bu]-, (ⁱBuO)-Ln-C₅H₄—[(CMe₂)₂-N"Bu]-, (ˢBuO)-Ln-C₅H₄—[(CMe₂)₂-N"Bu]-, (ᵗBuO)-Ln-C₅H₄—[(CMe₂)₂-N"Bu]-, (H₂N)-Ln-C₅H₄—[(CMe₂)₂-NⁱBu]-, (Me₂N)-Ln-C₅H₄—[(CMe₂)₂-NⁱBu]-, (Et₂N)-Ln-C₅H₄—[(CMe₂)₂-NⁱBu]-, ("Pr₂N)-Ln-C₅H₄—[(CMe₂)₂-NⁱBu]-, (ⁱPr₂N)-Ln- C₅H₄—[(CMe₂)₂-NⁱBu]-, ("Bu₂N)-Ln-C₅H₄—[(CMe₂)₂-NⁱBu]-, (ⁱBu₂N)-Ln-

C₅H₄—[(CMe₂)₂-NⁱBu]-, (ˢBu₂N)-Ln-C₅H₄—[(CMe₂)₂-NⁱBu]-, (ᵗBu₂N)-Ln-C₅H₄—[(CMe₂)₂-NⁱBu]-, (Cp)-Ln-C₅H₄—[(CMe₂)₂-NⁱBu]-, (HO)-Ln-C₅H₄—[(CMe₂)₂-NⁱBu]-, (MeO)-Ln-C₅H₄—[(CMe₂)₂-NⁱBu]-, (EtO)-Ln-C₅H₄—[(CMe₂)₂-NⁱBu]-, (ⁿPrO)-Ln-C₅H₄—[(CMe₂)₂-NⁱBu]-, (ⁱPrO)-Ln-C₅H₄—[(CMe₂)₂-NⁱBu]-, (ⁿBuO)-Ln-C₅H₄—[(CMe₂)₂-NⁱBu]-, (ⁱBuO)-Ln-C₅H₄—[(CMe₂)₂-NⁱBu]-, (ˢBuO)-Ln-C₅H₄—[(CMe₂)₂-NⁱBu]-, (ᵗBuO)-Ln-C₅H₄—[(CMe₂)₂-NⁱBu]-, (H₂N)-Ln-C₅H₄—[(CMe₂)₂-NˢBu]-, (Me₂N)-Ln-C₅H₄—[(CMe₂)₂-NˢBu]-, (Et₂N)-Ln-C₅H₄—[(CMe₂)₂-NˢBu]-, (ⁿPr₂N)-Ln-C₅H₄—[(CMe₂)₂-NˢBu]-, (ⁱPr₂N)-Ln-C₅H₄—[(CMe₂)₂-NˢBu]-, (ⁿBu₂N)-Ln-C₅H₄—[(CMe₂)₂-NˢBu]-, (ⁱBu₂N)-Ln-C₅H₄—[(CMe₂)₂-NˢBu]-, (ˢBu₂N)-Ln-C₅H₄—[(CMe₂)₂-NˢBu]-, (ᵗBu₂N)-Ln-C₅H₄—[(CMe₂)₂-NˢBu]-, (Cp)-Ln-C₅H₄—[(CMe₂)₂-NˢBu]-, (HO)-Ln-C₅H₄—[(CMe₂)₂-NˢBu]-, (MeO)-Ln-C₅H₄—[(CMe₂)₂-NˢBu]-, (EtO)-Ln-C₅H₄—[(CMe₂)₂-NˢBu]-, (ⁿPrO)-Ln-C₅H₄—[(CMe₂)₂-NˢBu]-, (ⁱPrO)-Ln-C₅H₄—[(CMe₂)₂-NˢBu]-, (ⁿBuO)-Ln-C₅H₄—[(CMe₂)₂-NˢBu]-, (ⁱBuO)-Ln-C₅H₄—[(CMe₂)₂-NˢBu]-, (ˢBuO)-Ln-C₅H₄—[(CMe₂)₂-NˢBu]-, (ᵗBuO)-Ln-C₅H₄—[(CMe₂)₂-NˢBu]-, (H₂N)-Ln-C₅H₄—[(CMe₂)₂-NᵗBu]-, (Me₂N)-Ln-C₅H₄—[(CMe₂)₂-NᵗBu]-, (Et₂N)-Ln-C₅H₄—[(CMe₂)₂-NᵗBu]-, (ⁿPr₂N)-Ln-C₅H₄—[(CMe₂)₂- NᵗBu]-, (ⁱPr₂N)-Ln-C₅H₄—[(CMe₂)₂-NᵗBu]-, (ⁿBu₂N)-Ln-C₅H₄—[(CMe₂)₂-NᵗBu]-, (ⁱBu₂N)-Ln-C₅H₄—[(CMe₂)₂-NᵗBu]-, (ˢBu₂N)-Ln-C₅H₄—[(CMe₂)₂-NᵗBu]-, (ᵗBu₂N)-Ln-C₅H₄—[(CMe₂)₂-NᵗBu]-, (Cp)-Ln-C₅H₄—[(CMe₂)₂-NᵗBu]-, (HO)-Ln-C₅H₄—[(CMe₂)₂-NᵗBu]-, (MeO)-Ln-C₅H₄—[(CMe₂)₂-NᵗBu]-, (EtO)-Ln-C₅H₄—[(CMe₂)₂-NᵗBu]-, (ⁿPrO)-Ln-C₅H₄—[(CMe₂)₂-NᵗBu]-, (ⁱPrO)-Ln-C₅H₄—[(CMe₂)₂-NᵗBu]-, (ⁿBuO)-Ln-C₅H₄—[(CMe₂)₂-NᵗBu]-, (ⁱBuO)-Ln-C₅H₄—[(CMe₂)₂-NᵗBu]-, (ˢBuO)-Ln-C₅H₄—[(CMe₂)₂-NᵗBu]-, (ᵗBuO)-Ln-C₅H₄—[(CMe₂)₂-NᵗBu]-, (H₂N)-Ln-C₅H₄—[(CMe₂)₂-O]—, (Me₂N)-Ln-C₅H₄—[(CMe₂)₂-O]—, (Et₂N)-Ln-C₅H₄—[(CMe₂)₂-O]—, (ⁿPr₂N)-Ln-C₅H₄—[(CMe₂)₂-O]—, (ⁱPr₂N)-Ln-C₅H₄—[(CMe₂)₂-O]—, (ⁿBu₂N)-Ln-C₅H₄—[(CMe₂)₂-O]—, (ⁱBu₂N)-Ln-C₅H₄—[(CMe₂)₂-O]—, (ˢBu₂N)-Ln-C₅H₄—[(CMe₂)₂-O]—, (ᵗBu₂N)-Ln-C₅H₄—[(CMe₂)₂-O]—, (Cp)-Ln-C₅H₄—[(CMe₂)₂-O]—, (HO)-Ln-C₅H₄—[(CMe₂)₂-O]—, (MeO)-Ln-C₅H₄—[(CMe₂)₂-O]—, (EtO)-Ln-C₅H₄—[(CMe₂)₂-O]—, (ⁿPrO)-Ln-C₅H₄—[(CMe₂)₂- O]—, (ⁱPrO)-Ln-C₅H₄—[(CMe₂)₂-O]—, (ⁿBuO)-Ln-C₅H₄—[(CMe₂)₂-O]—, (ⁱBuO)-Ln-C₅H₄—[(CMe₂)₂-O]—, (ˢBuO)-Ln-C₅H₄—[(CMe₂)₂-O]—, (ᵗBuO)-Ln-C₅H₄—[(CMe₂)₂-O]—, (H₂N)- Ln-C₅Me₄-[(CH₂)₂—NH]—, (Me₂N)-Ln-C₅Me₄-[(CH₂)₂—NH]—, (Et₂N)-Ln-C₅Me₄-[(CH₂)₂—NH]—, (ⁿPr₂N)-Ln-C₅Me₄-[(CH₂)₂—NH]—, (ⁱPr₂N)-Ln-C₅Me₄-[(CH₂)₂—NH]—, (ⁿBu₂N)-Ln-C₅Me₄-[(CH₂)₂—NH]—, (ⁱBu₂N)-Ln-C₅Me₄-[(CH₂)₂—NH]—, (ˢBu₂N)-Ln-C₅Me₄-[(CH₂)₂—NH]—, (ᵗBu₂N)-Ln-C₅Me₄-[(CH₂)₂—NH]—, (Cp)-Ln-C₅Me₄-[(CH₂)₂—NH]—, (HO)-Ln-C₅Me₄-[(CH₂)₂—NH]—, (MeO)-Ln-C₅Me₄-[(CH₂)₂—NH]—, (EtO)-Ln-C₅Me₄-[(CH₂)₂—NH]—, (ⁿPrO)-Ln-C₅Me₄-[(CH₂)₂—NH]—, (ⁱPrO)-Ln-C₅Me₄-[(CH₂)₂—NH]—, (ⁿBuO)-Ln-C₅Me₄-[(CH₂)₂—NH]—, (ⁱBuO)-Ln-C₅Me₄-[(CH₂)₂—NH]—, (ˢBuO)-Ln-C₅Me₄-[(CH₂)₂—NH]—, (ᵗBuO)-Ln-C₅Me₄-[(CH₂)₂—NH]—, (H₂N)-Ln-C₅Me₄-[(CH₂)₂—NMe]-, (Me₂N)-Ln-C₅Me₄-[(CH₂)₂—NMe]-, (Et₂N)-Ln-C₅Me₄-[(CH₂)₂—NMe]-, (ⁿPr₂N)-Ln-C₅Me₄-[(CH₂)₂—NMe]-, (ⁱPr₂N)-Ln-C₅Me₄-[(CH₂)₂—NMe]-, (ⁿBu₂N)-Ln-C₅Me₄-[(CH₂)₂—NMe]-, (ⁱBu₂N)-Ln-C₅Me₄-[(CH₂)₂—NMe]-, (ˢBu₂N)-Ln-C₅Me₄-[(CH₂)₂—NMe]-, (ᵗBu₂N)-Ln-C₅Me₄-[(CH₂)₂—NMe]-, (Cp)-Ln-C₅Me₄-[(CH₂)₂—NMe]-, (HO)-Ln-C₅Me₄-[(CH₂)₂—NMe]-, (MeO)-Ln-C₅Me₄-[(CH₂)₂—NMe]-, (EtO)-Ln-C₅Me₄-[(CH₂)₂—NMe]-, (ⁿPrO)-Ln-C₅Me₄-[(CH₂)₂—NMe]-, (ⁱPrO)-Ln-C₅Me₄-[(CH₂)₂—NMe]-, (ⁿBuO)-Ln-C₅Me₄-[(CH₂)₂—NMe]-, (ⁱBuO)-Ln-C₅Me₄-[(CH₂)₂—NMe]-, (ˢBuO)-Ln-C₅Me₄-[(CH₂)₂—NMe]-, (ᵗBuO)-Ln-C₅Me₄-[(CH₂)₂—NMe]-, (H₂N)-Ln-C₅Me₄-[(CH₂)₂—NEt]-, (Me₂N)-Ln-C₅Me₄-[(CH₂)₂—NEt]-, (Et₂N)-Ln-C₅Me₄-[(CH₂)₂—NEt]-, (ⁿPr₂N)-Ln-C₅Me₄-[(CH₂)₂—NEt]-, (ⁱPr₂N)-Ln-C₅Me₄-[(CH₂)₂—NEt]-, (ⁿBu₂N)-Ln-C₅Me₄-[(CH₂)₂—NEt]-, (ⁱBu₂N)-Ln-C₅Me₄-[(CH₂)₂—NEt]-, (ˢBu₂N)-Ln-C₅Me₄-[(CH₂)₂—NEt]-, (ᵗBu₂N)-Ln-C₅Me₄-[(CH₂)₂—NEt]-, (Cp)-Ln-C₅Me₄-[(CH₂)₂—NEt]-, (HO)-Ln-C₅Me₄-[(CH₂)₂—NEt]-, (MeO)-Ln-C₅Me₄-[(CH₂)₂—NEt]-, (EtO)-Ln-C₅Me₄-[(CH₂)₂—NEt]-, (ⁿPrO)-Ln-C₅Me₄-[(CH₂)₂—NEt]-, (ⁱPrO)-Ln-C₅Me₄-[(CH₂)₂—NEt]-, (ⁿBuO)-Ln-C₅Me₄-[(CH₂)₂—NEt]-, (ⁱBuO)-Ln-C₅Me₄-[(CH₂)₂—NEt]-, (ˢBuO)-Ln-C₅Me₄-[(CH₂)₂—NEt]-, (ᵗBuO)-Ln-C₅Me₄-[(CH₂)₂—NEt]-, (H₂N)-Ln-C₅Me₄-[(CH₂)₂—NⁿPr]—, (Me₂N)-Ln-C₅Me₄-[(CH₂)₂—NⁿPr]—, (Et₂N)-Ln-C₅Me₄-[(CH₂)₂—NⁿPr]—, (ⁿPr₂N)-Ln-C₅Me₄-[(CH₂)₂—NⁿPr]—, (ⁱPr₂N)-Ln-C₅Me₄-[(CH₂)₂—NⁿPr]—, (ⁿBu₂N)-Ln-C₅Me₄-[(CH₂)₂—NⁿPr]—, (ⁱBu₂N)-Ln-C₅Me₄-[(CH₂)₂—NⁿPr]—, (ˢBu₂N)-Ln-C₅Me₄-[(CH₂)₂—NⁿPr]—, (ᵗBu₂N)-Ln-C₅Me₄-[(CH₂)₂—NⁿPr]—, (Cp)-Ln-C₅Me₄-[(CH₂)₂—NⁿPr]—, (HO)-Ln-C₅Me₄-[(CH₂)₂—NⁿPr]—, (MeO)-Ln-C₅Me₄-[(CH₂)₂—NⁿPr]—, (EtO)-Ln-C₅Me₄-[(CH₂)₂—NⁿPr]—, (ⁿPrO)-Ln-C₅Me₄-[(CH₂)₂—NⁿPr]—, (ⁱPrO)- Ln-C₅Me₄-[(CH₂)₂—NⁿPr]—, (ⁿBuO)-Ln-C₅Me₄-[(CH₂)₂—NⁿPr]—, (ⁱBuO)-Ln-C₅Me₄-[(CH₂)₂—NⁿPr]—, (ˢBuO)-Ln-C₅Me₄-[(CH₂)₂—NⁿPr]—, (ᵗBuO)-Ln-C₅Me₄-[(CH₂)₂—NⁿPr]—, (H₂N)-Ln-C₅Me₄-[(CH₂)₂—NⁱPr]—, (Me₂N)-Ln-C₅Me₄-[(CH₂)₂—NⁱPr]—, (Et₂N)-Ln-C₅Me₄-[(CH₂)₂—NⁱPr]—, (ⁿPr₂N)-Ln-C₅Me₄-[(CH₂)₂—NⁱPr]—, (ⁱPr₂N)-Ln-C₅Me₄-[(CH₂)₂—NⁱPr]—, (ⁿBu₂N)-Ln-C₅Me₄-[(CH₂)₂—NⁱPr]—, (ⁱBu₂N)-Ln-C₅Me₄-[(CH₂)₂—NⁱPr]—, (ˢBu₂N)-Ln-C₅Me₄-[(CH₂)₂—NⁱPr]—, (ᵗBu₂N)-Ln-C₅Me₄-[(CH₂)₂—NⁱPr]—, (Cp)-Ln-C₅Me₄-[(CH₂)₂—NⁱPr]—, (HO)- C₅Me₄-[(CH₂)₂—NⁱPr]—, (MeO)-Ln-C₅Me₄-[(CH₂)₂—NⁱPr]—, (EtO)-Ln-C₅Me₄-[(CH₂)₂—NⁱPr]—, (ⁿPrO)-Ln-C₅Me₄-[(CH₂)₂—NⁱPr]—, (ⁱPrO)-Ln-C₅Me₄-[(CH₂)₂—NⁱPr]—, (ⁿBuO)-Ln-C₅Me₄-[(CH₂)₂—NⁱPr]—, (ⁱBuO)-Ln-C₅Me₄-[(CH₂)₂—NⁱPr]—, (ˢBuO)-Ln-C₅Me₄-[(CH₂)₂—NⁱPr]—, (ᵗBuO)-Ln-C₅Me₄-[(CH₂)₂—NⁱPr]—, (H₂N)-Ln-C₅Me₄-[(CH₂)₂—NⁿBu]-, (Me₂N)-Ln-C₅Me₄-[(CH₂)₂—NⁿBu]-, (Et₂N)-Ln-C₅Me₄-[(CH₂)₂—NⁿBu]-, (ⁿPr₂N)-Ln-C₅Me₄-[(CH₂)₂—NⁿBu]-, (ⁱPr₂N)-Ln-C₅Me₄-[(CH₂)₂—NⁿBu]-, (ⁿBu₂N)-Ln-C₅Me₄-[(CH₂)₂—NⁿBu]-, (ⁱBu₂N)-Ln-C₅Me₄-[(CH₂)₂—NⁿBu]-, (ˢBu₂N)-Ln-C₅Me₄-[(CH₂)₂—NⁿBu]-, (ᵗBu₂N)-Ln-C₅Me₄-[(CH₂)₂—NⁿBu]-, (Cp)-Ln-C₅Me₄-[(CH₂)₂—NⁿBu]-, (HO)-Ln-C₅Me₄-[(CH₂)₂—NⁿBu]-, (MeO)-Ln-C₅Me₄-[(CH₂)₂—NⁿBu]-, (EtO)-Ln-C₅Me₄-[(CH₂)₂—NⁿBu]-, (ⁿPrO)-Ln-C₅Me₄-[(CH₂)₂—NⁿBu]-, (ⁱPrO)-Ln-C₅Me₄-[(CH₂)₂—NⁿBu]-, (ⁿBuO)-Ln- C₅Me₄-[(CH₂)₂—NⁿBu]-, (ⁱBuO)-Ln-C₅Me₄-[(CH₂)₂—NⁿBu]-, (ˢBuO)-Ln-C₅Me₄-[(CH₂)₂—NⁿBu]-, (ᵗBuO)-Ln-C₅Me₄-[(CH₂)₂—NⁿBu]-, (H₂N)-Ln-C₅Me₄-[(CH₂)₂—NⁱBu]-, (Me₂N)-Ln-C₅Me₄-[(CH₂)₂—NⁱBu]-, (Et₂N)-Ln- C₅Me₄-[(CH₂)₂—NⁱBu]-, (ⁿPr₂N)-Ln-C₅Me₄-[(CH₂)₂—NⁱBu]-, (ⁱPr₂N)-Ln-C₅Me₄-[(CH₂)₂—NⁱBu]-, (ⁿBu₂N)-Ln-C₅Me₄-[(CH₂)₂—NⁱBu]-, (ⁱBu₂N)-Ln-C₅Me₄-[(CH₂)₂—NⁱBu]-, (ˢBu₂N)-Ln-C₅Me₄-[(CH₂)₂—NⁱBu]-, (ᵗBu₂N)-Ln-C₅Me₄-[(CH₂)₂—NⁱBu]-, (Cp)-Ln-C₅Me₄-[(CH₂)₂—NⁱBu]-, (HO)-Ln-C₅Me₄-[(CH₂)₂—NⁱBu]-, (MeO)-Ln-C₅Me₄-[(CH₂)₂—NⁱBu]-, (EtO)-Ln-C₅Me₄-[(CH₂)₂—NⁱBu]-, (ⁿPrO)-Ln-C₅Me₄-[(CH₂)₂—NⁱBu]-, (ⁱPrO)-Ln-C₅Me₄-[(CH₂)₂—NⁱBu]-, (ⁿBuO)-Ln-C₅Me₄-[(CH₂)₂—NⁱBu]-, (ⁱBuO)-Ln-C₅Me₄-[(CH₂)₂—NⁱBu]-, (ˢBuO)-Ln- C₅Me₄-[(CH₂)₂—

N$^t$Bu]-, ($^t$BuO)-Ln-C$_5$Me$_4$-[(CH$_2$)$_2$—N$^t$Bu]-, (H$_2$N)-Ln-C$_5$Me$_4$-[(CH$_2$)$_2$—N$^s$Bu]-, (Me$_2$N)-Ln-C$_5$Me$_4$-[(CH$_2$)$_2$—N$^s$Bu]-, (Et$_2$N)-Ln-C$_5$Me$_4$-[(CH$_2$)$_2$—N$^s$Bu]-, ($^n$Pr$_2$N)-Ln-C$_5$Me$_4$-[(CH$_2$)$_2$—N$^s$Bu]-, ($^i$Pr$_2$N)-Ln-C$_5$Me$_4$-[(CH$_2$)$_2$—N$^s$Bu]-, ($^n$Bu$_2$N)-Ln-C$_5$Me$_4$-[(CH$_2$)$_2$—N$^s$Bu]-, ($^i$Bu$_2$N)-Ln-C$_5$Me$_4$-[(CH$_2$)$_2$—N$^s$Bu]-, ($^s$Bu$_2$N)-Ln-C$_5$Me$_4$-[(CH$_2$)$_2$—N$^s$Bu]-, ($^t$Bu$_2$N)-Ln-C$_5$Me$_4$-[(CH$_2$)$_2$—N$^s$Bu]-, (Cp)-Ln-C$_5$Me$_4$-[(CH$_2$)$_2$—N$^s$Bu]-, (HO)-Ln-C$_5$Me$_4$-[(CH$_2$)$_2$—N$^s$Bu]-, (MeO)-Ln-C$_5$Me$_4$-[(CH$_2$)$_2$—N$^s$Bu]-, (EtO)-Ln-C$_5$Me$_4$-[(CH$_2$)$_2$—N$^s$Bu]-, ($^n$PrO)-Ln-C$_5$Me$_4$-[(CH$_2$)$_2$—N$^s$Bu]-, ($^i$PrO)-Ln-C$_5$Me$_4$-[(CH$_2$)$_2$—N$^s$Bu]-, ($^n$BuO)-Ln-C$_5$Me$_4$-[(CH$_2$)$_2$—N$^s$Bu]-, ($^i$BuO)-Ln-C$_5$Me$_4$-[(CH$_2$)$_2$—N$^s$Bu]-, ($^s$BuO)-Ln-C$_5$Me$_4$-[(CH$_2$)$_2$—N$^s$Bu]-, ($^t$BuO)-Ln-C$_5$Me$_4$-[(CH$_2$)$_2$—N$^s$Bu]-, (H$_2$N)-Ln-C$_5$Me$_4$-[(CH$_2$)$_2$—N$^t$Bu]-, (Me$_2$N)-Ln-C$_5$Me$_4$-[(CH$_2$)$_2$—N$^t$Bu]-, (Et$_2$N)-Ln-C$_5$Me$_4$-[(CH$_2$)$_2$—N$^t$Bu]-, ($^n$Pr$_2$N)-Ln-C$_5$Me$_4$-[(CH$_2$)$_2$—N$^t$Bu]-, ($^i$Pr$_2$N)-Ln-C$_5$Me$_4$-[(CH$_2$)$_2$—N$^t$Bu]-, ($^n$Bu$_2$N)-Ln-C$_5$Me$_4$-[(CH$_2$)$_2$—N$^t$Bu]-, ($^i$Bu$_2$N)-Ln-C$_5$Me$_4$-[(CH$_2$)$_2$—N$^t$Bu]-, ($^s$Bu$_2$N)-Ln-C$_5$Me$_4$-[(CH$_2$)$_2$—N$^t$Bu]-, ($^t$Bu$_2$N)-Ln-C$_5$Me$_4$-[(CH$_2$)$_2$—N$^t$Bu]-, (Cp)-Ln-C$_5$Me$_4$-[(CH$_2$)$_2$—N$^t$Bu]-, (HO)-Ln-C$_5$Me$_4$-[(CH$_2$)$_2$—N$^t$Bu]-, (MeO)-Ln-C$_5$Me$_4$-[(CH$_2$)$_2$—N$^t$Bu]-, (EtO)-Ln-C$_5$Me$_4$-[(CH$_2$)$_2$—N$^t$Bu]-, ($^n$PrO)-Ln-C$_5$Me$_4$-[(CH$_2$)$_2$—N$^t$Bu]-, ($^i$PrO)-Ln-C$_5$Me$_4$-[(CH$_2$)$_2$—N$^t$Bu]-, ($^n$BuO)-Ln-C$_5$Me$_4$-[(CH$_2$)$_2$—N$^t$Bu]-, ($^i$BuO)-Ln-C$_5$Me$_4$-[(CH$_2$)$_2$—N$^t$Bu]-, ($^s$BuO)-Ln-C$_5$Me$_4$-[(CH$_2$)$_2$—N$^t$Bu]-, ($^t$BuO)-Ln-C$_5$Me$_4$-[(CH$_2$)$_2$—N$^t$Bu]-, (H$_2$N)-Ln-C$_5$Me$_4$-[(CH$_2$)$_2$—O]—, (Me$_2$N)-Ln-C$_5$Me$_4$-[(CH$_2$)$_2$—O]—, (Et$_2$N)-Ln-C$_5$Me$_4$-[(CH$_2$)$_2$—O]—, ($^n$Pr$_2$N)-Ln-C$_5$Me$_4$-[(CH$_2$)$_2$—O]—, ($^i$Pr$_2$N)-Ln-C$_5$Me$_4$-[(CH$_2$)$_2$—O]—, ($^n$Bu$_2$N)-Ln-C$_5$Me$_4$-[(CH$_2$)$_2$—O]—, ($^i$Bu$_2$N)-Ln-C$_5$Me$_4$-[(CH$_2$)$_2$—O]—, ($^s$Bu$_2$N)-Ln-C$_5$Me$_4$-[(CH$_2$)$_2$—O]—, ($^t$Bu$_2$N)-Ln-C$_5$Me$_4$-[(CH$_2$)$_2$—O]—, (Cp)-Ln-C$_5$Me$_4$-[(CH$_2$)$_2$—O]—, (HO)-Ln-C$_5$Me$_4$-[(CH$_2$)$_2$—O]—, (MeO)-Ln-C$_5$Me$_4$-[(CH$_2$)$_2$—O]—, (EtO)-Ln-C$_5$Me$_4$-[(CH$_2$)$_2$—O]—, ($^n$PrO)-Ln-C$_5$Me$_4$-[(CH$_2$)$_2$—O]—, ($^i$PrO)-Ln-C$_5$Me$_4$-[(CH$_2$)$_2$—O]—, ($^n$BuO)-Ln-C$_5$Me$_4$-[(CH$_2$)$_2$—O]—, ($^i$BuO)-Ln-C$_5$Me$_4$-[(CH$_2$)$_2$—O]—, ($^s$BuO)-Ln-C$_5$Me$_4$-[(CH$_2$)$_2$—O]—, ($^t$BuO)-Ln-C$_5$Me$_4$-[(CH$_2$)$_2$—O]—, (H$_2$N)-Ln-C$_5$Me$_4$-[(CMe$_2$)$_2$-NH]—, (Me$_2$N)-Ln-C$_5$Me$_4$-[(CMe$_2$)$_2$-NH]—, (Et$_2$N)-Ln-C$_5$Me$_4$-[(CMe$_2$)$_2$-NH]—, ($^n$Pr$_2$N)-Ln-C$_5$Me$_4$-[(CMe$_2$)$_2$-NH]—, ($^i$Pr$_2$N)-Ln-C$_5$Me$_4$-[(CMe$_2$)$_2$-NH]—, ($^n$Bu$_2$N)-Ln-C$_5$Me$_4$-[(CMe$_2$)$_2$-NH]—, ($^i$Bu$_2$N)-Ln-C$_5$Me$_4$-[(CMe$_2$)$_2$-NH]—, ($^s$Bu$_2$N)-Ln-C$_5$Me$_4$-[(CMe$_2$)$_2$-NH]—, ($^t$Bu$_2$N)-Ln-C$_5$Me$_4$-[(CMe$_2$)$_2$-NH]—, (Cp)-Ln-C$_5$Me$_4$-[(CMe$_2$)$_2$-NH]—, (HO)-Ln-C$_5$Me$_4$-[(CMe$_2$)$_2$-NH]—, (MeO)-Ln-C$_5$Me$_4$-[(CMe$_2$)$_2$-NH]—, (EtO)-Ln-C$_5$Me$_4$-[(CMe$_2$)$_2$-NH]—, ($^n$PrO)-Ln-C$_5$Me$_4$-[(CMe$_2$)$_2$-NH]—, ($^i$PrO)-Ln-C$_5$Me$_4$-[(CMe$_2$)$_2$-NH]—, ($^n$BuO)-Ln-C$_5$Me$_4$-[(CMe$_2$)$_2$-NH]—, ($^i$BuO)-Ln-C$_5$Me$_4$-[(CMe$_2$)$_2$-NH]—, ($^s$BuO)-Ln-C$_5$Me$_4$-[(CMe$_2$)$_2$-NH]—, ($^t$BuO)-Ln-C$_5$Me$_4$-[(CMe$_2$)$_2$-NH]—, (H$_2$N)-Ln-C$_5$Me$_4$-[(CMe$_2$)$_2$-NMe]-, (Me$_2$N)-Ln-C$_5$Me$_4$-[(CMe$_2$)$_2$-NMe]-, (Et$_2$N)-Ln-C$_5$Me$_4$-[(CMe$_2$)$_2$-NMe]-, ($^n$Pr$_2$N)-Ln-C$_5$Me$_4$-[(CMe$_2$)$_2$-NMe]-, ($^i$Pr$_2$N)-Ln-C$_5$Me$_4$-[(CMe$_2$)$_2$-NMe]-, ($^n$Bu$_2$N)-Ln-C$_5$Me$_4$-[(CMe$_2$)$_2$-NMe]-, ($^i$Bu$_2$N)-Ln-C$_5$Me$_4$-[(CMe$_2$)$_2$-NMe]-, ($^s$Bu$_2$N)-Ln-C$_5$Me$_4$-[(CMe$_2$)$_2$-NMe]-, ($^t$Bu$_2$N)-Ln-C$_5$Me$_4$-[(CMe$_2$)$_2$-NMe]-, (Cp)-Ln-C$_5$Me$_4$-[(CMe$_2$)$_2$-NMe]-, (HO)-Ln-C$_5$Me$_4$-[(CMe$_2$)$_2$-NMe]-, (MeO)-Ln-C$_5$Me$_4$-[(CMe$_2$)$_2$-NMe]-, (EtO)-Ln-C$_5$Me$_4$-[(CMe$_2$)$_2$-NMe]-, ($^n$PrO)-Ln-C$_5$Me$_4$-[(CMe$_2$)$_2$-NMe]-, ($^i$PrO)-Ln-C$_5$Me$_4$-[(CMe$_2$)$_2$-NMe]-, ($^n$BuO)-Ln-C$_5$Me$_4$-[(CMe$_2$)$_2$-NMe]-, ($^i$BuO)-Ln-C$_5$Me$_4$-[(CMe$_2$)$_2$-NMe]-, ($^s$BuO)-Ln-C$_5$Me$_4$-[(CMe$_2$)$_2$-NMe]-, ($^t$BuO)-Ln-C$_5$Me$_4$-[(CMe$_2$)$_2$-NMe]-, (H$_2$N)-Ln-C$_5$Me$_4$-[(CMe$_2$)$_2$-NEt]-, (Me$_2$N)-Ln-C$_5$Me$_4$-[(CMe$_2$)$_2$-NEt]-, (Et$_2$N)-Ln-C$_5$Me$_4$-[(CMe$_2$)$_2$-NEt]-, ($^n$Pr$_2$N)-Ln-C$_5$Me$_4$-[(CMe$_2$)$_2$-NEt]-, ($^i$Pr$_2$N)-Ln-C$_5$Me$_4$-[(CMe$_2$)$_2$-NEt]-, ($^n$Bu$_2$N)-Ln-C$_5$Me$_4$-[(CMe$_2$)$_2$-NEt]-, ($^i$Bu$_2$N)-Ln-C$_5$Me$_4$-[(CMe$_2$)$_2$-NEt]-, ($^s$Bu$_2$N)-Ln-C$_5$Me$_4$-[(CMe$_2$)$_2$-NEt]-, ($^t$Bu$_2$N)-Ln- C$_5$Me$_4$-[(CMe$_2$)$_2$-NEt]-, (Cp)-Ln-C$_5$Me$_4$-[(CMe$_2$)$_2$-NEt]-, (HO)-Ln-C$_5$Me$_4$-[(CMe$_2$)$_2$-NEt]-, (MeO)-Ln-C$_5$Me$_4$-[(CMe$_2$)$_2$-NEt]-, (EtO)-Ln-C$_5$Me$_4$-[(CMe$_2$)$_2$-NEt]-, ($^n$PrO)-Ln-C$_5$Me$_4$-[(CMe$_2$)$_2$-NEt]-, ($^i$PrO)-Ln-C$_5$Me$_4$-[(CMe$_2$)$_2$-NEt]-, ($^n$BuO)-Ln-C$_5$Me$_4$-[(CMe$_2$)$_2$-NEt]-, ($^i$BuO)-Ln-C$_5$Me$_4$-[(CMe$_2$)$_2$-NEt]-, ($^s$BuO)-Ln-C$_5$Me$_4$-[(CMe$_2$)$_2$-NEt]-, ($^t$BuO)-Ln-C$_5$Me$_4$-[(CMe$_2$)$_2$-NEt]-, (H$_2$N)-Ln-C$_5$Me$_4$-[(CMe$_2$)$_2$-N$^n$Pr]—, (Me$_2$N)-Ln-C$_5$Me$_4$-[(CMe$_2$)$_2$-N$^n$Pr]—, (Et$_2$N)-Ln-C$_5$Me$_4$-[(CMe$_2$)$_2$-N$^n$Pr]—, ($^n$Pr$_2$N)-Ln-C$_5$Me$_4$-[(CMe$_2$)$_2$-N$^n$Pr]—, ($^i$Pr$_2$N)-Ln-C$_5$Me$_4$-[(CMe$_2$)$_2$-N$^n$Pr]—, ($^n$Bu$_2$N)-Ln-C$_5$Me$_4$-[(CMe$_2$)$_2$-N$^n$Pr]—, ($^i$Bu$_2$N)-Ln-C$_5$Me$_4$- [(CMe$_2$)$_2$-N$^n$Pr]—, ($^s$Bu$_2$N)-Ln-C$_5$Me$_4$-[(CMe$_2$)$_2$-N$^n$Pr]—, ($^t$Bu$_2$N)-Ln-C$_5$Me$_4$-[(CMe$_2$)$_2$-N$^n$Pr]—, (Cp)-Ln-C$_5$Me$_4$-[(CMe$_2$)$_2$-N$^n$Pr]—, (HO)-Ln-C$_5$Me$_4$-[(CMe$_2$)$_2$-N$^n$Pr]—, (MeO)-Ln-C$_5$Me$_4$-[(CMe$_2$)$_2$-N$^n$Pr]—, (EtO)-Ln-C$_5$Me$_4$-[(CMe$_2$)$_2$-N$^n$Pr]—, ($^n$PrO)-Ln-C$_5$Me$_4$-[(CMe$_2$)$_2$-N$^n$Pr]—, ($^i$PrO)-Ln-C$_5$Me$_4$-[(CMe$_2$)$_2$-N$^n$Pr]—, ($^n$BuO)-Ln-C$_5$Me$_4$-[(CMe$_2$)$_2$-N$^n$Pr]—, ($^i$BuO)-Ln- C$_5$Me$_4$-[(CMe$_2$)$_2$-N$^n$Pr]—, ($^s$BuO)-Ln-C$_5$Me$_4$-[(CMe$_2$)$_2$-N$^n$Pr]—, ($^t$BuO)-Ln-C$_5$Me$_4$-[(CMe$_2$)$_2$-N$^n$Pr]—, (H$_2$N)-Ln-C$_5$Me$_4$-[(CMe$_2$)$_2$-N$^i$Pr]—, (Me$_2$N)-Ln-C$_5$Me$_4$-[(CMe$_2$)$_2$-N$^i$Pr]—, (Et$_2$N)-Ln-C$_5$Me$_4$-[(CMe$_2$)$_2$-N$^i$Pr]—, ($^n$Pr$_2$N)-Ln-C$_5$Me$_4$-[(CMe$_2$)$_2$-N$^i$Pr]—, ($^i$Pr$_2$N)- Ln-C$_5$Me$_4$-[(CMe$_2$)$_2$-N$^i$Pr]—, ($^n$Bu$_2$N)-Ln-C$_5$Me$_4$-[(CMe$_2$)$_2$-N$^i$Pr]—, ($^i$Bu$_2$N)-Ln-C$_5$Me$_4$- [(CMe$_2$)$_2$-N$^i$Pr]—, ($^s$Bu$_2$N)-Ln-C$_5$Me$_4$-[(CMe$_2$)$_2$-N$^i$Pr]—, ($^t$Bu$_2$N)-Ln-C$_5$Me$_4$-[(CMe$_2$)$_2$-N$^i$Pr]—, (Cp)-Ln-C$_5$Me$_4$-[(CMe$_2$)$_2$-N$^i$Pr]—, (HO)-Ln-C$_5$Me$_4$-[(CMe$_2$)$_2$-N$^i$Pr]—, (MeO)-Ln-C$_5$Me$_4$-[(CMe$_2$)$_2$-N$^i$Pr]—, (EtO)-Ln-C$_5$Me$_4$-[(CMe$_2$)$_2$-N$^i$Pr]—, ($^n$PrO)-Ln-C$_5$Me$_4$-[(CMe$_2$)$_2$-N$^i$Pr]—, ($^i$PrO)-Ln-C$_5$Me$_4$-[(CMe$_2$)$_2$-N$^i$Pr]—, ($^n$BuO)-Ln-C$_5$Me$_4$-[(CMe$_2$)$_2$-N$^i$Pr]—, ($^i$BuO)-Ln-C$_5$Me$_4$-[(CMe$_2$)$_2$-N$^i$Pr]—, ($^s$BuO)-Ln-C$_5$Me$_4$-[(CMe$_2$)$_2$-N$^i$Pr]—, ($^t$BuO)-Ln-C$_5$Me$_4$-[(CMe$_2$)$_2$-N$^i$Pr]—, (H$_2$N)-Ln-C$_5$Me$_4$-[(CMe$_2$)$_2$-N$^n$Bu]-, (Me$_2$N)-Ln-C$_5$Me$_4$-[(CMe$_2$)$_2$-N$^n$Bu]-, (Et$_2$N)-Ln-C$_5$Me$_4$-[(CMe$_2$)$_2$-N$^n$Bu]-, ($^n$Pr$_2$N)-Ln-C$_5$Me$_4$-[(CMe$_2$)$_2$-N$^n$Bu]-, ($^i$Pr$_2$N)-Ln-C$_5$Me$_4$-[(CMe$_2$)$_2$-N$^n$Bu]-, ($^n$Bu$_2$N)-Ln-C$_5$Me$_4$-[(CMe$_2$)$_2$-N$^n$Bu]-, ($^i$Bu$_2$N)-Ln-C$_5$Me$_4$-[(CMe$_2$)$_2$- N$^n$Bu]-, ($^s$Bu$_2$N)-Ln-C$_5$Me$_4$-[(CMe$_2$)$_2$-N$^n$Bu]-, ($^t$Bu$_2$N)-Ln-C$_5$Me$_4$-[(CMe$_2$)$_2$-N$^n$Bu]-, (Cp)-Ln- C$_5$Me$_4$-[(CMe$_2$)$_2$-N$^n$Bu]-, (HO)-Ln-C$_5$Me$_4$-[(CMe$_2$)$_2$-N$^n$Bu]-, (MeO)-Ln-C$_5$Me$_4$-[(CMe$_2$)$_2$-N$^n$Bu]-, (EtO)-Ln-C$_5$Me$_4$-[(CMe$_2$)$_2$-N$^n$Bu]-, ($^n$PrO)-Ln-C$_5$Me$_4$-[(CMe$_2$)$_2$-N$^n$Bu]-, ($^i$PrO)-Ln-C$_5$Me$_4$-[(CMe$_2$)$_2$-N$^n$Bu]-, ($^n$BuO)-Ln-C$_5$Me$_4$-[(CMe$_2$)$_2$-N$^n$Bu]-, ($^i$BuO)-Ln-C$_5$Me$_4$-[(CMe$_2$)$_2$-N$^n$Bu]-, ($^s$BuO)-Ln-C$_5$Me$_4$-[(CMe$_2$)$_2$-N$^n$Bu]-, ($^t$BuO)-Ln-C$_5$Me$_4$-[(CMe$_2$)$_2$-N$^n$Bu]-, (H$_2$N)-Ln-C$_5$Me$_4$-[(CMe$_2$)$_2$-N$^i$Bu]-, (Me$_2$N)-Ln-C$_5$Me$_4$-[(CMe$_2$)$_2$-N$^i$Bu]-, (Et$_2$N)-Ln-C$_5$Me$_4$-[(CMe$_2$)$_2$-N$^i$Bu]-, ($^n$Pr$_2$N)-Ln-C$_5$Me$_4$-[(CMe$_2$)$_2$-N$^i$Bu]-, ($^i$Pr$_2$N)-Ln-C$_5$Me$_4$-[(CMe$_2$)$_2$-N$^i$Bu]-, ($^n$Bu$_2$N)-Ln-C$_5$Me$_4$-[(CMe$_2$)$_2$-N$^i$Bu]-, ($^i$Bu$_2$N)-Ln-C$_5$Me$_4$-[(CMe$_2$)$_2$-N$^i$Bu]-, ($^s$Bu$_2$N)-Ln-C$_5$Me$_4$-[(CMe$_2$)$_2$-N$^i$Bu]-, ($^t$Bu$_2$N)-Ln-C$_5$Me$_4$-[(CMe$_2$)$_2$-N$^i$Bu]-, (Cp)-Ln-C$_5$Me$_4$-[(CMe$_2$)$_2$-N$^i$Bu]-, (HO)-Ln-C$_5$Me$_4$-[(CMe$_2$)$_2$-N$^i$Bu]-, (MeO)-Ln-C$_5$Me$_4$-[(CMe$_2$)$_2$-N$^i$Bu]-, (EtO)-Ln-C$_5$Me$_4$-[(CMe$_2$)$_2$-N$^i$Bu]-, ($^n$PrO)-Ln-C$_5$Me$_4$-[(CMe$_2$)$_2$-N$^i$Bu]-, ($^i$PrO)-Ln-C$_5$Me$_4$-[(CMe$_2$)$_2$-N$^i$Bu]-, ($^n$BuO)-Ln-C$_5$Me$_4$-[(CMe$_2$)$_2$-N$^i$Bu]-, ($^i$BuO)-Ln- C$_5$Me$_4$-[(CMe$_2$)$_2$-N$^i$Bu]-, ($^s$BuO)-Ln-C$_5$Me$_4$-[(CMe$_2$)$_2$-N$^i$Bu]-, ($^t$BuO)-Ln-C$_5$Me$_4$-[(CMe$_2$)$_2$-N$^i$Bu]-, (H$_2$N)-Ln-C$_5$Me$_4$-[(CMe$_2$)$_2$-N$^s$Bu]-, (Me$_2$N)-Ln-C$_5$Me$_4$-[(CMe$_2$)$_2$-N$^s$Bu]-, (Et$_2$N)-Ln-C$_5$Me$_4$-[(CMe$_2$)$_2$-N$^s$Bu]-, ($^n$Pr$_2$N)-Ln-C$_5$Me$_4$-[(CMe$_2$)$_2$-N$^s$Bu]-, ($^i$Pr$_2$N)-Ln-C$_5$Me$_4$-[(CMe$_2$)$_2$-N$^s$Bu]-, ($^n$Bu$_2$N)-Ln-C$_5$Me$_4$-[(CMe$_2$)$_2$-N$^s$Bu]-, ($^i$Bu$_2$N)-Ln-C$_5$Me$_4$-[(CMe$_2$)$_2$-N$^s$Bu]-, ($^s$Bu$_2$N)-Ln-C$_5$Me$_4$-[(CMe$_2$)$_2$-N$^s$Bu]-, ($^t$Bu$_2$N)-Ln-C$_5$Me$_4$-[(CMe$_2$)$_2$-N$^s$Bu]-, (Cp)-Ln-C$_5$Me$_4$-[(CMe$_2$)$_2$-N$^s$Bu]-, (HO)-Ln-C$_5$Me$_4$-[(CMe$_2$)$_2$-N$^s$Bu]-, (MeO)-Ln-C₅Me₄-[(CMe₂)₂-NˢBu]-, (EtO)-Ln-C₅Me₄-[(CMe₂)₂-NˢBu]-, (ⁿPrO)-Ln-C₅Me₄-[(CMe₂)₂-NˢBu]-, (ⁱPrO)-Ln-C₅Me₄-[(CMe₂)₂-NˢBu]-, (ⁿBuO)-Ln-C₅Me₄-[(CMe₂)₂-NˢBu]-, (ⁱBuO)-Ln-C₅Me₄-[(CMe₂)₂-NˢBu]-, (ˢBuO)-Ln-C₅Me₄-[(CMe₂)₂-NˢBu]-, (ᵗBuO)-Ln-C₅Me₄-[(CMe₂)₂-NˢBu]-, (H₂N)-Ln-C₅Me₄-[(CMe₂)₂-NᵗBu]-, (Me₂N)-Ln-C₅Me₄-[(CMe₂)₂-NᵗBu]-, (Et₂N)-Ln-C₅Me₄-[(CMe₂)₂-NᵗBu]-, (ⁿPr₂N)-Ln-C₅Me₄-[(CMe₂)₂-NᵗBu]-, (ⁱPr₂N)-Ln-C₅Me₄-[(CMe₂)₂-NᵗBu]-, (ⁿBu₂N)-Ln-C₅Me₄-[(CMe₂)₂-NᵗBu]-, (ⁱBu₂N)-Ln-C₅Me₄-[(CMe₂)₂-NᵗBu]-, (ˢBu₂N)-Ln-C₅Me₄-[(CMe₂)₂-NᵗBu]-, (ᵗBu₂N)-Ln-C₅Me₄-[(CMe₂)₂-NᵗBu]-, (Cp)-Ln-C₅Me₄-[(CMe₂)₂-NᵗBu]-, (HO)-Ln-C₅Me₄-[(CMe₂)₂-NᵗBu]-, (MeO)-Ln-C₅Me₄-[(CMe₂)₂-NᵗBu]-, (EtO)-Ln-C₅Me₄-[(CMe₂)₂-NᵗBu]-, (ⁿPrO)-Ln-C₅Me₄-[(CMe₂)₂-NᵗBu]-, (ⁱPrO)-Ln-C₅Me₄-[(CMe₂)₂-NᵗBu]-, (ⁿBuO)-Ln-C₅Me₄-[(CMe₂)₂-NᵗBu]-, (ⁱBuO)-Ln-C₅Me₄-[(CMe₂)₂-NᵗBu]-, (ˢBuO)-Ln-C₅Me₄-[(CMe₂)₂-NᵗBu]-, (ᵗBuO)-Ln-C₅Me₄-[(CMe₂)₂-NᵗBu]-, (H₂N)-Ln-C₅Me₄-[(CMe₂)₂-O]—, (Me₂N)-Ln-C₅Me₄-[(CMe₂)₂-O]—, (Et₂N)-Ln-C₅Me₄-[(CMe₂)₂-O]—, (ⁿPr₂N)-Ln-C₅Me₄-[(CMe₂)₂-O]—, (ⁱPr₂N)-Ln-C₅Me₄-[(CMe₂)₂-O]—, (ⁿBu₂N)-Ln-C₅Me₄-[(CMe₂)₂-O]—, (ⁱBu₂N)-Ln-C₅Me₄-[(CMe₂)₂-O]—, (ˢBu₂N)-Ln-C₅Me₄-[(CMe₂)₂-O]—, (ᵗBu₂N)-Ln-C₅Me₄-[(CMe₂)₂-O]—, (Cp)-Ln-C₅Me₄-[(CMe₂)₂-O]—, (HO)-Ln-C₅Me₄-[(CMe₂)₂-O]—, (MeO)-Ln-C₅Me₄-[(CMe₂)₂-O]—, (EtO)-Ln-C₅Me₄-[(CMe₂)₂-O]—, (ⁿPrO)-Ln-C₅Me₄-[(CMe₂)₂-O]—, (ⁱPrO)-Ln-C₅Me₄-[(CMe₂)₂-O]—, (ⁿBuO)-Ln-C₅Me₄-[(CMe₂)₂-O]—, (ⁱBuO)-Ln-C₅Me₄-[(CMe₂)₂-O]—, (ˢBuO)-Ln-C₅Me₄-[(CMe₂)₂-O]—, (ᵗBuO)-Ln-C₅Me₄-[(CMe₂)₂-O]—, (H₂N)-Ln-C₅H₃-1-Me-3-[(CH₂)₂—NH]—, (Me₂N)-Ln-C₅H₃-1-Me-3-[(CH₂)₂—NH]—, (Et₂N)-Ln-C₅H₃-1-Me-3-[(CH₂)₂—NH]—, (ⁿPr₂N)-Ln-C₅H₃-1-Me-3-[(CH₂)₂—NH]—, (ⁱPr₂N)-Ln-C₅H₃-1-Me-3-[(CH₂)₂—NH]—, (ⁿBu₂N)-Ln-C₅H₃-1-Me-3-[(CH₂)₂—NH]—, (ⁱBu₂N)-Ln-C₅H₃-1-Me-3-[(CH₂)₂—NH]—, (ˢBu₂N)-Ln-C₅H₃-1-Me-3-[(CH₂)₂—NH]—, (ᵗBu₂N)-Ln-C₅H₃-1-Me-3-[(CH₂)₂—NH]—, (Cp)-Ln-C₅H₃-1-Me-3-[(CH₂)₂—NH]—, (HO)-Ln-C₅H₃-1-Me-3-[(CH₂)₂—NH]—, (MeO)-Ln-C₅H₃-1-Me-3-[(CH₂)₂—NH]—, (EtO)-Ln-C₅H₃-1-Me-3-[(CH₂)₂—NH]—, (ⁿPrO)-Ln-C₅H₃-1-Me-3-[(CH₂)₂—NH]—, (ⁱPrO)-Ln-C₅H₃-1-Me-3-[(CH₂)₂—NH]—, (ⁿBuO)-Ln-C₅H₃-1-Me-3-[(CH₂)₂—NH]—, (ⁱBuO)-Ln-C₅H₃-1-Me-3-[(CH₂)₂—NH]—, (ˢBuO)-Ln-C₅H₃-1-Me-3-[(CH₂)₂—NH]—, (ᵗBuO)-Ln-C₅H₃-1-Me-3-[(CH₂)₂—NH]—, (H₂N)-Ln-C₅H₃-1-Me-3-[(CH₂)₂—NMe]-, (Me₂N)-Ln-C₅H₃-1-Me-3-[(CH₂)₂—NMe]-, (Et₂N)-Ln-C₅H₃-1-Me-3-[(CH₂)₂—NMe]-, (ⁿPr₂N)-Ln-C₅H₃-1-Me-3-[(CH₂)₂—NMe]-, (ⁱPr₂N)-Ln-C₅H₃-1-Me-3-[(CH₂)₂—NMe]-, (ⁿBu₂N)-Ln-C₅H₃-1-Me-3-[(CH₂)₂—NMe]-, (ⁱBu₂N)-Ln-C₅H₃-1-Me-3-[(CH₂)₂—NMe]-, (ˢBu₂N)-Ln-C₅H₃-1-Me-3-[(CH₂)₂—NMe]-, (ᵗBu₂N)-Ln-C₅H₃-1-Me-3-[(CH₂)₂—NMe]-, (Cp)-Ln-C₅H₃-1-Me-3-[(CH₂)₂—NMe]-, (HO)-Ln-C₅H₃-1-Me-3-[(CH₂)₂—NMe]-, (MeO)-Ln-C₅H₃-1-Me-3-[(CH₂)₂—NMe]-, (EtO)-Ln-C₅H₃-1-Me-3-[(CH₂)₂—NMe]-, (ⁿPrO)-Ln-C₅H₃-1-Me-3-[(CH₂)₂—NMe]-, (ⁱPrO)-Ln-C₅H₃-1-Me-3-[(CH₂)₂—NMe]-, (ⁿBuO)-Ln-C₅H₃-1-Me-3-[(CH₂)₂—NMe]-, (ⁱBuO)-Ln-C₅H₃-1-Me-3-[(CH₂)₂—NMe]-, (ˢBuO)-Ln-C₅H₃-1-Me-3-[(CH₂)₂—NMe]-, (ᵗBuO)-Ln-C₅H₃-1-Me-3-[(CH₂)₂—NMe]-, (H₂N)-Ln-C₅H₃-1-Me-3-[(CH₂)₂—NEt]-, (Me₂N)-Ln-C₅H₃-1-Me-3-[(CH₂)₂—NEt]-, (Et₂N)-Ln-C₅H₃-1-Me-3-[(CH₂)₂—NEt]-, (ⁿPr₂N)-Ln-C₅H₃-1-Me-3-[(CH₂)₂—NEt]-, (ⁱPr₂N)-Ln-C₅H₃-1-Me-3-[(CH₂)₂—NEt]-, (ⁿBu₂N)-Ln-C₅H₃-1-Me-3-[(CH₂)₂—NEt]-, (ⁱBu₂N)-Ln-C₅H₃-1-Me-3-[(CH₂)₂—NEt]-, (ˢBu₂N)-Ln-C₅H₃-1-Me-3-[(CH₂)₂—NEt]-, (ᵗBu₂N)-Ln-C₅H₃-1-Me-3-[(CH₂)₂—NEt]-, (Cp)-Ln-C₅H₃-1-Me-3-[(CH₂)₂—NEt]-, (HO)-Ln-C₅H₃-1-Me-3-[(CH₂)₂—NEt]-, (MeO)-Ln-C₅H₃-1-Me-3-[(CH₂)₂—NEt]-, (EtO)-Ln-C₅H₃-1-Me-3-[(CH₂)₂—NEt]-, (ⁿPrO)-Ln-C₅H₃-1-Me-3-[(CH₂)₂—NEt]-, (ⁱPrO)-Ln-C₅H₃-1-Me-3-[(CH₂)₂—NEt]-, (ⁿBuO)-Ln-C₅H₃-1-Me-3-[(CH₂)₂—NEt]-, (ⁱBuO)-Ln-C₅H₃-1-Me-3-[(CH₂)₂—NEt]-, (ˢBuO)-Ln-C₅H₃-1-Me-3-[(CH₂)₂—NEt]-, (ᵗBuO)-Ln-C₅H₃-1-Me-3-[(CH₂)₂—NEt]-, (H₂N)-Ln-C₅H₃-1-Me-3-[(CH₂)₂—NⁿPr]—, (Me₂N)-Ln-C₅H₃-1-Me-3-[(CH₂)₂—NⁿPr]—, (Et₂N)-Ln-C₅H₃-1-Me-3-[(CH₂)₂—NⁿPr]—, (ⁿPr₂N)-Ln-C₅H₃-1-Me-3-[(CH₂)₂—NⁿPr]—, (ⁱPr₂N)-Ln-C₅H₃-1-Me-3-[(CH₂)₂—NⁿPr]—, (ⁿBu₂N)-Ln-C₅H₃-1-Me-3-[(CH₂)₂—NⁿPr]—, (ⁱBu₂N)-Ln-C₅H₃-1-Me-3-[(CH₂)₂—NⁿPr]—, (ˢBu₂N)-Ln-C₅H₃-1-Me-3-[(CH₂)₂—NⁿPr]—, (ᵗBu₂N)-Ln-C₅H₃-1-Me-3-[(CH₂)₂—NⁿPr]—, (Cp)-Ln-C₅H₃-1-Me-3-[(CH₂)₂—NⁿPr]—, (HO)-Ln-C₅H₃-1-Me-3-[(CH₂)₂—NⁿPr]—, (MeO)-Ln-C₅H₃-1-Me-3-[(CH₂)₂—NⁿPr]—, (EtO)-Ln-C₅H₃-1-Me-3-[(CH₂)₂—NⁿPr]—, (ⁿPrO)-Ln-C₅H₃-1-Me-3-[(CH₂)₂—NⁿPr]—, (ⁱPrO)-Ln-C₅H₃-1-Me-3-[(CH₂)₂—NⁿPr]—, (ⁿBuO)-Ln-C₅H₃-1-Me-3-[(CH₂)₂—NⁿPr]—, (ⁱBuO)-Ln-C₅H₃-1-Me-3-[(CH₂)₂—NⁿPr]—, (ˢBuO)-Ln-C₅H₃-1-Me-3-[(CH₂)₂—NⁿPr]—, (ᵗBuO)-Ln-C₅H₃-1-Me-3-[(CH₂)₂—NⁿPr]—, (H₂N)-Ln-C₅H₃-1-Me-3-[(CH₂)₂—NⁱPr]—, (Me₂N)-Ln-C₅H₃-1-Me-3-[(CH₂)₂—NⁱPr]—, (Et₂N)-Ln-C₅H₃-1-Me-3-[(CH₂)₂—NⁱPr]—, (ⁿPr₂N)-Ln-C₅H₃-1-Me-3-[(CH₂)₂—NⁱPr]—, (ⁱPr₂N)-Ln-C₅H₃-1-Me-3-[(CH₂)₂—NⁱPr]—, (ⁿBu₂N)-Ln-C₅H₃-1-Me-3-[(CH₂)₂—NⁱPr]—, (ⁱBu₂N)-Ln-C₅H₃-1-Me-3-[(CH₂)₂—NⁱPr]—, (ˢBu₂N)-Ln-C₅H₃-1-Me-3-[(CH₂)₂—NⁱPr]—, (ᵗBu₂N)-Ln-C₅H₃-1-Me-3-[(CH₂)₂—NⁱPr]—, (Cp)-Ln-C₅H₃-1-Me-3-[(CH₂)₂—NⁱPr]—, (HO)-Ln-C₅H₃-1-Me-3-[(CH₂)₂—NⁱPr]—, (MeO)-Ln-C₅H₃-1-Me-3-[(CH₂)₂—NⁱPr]—, (EtO)-Ln-C₅H₃-1-Me-3-[(CH₂)₂—NⁱPr]—, (ⁿPrO)-Ln-C₅H₃-1-Me-3-[(CH₂)₂—NⁱPr]—, (ⁱPrO)-Ln-C₅H₃-1-Me-3-[(CH₂)₂—NⁱPr]—, (ⁿBuO)-Ln-C₅H₃-1-Me-3-[(CH₂)₂—NⁱPr]—, (ⁱBuO)-Ln-C₅H₃-1-Me-3-[(CH₂)₂—NⁱPr]—, (ˢBuO)-Ln-C₅H₃-1-Me-3-[(CH₂)₂—NⁱPr]—, (ᵗBuO)-Ln-C₅H₃-1-Me-3-[(CH₂)₂—NⁱPr]—, (H₂N)-Ln-C₅H₃-1-Me-3-[(CH₂)₂—NⁿBu]-, (Me₂N)-Ln-C₅H₃-1-Me-3-[(CH₂)₂—NⁿBu]-, (Et₂N)-Ln-C₅H₃-1-Me-3-[(CH₂)₂—NⁿBu]-, (ⁿPr₂N)-Ln-C₅H₃-1-Me-3-[(CH₂)₂—NⁿBu]-, (ⁱPr₂N)-Ln-C₅H₃-1-Me-3-[(CH₂)₂—NⁿBu]-, (ⁿBu₂N)-Ln-C₅H₃-1-Me-3-[(CH₂)₂—NⁿBu]-, (ⁱBu₂N)-Ln-C₅H₃-1-Me-3-[(CH₂)₂—NⁿBu]-, (ˢBu₂N)-Ln-C₅H₃-1-Me-3-[(CH₂)₂—NⁿBu]-, (ᵗBu₂N)-Ln-C₅H₃-1-Me-3-[(CH₂)₂—NⁿBu]-, (Cp)-Ln-C₅H₃-1-Me-3-[(CH₂)₂—NⁿBu]-, (HO)-Ln-C₅H₃-1-Me-3-[(CH₂)₂—NⁿBu]-, (MeO)-Ln-C₅H₃-1-Me-3-[(CH₂)₂—NⁿBu]-, (EtO)-Ln-C₅H₃-1-Me-3-[(CH₂)₂—NⁿBu]-, (ⁿPrO)-Ln-C₅H₃-1-Me-3-[(CH₂)₂—NⁿBu]-, (ⁱPrO)-Ln-C₅H₃-1-Me-3-[(CH₂)₂—NⁿBu]-, (ⁿBuO)-Ln-C₅H₃-1-Me-3-[(CH₂)₂—NⁿBu]-, (ⁱBuO)-Ln-C₅H₃-1-Me-3-[(CH₂)₂—NⁿBu]-, (ˢBuO)-Ln-C₅H₃-1-Me-3-[(CH₂)₂—NⁿBu]-, (ᵗBuO)-Ln-C₅H₃-1-Me-3-[(CH₂)₂—NⁿBu]-, (H₂N)-Ln-C₅H₃-1-Me-3-[(CH₂)₂—NⁱBu]-, (Me₂N)-Ln-C₅H₃-1-Me-3-[(CH₂)₂—NⁱBu]-, (Et₂N)-Ln-C₅H₃-1-Me-3-[(CH₂)₂—NⁱBu]-, (ⁿPr₂N)-Ln-C₅H₃-1-Me-3-[(CH₂)₂—NⁱBu]-, (ⁱPr₂N)-Ln-C₅H₃-1-Me-3-[(CH₂)₂—NⁱBu]-, (ⁿBu₂N)-Ln-C₅H₃-1-Me-3-[(CH₂)₂—NⁱBu]-, (ⁱBu₂N)-Ln-C₅H₃-1-Me-3-[(CH₂)₂—NⁱBu]-, (ˢBu₂N)-Ln-C₅H₃-1-Me-3-[(CH₂)₂—NⁱBu]-, (ᵗBu₂N)-Ln-C₅H₃-1-Me-3-[(CH₂)₂—NⁱBu]-, (Cp)-Ln-C₅H₃-1-Me-3-[(CH₂)₂—NⁱBu]-, (HO)-Ln-C₅H₃-1-Me-3-[(CH₂)₂—NⁱBu]-, (MeO)-Ln-C₅H₃-1-Me-3-[(CH₂)₂—NⁱBu]-, (EtO)-Ln-C₅H₃-1-Me-3-[(CH₂)₂—NⁱBu]-, (ⁿPrO)-Ln-C₅H₃-1-Me-3-[(CH₂)₂—NⁱBu]-, (ⁱPrO)-Ln-C₅H₃-1-Me-3-[(CH₂)₂—NⁱBu]-, (ⁿBuO)-Ln-C₅H₃-1-Me-3-[(CH₂)₂—NⁱBu]-, (ⁱBuO)-Ln-C₅H₃-1-Me-3-[(CH₂)₂—NⁱBu]-, (ˢBuO)-Ln-C₅H₃-1-Me-3-[(CH₂)₂—NⁱBu]-, (ᵗBuO)-Ln-C₅H₃-1-Me-3-[(CH₂)₂—NⁱBu]-, (H₂N)-Ln- $C_5H_3$-1-Me-3-[($CH_2)_2$—$N^sBu$]-, ($Me_2N$)-Ln-$C_5H_3$-1-Me-3-[($CH_2)_2$—$N^sBu$]-, ($Et_2N$)-Ln-$C_5H_3$-1-Me-3-[($CH_2)_2$—$N^sBu$]-, ($^nPr_2N$)-Ln-$C_5H_3$-1-Me-3-[($CH_2)_2$—$N^sBu$]-, ($^iPr_2N$)-Ln-$C_5H_3$-1-Me-3-[($CH_2)_2$—$N^sBu$]-, ($^nBu_2N$)-Ln-$C_5H_3$-1-Me-3-[($CH_2)_2$—$N^sBu$]-, ($^sBu_2N$)-Ln-$C_5H_3$-1-Me-3-[($CH_2)_2$—$N^sBu$]-, ($^tBu_2N$)-Ln-$C_5H_3$-1-Me-3-[($CH_2)_2$—$N^sBu$]-, (Cp)-Ln-$C_5H_3$-1-Me-3-[($CH_2)_2$—$N^sBu$]-, (HO)-Ln-$C_5H_3$-1-Me-3-[($CH_2)_2$—$N^sBu$]-, (MeO)-Ln-$C_5H_3$-1-Me-3-[($CH_2)_2$—$N^sBu$]-, (EtO)-Ln-$C_5H_3$-1-Me-3-[($CH_2)_2$—$N^sBu$]-, ($^nPrO$)-Ln-$C_5H_3$-1-Me-3-[($CH_2)_2$—$N^sBu$]-, ($^iPrO$)-Ln-$C_5H_3$-1-Me-3-[($CH_2)_2$—$N^sBu$]-, ($^nBuO$)-Ln-$C_5H_3$-1-Me-3-[($CH_2)_2$—$N^sBu$]-, ($^iBuO$)-Ln-$C_5H_2$-1-Me-3-[($CH_2)_2$—$N^sBu$]-, ($^sBuO$)-Ln-$C_5H_3$-1-Me-3[($CH_2)_2$—$N^sBu$]-, ($^tBuO$)-Ln-$C_5H_3$-1-Me-3-[($CH_2)_2$—$N^sBu$]-, ($H_2N$)-Ln-$C_5H_3$-1-Me-3-[($CH_2)_2$—$N^tBu$]-, ($Me_2N$)-Ln-$C_5H_3$-1-Me-3-[($CH_2)_2$—$N^tBu$]-, ($Et_2N$)-Ln-$C_5H_3$-1-Me-3-[($CH_2)_2$—$N^tBu$]-, ($^nPr_2N$)-Ln-$C_5H_3$-1-Me-3-[($CH_2)_2$—$N^tBu$]-, ($^iPr_2N$)-Ln-$C_5H_3$-1-Me-3-[($CH_2)_2$—$N^tBu$]-, ($^nBu_2N$)-Ln-$C_5H_3$-1-Me-3-[($CH_2)_2$—$N^tBu$]-, ($^iBu_2N$)-Ln-$C_5H_3$-1-Me-3-[($CH_2)_2$—$N^tBu$]-, ($^sBu_2N$)-Ln-$C_5H_3$-1-Me-3-[($CH_2)_2$—$N^tBu$]-, ($^tBu_2N$)-Ln-$C_5H_3$-1-Me-3-[($CH_2)_2$—$N^tBu$]-, (Cp)-Ln-$C_5H_3$-1-Me-3-[($CH_2)_2$—$N^tBu$]-, (HO)-Ln-$C_5H_3$-1-Me-3-[($CH_2)_2$—$N^tBu$]-, (MeO)-Ln-$C_5H_3$-1-Me-3-[($CH_2)_2$—$N^tBu$]-, (EtO)-Ln-$C_5H_3$-1-Me-3-[($CH_2)_2$—$N^tBu$]-, ($^nPrO$)-Ln-$C_5H_3$-1-Me-3-[($CH_2)_2$—$N^tBu$]-, ($^iPrO$)-Ln-$C_5H_3$-1-Me-3-[($CH_2)_2$—$N^tBu$]-, ($^nBuO$)-Ln-$C_5H_3$-1-Me-3-[($CH_2)_2$—$N^tBu$]-, ($^iBuO$)-Ln-$C_5H_3$-1-Me-3-[($CH_2)_2$—$N^tBu$]-, ($^sBuO$)-Ln-$C_5H_3$-1-Me-3-[($CH_2)_2$—$N^tBu$]-, ($^tBuO$)-Ln-$C_5H_3$-1-Me-3-[($CH_2)_2$—$N^tBu$]-, ($H_2N$)-Ln-$C_5H_3$-1-Me-3-[($CH_2)_2$—O]—, ($Me_2N$)-Ln-$C_5H_3$-1-Me-3-[($CH_2)_2$—O]—, ($Et_2N$)-Ln-$C_5H_3$-1-Me-3-[($CH_2)_2$—O]—, ($^nPr_2N$)-Ln-$C_5H_3$-1-Me-3-[($CH_2)_2$—O]—, ($^iPr_2N$)-Ln-$C_5H_3$-1-Me-3-[($CH_2)_2$—O]—, ($^nBu_2N$)-Ln-$C_5H_3$-1-Me-3-[($CH_2)_2$—O]—, ($^tBu_2N$)-Ln-$C_5H_3$-1-Me-3-[($CH_2)_2$—O]—, ($^sBu_2N$)-Ln-$C_5H_3$-1-Me-3-[($CH_2)_2$—O]—, ($^iBu_2N$)-Ln-$C_5H_3$-1-Me-3-[($CH_2)_2$—O]—, (Cp)-Ln-$C_5H_3$-1-Me-3-[($CH_2)_2$—O]—, (HO)-Ln-$C_5H_3$-1-Me-3-[($CH_2)_2$—O]—, (MeO)-Ln-$C_5H_3$-1-Me-3-[($CH_2)_2$—O]—, (EtO)-Ln-$C_5H_3$-1-Me-3-[($CH_2)_2$—O]—, ($^nPrO$)-Ln-$C_5H_3$-1-Me-3-[($CH_2)_2$—O]—, ($^iPrO$)-Ln-$C_5H_3$-1-Me-3-[($CH_2)_2$—O]—, ($^nBuO$)-Ln-$C_5H_3$-1-Me-3-[($CH_2)_2$—O]—, ($^iBuO$)-Ln-$C_5H_3$-1-Me-3-[($CH_2)_2$—O]—, ($^sBuO$)-Ln-$C_5H_3$-1-Me-3-[($CH_2)_2$—O]—, ($^tBuO$)-Ln-$C_5H_3$-1-Me-3-[($CH_2)_2$—O]—, ($H_2N$)-Ln-$C_5H_3$-1-Me-3-[($CMe_2)_2$-NH]—, ($Me_2N$)-Ln-$C_5H_3$-1-Me-3-[($CMe_2)_2$-NH]—, ($Et_2N$)-Ln-$C_5H_3$-1-Me-3-[($CMe_2)_2$-NH]—, ($^nPr_2N$)-Ln-$C_5H_3$-1-Me-3-[($CMe_2)_2$-NH]—, ($^iPr_2N$)-Ln-$C_5H_3$-1-Me-3-[($CMe_2)_2$-NH]—, ($^nBu_2N$)-Ln-$C_5H_3$-1-Me-3-[($CMe_2)_2$-NH]—, ($^iBu_2N$)-Ln-$C_5H_3$-1-Me-3-[($CMe_2)_2$-NH]—, ($^sBu_2N$)-Ln-$C_5H_3$-1-Me-3-[($CMe_2)_2$-NH]—, ($^tBu_2N$)-Ln-$C_5H_3$-1-Me-3-[($CMe_2)_2$-NH]—, (Cp)-Ln-$C_5H_3$-1-Me-3-[($CMe_2)_2$-NH]—, (HO)-Ln-$C_5H_3$-1-Me-3-[($CMe_2)_2$-NH]—, (MeO)-Ln-$C_5H_3$-1-Me-3-[($CMe_2)_2$-NH]—, (EtO)-Ln-$C_5H_3$-1-Me-3-[($CMe_2)_2$-NH]—, ($^nPrO$)-Ln-$C_5H_3$-1-Me-3-[($CMe_2)_2$-NH]—, ($^iPrO$)-Ln-$C_5H_3$-1-Me-3-[($CMe_2)_2$-NH]—, ($^nBuO$)-Ln-$C_5H_3$-1-Me-3-[($CMe_2)_2$-NH]—, ($^iBuO$)-Ln-$C_5H_3$-1-Me-3-[($CMe_2)_2$-NH]—, ($^sBuO$)-Ln-$C_5H_3$-1-Me-3-[($CMe_2)_2$-NH]—, ($^tBuO$)-Ln-$C_5H_3$-1-Me-3-[($CMe_2)_2$-NH]—, ($H_2N$)-Ln-$C_5H_3$-1-Me-3-[($CMe_2)_2$-NMe]-, ($Me_2N$)-Ln-$C_5H_3$-1-Me-3-[($CMe_2)_2$-NMe]-, ($Et_2N$)-Ln-$C_5H_3$-1-Me-3-[($CMe_2)_2$-NMe]-, ($^nPr_2N$)-Ln-$C_5H_3$-1-Me-3-[($CMe_2)_2$-NMe]-, ($^iPr_2N$)-Ln-$C_5H_3$-1-Me-3-[($CMe_2)_2$-NMe]-, ($^nBu_2N$)-Ln-$C_5H_3$-1-Me-3-[($CMe_2)_2$-NMe]-, ($^iBu_2N$)-Ln-$C_5H_3$-1-Me-3-[($CMe_2)_2$-NMe]-, ($^sBu_2N$)-Ln-$C_5H_3$-1-Me-3-[($CMe_2)_2$-NMe]-, ($^tBu_2N$)-Ln-$C_5H_3$-1-Me-3-[($CMe_2)_2$-NMe]-, (Cp)-Ln-$C_5H_3$-1-Me-3-[($CMe_2)_2$-NMe]-, (HO)-Ln-$C_5H_3$-1-Me-3-[($CMe_2)_2$-NMe]-, (MeO)-Ln-$C_5H_3$-1-Me-3-[($CMe_2)_2$-NMe]-, (EtO)-Ln-$C_5H_3$-1-Me-3-[($CMe_2)_2$-NMe]-, ($^nPrO$)-Ln-$C_5H_3$-1-Me-3-[($CMe_2)_2$-NMe]-, ($^iPrO$)-Ln-$C_5H_3$-1-Me-3-[($CMe_2)_2$-NMe]-, ($^nBuO$)-Ln-$C_5H_3$-1-Me-3-[($CMe_2)_2$-NMe]-, ($^iBuO$)-Ln-$C_5H_3$-1-Me-3-[($CMe_2)_2$-NMe]-, ($^sBuO$)-Ln-$C_5H_3$-1-Me-3-[($CMe_2)_2$-NMe]-, ($^tBuO$)-Ln-$C_5H_3$-1-Me-3-[($CMe_2)_2$-NMe]-, ($H_2N$)-Ln-$C_5H_3$-1-Me-3-[($CMe_2)_2$-NEt]-, ($Me_2N$)-Ln-$C_5H_3$-1-Me-3-[($CMe_2)_2$-NEt]-, ($Et_2N$)-Ln-$C_5H_3$-1-Me-3-[($CMe_2)_2$-NEt]-, ($^nPr_2N$)-Ln-$C_5H_3$-1-Me-3-[($CMe_2)_2$-NEt]-, ($^iPr_2N$)-Ln-$C_5H_3$-1-Me-3-[($CMe_2)_2$-NEt]-, ($^nBu_2N$)-Ln-$C_5H_3$-1-Me-3-[($CMe_2)_2$-NEt]-, ($^iBu_2N$)-Ln-$C_5H_3$-1-Me-3-[($CMe_2)_2$-NEt]-, ($^sBu_2N$)-Ln-$C_5H_3$-1-Me-3-[($CMe_2)_2$-NEt]-, ($^tBu_2N$)-Ln-$C_5H_3$-1-Me-3-[($CMe_2)_2$-NEt]-, (Cp)-Ln-$C_5H_3$-1-Me-3-[($CMe_2)_2$-NEt]-, (HO)-Ln-$C_5H_3$-1-Me-3-[($CMe_2)_2$-NEt]-, (MeO)-Ln-$C_5H_3$-1-Me-3-[($CMe_2)_2$-NEt]-, (EtO)-Ln-$C_5H_3$-1-Me-3-[($CMe_2)_2$-NEt]-, ($^nPrO$)-Ln-$C_5H_3$-1-Me-3-[($CMe_2)_2$-NEt]-, ($^iPrO$)-Ln-$C_5H_3$-1-Me-3-[($CMe_2)_2$-NEt]-, ($^nBuO$)-Ln-$C_5H_3$-1-Me-3-[($CMe_2)_2$-NEt]-, ($^iBuO$)-Ln-$C_5H_3$-1-Me-3-[($CMe_2)_2$-NEt]-, ($^sBuO$)-Ln-$C_5H_3$-1-Me-3-[($CMe_2)_2$-NEt]-, ($^tBuO$)-Ln-$C_5H_3$-1-Me-3-[($CMe_2)_2$-NEt]-, ($H_2N$)-Ln-$C_5H_3$-1-Me-3-[($CMe_2)_2$-$N^nPr$]—, ($Me_2N$)-Ln-$C_5H_3$-1-Me-3-[($CMe_2)_2$-$N^nPr$]—, ($Et_2N$)-Ln-$C_5H_3$-1-Me-3-[($CMe_2)_2$-$N^nPr$]—, ($^nPr_2N$)-Ln-$C_5H_3$-1-Me-3-[($CMe_2)_2$-$N^nPr$]—, ($^iPr_2N$)-Ln-$C_5H_3$-1-Me-3-[($CMe_2)_2$-$N^nPr$]—, ($^nBu_2N$)-Ln-$C_5H_3$-1-Me-3-[($CMe_2)_2$-$N^nPr$]—, ($^iBu_2N$)-Ln-$C_5H_3$-1-Me-3-[($CMe_2)_2$-$N^nPr$]—, ($^sBu_2N$)-Ln-$C_5H_3$-1-Me-3-[($CMe_2)_2$-$N^nPr$]—, ($^tBu_2N$)-Ln-$C_5H_3$-1-Me-3-[($CMe_2)_2$-$N^nPr$]—, (Cp)-Ln-$C_5H_3$-1-Me-3-[($CMe_2)_2$-$N^nPr$]—, (HO)-Ln-$C_5H_3$-1-Me-3-[($CMe_2)_2$-$N^nPr$]—, (MeO)-Ln-$C_5H_3$-1-Me-3-[($CMe_2)_2$-$N^nPr$]—, (EtO)-Ln-$C_5H_3$-1-Me-3-[($CMe_2)_2$-$N^nPr$]—, ($^nPrO$)-Ln-$C_5H_3$-1-Me-3-[($CMe_2)_2$-$N^nPr$]—, ($^iPrO$)-Ln-$C_5H_3$-1-Me-3-[($CMe_2)_2$-$N^nPr$]—, ($^nBuO$)-Ln-$C_5H_3$-1-Me-3-[($CMe_2)_2$-$N^nPr$]—, ($^iBuO$)-Ln-$C_5H_3$-1-Me-3-[($CMe_2)_2$-$N^nPr$]—, ($^sBuO$)-Ln-$C_5H_3$-1-Me-3-[($CMe_2)_2$-$N^nPr$]—, ($^tBuO$)-Ln-$C_5H_3$-1-Me-3-[($CMe_2)_2$-$N^nPr$]—, ($H_2N$)-Ln-$C_5H_3$-1-Me-3-[($CMe_2)_2$-$N^iPr$]—, ($Me_2N$)-Ln-$C_5H_3$-1-Me-3-[($CMe_2)_2$-$N^iPr$]—, ($Et_2N$)-Ln-$C_5H_3$-1-Me-3-[($CMe_2)_2$-$N^iPr$]—, ($^nPr_2N$)-Ln-$C_5H_3$-1-Me-3-[($CMe_2)_2$-$N^iPr$]—, ($^iPr_2N$)-Ln-$C_5H_3$-1-Me-3-[($CMe_2)_2$-$N^iPr$]—, ($^nBu_2N$)-Ln-$C_5H_3$-1-Me-3-[($CMe_2)_2$-$N^iPr$]—, ($^iBu_2N$)-Ln-$C_5H_3$-1-Me-3-[($CMe_2)_2$-$N^iPr$]—, ($^sBu_2N$)-Ln-$C_5H_3$-1-Me-3-[($CMe_2)_2$-$N^iPr$]—, ($^tBu_2N$)-Ln-$C_5H_3$-1-Me-3-[($CMe_2)_2$-$N^iPr$]—, (Cp)-Ln-$C_5H_3$-1-Me-3-[($CMe_2)_2$-$N^iPr$]—, (HO)-Ln-$C_5H_3$-1-Me-3-[($CMe_2)_2$-$N^iPr$]—, (MeO)-Ln-$C_5H_3$-1-Me-3-[($CMe_2)_2$-$N^iPr$]—, (EtO)-Ln-$C_5H_3$-1-Me-3-[($CMe_2)_2$-$N^iPr$]—, ($^nPrO$)-Ln-$C_5H_3$-1-Me-3-[($CMe_2)_2$-$N^iPr$]—, ($^iPrO$)-Ln-$C_5H_3$-1-Me-3-[($CMe_2)_2$-$N^iPr$]—, ($^nBuO$)-Ln-$C_5H_3$-1-Me-3-[($CMe_2)_2$-$N^iPr$]—, ($^iBuO$)-Ln-$C_5H_3$-1-Me-3-[($CMe_2)_2$-$N^iPr$]—, ($^sBuO$)-Ln-$C_5H_3$-1-Me-3-[($CMe_2)_2$-$N^iPr$]—, ($^tBuO$)-Ln-$C_5H_3$-1-Me-3-[($CMe_2)_2$-$N^iPr$]—, ($H_2N$)-Ln-$C_5H_3$-1-Me-3-[($CMe_2)_2$-$N^nBu$]-, ($Me_2N$)-Ln-$C_5H_3$-1-Me-3-[($CMe_2)_2$-$N^nBu$]-, ($Et_2N$)-Ln-$C_5H_3$-1-Me-3-[($CMe_2)_2$-$N^nBu$]-, ($^nPr_2N$)-Ln-$C_5H_3$-1-Me-3-[($CMe_2)_2$-$N^nBu$]-, ($^iPr_2N$)-Ln-$C_5H_3$-1-Me-3-[($CMe_2)_2$-$N^nBu$]-, ($^nBu_2N$)-Ln-$C_5H_3$-1-Me-3-[($CMe_2)_2$-$N^nBu$]-, ($^iBu_2N$)-Ln-$C_5H_3$-1-Me-3-[($CMe_2)_2$-$N^nBu$]-, ($^sBu_2N$)-Ln-$C_5H_3$-1-Me-3-[($CMe_2)_2$-$N^nBu$]-, ($^tBu_2N$)-Ln-$C_5H_3$-1-Me-3-[($CMe_2)_2$-$N^nBu$]-, (Cp)-Ln-$C_5H_3$-1-Me-3-[($CMe_2)_2$-$N^nBu$]-, (HO)-Ln-$C_5H_3$-1-Me-3-[($CMe_2)_2$-$N^nBu$]-, (MeO)-Ln-$C_5H_3$-1-Me-3-[($CMe_2)_2$-$N^nBu$]-, (EtO)-Ln-$C_5H_3$-1-Me-3-[($CMe_2)_2$-$N^nBu$]-, ($^nPrO$)-Ln-$C_5H_3$-1-Me-3-[($CMe_2)_2$-$N^nBu$]-, ($^iPrO$)-Ln-$C_5H_3$-1-Me-3-[($CMe_2)_2$-$N^nBu$]-, ($^nBuO$)-Ln-$C_5H_3$-1-Me-3-[($CMe_2)_2$-$N^nBu$]-, ($^iBuO$)-Ln-$C_5H_3$-1-Me-3-[($CMe_2)_2$-$N^nBu$]-, ($^sBuO$)-Ln-$C_5H_3$-1-Me-3-[($CMe_2)_2$-$N^nBu$]-, ($^tBuO$)-Ln-$C_5H_3$-1-Me-3-[($CMe_2)_2$-$N^nBu$]-, ($H_2N$)-Ln-$C_5H_3$-1-Me-3-[($CMe_2)_2$-$N^iBu$]-, (Me₂N)-Ln-C₅H₃-1-Me-3-[(CMe₂)₂-NⁱBu]-, (Et₂N)-Ln-C₅H₃-1-Me-3-[(CMe₂)₂-NⁱBu]-, (ⁿPr₂N)-Ln-C₅H₃-1-Me-3-[(CMe₂)₂-NⁱBu]-, (ⁱPr₂N)-Ln-C₅H₃-1-Me-3-[(CMe₂)₂-NⁱBu]-, (ⁿBu₂N)-Ln-C₅H₃-1-Me-3-[(CMe₂)₂-NⁱBu]-, (ⁱBu₂N)-Ln-C₅H₃-1-Me-3-[(CMe₂)₂-NⁱBu]-, (ˢBu₂N)-Ln-C₅H₃-1-Me-3-[(CMe₂)₂-NⁱBu]-, (ᵗBu₂N)-Ln-C₅H₃-1-Me-3-[(CMe₂)₂-NⁱBu]-, (Cp)-Ln-C₅H₃-1-Me-3-[(CMe₂)₂-NⁱBu]-, (HO)-Ln-C₅H₃-1-Me-3-[(CMe₂)₂-NⁱBu]-, (MeO)-Ln-C₅H₃-1-Me-3-[(CMe₂)₂-NⁱBu]-, (EtO)-Ln-C₅H₃-1-Me-3-[(CMe₂)₂-NⁱBu]-, (ⁿPrO)-Ln-C₅H₃-1-Me-3-[(CMe₂)₂-NⁱBu]-, (ⁱPrO)-Ln-C₅H₃-1-Me-3-[(CMe₂)₂-NⁱBu]-, (ⁿBuO)-Ln-C₅H₃-1-Me-3-[(CMe₂)₂-NⁱBu]-, (ⁱBuO)-Ln-C₅H₃-1-Me-3-[(CMe₂)₂-NⁱBu]-, (ˢBuO)-Ln-C₅H₃-1-Me-3-[(CMe₂)₂-NⁱBu]-, (ᵗBuO)-Ln-C₅H₃-1-Me-3-[(CMe₂)₂-NⁱBu]-, (H₂N)-Ln-C₅H₃-1-Me-3-[(CMe₂)₂-NˢBu]-, (Me₂N)-Ln-C₅H₃-1-Me-3-[(CMe₂)₂-NˢBu]-, (Et₂N)-Ln-C₅H₃-1-Me-3-[(CMe₂)₂-NˢBu]-, (ⁿPr₂N)-Ln-C₅H₃-1-Me-3-[(CMe₂)₂-NˢBu]-, (ⁱPr₂N)-Ln-C₅H₃-1-Me-3-[(CMe₂)₂-NˢBu]-, (ⁿBu₂N)-Ln-C₅H₃-1-Me-3-[(CMe₂)₂-NˢBu]-, (ⁱBu₂N)-Ln-C₅H₃-1-Me-3-[(CMe₂)₂-NˢBu]-, (ˢBu₂N)-Ln-C₅H₃-1-Me-3-[(CMe₂)₂-NˢBu]-, (ᵗBu₂N)-Ln-C₅H₃-1-Me-3-[(CMe₂)₂-NˢBu]-, (Cp)-Ln-C₅H₃-1-Me-3-[(CMe₂)₂-NˢBu]-, (HO)-Ln-C₅H₃-1-Me-3-[(CMe₂)₂-NˢBu]-, (MeO)-Ln-C₅H₃-1-Me-3-[(CMe₂)₂-NˢBu]-, (EtO)-Ln-C₅H₃-1-Me-3-[(CMe₂)₂-NˢBu]-, (ⁿPrO)-Ln-C₅H₃-1-Me-3-[(CMe₂)₂-NˢBu]-, (ⁱPrO)-Ln-C₅H₃-1-Me-3-[(CMe₂)₂-NˢBu]-, (ⁿBuO)-Ln-C₅H₃-1-Me-3-[(CMe₂)₂-NˢBu]-, (ⁱBuO)-Ln-C₅H₃-1-Me-3-[(CMe₂)₂-NˢBu]-, (ˢBuO)-Ln-C₅H₃-1-Me-3-[(CMe₂)₂-NˢBu]-, (ᵗBuO)-Ln-C₅H₃-1-Me-3-[(CMe₂)₂-NˢBu]-, (H₂N)-Ln-C₅H₃-1-Me-3-[(CMe₂)₂-NᵗBu]-, (Me₂N)-Ln-C₅H₃-1-Me-3-[(CMe₂)₂-NᵗBu]-, (Et₂N)-Ln-C₅H₃-1-Me-3-[(CMe₂)₂-NᵗBu]-, (ⁿPr₂N)-Ln-C₅H₃-1-Me-3-[(CMe₂)₂-NᵗBu]-, (ⁱPr₂N)-Ln-C₅H₃-1-Me-3-[(CMe₂)₂-NᵗBu]-, (ⁿBu₂N)-Ln-C₅H₃-1-Me-3-[(CMe₂)₂-NᵗBu]-, (ⁱBu₂N)-Ln-C₅H₃-1-Me-3-[(CMe₂)₂-NᵗBu]-, (ˢBu₂N)-Ln-C₅H₃-1-Me-3-[(CMe₂)₂-NᵗBu]-, (ᵗBu₂N)-Ln-C₅H₃-1-Me-3-[(CMe₂)₂-NᵗBu]-, (Cp)-Ln-C₅H₃-1-Me-3-[(CMe₂)₂-NᵗBu]-, (HO)-Ln-C₅H₃-1-Me-3-[(CMe₂)₂-NᵗBu]-, (MeO)-Ln-C₅H₃-1-Me-3-[(CMe₂)₂-NᵗBu]-, (EtO)-Ln-C₅H₃-1-Me-3-[(CMe₂)₂-NᵗBu]-, (ⁿPrO)-Ln-C₅H₃-1-Me-3-[(CMe₂)₂-NᵗBu]-, (ⁱPrO)-Ln-C₅H₃-1-Me-3-[(CMe₂)₂-NᵗBu]-, (ⁿBuO)-Ln-C₅H₃-1-Me-3-[(CMe₂)₂-NᵗBu]-, (ⁱBuO)-Ln-C₅H₃-1-Me-3-[(CMe₂)₂-NᵗBu]-, (ˢBuO)-Ln-C₅H₃-1-Me-3-[(CMe₂)₂-NᵗBu]-, (ᵗBuO)-Ln-C₅H₃-1-Me-3-[(CMe₂)₂-NᵗBu]-, (H₂N)-Ln-C₅H₃-1-Me-3-[(CMe₂)₂-O]—, (Me₂N)-Ln-C₅H₃-1-Me-3-[(CMe₂)₂-O]—, (Et₂N)-Ln-C₅H₃-1-Me-3-[(CMe₂)₂-O]—, (ⁿPr₂N)-Ln-C₅H₃-1-Me-3-[(CMe₂)₂-O]—, (ⁱPr₂N)-Ln-C₅H₃-1-Me-3-[(CMe₂)₂-O]—, (ⁿBu₂N)-Ln-C₅H₃-1-Me-3-[(CMe₂)₂-O]—, (ⁱBu₂N)-Ln-C₅H₃-1-Me-3-[(CMe₂)₂-O]—, (ˢBu₂N)-Ln-C₅H₃-1-Me-3-[(CMe₂)₂-O]—, (ᵗBu₂N)-Ln-C₅H₃-1-Me-3-[(CMe₂)₂-O]—, (Cp)-Ln-C₅H₃-1-Me-3-[(CMe₂)₂-O]—, (HO)-Ln-C₅H₃-1-Me-3-[(CMe₂)₂-O]—, (MeO)-Ln-C₅H₃-1-Me-3-[(CMe₂)₂-O]—, (EtO)-Ln-C₅H₃-1-Me-3-[(CMe₂)₂-O]—, (ⁿPrO)-Ln-C₅H₃-1-Me-3-[(CMe₂)₂-O]—, (ⁱPrO)-Ln-C₅H₃-1-Me-3-[(CMe₂)₂-O]—, (ⁿBuO)-Ln-C₅H₃-1-Me-3-[(CMe₂)₂-O]—, (ⁱBuO)-Ln-C₅H₃-1-Me-3-[(CMe₂)₂-O]—, (ˢBuO)-Ln-C₅H₃-1-Me-3-[(CMe₂)₂-O]—, (ᵗBuO)-Ln-C₅H₃-1-Me-3-[(CMe₂)₂-O]—, (H₂N)-Ln-C₅H₃-1-Me-3-[(CEt₂)₂-NH]—, (Me₂N)-Ln-C₅H₃-1-Me-3-[(CEt₂)₂-NH]—, (Et₂N)-Ln-C₅H₃-1-Me-3-[(CEt₂)₂-NH]—, (ⁿPr₂N)-Ln-C₅H₃-1-Me-3-[(CEt₂)₂-NH]—, (ⁱPr₂N)-Ln-C₅H₃-1-Me-3-[(CEt₂)₂-NH]—, (ⁿBu₂N)-Ln-C₅H₃-1-Me-3-[(CEt₂)₂-NH]—, (ⁱBu₂N)-Ln-C₅H₃-1-Me-3-[(CEt₂)₂-NH]—, (ˢBu₂N)-Ln-C₅H₃-1-Me-3-[(CEt₂)₂-NH]—, (ᵗBu₂N)-Ln-C₅H₃-1-Me-3-[(CEt₂)₂-NH]—, (Cp)-Ln-C₅H₃-1-Me-3-[(CEt₂)₂-NH]—, (HO)-Ln-C₅H₃-1-Me-3-[(CEt₂)₂-NH]—, (MeO)-Ln-C₅H₃-1-Me-3-[(CEt₂)₂-NH]—, (EtO)-Ln-C₅H₃-1-Me-3-[(CEt₂)₂-NH]—, (ⁿPrO)-Ln-C₅H₃-1-Me-3-[(CEt₂)₂-NH]—, (ⁱPrO)-Ln-C₅H₃-1-Me-3-[(CEt₂)₂-NH]—, (ⁿBuO)-Ln-C₅H₃-1-Me-3-[(CEt₂)₂-NH]—, (ⁱBuO)-Ln-C₅H₃-1-Me-3-[(CEt₂)₂-NH]—, (ˢBuO)-Ln-C₅H₃-1-Me-3-[(CEt₂)₂-NH]—, (ᵗBuO)-Ln-C₅H₃-1-Me-3-[(CEt₂)₂-NH]—, (H₂N)-Ln-C₅H₃-1-Me-3-[(CEt₂)₂-NMe]-, (Me₂N)-Ln-C₅H₃-1-Me-3-[(CEt₂)₂-NMe]-, (Et₂N)-Ln-C₅H₃-1-Me-3-[(CEt₂)₂-NMe]-, (ⁿPr₂N)-Ln-C₅H₃-1-Me-3-[(CEt₂)₂-NMe]-, (ⁱPr₂N)-Ln-C₅H₃-1-Me-3-[(CEt₂)₂-NMe]-, (ⁿBu₂N)-Ln-C₅H₃-1-Me-3-[(CEt₂)₂-NMe]-, (ⁱBu₂N)-Ln-C₅H₃-1-Me-3-[(CEt₂)₂-NMe]-, (ˢBu₂N)-Ln-C₅H₃-1-Me-3-[(CEt₂)₂-NMe]-, (ᵗBu₂N)-Ln-C₅H₃-1-Me-3-[(CEt₂)₂-NMe]-, (Cp)-Ln-C₅H₃-1-Me-3-[(CEt₂)₂-NMe]-, (HO)-Ln-C₅H₃-1-Me-3-[(CEt₂)₂-NMe]-, (MeO)-Ln-C₅H₃-1-Me-3-[(CEt₂)₂-NMe]-, (EtO)-Ln-C₅H₃-1-Me-3-[(CEt₂)₂-NMe]-, (ⁿPrO)-Ln-C₅H₃-1-Me-3-[(CEt₂)₂-NMe]-, (ⁱPrO)-Ln-C₅H₃-1-Me-3-[(CEt₂)₂-NMe]-, (ⁿBuO)-Ln-C₅H₃-1-Me-3-[(CEt₂)₂-NMe]-, (ⁱBuO)-Ln-C₅H₃-1-Me-3-[(CEt₂)₂-NMe]-, (ˢBuO)-Ln-C₅H₃-1-Me-3-[(CEt₂)₂-NMe]-, (ᵗBuO)-Ln-C₅H₃-1-Me-3-[(CEt₂)₂-NMe]-, (H₂N)-Ln-C₅H₃-1-Me-3-[(CEt₂)₂-NEt]-, (Me₂N)-Ln-C₅H₃-1-Me-3-[(CEt₂)₂-NEt]-, (Et₂N)-Ln-C₅H₃-1-Me-3-[(CEt₂)₂-NEt]-, (ⁿPr₂N)-Ln-C₅H₃-1-Me-3-[(CEt₂)₂-NEt]-, (ⁱPr₂N)-Ln-C₅H₃-1-Me-3-[(CEt₂)₂-NEt]-, (ⁿBu₂N)-Ln-C₅H₃-1-Me-3-[(CEt₂)₂-NEt]-, (ⁱBu₂N)-Ln-C₅H₃-1-Me-3-[(CEt₂)₂-NEt]-, (ˢBu₂N)-Ln-C₅H₃-1-Me-3-[(CEt₂)₂-NEt]-, (ᵗBu₂N)-Ln-C₅H₃-1-Me-3-[(CEt₂)₂-NEt]-, (Cp)-Ln-C₅H₃-1-Me-3-[(CEt₂)₂-NEt]-, (HO)-Ln-C₅H₃-1-Me-3-[(CEt₂)₂-NEt]-, (MeO)-Ln-C₅H₃-1-Me-3-[(CEt₂)₂-NEt]-, (EtO)-Ln-C₅H₃-1-Me-3-[(CEt₂)₂-NEt]-, (ⁿPrO)-Ln-C₅H₃-1-Me-3-[(CEt₂)₂-NEt]-, (ⁱPrO)-Ln-C₅H₃-1-Me-3-[(CEt₂)₂-NEt]-, (ⁿBuO)-Ln-C₅H₃-1-Me-3-[(CEt₂)₂-NEt]-, (ⁱBuO)-Ln-C₅H₃-1-Me-3-[(CEt₂)₂-NEt]-, (ˢBuO)-Ln-C₅H₃-1-Me-3-[(CEt₂)₂-NEt]-, (ᵗBuO)-Ln-C₅H₃-1-Me-3-[(CEt₂)₂-NEt]-, (H₂N)-Ln-C₅H₃-1-Me-3-[(CEt₂)₂-NⁿPr]—, (Me₂N)-Ln-C₅H₃-1-Me-3-[(CEt₂)₂-NⁿPr]—, (Et₂N)-Ln-C₅H₃-1-Me-3-[(CEt₂)₂-NⁿPr]—, (ⁿPr₂N)-Ln-C₅H₃-1-Me-3-[(CEt₂)₂-NⁿPr]—, (ⁱPr₂N)-Ln-C₅H₃-1-Me-3-[(CEt₂)₂-NⁿPr]—, (ⁿBu₂N)-Ln-C₅H₃-1-Me-3-[(CEt₂)₂-NⁿPr]—, (ⁱBu₂N)-Ln-C₅H₃-1-Me-3-[(CEt₂)₂-NⁿPr]—, (ˢBu₂N)-Ln-C₅H₃-1-Me-3-[(CEt₂)₂-NⁿPr]—, (ᵗBu₂N)-Ln-C₅H₃-1-Me-3-[(CEt₂)₂-NⁿPr]—, (Cp)-Ln-C₅H₃-1-Me-3-[(CEt₂)₂-NⁿPr]—, (HO)-Ln-C₅H₃-1-Me-3-[(CEt₂)₂-NⁿPr]—, (MeO)-Ln-C₅H₃-1-Me-3-[(CEt₂)₂-NⁿPr]—, (EtO)-Ln-C₅H₃-1-Me-3-[(CEt₂)₂-NⁿPr]—, (ⁿPrO)-Ln-C₅H₃-1-Me-3-[(CEt₂)₂-NⁿPr]—, (ⁱPrO)-Ln-C₅H₃-1-Me-3-[(CEt₂)₂-NⁿPr]—, (ⁿBuO)-Ln-C₅H₃-1-Me-3-[(CEt₂)₂-NⁿPr]—, (ⁱBuO)-Ln-C₅H₃-1-Me-3-[(CEt₂)₂-NⁿPr]—, (ˢBuO)-Ln-C₅H₃-1-Me-3-[(CEt₂)₂-NⁿPr]—, (ᵗBuO)-Ln-C₅H₃-1-Me-3-[(CEt₂)₂-NⁿPr]—, (H₂N)-Ln-C₅H₃-1-Me-3-[(CEt₂)₂-NⁱPr]—, (Me₂N)-Ln-C₅H₃-1-Me-3-[(CEt₂)₂-NⁱPr]—, (Et₂N)-Ln-C₅H₃-1-Me-3-[(CEt₂)₂-NⁱPr]—, (ⁿPr₂N)-Ln-C₅H₃-1-Me-3-[(CEt₂)₂-NⁱPr]—, (ⁱPr₂N)-Ln-C₅H₃-1-Me-3-[(CEt₂)₂-NⁱPr]—, (ⁿBu₂N)-Ln-C₅H₃-1-Me-3-[(CEt₂)₂- NⁱPr]—, (ⁱBu₂N)-Ln-C₅H₃-1-Me-3-[(CEt₂)₂-NⁱPr]—, (ˢBu₂N)-Ln-C₅H₃-1-Me-3-[(CEt₂)₂- NⁱPr]—, (ᵗBu₂N)-Ln-C₅H₃-1-Me-3-[(CEt₂)₂-NⁱPr]—, (Cp)-Ln-C₅H₃-1-Me-3-[(CEt₂)₂-NⁱPr]—, (HO)-Ln-C₅H₃-1-Me-3-[(CEt₂)₂-NⁱPr]—, (MeO)-Ln-C₅H₃-1-Me-3-[(CEt₂)₂-NⁱPr]—, (EtO)-Ln-C₅H₃-1-Me-3-[(CEt₂)₂-NⁱPr]—, (ⁿPrO)-Ln-C₅H₃-1-Me-3-[(CEt₂)₂-NⁱPr]—, (ⁱPrO)-Ln- C₅H₃-1-Me-3-[(CEt₂)₂-NⁱPr]—, (ⁿBuO)-Ln-C₅H₃-1-Me-3-[(CEt₂)₂-NⁱPr]—, (ⁱBuO)-Ln-C₅H₃-1-Me-3-[(CEt₂)₂-NⁱPr]—, (ˢBuO)-Ln-C₅H₃-1-Me-3-[(CEt₂)₂-NⁱPr]—, (ᵗBuO)-Ln-C₅H₃-1- Me-3-[(CEt₂)₂-NⁱPr]—, (H₂N)-Ln-C₅H₃-1-Me-3-[(CEt₂)₂-NⁿBu]-, (Me₂N)-Ln-C₅H₃-1-Me-3-[(CEt₂)₂-NⁿBu]-, (Et₂N)-Ln-C₅H₃-1-Me-3-[(CEt₂)₂-NⁿBu]-, (ⁿPr₂N)-Ln-C₅H₃-1-Me- 3-[(CEt₂)₂-NⁿBu]-, (ⁱPr₂N)-Ln-

C₅H₃-1-Me-3-[(CEt₂)₂-N"Bu]-, ("Bu₂N)-Ln-C₅H₃-1-Me-3-[(CEt₂)₂-N"Bu]-, (ᵗBu₂N)-Ln-C₅H₃-1-Me-3-[(CEt₂)₂-N"Bu]-, (ˢBu₂N)-Ln-C₅H₃-1-Me-3-[(CEt₂)₂-N"Bu]-, (ᶠBu₂N)-Ln-C₅H₃-1-Me-3-[(CEt₂)₂-N"Bu]-, (Cp)-Ln-C₅H₃-1-Me-3-[(CEt₂)₂-N"Bu]-, (HO)-Ln-C₅H₃-1-Me-3-[(CEt₂)₂-N"Bu]-, (MeO)-Ln-C₅H₃-1-Me-3-[(CEt₂)₂-N"Bu]-, (EtO)-Ln-C₅H₃-1-Me-3-[(CEt₂)₂-N"Bu]-, ("PrO)-Ln-C₅H₃-1-Me-3-[(CEt₂)₂-N"Bu]-, (ⁱPrO)-Ln-C₅H₃-1-Me-3-[(CEt₂)₂-N"Bu]-, ("BuO)-Ln-C₅H₃-1-Me-3-[(CEt₂)₂-N"Bu]-, (ᵗBuO)-Ln-C₅H₃-1-Me-3-[(CEt₂)₂-N"Bu]-, (ˢBuO)-Ln-C₅H₃-1-Me-3-[(CEt₂)₂-N"Bu]-, (ᶠBuO)-Ln-C₅H₃-1-Me-3-[(CEt₂)₂-N"Bu]-, (H₂N)-Ln-C₅H₃-1-Me-3-[(CEt₂)₂-NⁱBu]-, (Me₂N)-Ln-C₅H₃-1-Me-3-[(CEt₂)₂-NⁱBu]-, (Et₂N)-Ln-C₅H₃-1-Me-3-[(CEt₂)₂-NⁱBu]-, ("Pr₂N)-Ln-C₅H₃-1-Me-3-[(CEt₂)₂-NⁱBu]-, (ⁱPr₂N)-Ln-C₅H₃-1-Me-3-[(CEt₂)₂-NⁱBu]-, ("Bu₂N)-Ln-C₅H₃-1-Me-3-[(CEt₂)₂-NⁱBu]-, (ᵗBu₂N)-Ln-C₅H₃-1-Me-3-[(CEt₂)₂-NⁱBu]-, (ˢBu₂N)-Ln-C₅H₃-1-Me-3-[(CEt₂)₂-NⁱBu]-, (ᶠBu₂N)-Ln-C₅H₃-1-Me-3-[(CEt₂)₂-NⁱBu]-, (Cp)-Ln-C₅H₃-1-Me-3-[(CEt₂)₂-NⁱBu]-, (HO)-Ln-C₅H₃-1-Me-3-[(CEt₂)₂-NⁱBu]-, (MeO)-Ln-C₅H₃-1-Me-3-[(CEt₂)₂-NⁱBu]-, (EtO)-Ln-C₅H₃-1-Me-3-[(CEt₂)₂-NⁱBu]-, ("PrO)-Ln-C₅H₃-1-Me-3-[(CEt₂)₂-NⁱBu]-, (ⁱPrO)-Ln-C₅H₃-1-Me-3-[(CEt₂)₂-NⁱBu]-, ("BuO)-Ln-C₅H₃-1-Me-3-[(CEt₂)₂-NⁱBu]-, (ᵗBuO)-Ln-C₅H₃-1-Me-3-[(CEt₂)₂-NⁱBu]-, (ˢBuO)-Ln-C₅H₃-1-Me-3-[(CEt₂)₂-NⁱBu]-, (ᶠBuO)-Ln-C₅H₃-1-Me-3-[(CEt₂)₂-NⁱBu]-, (H₂N)-Ln-C₅H₃-1-Me-3-[(CEt₂)₂-NˢBu]-, (Me₂N)-Ln-C₅H₃-1-Me-3-[(CEt₂)₂-NˢBu]-, (Et₂N)-Ln-C₅H₃-1-Me-3-[(CEt₂)₂-NˢBu]-, ("Pr₂N)-Ln-C₅H₃-1-Me-3-[(CEt₂)₂-NˢBu]-, (ⁱPr₂N)-Ln-C₅H₃-1-Me-3-[(CEt₂)₂-NˢBu]-, ("Bu₂N)-Ln-C₅H₃-1-Me-3-[(CEt₂)₂-NˢBu]-, (ᵗBu₂N)-Ln-C₅H₃-1-Me-3-[(CEt₂)₂-NˢBu]-, (ˢBu₂N)-Ln-C₅H₃-1-Me-3-[(CEt₂)₂-NˢBu]-, (ᶠBu₂N)-Ln-C₅H₃-1-Me-3-[(CEt₂)₂-NˢBu]-, (Cp)-Ln-C₅H₃-1-Me-3-[(CEt₂)₂-NˢBu]-, (HO)-Ln-C₅H₃-1-Me-3-[(CEt₂)₂-NˢBu]-, (MeO)-Ln-C₅H₃-1-Me-3-[(CEt₂)₂-NˢBu]-, (EtO)-Ln-C₅H₃-1-Me-3-[(CEt₂)₂-NˢBu]-, ("PrO)-Ln-C₅H₃-1-Me-3-[(CEt₂)₂-NˢBu]-, (ⁱPrO)-Ln-C₅H₃-1-Me-3-[(CEt₂)₂-NˢBu]-, ("BuO)-Ln-C₅H₃-1-Me-3-[(CEt₂)₂-NˢBu]-, (ᵗBuO)-Ln-C₅H₃-1-Me-3-[(CEt₂)₂-NˢBu]-, (ˢBuO)-Ln-C₅H₃-1-Me-3-[(CEt₂)₂-NˢBu]-, (ᶠBuO)-Ln-C₅H₃-1-Me-3-[(CEt₂)₂-NˢBu]-, (H₂N)-Ln-C₅H₃-1-Me-3-[(CEt₂)₂-NᶠBu]-, (Me₂N)-Ln-C₅H₃-1-Me-3-[(CEt₂)₂-NᶠBu]-, (Et₂N)-Ln-C₅H₃-1-Me-3-[(CEt₂)₂-NᶠBu]-, ("Pr₂N)-Ln-C₅H₃-1-Me-3-[(CEt₂)₂-NᶠBu]-, (ⁱPr₂N)-Ln-C₅H₃-1-Me-3-[(CEt₂)₂-NᶠBu]-, ("Bu₂N)-Ln-C₅H₃-1-Me-3-[(CEt₂)₂-NᶠBu]-, (ᵗBu₂N)-Ln-C₅H₃-1-Me-3-[(CEt₂)₂-NᶠBu]-, (ˢBu₂N)-Ln-C₅H₃-1-Me-3-[(CEt₂)₂-NᶠBu]-, (ᶠBu₂N)-Ln-C₅H₃-1-Me-3-[(CEt₂)₂-NᶠBu]-, (Cp)-Ln-C₅H₃-1-Me-3-[(CEt₂)₂-NᶠBu]-, (HO)-Ln-C₅H₃-1-Me-3-[(CEt₂)₂-NᶠBu]-, (MeO)-Ln-C₅H₃-1-Me-3-[(CEt₂)₂-NᶠBu]-, (EtO)-Ln-C₅H₃-1-Me-3-[(CEt₂)₂-NᶠBu]-, ("PrO)-Ln-C₅H₃-1-Me-3-[(CEt₂)₂-NᶠBu]-, (ⁱPrO)-Ln-C₅H₃-1-Me-3-[(CEt₂)₂-NᶠBu]-, ("BuO)-Ln-C₅H₃-1-Me-3-[(CEt₂)₂-NᶠBu]-, (ᵗBuO)-Ln-C₅H₃-1-Me-3-[(CEt₂)₂-NᶠBu]-, (ˢBuO)-Ln-C₅H₃-1-Me-3-[(CEt₂)₂-NᶠBu]-, (ᶠBuO)-Ln-C₅H₃-1-Me-3-[(CEt₂)₂-NᶠBu]-, (H₂N)-Ln-C₅H₃-1-Me-3-[(CEt₂)₂-O]—, (Me₂N)-Ln-C₅H₃-1-Me-3-[(CEt₂)₂-O]—, (Et₂N)-Ln-C₅H₃-1-Me-3-[(CEt₂)₂-O]—, ("Pr₂N)-Ln-C₅H₃-1-Me-3-[(CEt₂)₂-O]—, (ⁱPr₂N)-Ln-C₅H₃-1-Me-3-[(CEt₂)₂-O]—, ("Bu₂N)-Ln-C₅H₃-1-Me-3-[(CEt₂)₂-O]—, (ᵗBu₂N)-Ln-C₅H₃-1-Me-3-[(CEt₂)₂-O]—, (ˢBu₂N)-Ln-C₅H₃-1-Me-3-[(CEt₂)₂-O]—, (ᶠBu₂N)-Ln-C₅H₃-1-Me-3-[(CEt₂)₂-O]—, (Cp)-Ln-C₅H₃-1-Me-3-[(CEt₂)₂-O]—, (HO)-Ln-C₅H₃-1-Me-3-[(CEt₂)₂-O]—, (MeO)-Ln-C₅H₃-1-Me-3-[(CEt₂)₂-O]—, (EtO)-Ln-C₅H₃-1-Me-3-[(CEt₂)₂-O]—, ("PrO)-Ln-C₅H₃-1-Me-3-[(CEt₂)₂-O]—, (ⁱPrO)-Ln-C₅H₃-1-Me-3-[(CEt₂)₂-O]—, ("BuO)-Ln-C₅H₃-1-Me-3-[(CEt₂)₂-O]—, (ᵗBuO)-Ln-C₅H₃-1-Me-3-[(CEt₂)₂-O]—, (ˢBuO)-Ln-C₅H₃-1-Me-3-[(CEt₂)₂-O]—, (ᶠBuO)-Ln-C₅H₃-1-Me-3-[(CEt₂)₂-O]—, (H₂N)-Ln-C₅H₃-1-Me-3-[(CⁱPr₂)₂—NH]—, (Me₂N)-Ln-C₅H₃-1-Me-3-[(CⁱPr₂)₂—NH]—, (Et₂N)-Ln-C₅H₃-1-Me-3-[(CⁱPr₂)₂—NH]—, ("Pr₂N)-Ln-C₅H₃-1-Me-3-[(CⁱPr₂)₂—NH]—, (ⁱPr₂N)-Ln-C₅H₃-1-Me-3-[(CⁱPr₂)₂—NH]—, ("Bu₂N)-Ln-C₅H₃-1-Me-3-[(CⁱPr₂)₂—NH]—, (ᵗBu₂N)-Ln-C₅H₃-1-Me-3-[(CⁱPr₂)₂—NH]—, (ˢBu₂N)-Ln-C₅H₃-1-Me-3-[(CⁱPr₂)₂—NH]—, (ᶠBu₂N)-Ln-C₅H₃-1-Me-3-[(CⁱPr₂)₂—NH]—, (Cp)-Ln-C₅H₃-1-Me-3-[(CⁱPr₂)₂—NH]—, (HO)-Ln-C₅H₃-1-Me-3-[(CⁱPr₂)₂—NH]—, (MeO)-Ln-C₅H₃-1-Me-3-[(CⁱPr₂)₂—NH]—, (EtO)-Ln-C₅H₃-1-Me-3-[(CⁱPr₂)₂—NH]—, ("PrO)-Ln-C₅H₃-1-Me-3-[(CⁱPr₂)₂—NH]—, (ⁱPrO)-Ln-C₅H₃-1-Me-3-[(CⁱPr₂)₂—NH]—, ("BuO)-Ln-C₅H₃-1-Me-3-[(CⁱPr₂)₂—NH]—, (ᵗBuO)-Ln-C₅H₃-1-Me-3-[(CⁱPr₂)₂—NH]—, (ˢBuO)-Ln-C₅H₃-1-Me-3-[(CⁱPr₂)₂—NH]—, (ᶠBuO)-Ln-C₅H₃-1-Me-3-[(CⁱPr₂)₂—NH]—, (H₂N)-Ln-C₅H₃-1-Me-3-[(CⁱPr₂)₂—NMe]-, (Me₂N)-Ln-C₅H₃-1-Me-3-[(CⁱPr₂)₂—NMe]-, (Et₂N)-Ln-C₅H₃-1-Me-3-[(CⁱPr₂)₂—NMe]-, ("Pr₂N)-Ln-C₅H₃-1-Me-3-[(CⁱPr₂)₂—NMe]-, (ⁱPr₂N)-Ln-C₅H₃-1-Me-3-[(CⁱPr₂)₂—NMe]-, ("Bu₂N)-Ln-C₅H₃-1-Me-3-[(CⁱPr₂)₂—NMe]-, (ᵗBu₂N)-Ln-C₅H₃-1-Me-3-[(CⁱPr₂)₂—NMe]-, (ˢBu₂N)-Ln-C₅H₃-1-Me-3-[(CⁱPr₂)₂—NMe]-, (ᶠBu₂N)-Ln-C₅H₃-1-Me-3-[(CⁱPr₂)₂—NMe]-, (Cp)-Ln-C₅H₃-1-Me-3-[(CⁱPr₂)₂—NMe]-, (HO)-Ln-C₅H₃-1-Me-3-[(CⁱPr₂)₂—NMe]-, (MeO)-Ln-C₅H₃-1-Me-3-[(CⁱPr₂)₂—NMe]-, (EtO)-Ln-C₅H₃-1-Me-3-[(CⁱPr₂)₂—NMe]-, ("PrO)-Ln-C₅H₃-1-Me-3-[(CⁱPr₂)₂—NMe]-, (ⁱPrO)-Ln-C₅H₃-1-Me-3-[(CⁱPr₂)₂—NMe]-, ("BuO)-Ln-C₅H₃-1-Me-3-[(CⁱPr₂)₂—NMe]-, (ᵗBuO)-Ln-C₅H₃-1-Me-3-[(CⁱPr₂)₂—NMe]-, (ˢBuO)-Ln-C₅H₃-1-Me-3-[(CⁱPr₂)₂—NMe]-, (ᶠBuO)-Ln-C₅H₃-1-Me-3-[(CⁱPr₂)₂—NMe]-, (H₂N)-Ln-C₅H₃-1-Me-3-[(CⁱPr₂)₂—NEt]-, (Me₂N)-Ln-C₅H₃-1-Me-3-[(CⁱPr₂)₂—NEt]-, (Et₂N)-Ln-C₅H₃-1-Me-3-[(CⁱPr₂)₂—NEt]-, ("Pr₂N)-Ln-C₅H₃-1-Me-3-[(CⁱPr₂)₂—NEt]-, (ⁱPr₂N)-Ln-C₅H₃-1-Me-3-[(CⁱPr₂)₂—NEt]-, ("Bu₂N)-Ln-C₅H₃-1-Me-3-[(CⁱPr₂)₂—NEt]-, (ᵗBu₂N)-Ln-C₅H₃-1-Me-3-[(CⁱPr₂)₂—NEt]-, (ˢBu₂N)-Ln-C₅H₃-1-Me-3-[(CⁱPr₂)₂—NEt]-, (ᶠBu₂N)-Ln-C₅H₃-1-Me-3-[(CⁱPr₂)₂—NEt]-, (Cp)-Ln-C₅H₃-1-Me-3-[(CⁱPr₂)₂—NEt]-, (HO)-Ln-C₅H₃-1-Me-3-[(CⁱPr₂)₂—NEt]-, (MeO)-Ln-C₅H₃-1-Me-3-[(CⁱPr₂)₂—NEt]-, (EtO)-Ln-C₅H₃-1-Me-3-[(CⁱPr₂)₂—NEt]-, ("PrO)-Ln-C₅H₃-1-Me-3-[(CⁱPr₂)₂—NEt]-, (ⁱPrO)-Ln-C₅H₃-1-Me-3-[(CⁱPr₂)₂—NEt]-, ("BuO)-Ln-C₅H₃-1-Me-3-[(CⁱPr₂)₂—NEt]-, (ᵗBuO)-Ln-C₅H₃-1-Me-3-[(CⁱPr₂)₂—NEt]-, (ˢBuO)-Ln-C₅H₃-1-Me-3-[(CⁱPr₂)₂—NEt]-, (ᶠBuO)-Ln-C₅H₃-1-Me-3-[(CⁱPr₂)₂—NEt]-, (H₂N)-Ln-C₅H₃-1-Me-3-[(CⁱPr₂)₂—N"Pr]—, (Me₂N)-Ln-C₅H₃-1-Me-3-[(CⁱPr₂)₂—N"Pr]—, (Et₂N)-Ln-C₅H₃-1-Me-3-[(CⁱPr₂)₂—N"Pr]—, ("Pr₂N)-Ln-C₅H₃-1-Me-3-[(CⁱPr₂)₂—N"Pr]—, (ⁱPr₂N)-Ln-C₅H₃-1-Me-3-[(CⁱPr₂)₂—N"Pr]—, ("Bu₂N)-Ln-C₅H₃-1-Me-3-[(CⁱPr₂)₂—N"Pr]—, (ᵗBu₂N)-Ln-C₅H₃-1-Me-3-[(CⁱPr₂)₂—N"Pr]—, (ˢBu₂N)-Ln-C₅H₃-1-Me-3-[(CⁱPr₂)₂—N"Pr]—, (ᶠBu₂N)-Ln-C₅H₃-1-Me-3-[(CⁱPr₂)₂—N"Pr]—, (Cp)-Ln-C₅H₃-1-Me-3-[(CⁱPr₂)₂—N"Pr]—, (HO)-Ln-C₅H₃-1-Me-3-[(CⁱPr₂)₂—N"Pr]—, (MeO)-Ln-C₅H₃-1-Me-3-[(CⁱPr₂)₂—N"Pr]—, (EtO)-Ln-C₅H₃-1-Me-3-[(CⁱPr₂)₂—N"Pr]—, ("PrO)-Ln-C₅H₃-1-Me-3-[(CⁱPr₂)₂—N"Pr]—, (ⁱPrO)-Ln-C₅H₃-1-Me-3-[(CⁱPr₂)₂—N"Pr]—, ("BuO)-Ln-C₅H₃-1-Me-3-[(CⁱPr₂)₂—N"Pr]—, (ᵗBuO)-Ln-C₅H₃-1-Me-3-[(CⁱPr₂)₂—N"Pr]—, (ˢBuO)-Ln-C₅H₃-1-Me-3-[(CⁱPr₂)₂—N"Pr]—, (ᶠBuO)-Ln-C₅H₃-1-Me-3-[(CⁱPr₂)₂—N"Pr]—, (H₂N)-Ln-C₅H₃-1-Me-3-[(CⁱPr₂)₂—NⁱPr]—, (Me₂N)-Ln-C₅H₃-1-Me-3-[(CⁱPr₂)₂—NⁱPr]—, (Et₂N)-Ln-C₅H₃-1-Me-3-[(CⁱPr₂)₂—NⁱPr]—, ("Pr₂N)-Ln-C₅H₃-1-Me-3-[(CⁱPr₂)₂—NⁱPr]—, (ⁱPr₂N)-Ln-C₅H₃-1-Me-3-[(CⁱPr₂)₂—NⁱPr]—, ("Bu₂N)-Ln-C₅H₃-1-Me-3-[(CⁱPr₂)₂—NⁱPr]—, ($^t$Bu$_2$N)-Ln-C$_5$H$_3$-1-Me-3-[(C$^i$Pr$_2$)$_2$—N$^i$Pr]—, ($^s$Bu$_2$N)-Ln-C$_5$H$_3$-1-Me-3-[(C$^i$Pr$_2$)$_2$—N$^i$Pr]—, ($^f$Bu$_2$N)-Ln-C$_5$H$_3$-1-Me-3-[(C$^i$Pr$_2$)$_2$—N$^i$Pr]—, (Cp)-Ln-C$_5$H$_3$-1-Me-3-[(C$^i$Pr$_2$)$_2$—N$^i$Pr]—, (HO)-Ln-C$_5$H$_3$-1-Me-3-[(C$^i$Pr$_2$)$_2$—N$^i$Pr]—, (MeO)-Ln-C$_5$H$_3$-1-Me-3-[(C$^i$Pr$_2$)$_2$—N$^i$Pr]—, (EtO)-Ln-C$_5$H$_3$-1-Me-3-[(C$^i$Pr$_2$)$_2$—N$^i$Pr]—, ($^n$PrO)-Ln-C$_5$H$_3$-1-Me-3-[(C$^i$Pr$_2$)$_2$—N$^i$Pr]—, ($^i$PrO)-Ln-C$_5$H$_3$-1-Me-3-[(C$^i$Pr$_2$)$_2$—N$^i$Pr]—, ($^n$BuO)-Ln-C$_5$H$_3$-1-Me-3-[(C$^i$Pr$_2$)$_2$—N$^i$Pr]—, ($^i$BuO)-Ln-C$_5$H$_3$-1-Me-3-[(C$^i$Pr$_2$)$_2$—N$^i$Pr]—, ($^s$BuO)-Ln-C$_5$H$_3$-1-Me-3-[(C$^i$Pr$_2$)$_2$—N$^i$Pr]—, ($^t$BuO)-Ln-C$_5$H$_3$-1-Me-3-[(C$^i$Pr$_2$)$_2$—N$^i$Pr]—, (H$_2$N)-Ln-C$_5$H$_3$-1-Me-3-[(C$^i$Pr$_2$)$_2$—N$^n$Bu]-, (Me$_2$N)-Ln-C$_5$H$_3$-1-Me-3-[(C$^i$Pr$_2$)$_2$—N$^n$Bu]-, (Et$_2$N)-Ln-C$_5$H$_3$-1-Me-3-[(C$^i$Pr$_2$)$_2$—N$^n$Bu]-, ($^n$Pr$_2$N)-Ln-C$_5$H$_3$-1-Me-3-[(C$^i$Pr$_2$)$_2$—N$^n$Bu]-, ($^i$Pr$_2$N)-Ln-C$_5$H$_3$-1-Me-3-[(C$^i$Pr$_2$)$_2$—N$^n$Bu]-, ($^n$Bu$_2$N)-Ln-C$_5$H$_3$-1-Me-3-[(C$^i$Pr$_2$)$_2$—N$^n$Bu]-, ($^i$Bu$_2$N)-Ln-C$_5$H$_3$-1-Me-3-[(C$^i$Pr$_2$)$_2$—N$^n$Bu]-, ($^s$Bu$_2$N)-Ln-C$_5$H$_3$-1-Me-3-[(C$^i$Pr$_2$)$_2$—N$^n$Bu]-, ($^t$Bu$_2$N)-Ln-C$_5$H$_3$-1-Me-3-[(C$^i$Pr$_2$)$_2$—N$^n$Bu]-, (Cp)-Ln-C$_5$H$_3$-1-Me-3-[(C$^i$Pr$_2$)$_2$—N$^n$Bu]-, (HO)-Ln-C$_5$H$_3$-1-Me-3-[(C$^i$Pr$_2$)$_2$—N$^n$Bu]-, (MeO)-Ln-C$_5$H$_3$-1-Me-3-[(C$^i$Pr$_2$)$_2$—N$^n$Bu]-, (EtO)-Ln-C$_5$H$_3$-1-Me-3-[(C$^i$Pr$_2$)$_2$—N$^n$Bu]-, ($^n$PrO)-Ln-C$_5$H$_3$-1-Me-3-[(C$^i$Pr$_2$)$_2$—N$^n$Bu]-, ($^i$PrO)-Ln-C$_5$H$_3$-1-Me-3-[(C$^i$Pr$_2$)$_2$—N$^n$Bu]-, ($^n$BuO)-Ln-C$_5$H$_3$-1-Me-3-[(C$^i$Pr$_2$)$_2$—N$^n$Bu]-, ($^i$BuO)-Ln-C$_5$H$_3$-1-Me-3-[(C$^i$Pr$_2$)$_2$—N$^n$Bu]-, ($^s$BuO)-Ln-C$_5$H$_3$-1-Me-3-[(C$^i$Pr$_2$)$_2$—N$^n$Bu]-, ($^t$BuO)-Ln-C$_5$H$_3$-1-Me-3-[(C$^i$Pr$_2$)$_2$—N$^n$Bu]-, (H$_2$N)-Ln-C$_5$H$_3$-1-Me-3-[(C$^i$Pr$_2$)$_2$—N$^i$Bu]-, (Me$_2$N)-Ln-C$_5$H$_3$-1-Me-3-[(C$^i$Pr$_2$)$_2$—N$^i$Bu]-, (Et$_2$N)-Ln-C$_5$H$_3$-1-Me-3-[(C$^i$Pr$_2$)$_2$—N$^i$Bu]-, ($^n$Pr$_2$N)-Ln-C$_5$H$_3$-1-Me-3-[(C$^i$Pr$_2$)$_2$—N$^i$Bu]-, ($^i$Pr$_2$N)-Ln-C$_5$H$_3$-1-Me-3-[(C$^i$Pr$_2$)$_2$—N$^i$Bu]-, ($^n$Bu$_2$N)-Ln-C$_5$H$_3$-1-Me-3-[(C$^i$Pr$_2$)$_2$—N$^i$Bu]-, ($^i$Bu$_2$N)-Ln-C$_5$H$_3$-1-Me-3-[(C$^i$Pr$_2$)$_2$—N$^i$Bu]-, ($^s$Bu$_2$N)-Ln-C$_5$H$_3$-1-Me-3-[(C$^i$Pr$_2$)$_2$—N$^i$Bu]-, ($^t$Bu$_2$N)-Ln-C$_5$H$_3$-1-Me-3-[(C$^i$Pr$_2$)$_2$—N$^i$Bu]-, (Cp)-Ln-C$_5$H$_3$-1-Me-3-[(C$^i$Pr$_2$)$_2$—N$^i$Bu]-, (HO)-Ln-C$_5$H$_3$-1-Me-3-[(C$^i$Pr$_2$)$_2$—N$^i$Bu]-, (MeO)-Ln-C$_5$H$_3$-1-Me-3-[(C$^i$Pr$_2$)$_2$—N$^i$Bu]-, (EtO)-Ln-C$_5$H$_3$-1-Me-3-[(C$^i$Pr$_2$)$_2$—N$^i$Bu]-, ($^n$PrO)-Ln-C$_5$H$_3$-1-Me-3-[(C$^i$Pr$_2$)$_2$—N$^i$Bu]-, ($^i$PrO)-Ln-C$_5$H$_3$-1-Me-3-[(C$^i$Pr$_2$)$_2$—N$^i$Bu]-, ($^n$BuO)-Ln-C$_5$H$_3$-1-Me-3-[(C$^i$Pr$_2$)$_2$—N$^i$Bu]-, ($^i$BuO)-Ln-C$_5$H$_3$-1-Me-3-[(C$^i$Pr$_2$)$_2$—N$^i$Bu]-, ($^s$BuO)-Ln-C$_5$H$_3$-1-Me-3-[(C$^i$Pr$_2$)$_2$—N$^i$Bu]-, ($^t$BuO)-Ln-C$_5$H$_3$-1-Me-3-[(C$^i$Pr$_2$)$_2$—N$^i$Bu]-, (H$_2$N)-Ln-C$_5$H$_3$-1-Me-3-[(C$^i$Pr$_2$)$_2$—N$^s$Bu]-, (Me$_2$N)-Ln-C$_5$H$_3$-1-Me-3-[(C$^i$Pr$_2$)$_2$—N$^s$Bu]-, (Et$_2$N)-Ln-C$_5$H$_3$-1-Me-3-[(C$^i$Pr$_2$)$_2$—N$^s$Bu]-, ($^n$Pr$_2$N)-Ln-C$_5$H$_3$-1-Me-3-[(C$^i$Pr$_2$)$_2$—N$^s$Bu]-, ($^i$Pr$_2$N)-Ln-C$_5$H$_3$-1-Me-3-[(C$^i$Pr$_2$)$_2$—N$^s$Bu]-, ($^n$Bu$_2$N)-Ln-C$_5$H$_3$-1-Me-3-[(C$^i$Pr$_2$)$_2$—N$^s$Bu]-, ($^i$Bu$_2$N)-Ln-C$_5$H$_3$-1-Me-3-[(C$^i$Pr$_2$)$_2$—N$^s$Bu]-, ($^s$Bu$_2$N)-Ln-C$_5$H$_3$-1-Me-3-[(C$^i$Pr$_2$)$_2$—N$^s$Bu]-, ($^t$Bu$_2$N)-Ln-C$_5$H$_3$-1-Me-3-[(C$^i$Pr$_2$)$_2$—N$^s$Bu]-, (Cp)-Ln-C$_5$H$_3$-1-Me-3-[(C$^i$Pr$_2$)$_2$—N$^s$Bu]-, (HO)-Ln-C$_5$H$_3$-1-Me-3-[(C$^i$Pr$_2$)$_2$—N$^s$Bu]-, (MeO)-Ln-C$_5$H$_3$-1-Me-3-[(C$^i$Pr$_2$)$_2$—N$^s$Bu]-, (EtO)-Ln-C$_5$H$_3$-1-Me-3-[(C$^i$Pr$_2$)$_2$—N$^s$Bu]-, ($^n$PrO)-Ln-C$_5$H$_3$-1-Me-3-[(C$^i$Pr$_2$)$_2$—N$^s$Bu]-, ($^i$PrO)-Ln-C$_5$H$_3$-1-Me-3-[(C$^i$Pr$_2$)$_2$—N$^s$Bu]-, ($^n$BuO)-Ln-C$_5$H$_3$-1-Me-3-[(C$^i$Pr$_2$)$_2$—N$^s$Bu]-, ($^i$BuO)-Ln-C$_5$H$_3$-1-Me-3-[(C$^i$Pr$_2$)$_2$—N$^s$Bu]-, ($^s$BuO)-Ln-C$_5$H$_3$-1-Me-3-[(C$^i$Pr$_2$)$_2$—N$^s$Bu]-, ($^t$BuO)-Ln-C$_5$H$_3$-1-Me-3-[(C$^i$Pr$_2$)$_2$—N$^s$Bu]-, (H$_2$N)-Ln-C$_5$H$_3$-1-Me-3-[(C$^i$Pr$_2$)$_2$—N$^t$Bu]-, (Me$_2$N)-Ln-C$_5$H$_3$-1-Me-3-[(C$^i$Pr$_2$)$_2$—N$^t$Bu]-, (Et$_2$N)-Ln-C$_5$H$_3$-1-Me-3-[(C$^i$Pr$_2$)$_2$—N$^t$Bu]-, ($^n$Pr$_2$N)-Ln-C$_5$H$_3$-1-Me-3-[(C$^i$Pr$_2$)$_2$—N$^t$Bu]-, ($^i$Pr$_2$N)-Ln-C$_5$H$_3$-1-Me-3-[(C$^i$Pr$_2$)$_2$—N$^t$Bu]-, ($^n$Bu$_2$N)-Ln-C$_5$H$_3$-1-Me-3-[(C$^i$Pr$_2$)$_2$—N$^t$Bu]-, ($^i$Bu$_2$N)-Ln-C$_5$H$_3$-1-Me-3-[(C$^i$Pr$_2$)$_2$—N$^t$Bu]-, ($^s$Bu$_2$N)-Ln-C$_5$H$_3$-1-Me-3-[(C$^i$Pr$_2$)$_2$—N$^t$Bu]-, ($^t$Bu$_2$N)-Ln-C$_5$H$_3$-1-Me-3-[(C$^i$Pr$_2$)$_2$—N$^t$Bu]-, (Cp)-Ln-C$_5$H$_3$-1-Me-3-[(C$^i$Pr$_2$)$_2$—N$^t$Bu]-, (HO)-Ln-C$_5$H$_3$-1-Me-3-[(C$^i$Pr$_2$)$_2$—N$^t$Bu]-, (MeO)-Ln-C$_5$H$_3$-1-Me-3-[(C$^i$Pr$_2$)$_2$—N$^t$Bu]-, (EtO)-Ln-C$_5$H$_3$-1-Me-3-[(C$^i$Pr$_2$)$_2$—N$^t$Bu]-, ($^n$PrO)-Ln-C$_5$H$_3$-1-Me-3-[(C$^i$Pr$_2$)$_2$—N$^t$Bu]-, ($^i$PrO)-Ln-C$_5$H$_3$-1-Me-3-[(C$^i$Pr$_2$)$_2$—N$^t$Bu]-, ($^n$BuO)-Ln-C$_5$H$_3$-1-Me-3-[(C$^i$Pr$_2$)$_2$—N$^t$Bu]-, ($^i$BuO)-Ln-C$_5$H$_3$-1-Me-3-[(C$^i$Pr$_2$)$_2$—N$^t$Bu]-, ($^s$BuO)-Ln-C$_5$H$_3$-1-Me-3-[(C$^i$Pr$_2$)$_2$—N$^t$Bu]-, ($^t$BuO)-Ln-C$_5$H$_3$-1-Me-3-[(C$^i$Pr$_2$)$_2$—N$^t$Bu]-, (H$_2$N)-Ln-C$_5$H$_3$-1-Me-3-[(C$^i$Pr$_2$)$_2$—O]—, (Me$_2$N)-Ln-C$_5$H$_3$-1-Me-3-[(C$^i$Pr$_2$)$_2$—O]—, (Et$_2$N)-Ln-C$_5$H$_3$-1-Me-3-[(C$^i$Pr$_2$)$_2$—O]—, ($^n$Pr$_2$N)-Ln-C$_5$H$_3$-1-Me-3-[(C$^i$Pr$_2$)$_2$—O]—, ($^i$Pr$_2$N)-Ln-C$_5$H$_3$-1-Me-3-[(C$^i$Pr$_2$)$_2$—O]—, ($^n$Bu$_2$N)-Ln-C$_5$H$_3$-1-Me-3-[(C$^i$Pr$_2$)$_2$—O]—, ($^i$Bu$_2$N)-Ln-C$_5$H$_3$-1-Me-3-[(C$^i$Pr$_2$)$_2$—O]—, ($^s$Bu$_2$N)-Ln-C$_5$H$_3$-1-Me-3-[(C$^i$Pr$_2$)$_2$—O]—, ($^t$Bu$_2$N)-Ln-C$_5$H$_3$-1-Me-3-[(C$^i$Pr$_2$)$_2$—O]—, (Cp)-Ln-C$_5$H$_3$-1-Me-3-[(C$^i$Pr$_2$)$_2$—O]—, (HO)-Ln-C$_5$H$_3$-1-Me-3-[(C$^i$Pr$_2$)$_2$—O]—, (MeO)-Ln-C$_5$H$_3$-1-Me-3-[(C$^i$Pr$_2$)$_2$—O]—, (EtO)-Ln-C$_5$H$_3$-1-Me-3-[(C$^i$Pr$_2$)$_2$—O]—, ($^n$PrO)-Ln-C$_5$H$_3$-1-Me-3-[(C$^i$Pr$_2$)$_2$—O]—, ($^i$PrO)-Ln-C$_5$H$_3$-1-Me-3-[(C$^i$Pr$_2$)$_2$—O]—, ($^n$BuO)-Ln-C$_5$H$_3$-1-Me-3-[(C$^i$Pr$_2$)$_2$—O]—, ($^i$BuO)-Ln-C$_5$H$_3$-1-Me-3-[(C$^i$Pr$_2$)$_2$—O]—, ($^s$BuO)-Ln-C$_5$H$_3$-1-Me-3-[(C$^i$Pr$_2$)$_2$—O]—, ($^t$BuO)-Ln-C$_5$H$_3$-1-Me-3-[(C$^i$Pr$_2$)$_2$—O]—, (H$_2$N)-Ln-C$_5$H$_3$-1-Me-3-[(C$^t$Bu$_2$)$_2$-NH]—, (Me$_2$N)-Ln-C$_5$H$_3$-1-Me-3-[(C$^t$Bu$_2$)$_2$-NH]—, (Et$_2$N)-Ln-C$_5$H$_3$-1-Me-3-[(C$^t$Bu$_2$)$_2$-NH]—, ($^n$Pr$_2$N)-Ln-C$_5$H$_3$-1-Me-3-[(C$^t$Bu$_2$)$_2$-NH]—, ($^i$Pr$_2$N)-Ln-C$_5$H$_3$-1-Me-3-[(C$^t$Bu$_2$)$_2$-NH]—, ($^n$Bu$_2$N)-Ln-C$_5$H$_3$-1-Me-3-[(C$^t$Bu$_2$)$_2$-NH]—, ($^i$Bu$_2$N)-Ln-C$_5$H$_3$-1-Me-3-[(C$^t$Bu$_2$)$_2$-NH]—, ($^s$Bu$_2$N)-Ln-C$_5$H$_3$-1-Me-3-[(C$^t$Bu$_2$)$_2$-NH]—, ($^t$Bu$_2$N)-Ln-C$_5$H$_3$-1-Me-3-[(C$^t$Bu$_2$)$_2$-NH]—, (Cp)-Ln-C$_5$H$_3$-1-Me-3-[(C$^t$Bu$_2$)$_2$-NH]—, (HO)-Ln-C$_5$H$_3$-1-Me-3-[(C$^t$Bu$_2$)$_2$-NH]—, (MeO)-Ln-C$_5$H$_3$-1-Me-3-[(C$^t$Bu$_2$)$_2$-NH]—, (EtO)-Ln-C$_5$H$_3$-1-Me-3-[(C$^t$Bu$_2$)$_2$-NH]—, ($^n$PrO)-Ln-C$_5$H$_3$-1-Me-3-[(C$^t$Bu$_2$)$_2$-NH]—, ($^i$PrO)-Ln-C$_5$H$_3$-1-Me-3-[(C$^t$Bu$_2$)$_2$-NH]—, ($^n$BuO)-Ln-C$_5$H$_3$-1-Me-3-[(C$^t$Bu$_2$)$_2$-NH]—, ($^i$BuO)-Ln-C$_5$H$_3$-1-Me-3-[(C$^t$Bu$_2$)$_2$-NH]—, ($^s$BuO)-Ln-C$_5$H$_3$-1-Me-3-[(C$^t$Bu$_2$)$_2$-NH]—, ($^t$BuO)-Ln-C$_5$H$_3$-1-Me-3-[(C$^t$Bu$_2$)$_2$-NH]—, (H$_2$N)-Ln-C$_5$H$_3$-1-Me-3-[(C$^t$Bu$_2$)$_2$-NMe]-, (Me$_2$N)-Ln-C$_5$H$_3$-1-Me-3-[(C$^t$Bu$_2$)$_2$-NMe]-, (Et$_2$N)-Ln-C$_5$H$_3$-1-Me-3-[(C$^t$Bu$_2$)$_2$-NMe]-, ($^n$Pr$_2$N)-Ln-C$_5$H$_3$-1-Me-3-[(C$^t$Bu$_2$)$_2$-NMe]-, ($^i$Pr$_2$N)-Ln-C$_5$H$_3$-1-Me-3-[(C$^t$Bu$_2$)$_2$-NMe]-, ($^n$Bu$_2$N)-Ln-C$_5$H$_3$-1-Me-3-[(C$^t$Bu$_2$)$_2$-NMe]-, ($^i$Bu$_2$N)-Ln-C$_5$H$_3$-1-Me-3-[(C$^t$Bu$_2$)$_2$-NMe]-, ($^s$Bu$_2$N)-Ln-C$_5$H$_3$-1-Me-3-[(C$^t$Bu$_2$)$_2$-NMe]-, ($^t$Bu$_2$N)-Ln-C$_5$H$_3$-1-Me-3-[(C$^t$Bu$_2$)$_2$-NMe]-, (Cp)-Ln-C$_5$H$_3$-1-Me-3-[(C$^t$Bu$_2$)$_2$-NMe]-, (HO)-Ln-C$_5$H$_3$-1-Me-3-[(C$^t$Bu$_2$)$_2$-NMe]-, (MeO)-Ln-C$_5$H$_3$-1-Me-3-[(C$^t$Bu$_2$)$_2$-NMe]-, (EtO)-Ln-C$_5$H$_3$-1-Me-3-[(C$^t$Bu$_2$)$_2$-NMe]-, ($^n$PrO)-Ln-C$_5$H$_3$-1-Me-3-[(C$^t$Bu$_2$)$_2$-NMe]-, ($^i$PrO)-Ln-C$_5$H$_3$-1-Me-3-[(C$^t$Bu$_2$)$_2$-NMe]-, ($^n$BuO)-Ln-C$_5$H$_3$-1-Me-3-[(C$^t$Bu$_2$)$_2$-NMe]-, ($^i$BuO)-Ln-C$_5$H$_3$-1-Me-3-[(C$^t$Bu$_2$)$_2$-NMe]-, ($^s$BuO)-Ln-C$_5$H$_3$-1-Me-3-[(C$^t$Bu$_2$)$_2$-NMe]-, ($^t$BuO)-Ln-C$_5$H$_3$-1-Me-3-[(C$^t$Bu$_2$)$_2$-NMe]-, (H$_2$N)-Ln-C$_5$H$_3$-1-Me-3-[(C$^t$Bu$_2$)$_2$-NEt]-, (Me$_2$N)-Ln-C$_5$H$_3$-1-Me-3-[(C$^t$Bu$_2$)$_2$-NEt]-, (Et$_2$N)-Ln-C$_5$H$_3$-1-Me-3-[(C$^t$Bu$_2$)$_2$-NEt]-, ($^n$Pr$_2$N)-Ln-C$_5$H$_3$-1-Me-3-[(C$^t$Bu$_2$)$_2$-NEt]-, ($^i$Pr$_2$N)-Ln-C$_5$H$_3$-1-Me-3-[(C$^t$Bu$_2$)$_2$-NEt]-, ($^n$Bu$_2$N)-Ln-C$_5$H$_3$-1-Me-3-[(C$^t$Bu$_2$)$_2$-NEt]-, ($^i$Bu$_2$N)-Ln-C$_5$H$_3$-1-Me-3-[(C$^t$Bu$_2$)$_2$-NEt]-, ($^s$Bu$_2$N)-Ln-C$_5$H$_3$-1-Me-3-[(C$^t$Bu$_2$)$_2$-NEt]-, ($^t$Bu$_2$N)-Ln-C$_5$H$_3$-1-Me-3-[(C$^t$Bu$_2$)$_2$-NEt]-, (Cp)-Ln-C$_5$H$_3$-1-Me-3-[(C$^t$Bu$_2$)$_2$-NEt]-, (HO)-Ln-C$_5$H$_3$-1-Me-3-[(C$^t$Bu$_2$)$_2$-NEt]-, (MeO)-Ln-C$_5$H$_3$-1-Me-3-[(C$^t$Bu$_2$)$_2$-NEt]-, (EtO)-Ln-C$_5$H$_3$-1-Me-3-[(C$^t$Bu$_2$)$_2$-NEt]-, ($^n$PrO)-Ln-C$_5$H$_3$-1-Me-3-[(C$^t$Bu$_2$)$_2$-NEt]-, ($^i$PrO)-Ln-C$_5$H$_3$-1-Me-3-[(C$^t$Bu$_2$)$_2$-NEt]-, ($^n$BuO)-Ln-C$_5$H$_3$-1-Me-3-[(C$^t$Bu$_2$)$_2$-NEt]-, ($^i$BuO)-Ln-C$_5$H$_3$-1-Me-3-[(C$^t$Bu$_2$)$_2$-NEt]-, ($^s$BuO)-Ln-C$_5$H$_3$-1-Me-3-[(C$^t$Bu$_2$)$_2$-NEt]-, ($^t$BuO)-Ln-C$_5$H$_3$-1-Me-3-[(C$^t$Bu$_2$)$_2$-NEt]-, (H$_2$N)-Ln-C$_5$H$_3$-1-Me-3-[(C$^t$Bu$_2$)$_2$-N$^n$Pr]—, (Me$_2$N)-Ln-C$_5$H$_3$-1-Me-3-[(C$^t$Bu$_2$)$_2$-N$^n$Pr]—, (Et$_2$N)-Ln-C$_5$H$_3$-1-Me-3-[(C$^t$Bu$_2$)$_2$-N$^n$Pr]—, ($^n$Pr$_2$N)-Ln-C$_5$H$_3$-1-Me-3-[(C$^t$Bu$_2$)$_2$-N$^n$Pr]—, ($^i$Pr$_2$N)-Ln-C$_5$H$_3$-1-Me-3-[(C$^t$Bu$_2$)$_2$-N$^n$Pr]—, (″Bu₂N)-Ln-C₅H₃-1-Me-3-[(CʳBu₂)₂-N″Pr]—, (ⁱBu₂N)-Ln-C₅H₃-1-Me-3-[(CʳBu₂)₂-N″Pr]—, (ˢBu₂N)-Ln-C₅H₃-1-Me-3-[(CʳBu₂)₂-N″Pr]—, (ᵗBu₂N)-Ln-C₅H₃-1-Me-3-[(CʳBu₂)₂-N″Pr]—, (Cp)-Ln-C₅H₃-1-Me-3-[(CʳBu₂)₂-N″Pr]—, (HO)-Ln-C₅H₃-1-Me-3-[(CʳBu₂)₂-N″Pr]—, (MeO)-Ln-C₅H₃-1-Me-3-[(CʳBu₂)₂-N″Pr]—, (EtO)-Ln-C₅H₃-1-Me-3-[(CʳBu₂)₂-N″Pr]—, (ⁿPrO)-Ln-C₅H₃-1-Me-3-[(CʳBu₂)₂-N″Pr]—, (ⁱPrO)-Ln-C₅H₃-1-Me-3-[(CʳBu₂)₂-N″Pr]—, (″BuO)-Ln-C₅H₃-1-Me-3-[(CʳBu₂)₂-N″Pr]—, (ⁱBuO)-Ln-C₅H₃-1-Me-3-[(CʳBu₂)₂-N″Pr]—, (ˢBuO)-Ln-C₅H₃-1-Me-3-[(CʳBu₂)₂-N″Pr]—, (ᵗBuO)-Ln-C₅H₃-1-Me-3-[(CʳBu₂)₂-N″Pr]—, (H₂N)-Ln-C₅H₃-1-Me-3-[(CʳBu₂)₂-NⁱPr]—, (Me₂N)-Ln-C₅H₃-1-Me-3-[(CʳBu₂)₂-NⁱPr]—, (Et₂N)-Ln-C₅H₃-1-Me-3-[(CʳBu₂)₂-NⁱPr]—, (ⁿPr₂N)-Ln-C₅H₃-1-Me-3-[(CʳBu₂)₂-NⁱPr]—, (ⁱPr₂N)-Ln-C₅H₃-1-Me-3-[(CʳBu₂)₂-NⁱPr]—, (″Bu₂N)-Ln-C₅H₃-1-Me-3-[(CʳBu₂)₂-NⁱPr]—, (ⁱBu₂N)-Ln-C₅H₃-1-Me-3-[(CʳBu₂)₂-NⁱPr]—, (ˢBu₂N)-Ln-C₅H₃-1-Me-3-[(CʳBu₂)₂-NⁱPr]—, (ᵗBu₂N)-Ln-C₅H₃-1-Me-3-[(CʳBu₂)₂-NⁱPr]—, (Cp)-Ln-C₅H₃-1-Me-3-[(CʳBu₂)₂-NⁱPr]—, (HO)-Ln-C₅H₃-1-Me-3-[(CʳBu₂)₂-NⁱPr]—, (MeO)-Ln-C₅H₃-1-Me-3-[(CʳBu₂)₂-NⁱPr]—, (EtO)-Ln-C₅H₃-1-Me-3-[(CʳBu₂)₂-NⁱPr]—, (ⁿPrO)-Ln-C₅H₃-1-Me-3-[(CʳBu₂)₂-NⁱPr]—, (ⁱPrO)-Ln-C₅H₃-1-Me-3-[(CʳBu₂)₂-NⁱPr]—, (″BuO)-Ln-C₅H₃-1-Me-3-[(CʳBu₂)₂-NⁱPr]—, (ⁱBuO)-Ln-C₅H₃-1-Me-3-[(CʳBu₂)₂-NⁱPr]—, (ˢBuO)-Ln-C₅H₃-1-Me-3-[(CʳBu₂)₂-NⁱPr]—, (ᵗBuO)-Ln-C₅H₃-1-Me-3-[(CʳBu₂)₂-NⁱPr]—, (H₂N)-Ln-C₅H₃-1-Me-3-[(CʳBu₂)₂-N″Bu]-, (Me₂N)-Ln-C₅H₃-1-Me-3-[(CʳBu₂)₂-N″Bu]-, (Et₂N)-Ln-C₅H₃-1-Me-3-[(CʳBu₂)₂-N″Bu]-, (ⁿPr₂N)-Ln-C₅H₃-1-Me-3-[(CʳBu₂)₂-N″Bu]-, (ⁱPr₂N)-Ln-C₅H₃-1-Me-3-[(CʳBu₂)₂-N″Bu]-, (″Bu₂N)-Ln-C₅H₃-1-Me-3-[(CʳBu₂)₂-N″Bu]-, (ⁱBu₂N)-Ln-C₅H₃-1-Me-3-[(CʳBu₂)₂-N″Bu]-, (ˢBu₂N)-Ln-C₅H₃-1-Me-3-[(CʳBu₂)₂-N″Bu]-, (ᵗBu₂N)-Ln-C₅H₃-1-Me-3-[(CʳBu₂)₂-N″Bu]-, (Cp)-Ln-C₅H₃-1-Me-3-[(CʳBu₂)₂-N″Bu]-, (HO)-Ln-C₅H₃-1-Me-3-[(CʳBu₂)₂-N″Bu]-, (MeO)-Ln-C₅H₃-1-Me-3-[(CʳBu₂)₂-N″Bu]-, (EtO)-Ln-C₅H₃-1-Me-3-[(CʳBu₂)₂-N″Bu]-, (ⁿPrO)-Ln-C₅H₃-1-Me-3-[(CʳBu₂)₂-N″Bu]-, (ⁱPrO)-Ln-C₅H₃-1-Me-3-[(CʳBu₂)₂-N″Bu]-, (″BuO)-Ln-C₅H₃-1-Me-3-[(CʳBu₂)₂-N″Bu]-, (ⁱBuO)-Ln-C₅H₃-1-Me-3-[(CʳBu₂)₂-N″Bu]-, (ˢBuO)-Ln-C₅H₃-1-Me-3-[(CʳBu₂)₂-N″Bu]-, (ᵗBuO)-Ln-C₅H₃-1-Me-3-[(CʳBu₂)₂-N″Bu]-, (H₂N)-Ln-C₅H₃-1-Me-3-[(CʳBu₂)₂-NⁱBu]-, (Me₂N)-Ln-C₅H₃-1-Me-3-[(CʳBu₂)₂-NⁱBu]-, (Et₂N)-Ln-C₅H₃-1-Me-3-[(CʳBu₂)₂-NⁱBu]-, (ⁿPr₂N)-Ln-C₅H₃-1-Me-3-[(CʳBu₂)₂-NⁱBu]-, (ⁱPr₂N)-Ln-C₅H₃-1-Me-3-[(CʳBu₂)₂-NⁱBu]-, (″Bu₂N)-Ln-C₅H₃-1-Me-3-[(CʳBu₂)₂-NⁱBu]-, (ⁱBu₂N)-Ln-C₅H₃-1-Me-3-[(CʳBu₂)₂-NⁱBu]-, (ˢBu₂N)-Ln-C₅H₃-1-Me-3-[(CʳBu₂)₂-NⁱBu]-, (ᵗBu₂N)-Ln-C₅H₃-1-Me-3-[(CʳBu₂)₂-NⁱBu]-, (Cp)-Ln-C₅H₃-1-Me-3-[(CʳBu₂)₂-NⁱBu]-, (HO)-Ln-C₅H₃-1-Me-3-[(CʳBu₂)₂-NⁱBu]-, (MeO)-Ln-C₅H₃-1-Me-3-[(CʳBu₂)₂-NⁱBu]-, (EtO)-Ln-C₅H₃-1-Me-3-[(CʳBu₂)₂-NⁱBu]-, (ⁿPrO)-Ln-C₅H₃-1-Me-3-[(CʳBu₂)₂-NⁱBu]-, (ⁱPrO)-Ln-C₅H₃-1-Me-3-[(CʳBu₂)₂-NⁱBu]-, (″BuO)-Ln-C₅H₃-1-Me-3-[(CʳBu₂)₂-NⁱBu]-, (ⁱBuO)-Ln-C₅H₃-1-Me-3-[(CʳBu₂)₂-NⁱBu]-, (ˢBuO)-Ln-C₅H₃-1-Me-3-[(CʳBu₂)₂-NⁱBu]-, (ᵗBuO)-Ln-C₅H₃-1-Me-3-[(CʳBu₂)₂-NⁱBu]-, (H₂N)-Ln-C₅H₃-1-Me-3-[(CʳBu₂)₂-NˢBu]-, (Me₂N)-Ln-C₅H₃-1-Me-3-[(CʳBu₂)₂-NˢBu]-, (Et₂N)-Ln-C₅H₃-1-Me-3-[(CʳBu₂)₂-NˢBu]-, (ⁿPr₂N)-Ln-C₅H₃-1-Me-3-[(CʳBu₂)₂-NˢBu]-, (ⁱPr₂N)-Ln-C₅H₃-1-Me-3-[(CʳBu₂)₂-NˢBu]-, (″Bu₂N)-Ln-C₅H₃-1-Me-3-[(CʳBu₂)₂-NˢBu]-, (ⁱBu₂N)-Ln-C₅H₃-1-Me-3-[(CʳBu₂)₂-NˢBu]-, (ˢBu₂N)-Ln-C₅H₃-1-Me-3-[(CʳBu₂)₂-NˢBu]-, (ᵗBu₂N)-Ln-C₅H₃-1-Me-3-[(CʳBu₂)₂-NˢBu]-, (Cp)-Ln-C₅H₃-1-Me-3-[(CʳBu₂)₂-NˢBu]-, (HO)-Ln-C₅H₃-1-Me-3-[(CʳBu₂)₂-NˢBu]-, (MeO)-Ln-C₅H₃-1-Me-3-[(CʳBu₂)₂-NˢBu]-, (EtO)-Ln-C₅H₃-1-Me-3-[(CʳBu₂)₂-NˢBu]-, (ⁿPrO)-Ln-C₅H₃-1-Me-3-[(CʳBu₂)₂-NˢBu]-, (ⁱPrO)-Ln-C₅H₃-1-Me-3-[(CʳBu₂)₂-NˢBu]-, (″BuO)-Ln-C₅H₃-1-Me-3-[(CʳBu₂)₂-NˢBu]-, (ⁱBuO)-Ln-C₅H₃-1-Me-3-[(CʳBu₂)₂-NˢBu]-, (ˢBuO)-Ln-C₅H₃-1-Me-3-[(CʳBu₂)₂-NˢBu]-, (ᵗBuO)-Ln-C₅H₃-1-Me-3-[(CʳBu₂)₂-NˢBu]-, (H₂N)-Ln-C₅H₃-1-Me-3-[(CʳBu₂)₂-NᵗBu]-, (Me₂N)-Ln-C₅H₃-1-Me-3-[(CʳBu₂)₂-NᵗBu]-, (Et₂N)-Ln-C₅H₃-1-Me-3-[(CʳBu₂)₂-NᵗBu]-, (ⁿPr₂N)-Ln-C₅H₃-1-Me-3-[(CʳBu₂)₂-NᵗBu]-, (ⁱPr₂N)-Ln-C₅H₃-1-Me-3-[(CʳBu₂)₂-NᵗBu]-, (″Bu₂N)-Ln-C₅H₃-1-Me-3-[(CʳBu₂)₂-NᵗBu]-, (ⁱBu₂N)-Ln-C₅H₃-1-Me-3-[(CʳBu₂)₂-NᵗBu]-, (ˢBu₂N)-Ln-C₅H₃-1-Me-3-[(CʳBu₂)₂-NᵗBu]-, (ᵗBu₂N)-Ln-C₅H₃-1-Me-3-[(CʳBu₂)₂-NᵗBu]-, (Cp)-Ln-C₅H₃-1-Me-3-[(CʳBu₂)₂-NᵗBu]-, (HO)-Ln-C₅H₃-1-Me-3-[(CʳBu₂)₂-NᵗBu]-, (MeO)-Ln-C₅H₃-1-Me-3-[(CʳBu₂)₂-NᵗBu]-, (EtO)-Ln-C₅H₃-1-Me-3-[(CʳBu₂)₂-NᵗBu]-, (ⁿPrO)-Ln-C₅H₃-1-Me-3-[(CʳBu₂)₂-NᵗBu]-, (ⁱPrO)-Ln-C₅H₃-1-Me-3-[(CʳBu₂)₂-NᵗBu]-, (″BuO)-Ln-C₅H₃-1-Me-3-[(CʳBu₂)₂-NᵗBu]-, (ⁱBuO)-Ln-C₅H₃-1-Me-3-[(CʳBu₂)₂-NᵗBu]-, (ˢBuO)-Ln-C₅H₃-1-Me-3-[(CʳBu₂)₂-NᵗBu]-, (ᵗBuO)-Ln-C₅H₃-1-Me-3-[(CʳBu₂)₂-NᵗBu]-, (H₂N)-Ln-C₅H₃-1-Me-3-[(CʳBu₂)₂-O]—, (Me₂N)-Ln-C₅H₃-1-Me-3-[(CʳBu₂)₂-O]—, (Et₂N)-Ln-C₅H₃-1-Me-3-[(CʳBu₂)₂-O]—, (ⁿPr₂N)-Ln-C₅H₃-1-Me-3-[(CʳBu₂)₂-O]—, (ⁱPr₂N)-Ln-C₅H₃-1-Me-3-[(CʳBu₂)₂-O]—, (″Bu₂N)-Ln-C₅H₃-1-Me-3-[(CʳBu₂)₂-O]—, (ⁱBu₂N)-Ln-C₅H₃-1-Me-3-[(CʳBu₂)₂-O]—, (ˢBu₂N)-Ln-C₅H₃-1-Me-3-[(CʳBu₂)₂-O]—, (ᵗBu₂N)-Ln-C₅H₃-1-Me-3-[(CʳBu₂)₂-O]—, (Cp)-Ln-C₅H₃-1-Me-3-[(CʳBu₂)₂-O]—, (HO)-Ln-C₅H₃-1-Me-3-[(CʳBu₂)₂-O]—, (MeO)-Ln-C₅H₃-1-Me-3-[(CʳBu₂)₂-O]—, (EtO)-Ln-C₅H₃-1-Me-3-[(CʳBu₂)₂-O]—, (ⁿPrO)-Ln-C₅H₃-1-Me-3-[(CʳBu₂)₂-O]—, (ⁱPrO)-Ln-C₅H₃-1-Me-3-[(CʳBu₂)₂-O]—, (″BuO)-Ln-C₅H₃-1-Me-3-[(CʳBu₂)₂-O]—, (ⁱBuO)-Ln-C₅H₃-1-Me-3-[(CʳBu₂)₂-O]—, (ˢBuO)-Ln-C₅H₃-1-Me-3-[(CʳBu₂)₂-O]—, (ᵗBuO)-Ln-C₅H₃-1-Me-3-[(CʳBu₂)₂-O]—, (H₂N)-Ln-C₅H₃-1-ⁱPr-3-[(CH₂)₂—NH]—, (Me₂N)-Ln-C₅H₃-1-ⁱPr-3-[(CH₂)₂—NH]—, (Et₂N)-Ln-C₅H₃-1-ⁱPr-3-[(CH₂)₂—NH]—, (ⁿPr₂N)-Ln-C₅H₃-1-ⁱPr-3-[(CH₂)₂—NH]—, (ⁱPr₂N)-Ln-C₅H₃-1-ⁱPr-3-[(CH₂)₂—NH]—, (″Bu₂N)-Ln-C₅H₃-1-ⁱPr-3-[(CH₂)₂—NH]—, (ⁱBu₂N)-Ln-C₅H₃-1-ⁱPr-3-[(CH₂)₂—NH]—, (ˢBu₂N)-Ln-C₅H₃-1-ⁱPr-3-[(CH₂)₂—NH]—, (ᵗBu₂N)-Ln-C₅H₃-1-ⁱPr-3-[(CH₂)₂—NH]—, (Cp)-Ln-C₅H₃-1-ⁱPr-3-[(CH₂)₂—NH]—, (HO)-Ln-C₅H₃-1-ⁱPr-3-[(CH₂)₂—NH]—, (MeO)-Ln-C₅H₃-1-ⁱPr-3-[(CH₂)₂—NH]—, (EtO)-Ln-C₅H₃-1-ⁱPr-3-[(CH₂)₂—NH]—, (ⁿPrO)-Ln-C₅H₃-1-ⁱPr-3-[(CH₂)₂—NH]—, (ⁱPrO)-Ln-C₅H₃-1-ⁱPr-3-[(CH₂)₂—NH]—, (″BuO)-Ln-C₅H₃-1-ⁱPr-3-[(CH₂)₂—NH]—, (ⁱBuO)-Ln-C₅H₃-1-ⁱPr-3-[(CH₂)₂—NH]—, (ˢBuO)-Ln-C₅H₃-1-ⁱPr-3-[(CH₂)₂—NH]—, (ᵗBuO)-Ln-C₅H₃-1-ⁱPr-3-[(CH₂)₂—NH]—, (H₂N)-Ln-C₅H₃-1-ⁱPr-3-[(CH₂)₂—NMe]-, (Me₂N)-Ln-C₅H₃-1-ⁱPr-3-[(CH₂)₂—NMe]-, (Et₂N)-Ln-C₅H₃-1-ⁱPr-3-[(CH₂)₂—NMe]-, (ⁿPr₂N)-Ln-C₅H₃-1-ⁱPr-3-[(CH₂)₂—NMe]-, (ⁱPr₂N)-Ln-C₅H₃-1-ⁱPr-3-[(CH₂)₂—NMe]-, (″Bu₂N)-Ln-C₅H₃-1-ⁱPr-3-[(CH₂)₂—NMe]-, (ⁱBu₂N)-Ln-C₅H₃-1-ⁱPr-3-[(CH₂)₂—NMe]-, (ˢBu₂N)-Ln-C₅H₃-1-ⁱPr-3-[(CH₂)₂—NMe]-, (ᵗBu₂N)-Ln-C₅H₃-1-ⁱPr-3-[(CH₂)₂—NMe]-, (Cp)-Ln-C₅H₃-1-ⁱPr-3-[(CH₂)₂—NMe]-, (HO)-Ln-C₅H₃-1-ⁱPr-3-[(CH₂)₂—NMe]-, (MeO)-Ln-C₅H₃-1-ⁱPr-3-[(CH₂)₂—NMe]-, (EtO)-Ln-C₅H₃-1-ⁱPr-3-[(CH₂)₂—NMe]-, (ⁿPrO)-Ln-C₅H₃-1-ⁱPr-3-[(CH₂)₂—NMe]-, (ⁱPrO)-Ln-C₅H₃-1-ⁱPr-3-[(CH₂)₂—NMe]-, (″BuO)-Ln-C₅H₃-1-ⁱPr-3-[(CH₂)₂—NMe]-, (ⁱBuO)-Ln-C₅H₃-1-ⁱPr-3-[(CH₂)₂—NMe]-, (ˢBuO)-Ln-C₅H₃-1-ⁱPr-3-[(CH₂)₂—NMe]-, (ᵗBuO)-Ln-C₅H₃-1-ⁱPr-3-[(CH₂)₂—NMe]-, (H₂N)-Ln-C₅H₃-1-ⁱPr-3-[(CH₂)₂—NEt]-, (Me₂N)-Ln-C₅H₃-1-ⁱPr-3-[(CH₂)₂—NEt]-, (Et₂N)-Ln-C₅H₃-1-ⁱPr-3-[(CH₂)₂—NEt]-, (ⁿPr₂N)-Ln-C₅H₃-1-ⁱPr-3-[(CH₂)₂—NEt]-, (ⁱPr₂N)-Ln-C₅H₃-1-ⁱPr-3-[(CH₂)₂—NEt]-, (″Bu₂N)-Ln-C₅H₃-1-ⁱPr-3-[(CH₂)₂—NEt]-, (ⁱBu₂N)-Ln-C₅H₃-1-ⁱPr-3-[(CH₂)₂—

NEt]-, (ˢBu₂N)-Ln-C₅H₃-1-ⁱPr-3-[(CH₂)₂—NEt]-, (ᵗBu₂N)-Ln-C₅H₃-1-ⁱPr-3-[(CH₂)₂—NEt]-, (Cp)-Ln-C₅H₃-1-ⁱPr-3-[(CH₂)₂—NEt]-, (HO)-Ln-C₅H₃-1-ⁱPr-3-[(CH₂)₂—NEt]-, (MeO)-Ln-C₅H₃-1-ⁱPr-3-[(CH₂)₂—NEt]-, (EtO)-Ln-C₅H₃-1-ⁱPr-3-[(CH₂)₂—NEt]-, (ⁿPrO)-Ln-C₅H₃-1-ⁱPr-3-[(CH₂)₂—NEt]-, (ⁱPrO)-Ln-C₅H₃-1-ⁱPr-3-[(CH₂)₂—NEt]-, (ⁿBuO)-Ln-C₅H₃-1-ⁱPr-3-[(CH₂)₂—NEt]-, (ⁱBuO)-Ln-C₅H₃-1-ⁱPr-3-[(CH₂)₂—NEt]-, (ˢBuO)-Ln-C₅H₃-1-ⁱPr-3-[(CH₂)₂—NEt]-, (ᵗBuO)-Ln-C₅H₃-1-ⁱPr-3-[(CH₂)₂—NEt]-, (H₂N)-Ln-C₅H₃-1-ⁱPr-3-[(CH₂)₂—Nⁿ Pr]—, (Me₂N)-Ln-C₅H₃-1-ⁱPr-3-[(CH₂)₂—Nⁿ Pr]—, (Et₂N)-Ln-C₅H₃-1-ⁱPr-3-[(CH₂)₂—Nⁿ Pr]—, (ⁿPr₂N)-Ln-C₅H₃-1-ⁱPr-3-[(CH₂)₂—Nⁿ Pr]—, (ⁱPr₂N)-Ln-C₅H₃-1-ⁱPr-3-[(CH₂)₂—Nⁿ Pr]—, (ⁿBu₂N)-Ln-C₅H₃-1-ⁱPr-3-[(CH₂)₂—Nⁿ Pr]—, (ⁱBu₂N)-Ln-C₅H₃-1-ⁱPr-3-[(CH₂)₂—Nⁿ Pr]—, (ˢBu₂N)-Ln-C₅H₃-1-ⁱPr-3-[(CH₂)₂—Nⁿ Pr]—, (ᵗBu₂N)-Ln-C₅H₃-1-ⁱPr-3-[(CH₂)₂—Nⁿ Pr]—, (Cp)-Ln-C₅H₃-1-ⁱPr-3-[(CH₂)₂—Nⁿ Pr]—, (HO)-Ln-C₅H₃-1-ⁱPr-3-[(CH₂)₂—Nⁿ Pr]—, (MeO)-Ln-C₅H₃-1-ⁱPr-3-[(CH₂)₂—Nⁿ Pr]—, (EtO)-Ln-C₅H₃-1-ⁱPr-3-[(CH₂)₂—Nⁿ Pr]—, (ⁿPrO)-Ln-C₅H₃-1-ⁱPr-3-[(CH₂)₂—Nⁿ Pr]—, (ⁱPrO)-Ln-C₅H₃-1-ⁱPr-3-[(CH₂)₂—Nⁿ Pr]—, (ⁿBuO)-Ln-C₅H₃-1-ⁱPr-3-[(CH₂)₂—Nⁿ Pr]—, (ⁱBuO)-Ln-C₅H₃-1-ⁱPr-3-[(CH₂)₂—Nⁿ Pr]—, (ˢBuO)-Ln-C₅H₃-1-ⁱPr-3-[(CH₂)₂—Nⁿ Pr]—, (ᵗBuO)-Ln-C₅H₃-1-ⁱPr-3-[(CH₂)₂—Nⁿ Pr]—, (H₂N)-Ln-C₅H₃-1-ⁱPr-3-[(CH₂)₂—Nⁱ Pr]—, (Me₂N)-Ln-C₅H₃-1-ⁱPr-3-[(CH₂)₂—Nⁱ Pr]—, (Et₂N)-Ln-C₅H₃-1-ⁱPr-3-[(CH₂)₂—Nⁱ Pr]—, (ⁿPr₂N)-Ln-C₅H₃-1-ⁱPr-3-[(CH₂)₂—Nⁱ Pr]—, (ⁱPr₂N)-Ln-C₅H₃-1-ⁱPr-3-[(CH₂)₂—Nⁱ Pr]—, (ⁿBu₂N)-Ln-C₅H₃-1-ⁱPr-3-[(CH₂)₂—Nⁱ Pr]—, (ⁱBu₂N)-Ln-C₅H₃-1-ⁱPr-3-[(CH₂)₂—Nⁱ Pr]—, (ˢBu₂N)-Ln-C₅H₃-1-ⁱPr-3-[(CH₂)₂—Nⁱ Pr]—, (ᵗBu₂N)-Ln-C₅H₃-1-ⁱPr-3-[(CH₂)₂—Nⁱ Pr]—, (Cp)-Ln-C₅H₃-1-ⁱPr-3-[(CH₂)₂—Nⁱ Pr]—, (HO)-Ln-C₅H₃-1-ⁱPr-3-[(CH₂)₂—Nⁱ Pr]—, (MeO)-Ln-C₅H₃-1-ⁱPr-3-[(CH₂)₂—Nⁱ Pr]—, (EtO)-Ln-C₅H₃-1-ⁱPr-3-[(CH₂)₂—Nⁱ Pr]—, (ⁿPrO)-Ln-C₅H₃-1-ⁱPr-3-[(CH₂)₂—Nⁱ Pr]—, (ⁱPrO)-Ln-C₅H₃-1-ⁱPr-3-[(CH₂)₂—Nⁱ Pr]—, (ⁿBuO)-Ln-C₅H₃-1-ⁱPr-3-[(CH₂)₂—Nⁱ Pr]—, (ⁱBuO)-Ln-C₅H₃-1-ⁱPr-3-[(CH₂)₂—Nⁱ Pr]—, (ˢBuO)-Ln-C₅H₃-1-ⁱPr-3-[(CH₂)₂—Nⁱ Pr]—, (ᵗBuO)-Ln-C₅H₃-1-ⁱPr-3-[(CH₂)₂—Nⁱ Pr]—, (H₂N)-Ln-C₅H₃-1-ⁱPr-3-[(CH₂)₂—Nⁿ Bu]-, (Me₂N)-Ln-C₅H₃-1-ⁱPr-3-[(CH₂)₂—Nⁿ Bu]-, (Et₂N)-Ln-C₅H₃-1-ⁱPr-3-[(CH₂)₂—Nⁿ Bu]-, (ⁿPr₂N)-Ln-C₅H₃-1-ⁱPr-3-[(CH₂)₂—Nⁿ Bu]-, (ⁱPr₂N)-Ln-C₅H₃-1-ⁱPr-3-[(CH₂)₂—Nⁿ Bu]-, (ⁿBu₂N)-Ln-C₅H₃-1-ⁱPr-3-[(CH₂)₂—Nⁿ Bu]-, (ⁱBu₂N)-Ln-C₅H₃-1-ⁱPr-3-[(CH₂)₂—Nⁿ Bu]-, (ˢBu₂N)-Ln-C₅H₃-1-ⁱPr-3-[(CH₂)₂—Nⁿ Bu]-, (ᵗBu₂N)-Ln-C₅H₃-1-ⁱPr-3-[(CH₂)₂—Nⁿ Bu]-, (Cp)-Ln-C₅H₃-1-ⁱPr-3-[(CH₂)₂—Nⁿ Bu]-, (HO)-Ln-C₅H₃-1-ⁱPr-3-[(CH₂)₂—Nⁿ Bu]-, (MeO)-Ln-C₅H₃-1-ⁱPr-3-[(CH₂)₂—Nⁿ Bu]-, (EtO)-Ln-C₅H₃-1-ⁱPr-3-[(CH₂)₂—Nⁿ Bu]-, (ⁿPrO)-Ln-C₅H₃-1-ⁱPr-3-[(CH₂)₂—Nⁿ Bu]-, (ⁱPrO)-Ln-C₅H₃-1-ⁱPr-3-[(CH₂)₂—Nⁿ Bu]-, (ⁿBuO)-Ln-C₅H₃-1-ⁱPr-3-[(CH₂)₂—Nⁿ Bu]-, (ⁱBuO)-Ln-C₅H₃-1-ⁱPr-3-[(CH₂)₂—Nⁿ Bu]-, (ˢBuO)-Ln-C₅H₃-1-ⁱPr-3-[(CH₂)₂—Nⁿ Bu]-, (ᵗBuO)-Ln-C₅H₃-1-ⁱPr-3-[(CH₂)₂—Nⁿ Bu]-, (H₂N)-Ln-C₅H₃-1-ⁱPr-3-[(CH₂)₂—Nⁱ Bu]-, (Me₂N)-Ln-C₅H₃-1-ⁱPr-3-[(CH₂)₂—Nⁱ Bu]-, (Et₂N)-Ln-C₅H₃-1-ⁱPr-3-[(CH₂)₂—Nⁱ Bu]-, (ⁿPr₂N)-Ln-C₅H₃-1-ⁱPr-3-[(CH₂)₂—Nⁱ Bu]-, (ⁱPr₂N)-Ln-C₅H₃-1-ⁱPr-3-[(CH₂)₂—Nⁱ Bu]-, (ⁿBu₂N)-Ln-C₅H₃-1-ⁱPr-3-[(CH₂)₂—Nⁱ Bu]-, (ⁱBu₂N)-Ln-C₅H₃-1-ⁱPr-3-[(CH₂)₂—Nⁱ Bu]-, (ˢBu₂N)-Ln-C₅H₃-1-ⁱPr-3-[(CH₂)₂—Nⁱ Bu]-, (ᵗBu₂N)-Ln-C₅H₃-1-ⁱPr-3-[(CH₂)₂—Nⁱ Bu]-, (Cp)-Ln-C₅H₃-1-ⁱPr-3-[(CH₂)₂—Nⁱ Bu]-, (HO)-Ln-C₅H₃-1-ⁱPr-3-[(CH₂)₂—Nⁱ Bu]-, (MeO)-Ln-C₅H₃-1-ⁱPr-3-[(CH₂)₂—Nⁱ Bu]-, (EtO)-Ln-C₅H₃-1-ⁱPr-3-[(CH₂)₂—Nⁱ Bu]-, (ⁿPrO)-Ln-C₅H₃-1-ⁱPr-3-[(CH₂)₂—Nⁱ Bu]-, (ⁱPrO)-Ln-C₅H₃-1-ⁱPr-3-[(CH₂)₂—Nⁱ Bu]-, (ⁿBuO)-Ln-C₅H₃-1-ⁱPr-3-[(CH₂)₂—Nⁱ Bu]-, (ⁱBuO)-Ln-C₅H₃-1-ⁱPr-3-[(CH₂)₂—Nⁱ Bu]-, (ˢBuO)-Ln-C₅H₃-1-ⁱPr-3-[(CH₂)₂—Nⁱ Bu]-, (ᵗBuO)-Ln-C₅H₃-1-ⁱPr-3-[(CH₂)₂—Nⁱ Bu]-, (H₂N)-Ln-C₅H₃-1-ⁱPr-3-[(CH₂)₂—Nˢ Bu]-, (Me₂N)-Ln-C₅H₃-1-ⁱPr-3-[(CH₂)₂—Nˢ Bu]-, (Et₂N)-Ln-C₅H₃-1-ⁱPr-3-[(CH₂)₂—Nˢ Bu]-, (ⁿPr₂N)-Ln-C₅H₃-1-ⁱPr-3-[(CH₂)₂—Nˢ Bu]-, (ⁱPr₂N)-Ln-C₅H₃-1-ⁱPr-3-[(CH₂)₂—Nˢ Bu]-, (ⁿBu₂N)-Ln-C₅H₃-1-ⁱPr-3-[(CH₂)₂—Nˢ Bu]-, (ⁱBu₂N)-Ln-C₅H₃-1-ⁱPr-3-[(CH₂)₂—Nˢ Bu]-, (ˢBu₂N)-Ln-C₅H₃-1-ⁱPr-3-[(CH₂)₂—Nˢ Bu]-, (ᵗBu₂N)-Ln-C₅H₃-1-ⁱPr-3-[(CH₂)₂—Nˢ Bu]-, (Cp)-Ln-C₅H₃-1-ⁱPr-3-[(CH₂)₂—Nˢ Bu]-, (HO)-Ln-C₅H₃-1-ⁱPr-3-[(CH₂)₂—Nˢ Bu]-, (MeO)-Ln-C₅H₃-1-ⁱPr-3-[(CH₂)₂—Nˢ Bu]-, (EtO)-Ln-C₅H₃-1-ⁱPr-3-[(CH₂)₂—Nˢ Bu]-, (ⁿPrO)-Ln-C₅H₃-1-ⁱPr-3-[(CH₂)₂—Nˢ Bu]-, (ⁱPrO)-Ln-C₅H₃-1-ⁱPr-3-[(CH₂)₂—Nˢ Bu]-, (ⁿBuO)-Ln-C₅H₃-1-ⁱPr-3-[(CH₂)₂—Nˢ Bu]-, (ⁱBuO)-Ln-C₅H₃-1-ⁱPr-3-[(CH₂)₂—Nˢ Bu]-, (ˢBuO)-Ln-C₅H₃-1-ⁱPr-3-[(CH₂)₂—Nˢ Bu]-, (ᵗBuO)-Ln-C₅H₃-1-ⁱPr-3-[(CH₂)₂—Nˢ Bu]-, (H₂N)-Ln-C₅H₃-1-ⁱPr-3-[(CH₂)₂—Nᵗ Bu]-, (Me₂N)-Ln-C₅H₃-1-ⁱPr-3-[(CH₂)₂—Nᵗ Bu]-, (Et₂N)-Ln-C₅H₃-1-ⁱPr-3-[(CH₂)₂—Nᵗ Bu]-, (ⁿPr₂N)-Ln-C₅H₃-1-ⁱPr-3-[(CH₂)₂—Nᵗ Bu]-, (ⁱPr₂N)-Ln-C₅H₃-1-ⁱPr-3-[(CH₂)₂—Nᵗ Bu]-, (ⁿBu₂N)-Ln-C₅H₃-1-ⁱPr-3-[(CH₂)₂—Nᵗ Bu]-, (ⁱBu₂N)-Ln-C₅H₃-1-ⁱPr-3-[(CH₂)₂—Nᵗ Bu]-, (ˢBu₂N)-Ln-C₅H₃-1-ⁱPr-3-[(CH₂)₂—Nᵗ Bu]-, (ᵗBu₂N)-Ln-C₅H₃-1-ⁱPr-3-[(CH₂)₂—Nᵗ Bu]-, (Cp)-Ln-C₅H₃-1-ⁱPr-3-[(CH₂)₂—Nᵗ Bu]-, (HO)-Ln-C₅H₃-1-ⁱPr-3-[(CH₂)₂—Nᵗ Bu]-, (MeO)-Ln-C₅H₃-1-ⁱPr-3-[(CH₂)₂—Nᵗ Bu]-, (EtO)-Ln-C₅H₃-1-ⁱPr-3-[(CH₂)₂—Nᵗ Bu]-, (ⁿPrO)-Ln-C₅H₃-1-ⁱPr-3-[(CH₂)₂—Nᵗ Bu]-, (ⁱPrO)-Ln-C₅H₃-1-ⁱPr-3-[(CH₂)₂—Nᵗ Bu]-, (ⁿBuO)-Ln-C₅H₃-1-ⁱPr-3-[(CH₂)₂—Nᵗ Bu]-, (ⁱBuO)-Ln-C₅H₃-1-ⁱPr-3-[(CH₂)₂—Nᵗ Bu]-, (ˢBuO)-Ln-C₅H₃-1-ⁱPr-3-[(CH₂)₂—Nᵗ Bu]-, (ᵗBuO)-Ln-C₅H₃-1-ⁱPr-3-[(CH₂)₂—Nᵗ Bu]-, (H₂N)-Ln-C₅H₃-1-ⁱPr-3-[(CH₂)₂—O]—, (Me₂N)-Ln-C₅H₃-1-ⁱPr-3-[(CH₂)₂—O]—, (Et₂N)-Ln-C₅H₃-1-ⁱPr-3-[(CH₂)₂—O]—, (ⁿPr₂N)-Ln-C₅H₃-1-ⁱPr-3-[(CH₂)₂—O]—, (ⁱPr₂N)-Ln-C₅H₃-1-ⁱPr-3-[(CH₂)₂—O]—, (ⁿBu₂N)-Ln-C₅H₃-1-ⁱPr-3-[(CH₂)₂—O]—, (ⁱBu₂N)-Ln-C₅H₃-1-ⁱPr-3-[(CH₂)₂—O]—, (ˢBu₂N)-Ln-C₅H₃-1-ⁱPr-3-[(CH₂)₂—O]—, (ᵗBu₂N)-Ln-C₅H₃-1-ⁱPr-3-[(CH₂)₂—O]—, (Cp)-Ln-C₅H₃-1-ⁱPr-3-[(CH₂)₂—O]—, (HO)-Ln-C₅H₃-1-ⁱPr-3-[(CH₂)₂—O]—, (MeO)-Ln-C₅H₃-1-ⁱPr-3-[(CH₂)₂—O]—, (EtO)-Ln-C₅H₃-1-ⁱPr-3-[(CH₂)₂—O]—, (ⁿPrO)-Ln-C₅H₃-1-ⁱPr-3-[(CH₂)₂—O]—, (ⁱPrO)-Ln-C₅H₃-1-ⁱPr-3-[(CH₂)₂—O]—, (ⁿBuO)-Ln-C₅H₃-1-ⁱPr-3-[(CH₂)₂—O]—, (ⁱBuO)-Ln-C₅H₃-1-ⁱPr-3-[(CH₂)₂—O]—, (ˢBuO)-Ln-C₅H₃-1-ⁱPr-3-[(CH₂)₂—O]—, (ᵗBuO)-Ln-C₅H₃-1-ⁱPr-3-[(CH₂)₂—O]—, (H₂N)-Ln-C₅H₃-1-ⁱPr-3-[(CMe₂)₂-NH]—, (Me₂N)-Ln-C₅H₃-1-ⁱPr-3-[(CMe₂)₂-NH]—, (Et₂N)-Ln-C₅H₃-1-ⁱPr-3-[(CMe₂)₂-NH]—, (ⁿPr₂N)-Ln-C₅H₃-1-ⁱPr-3-[(CMe₂)₂-NH]—, (ⁱPr₂N)-Ln-C₅H₃-1-ⁱPr-3-[(CMe₂)₂-NH]—, (ⁿBu₂N)-Ln-C₅H₃-1-ⁱPr-3-[(CMe₂)₂-NH]—, (ⁱBu₂N)-Ln-C₅H₃-1-ⁱPr-3-[(CMe₂)₂-NH]—, (ˢBu₂N)-Ln-C₅H₃-1-ⁱPr-3-[(CMe₂)₂-NH]—, (ᵗBu₂N)-Ln-C₅H₃-1-ⁱPr-3-[(CMe₂)₂-NH]—, (Cp)-Ln-C₅H₃-1-ⁱPr-3-[(CMe₂)₂-NH]—, (HO)-Ln-C₅H₃-1-ⁱPr-3-[(CMe₂)₂-NH]—, (MeO)-Ln-C₅H₃-1-ⁱPr-3-[(CMe₂)₂-NH]—, (EtO)-Ln-C₅H₃-1-ⁱPr-3-[(CMe₂)₂-NH]—, (ⁿPrO)-Ln-C₅H₃-1-ⁱPr-3-[(CMe₂)₂-NH]—, (ⁱPrO)-Ln-C₅H₃-1-ⁱPr-3-[(CMe₂)₂-NH]—, (ⁿBuO)-Ln-C₅H₃-1-ⁱPr-3-[(CMe₂)₂-NH]—, (ⁱBuO)-Ln-C₅H₃-1-ⁱPr-3-[(CMe₂)₂-NH]—, (ˢBuO)-Ln-C₅H₃-1-ⁱPr-3-[(CMe₂)₂-NH]—, (ᵗBuO)-Ln-C₅H₃-1-ⁱPr-3-[(CMe₂)₂-NH]—, (H₂N)-Ln-C₅H₃-1-ⁱPr-3-[(CMe₂)₂-NMe]-, (Me₂N)-Ln-C₅H₃-1-ⁱPr-3-[(CMe₂)₂-NMe]-, (Et₂N)-Ln-C₅H₃-1-ⁱPr-3-[(CMe₂)₂-NMe]-, (ⁿPr₂N)-Ln-C₅H₃-1-ⁱPr-3-[(CMe₂)₂-NMe]-, (ⁱPr₂N)-Ln-C₅H₃-1-ⁱPr-3-[(CMe₂)₂-NMe]-, (ⁿBu₂N)-Ln-C₅H₃-1-ⁱPr-3-[(CMe₂)₂-NMe]-, (ⁱBu₂N)-Ln-C₅H₃-1-ⁱPr-3-[(CMe₂)₂-NMe]-, (ˢBu₂N)-Ln-C₅H₃-1-ⁱPr-3-[(CMe₂)₂-NMe]-, (ᵗBu₂N)-Ln-C₅H₃-1-ⁱPr-3-[(CMe₂)₂-NMe]-, (Cp)-

Ln-C$_5$H$_3$-1-$^i$Pr-3-[(CMe$_2$)$_2$-NMe]-, (HO)-Ln-C$_5$H$_3$-1-$^i$Pr-3-[(CMe$_2$)$_2$-NMe]-, (MeO)-Ln-C$_5$H$_3$-1-$^i$Pr-3-[(CMe$_2$)$_2$-NMe]-, (EtO)-Ln-C$_5$H$_3$-1-$^i$Pr-3-[(CMe$_2$)$_2$-NMe]-, ($^n$PrO)-Ln-C$_5$H$_3$-1-$^i$Pr-3-[(CMe$_2$)$_2$-NMe]-, ($^i$PrO)-Ln-C$_5$H$_3$-1-$^i$Pr-3-[(CMe$_2$)$_2$-NMe]-, ($^n$BuO)-Ln-C$_5$H$_3$-1-$^i$Pr-3-[(CMe$_2$)$_2$-NMe]-, ($^i$BuO)-Ln-C$_5$H$_3$-1-$^i$Pr-3-[(CMe$_2$)$_2$-NMe]-, ($^s$BuO)-Ln-C$_5$H$_3$-1-$^i$Pr-3-[(CMe$_2$)$_2$-NMe]-, ($^t$BuO)-Ln-C$_5$H$_3$-1-$^i$Pr-3-[(CMe$_2$)$_2$-NMe]-, (H$_2$N)-Ln-C$_5$H$_3$-1-$^i$Pr-3-[(CMe$_2$)$_2$-NEt]-, (Me$_2$N)-Ln-C$_5$H$_3$-1-$^i$Pr-3-[(CMe$_2$)$_2$-NEt]-, (Et$_2$N)-Ln-C$_5$H$_3$-1-$^i$Pr-3-[(CMe$_2$)$_2$-NEt]-, ($^n$Pr$_2$N)-Ln-C$_5$H$_3$-1-$^i$Pr-3-[(CMe$_2$)$_2$-NEt]-, ($^i$Pr$_2$N)-Ln-C$_5$H$_3$-1-$^i$Pr-3-[(CMe$_2$)$_2$-NEt]-, ($^n$Bu$_2$N)-Ln-C$_5$H$_3$-1-$^i$Pr-3-[(CMe$_2$)$_2$-NEt]-, ($^i$Bu$_2$N)-Ln-C$_5$H$_3$-1-$^i$Pr-3-[(CMe$_2$)$_2$-NEt]-, ($^s$Bu$_2$N)-Ln-C$_5$H$_3$-1-$^i$Pr-3-[(CMe$_2$)$_2$-NEt]-, ($^t$Bu$_2$N)-Ln-C$_5$H$_3$-1-$^i$Pr-3-[(CMe$_2$)$_2$-NEt]-, (Cp)-Ln-C$_5$H$_3$-1-$^i$Pr-3-[(CMe$_2$)$_2$-NEt]-, (HO)-Ln-C$_5$H$_3$-1-$^i$Pr-3-[(CMe$_2$)$_2$-NEt]-, (MeO)-Ln-C$_5$H$_3$-1-$^i$Pr-3-[(CMe$_2$)$_2$-NEt]-, (EtO)-Ln-C$_5$H$_3$-1-$^i$Pr-3-[(CMe$_2$)$_2$-NEt]-, ($^n$PrO)-Ln-C$_5$H$_3$-1-$^i$Pr-3-[(CMe$_2$)$_2$-NEt]-, ($^i$PrO)-Ln-C$_5$H$_3$-1-$^i$Pr-3-[(CMe$_2$)$_2$-NEt]-, ($^n$BuO)-Ln-C$_5$H$_3$-1-$^i$Pr-3-[(CMe$_2$)$_2$-NEt]-, ($^i$BuO)-Ln-C$_5$H$_3$-1-$^i$Pr-3-[(CMe$_2$)$_2$-NEt]-, ($^s$BuO)-Ln-C$_5$H$_3$-1-$^i$Pr-3-[(CMe$_2$)$_2$-NEt]-, ($^t$BuO)-Ln-C$_5$H$_3$-1-$^i$Pr-3-[(CMe$_2$)$_2$-NEt]-, (H$_2$N)-Ln-C$_5$H$_3$-1-$^i$Pr-3-[(CMe$_2$)$_2$-N$^n$Pr]—, (Me$_2$N)-Ln-C$_5$H$_3$-1-$^i$Pr-3-[(CMe$_2$)$_2$-N$^n$Pr]—, (Et$_2$N)-Ln-C$_5$H$_3$-1-$^i$Pr-3-[(CMe$_2$)$_2$-N$^n$Pr]—, ($^n$Pr$_2$N)-Ln-C$_5$H$_3$-1-$^i$Pr-3-[(CMe$_2$)$_2$-N$^n$Pr]—, ($^i$Pr$_2$N)-Ln-C$_5$H$_3$-1-$^i$Pr-3-[(CMe$_2$)$_2$-N$^n$Pr]—, ($^n$Bu$_2$N)-Ln-C$_5$H$_3$-1-$^i$Pr-3-[(CMe$_2$)$_2$-N$^n$Pr]—, ($^i$Bu$_2$N)-Ln-C$_5$H$_3$-1-$^i$Pr-3-[(CMe$_2$)$_2$-N$^n$Pr]—, ($^s$Bu$_2$N)-Ln-C$_5$H$_3$-1-$^i$Pr-3-[(CMe$_2$)$_2$-N$^n$Pr]—, ($^t$Bu$_2$N)-Ln-C$_5$H$_3$-1-$^i$Pr-3-[(CMe$_2$)$_2$-N$^n$Pr]—, (Cp)-Ln-C$_5$H$_3$-1-$^i$Pr-3-[(CMe$_2$)$_2$-N$^n$Pr]—, (HO)-Ln-C$_5$H$_3$-1-$^i$Pr-3-[(CMe$_2$)$_2$-N$^n$Pr]—, (MeO)-Ln-C$_5$H$_3$-1-$^i$Pr-3-[(CMe$_2$)$_2$-N$^n$Pr]—, (EtO)-Ln-C$_5$H$_3$-1-$^i$Pr-3-[(CMe$_2$)$_2$-N$^n$Pr]—, ($^n$PrO)-Ln-C$_5$H$_3$-1-$^i$Pr-3-[(CMe$_2$)$_2$-N$^n$Pr]—, ($^i$PrO)-Ln-C$_5$H$_3$-1-$^i$Pr-3-[(CMe$_2$)$_2$-N$^n$Pr]—, ($^n$BuO)-Ln-C$_5$H$_3$-1-$^i$Pr-3-[(CMe$_2$)$_2$-N$^n$Pr]—, ($^i$BuO)-Ln-C$_5$H$_3$-1-$^i$Pr-3-[(CMe$_2$)$_2$-N$^n$Pr]—, ($^s$BuO)-Ln-C$_5$H$_3$-1-$^i$Pr-3-[(CMe$_2$)$_2$-N$^n$Pr]—, ($^t$BuO)-Ln-C$_5$H$_3$-1-$^i$Pr-3-[(CMe$_2$)$_2$-N$^n$Pr]—, (H$_2$N)-Ln-C$_5$H$_3$-1-$^i$Pr-3-[(CMe$_2$)$_2$-N$^i$Pr]—, (Me$_2$N)-Ln-C$_5$H$_3$-1-$^i$Pr-3-[(CMe$_2$)$_2$-N$^i$Pr]—, (Et$_2$N)-Ln-C$_5$H$_3$-1-$^i$Pr-3-[(CMe$_2$)$_2$-N$^i$Pr]—, ($^n$Pr$_2$N)-Ln-C$_5$H$_3$-1-$^i$Pr-3-[(CMe$_2$)$_2$-N$^i$Pr]—, ($^i$Pr$_2$N)-Ln-C$_5$H$_3$-1-$^i$Pr-3-[(CMe$_2$)$_2$-N$^i$Pr]—, ($^n$Bu$_2$N)-Ln-C$_5$H$_3$-1-$^i$Pr-3-[(CMe$_2$)$_2$-N$^i$Pr]—, ($^i$Bu$_2$N)-Ln-C$_5$H$_3$-1-$^i$Pr-3-[(CMe$_2$)$_2$-N$^i$Pr]—, ($^s$Bu$_2$N)-Ln-C$_5$H$_3$-1-$^i$Pr-3-[(CMe$_2$)$_2$-N$^i$Pr]—, ($^t$Bu$_2$N)-Ln-C$_5$H$_3$-1-$^i$Pr-3-[(CMe$_2$)$_2$-N$^i$Pr]—, (Cp)-Ln-C$_5$H$_3$-1-$^i$Pr-3-[(CMe$_2$)$_2$-N$^i$Pr]—, (HO)-Ln-C$_5$H$_3$-1-$^i$Pr-3-[(CMe$_2$)$_2$-N$^i$Pr]—, (MeO)-Ln-C$_5$H$_3$-1-$^i$Pr-3-[(CMe$_2$)$_2$-N$^i$Pr]—, (EtO)-Ln-C$_5$H$_3$-1-$^i$Pr-3-[(CMe$_2$)$_2$-N$^i$Pr]—, ($^n$PrO)-Ln-C$_5$H$_3$-1-$^i$Pr-3-[(CMe$_2$)$_2$-N$^i$Pr]—, ($^i$PrO)-Ln-C$_5$H$_3$-1-$^i$Pr-3-[(CMe$_2$)$_2$-N$^i$Pr]—, ($^n$BuO)-Ln-C$_5$H$_3$-1-$^i$Pr-3-[(CMe$_2$)$_2$-N$^i$Pr]—, ($^i$BuO)-Ln-C$_5$H$_3$-1-$^i$Pr-3-[(CMe$_2$)$_2$-N$^i$Pr]—, ($^s$BuO)-Ln-C$_5$H$_3$-1-$^i$Pr-3-[(CMe$_2$)$_2$-N$^i$Pr]—, ($^t$BuO)-Ln-C$_5$H$_3$-1-$^i$Pr-3-[(CMe$_2$)$_2$-N$^i$Pr]—, (H$_2$N)-Ln-C$_5$H$_3$-1-$^i$Pr-3-[(CMe$_2$)$_2$-N$^n$Bu]-, (Me$_2$N)-Ln-C$_5$H$_3$-1-$^i$Pr-3-[(CMe$_2$)$_2$-N$^n$Bu]-, (Et$_2$N)-Ln-C$_5$H$_3$-1-$^i$Pr-3-[(CMe$_2$)$_2$-N$^n$Bu]-, ($^n$Pr$_2$N)-Ln-C$_5$H$_3$-1-$^i$Pr-3-[(CMe$_2$)$_2$-N$^n$Bu]-, ($^i$Pr$_2$N)-Ln-C$_5$H$_3$-1-$^i$Pr-3-[(CMe$_2$)$_2$-N$^n$Bu]-, ($^n$Bu$_2$N)-Ln-C$_5$H$_3$-1-$^i$Pr-3-[(CMe$_2$)$_2$-N$^n$Bu]-, ($^i$Bu$_2$N)-Ln-C$_5$H$_3$-1-$^i$Pr-3-[(CMe$_2$)$_2$-N$^n$Bu]-, ($^s$Bu$_2$N)-Ln-C$_5$H$_3$-1-$^i$Pr-3-[(CMe$_2$)$_2$-N$^n$Bu]-, ($^t$Bu$_2$N)-Ln-C$_5$H$_3$-1-$^i$Pr-3-[(CMe$_2$)$_2$-N$^n$Bu]-, (Cp)-Ln-C$_5$H$_3$-1-$^i$Pr-3-[(CMe$_2$)$_2$-N$^n$Bu]-, (HO)-Ln-C$_5$H$_3$-1-$^i$Pr-3-[(CMe$_2$)$_2$-N$^n$Bu]-, (MeO)-Ln-C$_5$H$_3$-1-$^i$Pr-3-[(CMe$_2$)$_2$-N$^n$Bu]-, (EtO)-Ln-C$_5$H$_3$-1-$^i$Pr-3-[(CMe$_2$)$_2$-N$^n$Bu]-, ($^n$PrO)-Ln-C$_5$H$_3$-1-$^i$Pr-3-[(CMe$_2$)$_2$-N$^n$Bu]-, ($^i$PrO)-Ln-C$_5$H$_3$-1-$^i$Pr-3-[(CMe$_2$)$_2$-N$^n$Bu]-, ($^n$BuO)-Ln-C$_5$H$_3$-1-$^i$Pr-3-[(CMe$_2$)$_2$-N$^n$Bu]-, ($^i$BuO)-Ln-C$_5$H$_3$-1-$^i$Pr-3-[(CMe$_2$)$_2$-N$^n$Bu]-, ($^s$BuO)-Ln-C$_5$H$_3$-1-$^i$Pr-3-[(CMe$_2$)$_2$-N$^n$Bu]-, ($^t$BuO)-Ln-C$_5$H$_3$-1-$^i$Pr-3-[(CMe$_2$)$_2$-N$^n$Bu]-, (H$_2$N)-Ln-C$_5$H$_3$-1-$^i$Pr-3-[(CMe$_2$)$_2$-N$^i$Bu]-, (Me$_2$N)-Ln-C$_5$H$_3$-1-$^i$Pr-3-[(CMe$_2$)$_2$-N$^i$Bu]-, (Et$_2$N)-Ln-C$_5$H$_3$-1-$^i$Pr-3-[(CMe$_2$)$_2$-N$^i$Bu]-, ($^n$Pr$_2$N)-Ln-C$_5$H$_3$-1-$^i$Pr-3-[(CMe$_2$)$_2$-N$^i$Bu]-, ($^i$Pr$_2$N)-Ln-C$_5$H$_3$-1-$^i$Pr-3-[(CMe$_2$)$_2$-N$^i$Bu]-, ($^n$Bu$_2$N)-Ln-C$_5$H$_3$-1-$^i$Pr-3-[(CMe$_2$)$_2$-N$^i$Bu]-, ($^i$Bu$_2$N)-Ln-C$_5$H$_3$-1-$^i$Pr-3-[(CMe$_2$)$_2$-N$^i$Bu]-, ($^s$Bu$_2$N)-Ln-C$_5$H$_3$-1-$^i$Pr-3-[(CMe$_2$)$_2$-N$^i$Bu]-, ($^t$Bu$_2$N)-Ln-C$_5$H$_3$-1-$^i$Pr-3-[(CMe$_2$)$_2$-N$^i$Bu]-, (Cp)-Ln-C$_5$H$_3$-1-$^i$Pr-3-[(CMe$_2$)$_2$-N$^i$Bu]-, (HO)-Ln-C$_5$H$_3$-1-$^i$Pr-3-[(CMe$_2$)$_2$-N$^i$Bu]-, (MeO)-Ln-C$_5$H$_3$-1-$^i$Pr-3-[(CMe$_2$)$_2$-N$^i$Bu]-, (EtO)-Ln-C$_5$H$_3$-1-$^i$Pr-3-[(CMe$_2$)$_2$-N$^i$Bu]-, ($^n$PrO)-Ln-C$_5$H$_3$-1-$^i$Pr-3-[(CMe$_2$)$_2$-N$^i$Bu]-, ($^i$PrO)-Ln-C$_5$H$_3$-1-$^i$Pr-3-[(CMe$_2$)$_2$-N$^i$Bu]-, ($^n$BuO)-Ln-C$_5$H$_3$-1-$^i$Pr-3-[(CMe$_2$)$_2$-N$^i$Bu]-, ($^i$BuO)-Ln-C$_5$H$_3$-1-$^i$Pr-3-[(CMe$_2$)$_2$-N$^i$Bu]-, ($^s$BuO)-Ln-C$_5$H$_3$-1-$^i$Pr-3-[(CMe$_2$)$_2$-N$^i$Bu]-, ($^t$BuO)-Ln-C$_5$H$_3$-1-$^i$Pr-3-[(CMe$_2$)$_2$-N$^i$Bu]-, (H$_2$N)-Ln-C$_5$H$_3$-1-$^i$Pr-3-[(CMe$_2$)$_2$-N$^s$Bu]-, (Me$_2$N)-Ln-C$_5$H$_3$-1-$^i$Pr-3-[(CMe$_2$)$_2$-N$^s$Bu]-, (Et$_2$N)-Ln-C$_5$H$_3$-1-$^i$Pr-3-[(CMe$_2$)$_2$-N$^s$Bu]-, ($^n$Pr$_2$N)-Ln-C$_5$H$_3$-1-$^i$Pr-3-[(CMe$_2$)$_2$-N$^s$Bu]-, ($^i$Pr$_2$N)-Ln-C$_5$H$_3$-1-$^i$Pr-3-[(CMe$_2$)$_2$-N$^s$Bu]-, ($^n$Bu$_2$N)-Ln-C$_5$H$_3$-1-$^i$Pr-3-[(CMe$_2$)$_2$-N$^s$Bu]-, ($^i$Bu$_2$N)-Ln-C$_5$H$_3$-1-$^i$Pr-3-[(CMe$_2$)$_2$-N$^s$Bu]-, ($^s$Bu$_2$N)-Ln-C$_5$H$_3$-1-$^i$Pr-3-[(CMe$_2$)$_2$-N$^s$Bu]-, ($^t$Bu$_2$N)-Ln-C$_5$H$_3$-1-$^i$Pr-3-[(CMe$_2$)$_2$-N$^s$Bu]-, (Cp)-Ln-C$_5$H$_3$-1-$^i$Pr-3-[(CMe$_2$)$_2$-N$^s$Bu]-, (HO)-Ln-C$_5$H$_3$-1-$^i$Pr-3-[(CMe$_2$)$_2$-N$^s$Bu]-, (MeO)-Ln-C$_5$H$_3$-1-$^i$Pr-3-[(CMe$_2$)$_2$-N$^s$Bu]-, (EtO)-Ln-C$_5$H$_3$-1-$^i$Pr-3-[(CMe$_2$)$_2$-N$^s$Bu]-, ($^n$PrO)-Ln-C$_5$H$_3$-1-$^i$Pr-3-[(CMe$_2$)$_2$-N$^s$Bu]-, ($^i$PrO)-Ln-C$_5$H$_3$-1-$^i$Pr-3-[(CMe$_2$)$_2$-N$^s$Bu]-, ($^n$BuO)-Ln-C$_5$H$_3$-1-$^i$Pr-3-[(CMe$_2$)$_2$-N$^s$Bu]-, ($^i$BuO)-Ln-C$_5$H$_3$-1-$^i$Pr-3-[(CMe$_2$)$_2$-N$^s$Bu]-, ($^s$BuO)-Ln-C$_5$H$_3$-1-$^i$Pr-3-[(CMe$_2$)$_2$-N$^s$Bu]-, ($^t$BuO)-Ln-C$_5$H$_3$-1-$^i$Pr-3-[(CMe$_2$)$_2$-N$^s$Bu]-, (H$_2$N)-Ln-C$_5$H$_3$-1-$^i$Pr-3-[(CMe$_2$)$_2$-N$^t$Bu]-, (Me$_2$N)-Ln-C$_5$H$_3$-1-$^i$Pr-3-[(CMe$_2$)$_2$-N$^t$Bu]-, (Et$_2$N)-Ln-C$_5$H$_3$-1-$^i$Pr-3-[(CMe$_2$)$_2$-N$^t$Bu]-, ($^n$Pr$_2$N)-Ln-C$_5$H$_3$-1-$^i$Pr-3-[(CMe$_2$)$_2$-N$^t$Bu]-, ($^i$Pr$_2$N)-Ln-C$_5$H$_3$-1-$^i$Pr-3-[(CMe$_2$)$_2$-N$^t$Bu]-, ($^n$Bu$_2$N)-Ln-C$_5$H$_3$-1-$^i$Pr-3-[(CMe$_2$)$_2$-N$^t$Bu]-, ($^i$Bu$_2$N)-Ln-C$_5$H$_3$-1-$^i$Pr-3-[(CMe$_2$)$_2$-N$^t$Bu]-, ($^s$Bu$_2$N)-Ln-C$_5$H$_3$-1-$^i$Pr-3-[(CMe$_2$)$_2$-N$^t$Bu]-, ($^t$Bu$_2$N)-Ln-C$_5$H$_3$-1-$^i$Pr-3-[(CMe$_2$)$_2$-N$^t$Bu]-, (Cp)-Ln-C$_5$H$_3$-1-$^i$Pr-3-[(CMe$_2$)$_2$-N$^t$Bu]-, (HO)-Ln-C$_5$H$_3$-1-$^i$Pr-3-[(CMe$_2$)$_2$-N$^t$Bu]-, (MeO)-Ln-C$_5$H$_3$-1-$^i$Pr-3-[(CMe$_2$)$_2$-N$^t$Bu]-, (EtO)-Ln-C$_5$H$_3$-1-$^i$Pr-3-[(CMe$_2$)$_2$-N$^t$Bu]-, ($^n$PrO)-Ln-C$_5$H$_3$-1-$^i$Pr-3-[(CMe$_2$)$_2$-N$^t$Bu]-, ($^i$PrO)-Ln-C$_5$H$_3$-1-$^i$Pr-3-[(CMe$_2$)$_2$-N$^t$Bu]-, ($^n$BuO)-Ln-C$_5$H$_3$-1-$^i$Pr-3-[(CMe$_2$)$_2$-N$^t$Bu]-, ($^i$BuO)-Ln-C$_5$H$_3$-1-$^i$Pr-3-[(CMe$_2$)$_2$-N$^t$Bu]-, ($^s$BuO)-Ln-C$_5$H$_3$-1-$^i$Pr-3-[(CMe$_2$)$_2$-N$^t$Bu]-, ($^t$BuO)-Ln-C$_5$H$_3$-1-$^i$Pr-3-[(CMe$_2$)$_2$-N$^t$Bu]-, (H$_2$N)-Ln-C$_5$H$_3$-1-$^i$Pr-3-[(CMe$_2$)$_2$-O]—, (Me$_2$N)-Ln-C$_5$H$_3$-1-$^i$Pr-3-[(CMe$_2$)$_2$-O]—, (Et$_2$N)-Ln-C$_5$H$_3$-1-$^i$Pr-3-[(CMe$_2$)$_2$-O]—, ($^n$Pr$_2$N)-Ln-C$_5$H$_3$-1-$^i$Pr-3-[(CMe$_2$)$_2$-O]—, ($^i$Pr$_2$N)-Ln-C$_5$H$_3$-1-$^i$Pr-3-[(CMe$_2$)$_2$-O]—, ($^n$Bu$_2$N)-Ln-C$_5$H$_3$-1-$^i$Pr-3-[(CMe$_2$)$_2$-O]—, ($^i$Bu$_2$N)-Ln-C$_5$H$_3$-1-$^i$Pr-3-[(CMe$_2$)$_2$-O]—, ($^s$Bu$_2$N)-Ln-C$_5$H$_3$-1-$^i$Pr-3-[(CMe$_2$)$_2$-O]—, ($^t$Bu$_2$N)-Ln-C$_5$H$_3$-1-$^i$Pr-3-[(CMe$_2$)$_2$-O]—, (Cp)-Ln-C$_5$H$_3$-1-$^i$Pr-3-[(CMe$_2$)$_2$-O]—, (HO)-Ln-C$_5$H$_3$-1-$^i$Pr-3-[(CMe$_2$)$_2$-O]—, (MeO)-Ln-C$_5$H$_3$-1-$^i$Pr-3-[(CMe$_2$)$_2$-O]—, (EtO)-Ln-C$_5$H$_3$-1-$^i$Pr-3-[(CMe$_2$)$_2$-O]—, ($^n$PrO)-Ln-C$_5$H$_3$-1-$^i$Pr-3-[(CMe$_2$)$_2$-O]—, ($^i$PrO)-Ln-C$_5$H$_3$-1-$^i$Pr-3-[(CMe$_2$)$_2$-O]—, ($^n$BuO)-Ln-C$_5$H$_3$-1-$^i$Pr-3-[(CMe$_2$)$_2$-O]—, ($^i$BuO)-Ln-C$_5$H$_3$-1-$^i$Pr-3-[(CMe$_2$)$_2$-O]—, ($^s$BuO)-Ln-C$_5$H$_3$-1-$^i$Pr-3-[(CMe$_2$)$_2$-O]—, ($^t$BuO)-Ln-C$_5$H$_3$-1-$^i$Pr-3-[(CMe$_2$)$_2$-O]—, (H$_2$N)-Ln-C$_5$H$_3$-1-$^i$Pr-3-[(CEt$_2$)$_2$-NH]—, (Me$_2$N)-Ln-C$_5$H$_3$-1-$^i$Pr-3-[(CEt$_2$)$_2$-NH]—, (Et$_2$N)-Ln-C$_5$H$_3$-1-$^i$Pr-3-[(CEt$_2$)$_2$-NH]—, ($^n$Pr$_2$N)-Ln-C$_5$H$_3$-1-$^i$Pr-3-[(CEt$_2$)$_2$-NH]—, ($^i$Pr$_2$N)-Ln-C$_5$H$_3$-1-$^i$Pr-3-[(CEt$_2$)$_2$-NH]—, ($^n$Bu$_2$N)-Ln-C$_5$H$_3$-1-$^i$Pr-3-[(CEt$_2$)$_2$-NH]—, ($^i$Bu$_2$N)-Ln-C$_5$H$_3$-1-$^i$Pr-3-[(CEt$_2$)$_2$-NH]—, ($^s$Bu$_2$N)-Ln-C$_5$H$_3$-1-$^i$Pr-3-[(CEt$_2$)$_2$-NH]—, ($^t$Bu$_2$N)-Ln-C$_5$H$_3$-1-$^i$Pr-3-[(CEt$_2$)$_2$-NH]—, (Cp)-Ln-C$_5$H$_3$-1-$^i$Pr-3-[(CEt$_2$)$_2$-NH]—, (HO)-Ln-C$_5$H$_3$-1-$^i$Pr-3-[(CEt$_2$)$_2$-NH]—, (MeO)-Ln-C$_5$H$_3$-1-$^i$Pr-3-[(CEt$_2$)$_2$-NH]—, (EtO)-Ln-C$_5$H$_3$-1-$^i$Pr-3-[(CEt$_2$)$_2$-NH]—, ($''$PrO)-Ln-C$_5$H$_3$-1-$^i$Pr-3-[(CEt$_2$)$_2$-NH]—, ($^i$PrO)-Ln-C$_5$H$_3$-1-$^i$Pr-3-[(CEt$_2$)$_2$-NH]—, ($''$BuO)-Ln-C$_5$H$_3$-1-$^i$Pr-3-[(CEt$_2$)$_2$-NH]—, ($^i$BuO)-Ln-C$_5$H$_3$-1-$^i$Pr-3-[(CEt$_2$)$_2$-NH]—, ($^s$BuO)-Ln-C$_5$H$_3$-1-$^i$Pr-3-[(CEt$_2$)$_2$-NH]—, ($^t$BuO)-Ln-C$_5$H$_3$-1-$^i$Pr-3-[(CEt$_2$)$_2$-NH]—, (H$_2$N)-Ln-C$_5$H$_3$-1-$^i$Pr-3-[(CEt$_2$)$_2$-NMe]-, (Me$_2$N)-Ln-C$_5$H$_3$-1-$^i$Pr-3-[(CEt$_2$)$_2$-NMe]-, (Et$_2$N)-Ln-C$_5$H$_3$-1-$^i$Pr-3-[(CEt$_2$)$_2$-NMe]-, ($''$Pr$_2$N)-Ln-C$_5$H$_3$-1-$^i$Pr-3-[(CEt$_2$)$_2$-NMe]-, ($^i$Pr$_2$N)-Ln-C$_5$H$_3$-1-$^i$Pr-3-[(CEt$_2$)$_2$-NMe]-, ($''$Bu$_2$N)-Ln-C$_5$H$_3$-1-$^i$Pr-3-[(CEt$_2$)$_2$-NMe]-, ($^i$Bu$_2$N)-Ln-C$_5$H$_3$-1-$^i$Pr-3-[(CEt$_2$)$_2$-NMe]-, ($^s$Bu$_2$N)-Ln-C$_5$H$_3$-1-$^i$Pr-3-[(CEt$_2$)$_2$-NMe]-, ($^t$Bu$_2$N)-Ln-C$_5$H$_3$-1-$^i$Pr-3-[(CEt$_2$)$_2$-NMe]-, (Cp)-Ln-C$_5$H$_3$-1-$^i$Pr-3-[(CEt$_2$)$_2$-NMe]-, (HO)-Ln-C$_5$H$_3$-1-$^i$Pr-3-[(CEt$_2$)$_2$-NMe]-, (MeO)-Ln-C$_5$H$_3$-1-$^i$Pr-3-[(CEt$_2$)$_2$-NMe]-, (EtO)-Ln-C$_5$H$_3$-1-$^i$Pr-3-[(CEt$_2$)$_2$-NMe]-, ($''$PrO)-Ln-C$_5$H$_3$-1-$^i$Pr-3-[(CEt$_2$)$_2$-NMe]-, ($^i$PrO)-Ln-C$_5$H$_3$-1-$^i$Pr-3-[(CEt$_2$)$_2$-NMe]-, ($''$BuO)-Ln-C$_5$H$_3$-1-$^i$Pr-3-[(CEt$_2$)$_2$-NMe]-, ($^i$BuO)-Ln-C$_5$H$_3$-1-$^i$Pr-3-[(CEt$_2$)$_2$-NMe]-, ($^s$BuO)-Ln-C$_5$H$_3$-1-$^i$Pr-3-[(CEt$_2$)$_2$-NMe]-, ($^t$BuO)-Ln-C$_5$H$_3$-1-$^i$Pr-3-[(CEt$_2$)$_2$-NMe]-, (H$_2$N)-Ln-C$_5$H$_3$-1-$^i$Pr-3-[(CEt$_2$)$_2$-NEt]-, (Me$_2$N)-Ln-C$_5$H$_3$-1-$^i$Pr-3-[(CEt$_2$)$_2$-NEt]-, (Et$_2$N)-Ln-C$_5$H$_3$-1-$^i$Pr-3-[(CEt$_2$)$_2$-NEt]-, ($''$Pr$_2$N)-Ln-C$_5$H$_3$-1-$^i$Pr-3-[(CEt$_2$)$_2$-NEt]-, ($^i$Pr$_2$N)-Ln-C$_5$H$_3$-1-$^i$Pr-3-[(CEt$_2$)$_2$-NEt]-, ($''$Bu$_2$N)-Ln-C$_5$H$_3$-1-$^i$Pr-3-[(CEt$_2$)$_2$-NEt]-, ($^i$Bu$_2$N)-Ln-C$_5$H$_3$-1-$^i$Pr-3-[(CEt$_2$)$_2$-NEt]-, ($^s$Bu$_2$N)-Ln-C$_5$H$_3$-1-$^i$Pr-3-[(CEt$_2$)$_2$-NEt]-, ($^t$Bu$_2$N)-Ln-C$_5$H$_3$-1-$^i$Pr-3-[(CEt$_2$)$_2$-NEt]-, (Cp)-Ln-C$_5$H$_3$-1-$^i$Pr-3-[(CEt$_2$)$_2$-NEt]-, (HO)-Ln-C$_5$H$_3$-1-$^i$Pr-3-[(CEt$_2$)$_2$-NEt]-, (MeO)-Ln-C$_5$H$_3$-1-$^i$Pr-3-[(CEt$_2$)$_2$-NEt]-, (EtO)-Ln-C$_5$H$_3$-1-$^i$Pr-3-[(CEt$_2$)$_2$-NEt]-, ($''$PrO)-Ln-C$_5$H$_3$-1-$^i$Pr-3-[(CEt$_2$)$_2$-NEt]-, ($^i$PrO)-Ln-C$_5$H$_3$-1-$^i$Pr-3-[(CEt$_2$)$_2$-NEt]-, ($''$BuO)-Ln-C$_5$H$_3$-1-$^i$Pr-3-[(CEt$_2$)$_2$-NEt]-, ($^i$BuO)-Ln-C$_5$H$_3$-1-$^i$Pr-3-[(CEt$_2$)$_2$-NEt]-, ($^s$BuO)-Ln-C$_5$H$_3$-1-$^i$Pr-3-[(CEt$_2$)$_2$-NEt]-, ($^t$BuO)-Ln-C$_5$H$_3$-1-$^i$Pr-3-[(CEt$_2$)$_2$-NEt]-, (H$_2$N)-Ln-C$_5$H$_3$-1-$^i$Pr-3-[(CEt$_2$)$_2$-N$''$Pr]—, (Me$_2$N)-Ln-C$_5$H$_3$-1-$^i$Pr-3-[(CEt$_2$)$_2$-N$''$Pr]—, (Et$_2$N)-Ln-C$_5$H$_3$-1-$^i$Pr-3-[(CEt$_2$)$_2$-N$''$Pr]—, ($''$Pr$_2$N)-Ln-C$_5$H$_3$-1-$^i$Pr-3-[(CEt$_2$)$_2$-N$''$Pr]—, ($^i$Pr$_2$N)-Ln-C$_5$H$_3$-1-$^i$Pr-3-[(CEt$_2$)$_2$-N$''$Pr]—, ($''$Bu$_2$N)-Ln-C$_5$H$_3$-1-$^i$Pr-3-[(CEt$_2$)$_2$-N$''$Pr]—, ($^i$Bu$_2$N)-Ln-C$_5$H$_3$-1-$^i$Pr-3-[(CEt$_2$)$_2$-N$''$Pr]—, ($^s$Bu$_2$N)-Ln-C$_5$H$_3$-1-$^i$Pr-3-[(CEt$_2$)$_2$-N$''$Pr]—, ($^t$Bu$_2$N)-Ln-C$_5$H$_3$-1-$^i$Pr-3-[(CEt$_2$)$_2$-N$''$Pr]—, (Cp)-Ln-C$_5$H$_3$-1-$^i$Pr-3-[(CEt$_2$)$_2$-N$''$Pr]—, (HO)-Ln-C$_5$H$_3$-1-$^i$Pr-3-[(CEt$_2$)$_2$-N$''$Pr]—, (MeO)-Ln-C$_5$H$_3$-1-$^i$Pr-3-[(CEt$_2$)$_2$-N$''$Pr]—, (EtO)-Ln-C$_5$H$_3$-1-$^i$Pr-3-[(CEt$_2$)$_2$-N$''$Pr]—, ($''$PrO)-Ln-C$_5$H$_3$-1-$^i$Pr-3-[(CEt$_2$)$_2$-N$''$Pr]—, ($^i$PrO)-Ln-C$_5$H$_3$-1-$^i$Pr-3-[(CEt$_2$)$_2$- N$''$Pr]—, ($''$BuO)-Ln-C$_5$H$_3$-1-$^i$Pr-3-[(CEt$_2$)$_2$- N$''$Pr]—, ($^i$BuO)-Ln-C$_5$H$_3$-1-$^i$Pr-3-[(CEt$_2$)$_2$- N$''$Pr]—, ($^s$BuO)-Ln-C$_5$H$_3$-1-$^i$Pr-3-[(CEt$_2$)$_2$-N$''$Pr]—, ($^t$BuO)-Ln-C$_5$H$_3$-1-$^i$Pr-3-[(CEt$_2$)$_2$- N$''$Pr]—, (H$_2$N)-Ln-C$_5$H$_3$-1-$^i$Pr-3-[(CEt$_2$)$_2$-N$^i$Pr]—, (Me$_2$N)-Ln-C$_5$H$_3$-1-$^i$Pr-3-[(CEt$_2$)$_2$-N$^i$Pr]—, (Et$_2$N)-Ln-C$_5$H$_3$-1-$^i$Pr-3-[(CEt$_2$)$_2$-N$^i$Pr]—, ($''$Pr$_2$N)-Ln-C$_5$H$_3$-1-$^i$Pr-3-[(CEt$_2$)$_2$-N$^i$Pr]—, ($^i$Pr$_2$N)-Ln-C$_5$H$_3$-1-$^i$Pr-3-[(CEt$_2$)$_2$-N$^i$Pr]—, ($''$Bu$_2$N)-Ln-C$_5$H$_3$-1-$^i$Pr-3-[(CEt$_2$)$_2$-N$^i$Pr]—, ($^i$Bu$_2$N)-Ln-C$_5$H$_3$-1-$^i$Pr-3-[(CEt$_2$)$_2$-N$^i$Pr]—, ($^s$Bu$_2$N)-Ln-C$_5$H$_3$-1-$^i$Pr-3-[(CEt$_2$)$_2$-N$^i$Pr]—, ($^t$Bu$_2$N)-Ln-C$_5$H$_3$-1-$^i$Pr-3-[(CEt$_2$)$_2$-N$^i$Pr]—, (Cp)-Ln-C$_5$H$_3$-1-$^i$Pr-3-[(CEt$_2$)$_2$-N$^i$Pr]—, (HO)-Ln-C$_5$H$_3$-1-$^i$Pr- 3-[(CEt$_2$)$_2$-N$^i$Pr]—, (MeO)-Ln-C$_5$H$_3$-1-$^i$Pr-3-[(CEt$_2$)$_2$-N$^i$Pr]—, (EtO)-Ln-C$_5$H$_3$-1-$^i$Pr-3-[(CEt$_2$)$_2$-N$^i$Pr]—, ($''$PrO)-Ln-C$_5$H$_3$-1-$^i$Pr-3-[(CEt$_2$)$_2$-N$^i$Pr]—, ($^i$PrO)-Ln-C$_5$H$_3$-1-$^i$Pr-3-[(CEt$_2$)$_2$-N$^i$Pr]—, ($''$BuO)-Ln-C$_5$H$_3$-1-$^i$Pr-3-[(CEt$_2$)$_2$-N$^i$Pr]—, ($^i$BuO)-Ln-C$_5$H$_3$-1-$^i$Pr-3-[(CEt$_2$)$_2$-N$^i$Pr]—, ($^s$BuO)-Ln-C$_5$H$_3$-1-$^i$Pr-3-[(CEt$_2$)$_2$-N$^i$Pr]—, ($^t$BuO)-Ln-C$_5$H$_3$-1-$^i$Pr-3-[(CEt$_2$)$_2$-N$^i$Pr]—, (H$_2$N)-Ln-C$_5$H$_3$-1-$^i$Pr-3-[(CEt$_2$)$_2$-N$''$Bu]-, (Me$_2$N)-Ln-C$_5$H$_3$-1-$^i$Pr-3-[(CEt$_2$)$_2$-N$''$Bu]-, (Et$_2$N)-Ln-C$_5$H$_3$-1-$^i$Pr-3-[(CEt$_2$)$_2$-N$''$Bu]-, ($''$Pr$_2$N)-Ln-C$_5$H$_3$-1-$^i$Pr-3-[(CEt$_2$)$_2$-N$''$Bu]-, ($^i$Pr$_2$N)-Ln-C$_5$H$_3$-1-$^i$Pr-3-[(CEt$_2$)$_2$-N$''$Bu]-, ($''$Bu$_2$N)-Ln-C$_5$H$_3$-1-$^i$Pr-3-[(CEt$_2$)$_2$-N$''$Bu]-, ($^s$Bu$_2$N)-Ln-C$_5$H$_3$-1-$^i$Pr-3-[(CEt$_2$)$_2$-N$''$Bu]-, ($^i$Bu$_2$N)-Ln-C$_5$H$_3$-1-$^i$Pr-3-[(CEt$_2$)$_2$-N$''$Bu]-, (Cp)-Ln-C$_5$H$_3$-1-$^i$Pr-3-[(CEt$_2$)$_2$-N$''$Bu]-, (HO)-Ln-C$_5$H$_3$-1-$^i$Pr-3-[(CEt$_2$)$_2$-N$''$Bu]-, (MeO)-Ln-C$_5$H$_3$-1-$^i$Pr-3-[(CEt$_2$)$_2$-N$''$Bu]-, (EtO)-Ln-C$_5$H$_3$-1-$^i$Pr-3-[(CEt$_2$)$_2$-N$''$Bu]-, ($''$PrO)-Ln-C$_5$H$_3$-1-$^i$Pr-3-[(CEt$_2$)$_2$-N$''$Bu]-, ($^i$PrO)-Ln-C$_5$H$_3$-1-$^i$Pr-3-[(CEt$_2$)$_2$- N$''$Bu]-, ($''$BuO)-Ln-C$_5$H$_3$-1-$^i$Pr-3-[(CEt$_2$)$_2$-N$''$Bu]-, ($^i$BuO)-Ln-C$_5$H$_3$-1-$^i$Pr-3-[(CEt$_2$)$_2$-N$''$Bu]-, ($^s$BuO)-Ln-C$_5$H$_3$-1-$^i$Pr-3-[(CEt$_2$)$_2$-N$''$Bu]-, ($^t$BuO)-Ln-C$_5$H$_3$-1-$^i$Pr-3-[(CEt$_2$)$_2$- N$''$Bu]-, (H$_2$N)-Ln-C$_5$H$_3$-1-$^i$Pr-3-[(CEt$_2$)$_2$-N$^i$Bu]-, (Me$_2$N)-Ln-C$_5$H$_3$-1-$^i$Pr-3-[(CEt$_2$)$_2$-N$^i$Bu]-, (Et$_2$N)-Ln-C$_5$H$_3$-1-$^i$Pr-3-[(CEt$_2$)$_2$-N$^i$Bu]-, ($''$Pr$_2$N)-Ln-C$_5$H$_3$-1-$^i$Pr-3-[(CEt$_2$)$_2$-N$^i$Bu]-, ($^i$Pr$_2$N)-Ln-C$_5$H$_3$-1-$^i$Pr-3-[(CEt$_2$)$_2$-N$^i$Bu]-, ($''$Bu$_2$N)-Ln-C$_5$H$_3$-1-$^i$Pr-3-[(CEt$_2$)$_2$-N$^i$Bu]-, ($^i$Bu$_2$N)-Ln-C$_5$H$_3$-1-$^i$Pr-3-[(CEt$_2$)$_2$-N$^i$Bu]-, ($^s$Bu$_2$N)-Ln-C$_5$H$_3$-1-$^i$Pr-3-[(CEt$_2$)$_2$-N$^i$Bu]-, ($^t$Bu$_2$N)-Ln-C$_5$H$_3$-1-$^i$Pr-3-[(CEt$_2$)$_2$-N$^i$Bu]-, (Cp)-Ln-C$_5$H$_3$-1-$^i$Pr-3-[(CEt$_2$)$_2$-N$^i$Bu]-, (HO)-Ln-C$_5$H$_3$-1-$^i$Pr-3-[(CEt$_2$)$_2$-N$^i$Bu]-, (MeO)-Ln-C$_5$H$_3$-1-$^i$Pr-3-[(CEt$_2$)$_2$-N$^i$Bu]-, (EtO)-Ln-C$_5$H$_3$-1-$^i$Pr-3-[(CEt$_2$)$_2$- N$^i$Bu]-, ($''$PrO)-Ln-C$_5$H$_3$-1-$^i$Pr-3-[(CEt$_2$)$_2$-N$^i$Bu]-, ($^i$PrO)-Ln-C$_5$H$_3$-1-$^i$Pr-3-[(CEt$_2$)$_2$-N$^i$Bu]-, ($''$BuO)-Ln-C$_5$H$_3$-1-$^i$Pr-3-[(CEt$_2$)$_2$-N$^i$Bu]-, ($^i$BuO)-Ln-C$_5$H$_3$-1-$^i$Pr-3-[(CEt$_2$)$_2$- N$^i$Bu]-, ($^s$BuO)-Ln-C$_5$H$_3$-1-$^i$Pr-3-[(CEt$_2$)$_2$-N$^i$Bu]-, ($^t$BuO)-Ln-C$_5$H$_3$-1-$^i$Pr-3-[(CEt$_2$)$_2$-N$^i$Bu]-, (H$_2$N)-Ln-C$_5$H$_3$-1-$^i$Pr-3-[(CEt$_2$)$_2$-N$^s$Bu]-, (Me$_2$N)-Ln-C$_5$H$_3$-1-$^i$Pr-3-[(CEt$_2$)$_2$-N$^s$Bu]-, (Et$_2$N)-Ln-C$_5$H$_3$-1-$^i$Pr-3-[(CEt$_2$)$_2$-N$^s$Bu]-, ($''$Pr$_2$N)-Ln-C$_5$H$_3$-1-$^i$Pr-3-[(CEt$_2$)$_2$-N$^s$Bu]-, ($^i$Pr$_2$N)-Ln-C$_5$H$_3$-1-$^i$Pr-3-[(CEt$_2$)$_2$-N$^s$Bu]-, ($''$Bu$_2$N)-Ln-C$_5$H$_3$-1-$^i$Pr-3-[(CEt$_2$)$_2$-N$^s$Bu]-, ($^i$Bu$_2$N)-Ln-C$_5$H$_3$-1-$^i$Pr-3-[(CEt$_2$)$_2$-N$^s$Bu]-, ($^s$Bu$_2$N)-Ln-C$_5$H$_3$-1-$^i$Pr-3-[(CEt$_2$)$_2$-N$^s$Bu]-, ($^t$Bu$_2$N)-Ln-C$_5$H$_3$-1-$^i$Pr-3-[(CEt$_2$)$_2$-N$^s$Bu]-, (Cp)-Ln-C$_5$H$_3$-1-$^i$Pr-3-[(CEt$_2$)$_2$-N$^s$Bu]-, (HO)-Ln-C$_5$H$_3$-1-$^i$Pr-3-[(CEt$_2$)$_2$-N$^s$Bu]-, (MeO)-Ln-C$_5$H$_3$-1-$^i$Pr-3-[(CEt$_2$)$_2$-N$^s$Bu]-, (EtO)-Ln-C$_5$H$_3$-1-$^i$Pr-3-[(CEt$_2$)$_2$-N$^s$Bu]-, ($''$PrO)-Ln-C$_5$H$_3$-1-$^i$Pr-3-[(CEt$_2$)$_2$-N$^s$Bu]-, ($^i$PrO)-Ln-C$_5$H$_3$-1-$^i$Pr-3-[(CEt$_2$)$_2$-N$^s$Bu]-, ($''$BuO)-Ln-C$_5$H$_3$-1-$^i$Pr-3-[(CEt$_2$)$_2$-N$^s$Bu]-, ($^i$BuO)-Ln-C$_5$H$_3$-1-$^i$Pr-3-[(CEt$_2$)$_2$-N$^s$Bu]-, ($^s$BuO)-Ln-C$_5$H$_3$-1-$^i$Pr-3-[(CEt$_2$)$_2$-N$^s$Bu]-, ($^t$BuO)-Ln-C$_5$H$_3$-1-$^i$Pr-3-[(CEt$_2$)$_2$-N$^s$Bu]-, (H$_2$N)-Ln-C$_5$H$_3$-1-$^i$Pr-3-[(CEt$_2$)$_2$-N$^t$Bu]-, (Me$_2$N)-Ln-C$_5$H$_3$-1-$^i$Pr-3-[(CEt$_2$)$_2$-N$^t$Bu]-, (Et$_2$N)-Ln-C$_5$H$_3$-1-$^i$Pr-3-[(CEt$_2$)$_2$-N$^t$Bu]-, ($''$Pr$_2$N)-Ln-C$_5$H$_3$-1-$^i$Pr-3-[(CEt$_2$)$_2$-N$^t$Bu]-, ($^i$Pr$_2$N)-Ln-C$_5$H$_3$-1-$^i$Pr-3-[(CEt$_2$)$_2$-N$^t$Bu]-, ($''$Bu$_2$N)-Ln-C$_5$H$_3$-1-$^i$Pr-3-[(CEt$_2$)$_2$-N$^t$Bu]-, ($^i$Bu$_2$N)-Ln-C$_5$H$_3$-1-$^i$Pr-3-[(CEt$_2$)$_2$-N$^t$Bu]-, ($^s$Bu$_2$N)-Ln-C$_5$H$_3$-1-$^i$Pr-3-[(CEt$_2$)$_2$-N$^t$Bu]-, ($^t$Bu$_2$N)-Ln-C$_5$H$_3$-1-$^i$Pr-3-[(CEt$_2$)$_2$-N$^t$Bu]-, (Cp)-Ln-C$_5$H$_3$-1-$^i$Pr-3-[(CEt$_2$)$_2$-N$^t$Bu]-, (HO)-Ln-C$_5$H$_3$-1-$^i$Pr-3-[(CEt$_2$)$_2$-N$^t$Bu]-, (MeO)-Ln-C$_5$H$_3$-1-$^i$Pr-3-[(CEt$_2$)$_2$-N$^t$Bu]-, (EtO)-Ln-C$_5$H$_3$-1-$^i$Pr-3-[(CEt$_2$)$_2$- N$^t$Bu]-, ($''$PrO)-Ln-C$_5$H$_3$-1-$^i$Pr-3-[(CEt$_2$)$_2$-N$^t$Bu]-, ($^i$PrO)-Ln-C$_5$H$_3$-1-$^i$Pr-3-[(CEt$_2$)$_2$-N$^t$Bu]-, ($''$BuO)-Ln-C$_5$H$_3$-1-$^i$Pr-3-[(CEt$_2$)$_2$-N$^t$Bu]-, ($^i$BuO)-Ln-C$_5$H$_3$-1-$^i$Pr-3-[(CEt$_2$)$_2$- N$^t$Bu]-, ($^s$BuO)-Ln-C$_5$H$_3$-1-$^i$Pr-3-[(CEt$_2$)$_2$-N$^t$Bu]-, ($^t$BuO)-Ln-C$_5$H$_3$-1-$^i$Pr-3-[(CEt$_2$)$_2$-N$^t$Bu]-, (H$_2$N)-Ln-C$_5$H$_3$-1-$^i$Pr-3-[(CEt$_2$)$_2$-O]—, (Me$_2$N)-Ln-C$_5$H$_3$-1-$^i$Pr-3-[(CEt$_2$)$_2$-O]—, (Et$_2$N)-Ln-C$_5$H$_3$-1-$^i$Pr-3-[(CEt$_2$)$_2$-O]—, ($''$Pr$_2$N)-Ln-C$_5$H$_3$-1-$^i$Pr-3-[(CEt$_2$)$_2$-O]—, ($^i$Pr$_2$N)-Ln-C$_5$H$_3$-1-$^i$Pr-3-[(CEt$_2$)$_2$-O]—, ($''$Bu$_2$N)-Ln-C$_5$H$_3$-1-$^i$Pr-3-[(CEt$_2$)$_2$-O]—, ($^i$Bu$_2$N)-Ln-C$_5$H$_3$-1-$^i$Pr-3-[(CEt$_2$)$_2$-O]—, ($^s$Bu$_2$N)-Ln-C$_5$H$_3$-1-$^i$Pr-3-[(CEt$_2$)$_2$-O]—, ($^t$Bu$_2$N)-Ln-C$_5$H$_3$-1-$^i$Pr-3-[(CEt$_2$)$_2$-O]—, (Cp)-Ln-C$_5$H$_3$-1-$^i$Pr-3-[(CEt$_2$)$_2$-O]—, (HO)-Ln-C$_5$H$_3$-1-$^i$Pr-3-[(CEt$_2$)$_2$-O]—, (MeO)-Ln-C$_5$H$_3$-1-$^i$Pr-3-[(CEt$_2$)$_2$-O]—, (EtO)-Ln-C$_5$H$_3$-1-$^i$Pr-3-[(CEt$_2$)$_2$-O]—, ($''$PrO)-Ln-C$_5$H$_3$-1-$^i$Pr-3-[(CEt$_2$)$_2$-O]—, ($^i$PrO)-Ln-C$_5$H$_3$-1-$^i$Pr-3-[(CEt$_2$)$_2$-O]—, ($''$BuO)-Ln-C$_5$H$_3$-1-$^i$Pr-3-[(CEt$_2$)$_2$-O]—, ($^i$BuO)-Ln-C$_5$H$_3$-1-$^i$Pr-3-[(CEt$_2$)$_2$-O]—, ($^s$BuO)-Ln-C$_5$H$_3$-1-$^i$Pr-3-[(CEt$_2$)$_2$-O]—, ($^t$BuO)-Ln-C$_5$H$_3$-1-$^i$Pr-3-[(CEt$_2$)$_2$-O]—, (H$_2$N)-Ln-C$_5$H$_3$-1-$^i$Pr-3-[(C$^i$Pr$_2$)$_2$—NH]—, (Me$_2$N)-Ln-C$_5$H$_3$-1-$^i$Pr-3-

[(C$^i$Pr$_2$)$_2$—NH]—, (Et$_2$N)-Ln-C$_5$H$_3$-1-$^i$Pr-3-[(C$^i$Pr$_2$)$_2$—NH]—, ($^n$Pr$_2$N)-Ln-C$_5$H$_3$-1-$^i$Pr-3-[(C$^i$Pr$_2$)$_2$—NH]—, ($^i$Pr$_2$N)-Ln-C$_5$H$_3$-1-$^i$Pr-3-[(C$^i$Pr$_2$)$_2$—NH]—, ($^n$Bu$_2$N)-Ln-C$_5$H$_3$-1-$^i$Pr-3-[(C$^i$Pr$_2$)$_2$—NH]—, ($^i$Bu$_2$N)-Ln-C$_5$H$_3$-1-$^i$Pr-3-[(C$^i$Pr$_2$)$_2$—NH]—, ($^s$Bu$_2$N)-Ln-C$_5$H$_3$-1-$^i$Pr-3-[(C$^i$Pr$_2$)$_2$—NH]—, ($^t$Bu$_2$N)-Ln-C$_5$H$_3$-1-$^i$Pr-3-[(C$^i$Pr$_2$)$_2$—NH]—, (Cp)-Ln-C$_5$H$_3$-1-$^i$Pr-3-[(C$^i$Pr$_2$)$_2$—NH]—, (HO)-Ln-C$_5$H$_3$-1-$^i$Pr-3-[(C$^i$Pr$_2$)$_2$—NH]—, (MeO)-Ln-C$_5$H$_3$-1-$^i$Pr-3-[(C$^i$Pr$_2$)$_2$—NH]—, (EtO)-Ln-C$_5$H$_3$-1-$^i$Pr-3-[(C$^i$Pr$_2$)$_2$—NH]—, ($^n$PrO)-Ln-C$_5$H$_3$-1-$^i$Pr-3-[(C$^i$Pr$_2$)$_2$—NH]—, ($^i$PrO)-Ln-C$_5$H$_3$-1-$^i$Pr-3-[(C$^i$Pr$_2$)$_2$—NH]—, ($^n$BuO)-Ln-C$_5$H$_3$-1-$^i$Pr-3-[(C$^i$Pr$_2$)$_2$—NH]—, ($^i$BuO)-Ln-C$_5$H$_3$-1-$^i$Pr-3-[(C$^i$Pr$_2$)$_2$—NH]—, ($^s$BuO)-Ln-C$_5$H$_3$-1-$^i$Pr-3-[(C$^i$Pr$_2$)$_2$—NH]—, ($^t$BuO)-Ln-C$_5$H$_3$-1-$^i$Pr-3-[(C$^i$Pr$_2$)$_2$—NH]—, (H$_2$N)-Ln-C$_5$H$_3$-1-$^i$Pr-3-[(C$^i$Pr$_2$)$_2$—NMe]-, (Me$_2$N)-Ln-C$_5$H$_3$-1-$^i$Pr-3-[(C$^i$Pr$_2$)$_2$—NMe]-, (Et$_2$N)-Ln-C$_5$H$_3$-1-$^i$Pr-3-[(C$^i$Pr$_2$)$_2$—NMe]-, ($^n$Pr$_2$N)-Ln-C$_5$H$_3$-1-$^i$Pr-3-[(C$^i$Pr$_2$)$_2$—NMe]-, ($^i$Pr$_2$N)-Ln-C$_5$H$_3$-1-$^i$Pr-3-[(C$^i$Pr$_2$)$_2$—NMe]-, ($^n$Bu$_2$N)-Ln-C$_5$H$_3$-1-$^i$Pr-3-[(C$^i$Pr$_2$)$_2$—NMe]-, ($^i$Bu$_2$N)-Ln-C$_5$H$_3$-1-$^i$Pr-3-[(C$^i$Pr$_2$)$_2$—NMe]-, ($^s$Bu$_2$N)-Ln-C$_5$H$_3$-1-$^i$Pr-3-[(C$^i$Pr$_2$)$_2$—NMe]-, ($^t$Bu$_2$N)-Ln-C$_5$H$_3$-1-$^i$Pr-3-[(C$^i$Pr$_2$)$_2$—NMe]-, (Cp)-Ln-C$_5$H$_3$-1-$^i$Pr-3-[(C$^i$Pr$_2$)$_2$—NMe]-, (HO)-Ln-C$_5$H$_3$-1-$^i$Pr-3-[(C$^i$Pr$_2$)$_2$—NMe]-, (MeO)-Ln-C$_5$H$_3$-1-$^i$Pr-3-[(C$^i$Pr$_2$)$_2$—NMe]-, (EtO)-Ln-C$_5$H$_3$-1-$^i$Pr-3-[(C$^i$Pr$_2$)$_2$—NMe]-, ($^n$PrO)-Ln-C$_5$H$_3$-1-$^i$Pr-3-[(C$^i$Pr$_2$)$_2$—NMe]-, ($^i$PrO)-Ln-C$_5$H$_3$-1-$^i$Pr-3-[(C$^i$Pr$_2$)$_2$—NMe]-, ($^n$BuO)-Ln-C$_5$H$_3$-1-$^i$Pr-3-[(C$^i$Pr$_2$)$_2$—NMe]-, ($^i$BuO)-Ln-C$_5$H$_3$-1-$^i$Pr-3-[(C$^i$Pr$_2$)$_2$—NMe]-, ($^s$BuO)-Ln-C$_5$H$_3$-1-$^i$Pr-3-[(C$^i$Pr$_2$)$_2$—NMe]-, ($^t$BuO)-Ln-C$_5$H$_3$-1-$^i$Pr-3-[(C$^i$Pr$_2$)$_2$—NMe]-, (H$_2$N)-Ln-C$_5$H$_3$-1-$^i$Pr-3-[(C$^i$Pr$_2$)$_2$—NEt]-, (Me$_2$N)-Ln-C$_5$H$_3$-1-$^i$Pr-3-[(C$^i$Pr$_2$)$_2$—NEt]-, (Et$_2$N)-Ln-C$_5$H$_3$-1-$^i$Pr-3-[(C$^i$Pr$_2$)$_2$—NEt]-, ($^n$Pr$_2$N)-Ln-C$_5$H$_3$-1-$^i$Pr-3-[(C$^i$Pr$_2$)$_2$—NEt]-, ($^i$Pr$_2$N)-Ln-C$_5$H$_3$-1-$^i$Pr-3-[(C$^i$Pr$_2$)$_2$—NEt]-, ($^n$Bu$_2$N)-Ln-C$_5$H$_3$-1-$^i$Pr-3-[(C$^i$Pr$_2$)$_2$—NEt]-, ($^i$Bu$_2$N)-Ln-C$_5$H$_3$-1-$^i$Pr-3-[(C$^i$Pr$_2$)$_2$—NEt]-, ($^s$Bu$_2$N)-Ln-C$_5$H$_3$-1-$^i$Pr-3-[(C$^i$Pr$_2$)$_2$—NEt]-, ($^t$Bu$_2$N)-Ln-C$_5$H$_3$-1-$^i$Pr-3-[(C$^i$Pr$_2$)$_2$—NEt]-, (Cp)-Ln-C$_5$H$_3$-1-$^i$Pr-3-[(C$^i$Pr$_2$)$_2$—NEt]-, (HO)-Ln-C$_5$H$_3$-1-$^i$Pr-3-[(C$^i$Pr$_2$)$_2$—NEt]-, (MeO)-Ln-C$_5$H$_3$-1-$^i$Pr-3-[(C$^i$Pr$_2$)$_2$—NEt]-, (EtO)-Ln-C$_5$H$_3$-1-$^i$Pr-3-[(C$^i$Pr$_2$)$_2$—NEt]-, ($^n$PrO)-Ln-C$_5$H$_3$-1-$^i$Pr-3-[(C$^i$Pr$_2$)$_2$—NEt]-, ($^i$PrO)-Ln-C$_5$H$_3$-1-$^i$Pr-3-[(C$^i$Pr$_2$)$_2$—NEt]-, ($^n$BuO)-Ln-C$_5$H$_3$-1-$^i$Pr-3-[(C$^i$Pr$_2$)$_2$—NEt]-, ($^i$BuO)-Ln-C$_5$H$_3$-1-$^i$Pr-3-[(C$^i$Pr$_2$)$_2$—NEt]-, ($^s$BuO)-Ln-C$_5$H$_3$-1-$^i$Pr-3-[(C$^i$Pr$_2$)$_2$—NEt]-, ($^t$BuO)-Ln-C$_5$H$_3$-1-$^i$Pr-3-[(C$^i$Pr$_2$)$_2$—NEt]-, (H$_2$N)-Ln-C$_5$H$_3$-1-$^i$Pr-3-[(C$^i$Pr$_2$)$_2$—N$^n$Pr]—, (Me$_2$N)-Ln-C$_5$H$_3$-1-$^i$Pr-3-[(C$^i$Pr$_2$)$_2$—N$^n$Pr]—, (Et$_2$N)-Ln-C$_5$H$_3$-1-$^i$Pr-3-[(C$^i$Pr$_2$)$_2$—N$^n$Pr]—, ($^n$Pr$_2$N)-Ln-C$_5$H$_3$-1-$^i$Pr-3-[(C$^i$Pr$_2$)$_2$—N$^n$Pr]—, ($^i$Pr$_2$N)-Ln-C$_5$H$_3$-1-$^i$Pr-3-[(C$^i$Pr$_2$)$_2$—N$^n$Pr]—, ($^n$Bu$_2$N)-Ln-C$_5$H$_3$-1-$^i$Pr-3-[(C$^i$Pr$_2$)$_2$—N$^n$Pr]—, ($^i$Bu$_2$N)-Ln-C$_5$H$_3$-1-$^i$Pr-3-[(C$^i$Pr$_2$)$_2$—N$^n$Pr]—, ($^s$Bu$_2$N)-Ln-C$_5$H$_3$-1-$^i$Pr-3-[(C$^i$Pr$_2$)$_2$—N$^n$Pr]—, ($^t$Bu$_2$N)-Ln-C$_5$H$_3$-1-$^i$Pr-3-[(C$^i$Pr$_2$)$_2$—N$^n$Pr]—, (Cp)-Ln-C$_5$H$_3$-1-$^i$Pr-3-[(C$^i$Pr$_2$)$_2$—N$^n$Pr]—, (HO)-Ln-C$_5$H$_3$-1-$^i$Pr-3-[(C$^i$Pr$_2$)$_2$—N$^n$Pr]—, (MeO)-Ln-C$_5$H$_3$-1-$^i$Pr-3-[(C$^i$Pr$_2$)$_2$—N$^n$Pr]—, (EtO)-Ln-C$_5$H$_3$-1-$^i$Pr-3-[(C$^i$Pr$_2$)$_2$—N$^n$Pr]—, ($^n$PrO)-Ln-C$_5$H$_3$-1-$^i$Pr-3-[(C$^i$Pr$_2$)$_2$—N$^n$Pr]—, ($^i$PrO)-Ln-C$_5$H$_3$-1-$^i$Pr-3-[(C$^i$Pr$_2$)$_2$—N$^n$Pr]—, ($^n$BuO)-Ln-C$_5$H$_3$-1-$^i$Pr-3-[(C$^i$Pr$_2$)$_2$—N$^n$Pr]—, ($^i$BuO)-Ln-C$_5$H$_3$-1-$^i$Pr-3-[(C$^i$Pr$_2$)$_2$—N$^n$Pr]—, ($^s$BuO)-Ln-C$_5$H$_3$-1-$^i$Pr-3-[(C$^i$Pr$_2$)$_2$—N$^n$Pr]—, ($^t$BuO)-Ln-C$_5$H$_3$-1-$^i$Pr-3-[(C$^i$Pr$_2$)$_2$—N$^n$Pr]—, (H$_2$N)-Ln-C$_5$H$_3$-1-$^i$Pr-3-[(C$^i$Pr$_2$)$_2$—N$^i$Pr]—, (MeO)-Ln-C$_5$H$_3$-1-$^i$Pr-3-[(C$^i$Pr$_2$)$_2$—N$^i$Pr]—, (EtO)-Ln-C$_5$H$_3$-1-$^i$Pr-3-[(C$^i$Pr$_2$)$_2$—N$^i$Pr]—, ($^n$PrO)-Ln-C$_5$H$_3$-1-$^i$Pr-3-[(C$^i$Pr$_2$)$_2$—N$^i$Pr]—, ($^i$PrO)-Ln-C$_5$H$_3$-1-$^i$Pr-3-[(C$^i$Pr$_2$)$_2$—N$^i$Pr]—, ($^n$BuO)-Ln-C$_5$H$_3$-1-$^i$Pr-3-[(C$^i$Pr$_2$)$_2$—N$^i$Pr]—, ($^i$BuO)-Ln-C$_5$H$_3$-1-$^i$Pr-3-[(C$^i$Pr$_2$)$_2$—N$^i$Pr]—, ($^s$BuO)-Ln-C$_5$H$_3$-1-$^i$Pr-3-[(C$^i$Pr$_2$)$_2$—N$^i$Pr]—, ($^t$BuO)-Ln-C$_5$H$_3$-1-$^i$Pr-3-[(C$^i$Pr$_2$)$_2$—N$^i$Pr]—, (H$_2$N)-Ln-C$_5$H$_3$-1-$^i$Pr-3-[(C$^i$Pr$_2$)$_2$—N$^n$Bu]-, (Me$_2$N)-Ln-C$_5$H$_3$-1-$^i$Pr-3-[(C$^i$Pr$_2$)$_2$—N$^n$Bu]-, (Et$_2$N)-Ln-C$_5$H$_3$-1-$^i$Pr-3-[(C$^i$Pr$_2$)$_2$—N$^n$Bu]-, ($^n$Pr$_2$N)-Ln-C$_5$H$_3$-1-$^i$Pr-3-[(C$^i$Pr$_2$)$_2$—N$^n$Bu]-, ($^i$Pr$_2$N)-Ln-C$_5$H$_3$-1-$^i$Pr-3-[(C$^i$Pr$_2$)$_2$—N$^n$Bu]-, ($^n$Bu$_2$N)-Ln-C$_5$H$_3$-1-$^i$Pr-3-[(C$^i$Pr$_2$)$_2$—N$^n$Bu]-, ($^i$Bu$_2$N)-Ln-C$_5$H$_3$-1-$^i$Pr-3-[(C$^i$Pr$_2$)$_2$—N$^n$Bu]-, ($^s$Bu$_2$N)-Ln-C$_5$H$_3$-1-$^i$Pr-3-[(C$^i$Pr$_2$)$_2$—N$^n$Bu]-, ($^t$Bu$_2$N)-Ln-C$_5$H$_3$-1-$^i$Pr-3-[(C$^i$Pr$_2$)$_2$—N$^n$Bu]-, (Cp)-Ln-C$_5$H$_3$-1-$^i$Pr-3-[(C$^i$Pr$_2$)$_2$—N$^n$Bu]-, (HO)-Ln-C$_5$H$_3$-1-$^i$Pr-3-[(C$^i$Pr$_2$)$_2$—N$^n$Bu]-, (MeO)-Ln-C$_5$H$_3$-1-$^i$Pr-3-[(C$^i$Pr$_2$)$_2$—N$^n$Bu]-, (EtO)-Ln-C$_5$H$_3$-1-$^i$Pr-3-[(C$^i$Pr$_2$)$_2$—N$^n$Bu]-, ($^n$PrO)-Ln-C$_5$H$_3$-1-$^i$Pr-3-[(C$^i$Pr$_2$)$_2$—N$^n$Bu]-, ($^i$PrO)-Ln-C$_5$H$_3$-1-$^i$Pr-3-[(C$^i$Pr$_2$)$_2$—N$^n$Bu]-, ($^n$BuO)-Ln-C$_5$H$_3$-1-$^i$Pr-3-[(C$^i$Pr$_2$)$_2$—N$^n$Bu]-, ($^i$BuO)-Ln-C$_5$H$_3$-1-$^i$Pr-3-[(C$^i$Pr$_2$)$_2$—N$^n$Bu]-, ($^s$BuO)-Ln-C$_5$H$_3$-1-$^i$Pr-3-[(C$^i$Pr$_2$)$_2$—N$^n$Bu]-, ($^t$BuO)-Ln-C$_5$H$_3$-1-$^i$Pr-3-[(C$^i$Pr$_2$)$_2$—N$^n$Bu]-, (H$_2$N)-Ln-C$_5$H$_3$-1-$^i$Pr-3-[(C$^i$Pr$_2$)$_2$—N$^i$Bu]-, (Me$_2$N)-Ln-C$_5$H$_3$-1-$^i$Pr-3-[(C$^i$Pr$_2$)$_2$—N$^i$Bu]-, (Et$_2$N)-Ln-C$_5$H$_3$-1-$^i$Pr-3-[(C$^i$Pr$_2$)$_2$—N$^i$Bu]-, ($^n$Pr$_2$N)-Ln-C$_5$H$_3$-1-$^i$Pr-3-[(C$^i$Pr$_2$)$_2$—N$^i$Bu]-, ($^i$Pr$_2$N)-Ln-C$_5$H$_3$-1-$^i$Pr-3-[(C$^i$Pr$_2$)$_2$—N$^i$Bu]-, ($^n$Bu$_2$N)-Ln-C$_5$H$_3$-1-$^i$Pr-3-[(C$^i$Pr$_2$)$_2$—N$^i$Bu]-, ($^i$Bu$_2$N)-Ln-C$_5$H$_3$-1-$^i$Pr-3-[(C$^i$Pr$_2$)$_2$—N$^i$Bu]-, ($^s$Bu$_2$N)-Ln-C$_5$H$_3$-1-$^i$Pr-3-[(C$^i$Pr$_2$)$_2$—N$^i$Bu]-, ($^t$Bu$_2$N)-Ln-C$_5$H$_3$-1-$^i$Pr-3-[(C$^i$Pr$_2$)$_2$—N$^i$Bu]-, (Cp)-Ln-C$_5$H$_3$-1-$^i$Pr-3-[(C$^i$Pr$_2$)$_2$—N$^i$Bu]-, (HO)-Ln-C$_5$H$_3$-1-$^i$Pr-3-[(C$^i$Pr$_2$)$_2$—N$^i$Bu]-, (MeO)-Ln-C$_5$H$_3$-1-$^i$Pr-3-[(C$^i$Pr$_2$)$_2$—N$^i$Bu]-, (EtO)-Ln-C$_5$H$_3$-1-$^i$Pr-3-[(C$^i$Pr$_2$)$_2$—N$^i$Bu]-, ($^n$PrO)-Ln-C$_5$H$_3$-1-$^i$Pr-3-[(C$^i$Pr$_2$)$_2$—N$^i$Bu]-, ($^i$PrO)-Ln-C$_5$H$_3$-1-$^i$Pr-3-[(C$^i$Pr$_2$)$_2$—N$^i$Bu]-, ($^n$BuO)-Ln-C$_5$H$_3$-1-$^i$Pr-3-[(C$^i$Pr$_2$)$_2$—N$^i$Bu]-, ($^i$BuO)-Ln-C$_5$H$_3$-1-$^i$Pr-3-[(C$^i$Pr$_2$)$_2$—N$^i$Bu]-, ($^s$BuO)-Ln-C$_5$H$_3$-1-$^i$Pr-3-[(C$^i$Pr$_2$)$_2$—N$^i$Bu]-, ($^t$BuO)-Ln-C$_5$H$_3$-1-$^i$Pr-3-[(C$^i$Pr$_2$)$_2$—N$^s$Bu]-, (Me$_2$N)-Ln-C$_5$H$_3$-1-$^i$Pr-3-[(C$^i$Pr$_2$)$_2$—N$^s$Bu]-, (Et$_2$N)-Ln-C$_5$H$_3$-1-$^i$Pr-3-[(C$^i$Pr$_2$)$_2$—N$^s$Bu]-, ($^n$Pr$_2$N)-Ln-C$_5$H$_3$-1-$^i$Pr-3-[(C$^i$Pr$_2$)$_2$—N$^s$Bu]-, ($^i$Pr$_2$N)-Ln-C$_5$H$_3$-1-$^i$Pr-3-[(C$^i$Pr$_2$)$_2$—N$^s$Bu]-, ($^n$Bu$_2$N)-Ln-C$_5$H$_3$-1-$^i$Pr-3-[(C$^i$Pr$_2$)$_2$—N$^s$Bu]-, ($^i$Bu$_2$N)-Ln-C$_5$H$_3$-1-$^i$Pr-3-[(C$^i$Pr$_2$)$_2$—N$^s$Bu]-, ($^s$Bu$_2$N)-Ln-C$_5$H$_3$-1-$^i$Pr-3-[(C$^i$Pr$_2$)$_2$—N$^s$Bu]-, ($^t$Bu$_2$N)-Ln-C$_5$H$_3$-1-$^i$Pr-3-[(C$^i$Pr$_2$)$_2$—N$^s$Bu]-, (Cp)-Ln-C$_5$H$_3$-1-$^i$Pr-3-[(C$^i$Pr$_2$)$_2$—N$^s$Bu]-, (HO)-Ln-C$_5$H$_3$-1-$^i$Pr-3-[(C$^i$Pr$_2$)$_2$—N$^s$Bu]-, (MeO)-Ln-C$_5$H$_3$-1-$^i$Pr-3-[(C$^i$Pr$_2$)$_2$—N$^s$Bu]-, (EtO)-Ln-C$_5$H$_3$-1-$^i$Pr-3-[(C$^i$Pr$_2$)$_2$—N$^s$Bu]-, ($^n$PrO)-Ln-C$_5$H$_3$-1-$^i$Pr-3-[(C$^i$Pr$_2$)$_2$—N$^s$Bu]-, ($^i$PrO)-Ln-C$_5$H$_3$-1-$^i$Pr-3-[(C$^i$Pr$_2$)$_2$—N$^s$Bu]-, ($^n$BuO)-Ln-C$_5$H$_3$-1-$^i$Pr-3-[(C$^i$Pr$_2$)$_2$—N$^s$Bu]-, ($^i$BuO)-Ln-C$_5$H$_3$-1-$^i$Pr-3-[(C$^i$Pr$_2$)$_2$—N$^s$Bu]-, ($^s$BuO)-Ln-C$_5$H$_3$-1-$^i$Pr-3-[(C$^i$Pr$_2$)$_2$—N$^s$Bu]-, ($^t$BuO)-Ln-C$_5$H$_3$-1-$^i$Pr-3-[(C$^i$Pr$_2$)$_2$—N$^t$Bu]-, (H$_2$N)-Ln-C$_5$H$_3$-1-$^i$Pr-3-[(C$^i$Pr$_2$)$_2$—N$^t$Bu]-, (Me$_2$N)-Ln-C$_5$H$_3$-1-$^i$Pr-3-[(C$^i$Pr$_2$)$_2$—N$^t$Bu]-, (Et$_2$N)-Ln-C$_5$H$_3$-1-$^i$Pr-3-[(C$^i$Pr$_2$)$_2$—N$^t$Bu]-, ($^n$Pr$_2$N)-Ln-C$_5$H$_3$-1-$^i$Pr-3-[(C$^i$Pr$_2$)$_2$—N$^t$Bu]-, ($^i$Pr$_2$N)-Ln-C$_5$H$_3$-1-$^i$Pr-3-[(C$^i$Pr$_2$)$_2$—N$^t$Bu]-, ($^n$Bu$_2$N)-Ln-C$_5$H$_3$-1-$^i$Pr-3-[(C$^i$Pr$_2$)$_2$—N$^t$Bu]-, ($^i$Bu$_2$N)-Ln-C$_5$H$_3$-1-$^i$Pr-3-[(C$^i$Pr$_2$)$_2$—N$^t$Bu]-, ($^s$Bu$_2$N)-Ln-C$_5$H$_3$-1-$^i$Pr-3-[(C$^i$Pr$_2$)$_2$—N$^t$Bu]-, ($^t$Bu$_2$N)-Ln-C$_5$H$_3$-1-$^i$Pr-3-[(C$^i$Pr$_2$)$_2$—N$^t$Bu]-, (Cp)-Ln-C$_5$H$_3$-1-$^i$Pr-3-[(C$^i$Pr$_2$)$_2$—N$^t$Bu]-, (HO)-Ln-C$_5$H$_3$-1-$^i$Pr-3-[(C$^i$Pr$_2$)$_2$—N$^t$Bu]-, (MeO)-Ln-C$_5$H$_3$-1-$^i$Pr-3-[(C$^i$Pr$_2$)$_2$—N$^t$Bu]-, (EtO)-Ln-C$_5$H$_3$-1-$^i$Pr-3-[(C$^i$Pr$_2$)$_2$—N$^t$Bu]-, ($^n$PrO)-Ln-C$_5$H$_3$-1-$^i$Pr-3-[(C$^i$Pr$_2$)$_2$—N$^t$Bu]-, ($^i$PrO)-Ln-C$_5$H$_3$-1-$^i$Pr-3-[(C$^i$Pr$_2$)$_2$—N$^t$Bu]-, ($^n$BuO)-Ln-C$_5$H$_3$-1-$^i$Pr-3-[(C$^i$Pr$_2$)$_2$—N$^t$Bu]-, ($^i$BuO)-Ln-C$_5$H$_3$-1-$^i$Pr-3-[(C$^i$Pr$_2$)$_2$—N$^t$Bu]-, ($^s$BuO)-Ln-C$_5$H$_3$-1-$^i$Pr-3-[(C$^i$Pr$_2$)$_2$—N$^t$Bu]-, ($^t$BuO)-Ln-C$_5$H$_3$-1-$^i$Pr-3-[(C$^i$Pr$_2$)$_2$—

N$^t$Bu]-, (H$_2$N)-Ln-C$_5$H$_3$-1-$^i$Pr-3-[(C$^i$Pr$_2$)$_2$—O]—, (Me$_2$N)-Ln-C$_5$H$_3$-1-$^i$Pr-3-[(C$^i$Pr$_2$)$_2$—O]—, (Et$_2$N)-Ln-C$_5$H$_3$-1-$^i$Pr-3-[(C$^i$Pr$_2$)$_2$—O]—, ($^n$Pr$_2$N)-Ln-C$_5$H$_3$-1-$^i$Pr-3-[(C$^i$Pr$_2$)$_2$—O]—, ($^i$Pr$_2$N)-Ln-C$_5$H$_3$-1-$^i$Pr-3-[(C$^i$Pr$_2$)$_2$—O]—, ($^n$Bu$_2$N)-Ln-C$_5$H$_3$-1-$^i$Pr-3-[(C$^i$Pr$_2$)$_2$—O]—, ($^i$Bu$_2$N)-Ln-C$_5$H$_3$-1-$^i$Pr-3-[(C$^i$Pr$_2$)$_2$—O]—, ($^s$Bu$_2$N)-Ln-C$_5$H$_3$-1-$^i$Pr-3-[(C$^i$Pr$_2$)$_2$—O]—, ($^t$Bu$_2$N)-Ln-C$_5$H$_3$-1-$^i$Pr-3-[(C$^i$Pr$_2$)$_2$—O]—, (Cp)-Ln-C$_5$H$_3$-1-$^i$Pr-3-[(C$^i$Pr$_2$)$_2$—O]—, (HO)-Ln-C$_5$H$_3$-1-$^i$Pr-3-[(C$^i$Pr$_2$)$_2$—O]—, (MeO)-Ln-C$_5$H$_3$-1-$^i$Pr-3-[(C$^i$Pr$_2$)$_2$—O]—, (EtO)-Ln-C$_5$H$_3$-1-$^i$Pr-3-[(C$^i$Pr$_2$)$_2$—O]—, ($^n$PrO)-Ln-C$_5$H$_3$-1-$^i$Pr-3-[(C$^i$Pr$_2$)$_2$—O]—, ($^i$PrO)-Ln-C$_5$H$_3$-1-$^i$Pr-3-[(C$^i$Pr$_2$)$_2$—O]—, ($^n$BuO)-Ln-C$_5$H$_3$-1-$^i$Pr-3-[(C$^i$Pr$_2$)$_2$—O]—, ($^i$BuO)-Ln-C$_5$H$_3$-1-$^i$Pr-3-[(C$^i$Pr$_2$)$_2$—O]—, ($^s$BuO)-Ln-C$_5$H$_3$-1-$^i$Pr-3-[(C$^i$Pr$_2$)$_2$—O]—, ($^t$BuO)-Ln-C$_5$H$_3$-1-$^i$Pr-3-[(C$^i$Pr$_2$)$_2$—O]—, (H$_2$N)-Ln-C$_5$H$_3$-1-$^i$Pr-3-[(C$^t$Bu$_2$)$_2$-NH]—, (Me$_2$N)-Ln-C$_5$H$_3$-1-$^i$Pr-3-[(C$^t$Bu$_2$)$_2$-NH]—, (Et$_2$N)-Ln-C$_5$H$_3$-1-$^i$Pr-3-[(C$^t$Bu$_2$)$_2$-NH]—, ($^n$Pr$_2$N)-Ln-C$_5$H$_3$-1-$^i$Pr-3-[(C$^t$Bu$_2$)$_2$-NH]—, ($^i$Pr$_2$N)-Ln-C$_5$H$_3$-1-$^i$Pr-3-[(C$^t$Bu$_2$)$_2$-NH]—, ($^n$Bu$_2$N)-Ln-C$_5$H$_3$-1-$^i$Pr-3-[(C$^t$Bu$_2$)$_2$-NH]—, ($^i$Bu$_2$N)-Ln-C$_5$H$_3$-1-$^i$Pr-3-[(C$^t$Bu$_2$)$_2$-NH]—, ($^s$Bu$_2$N)-Ln-C$_5$H$_3$-1-$^i$Pr-3-[(C$^t$Bu$_2$)$_2$-NH]—, ($^t$Bu$_2$N)-Ln-C$_5$H$_3$-1-$^i$Pr-3-[(C$^t$Bu$_2$)$_2$-NH]—, (Cp)-Ln-C$_5$H$_3$-1-$^i$Pr-3-[(C$^t$Bu$_2$)$_2$-NH]—, (HO)-Ln-C$_5$H$_3$-1-$^i$Pr-3-[(C$^t$Bu$_2$)$_2$-NH]—, (MeO)-Ln-C$_5$H$_3$-1-$^i$Pr-3-[(C$^t$Bu$_2$)$_2$-NH]—, (EtO)-Ln-C$_5$H$_3$-1-$^i$Pr-3-[(C$^t$Bu$_2$)$_2$-NH]—, ($^n$PrO)-Ln-C$_5$H$_3$-1-$^i$Pr-3-[(C$^t$Bu$_2$)$_2$-NH]—, ($^i$PrO)-Ln-C$_5$H$_3$-1-$^i$Pr-3-[(C$^t$Bu$_2$)$_2$-NH]—, ($^n$BuO)-Ln-C$_5$H$_3$-1-$^i$Pr-3-[(C$^t$Bu$_2$)$_2$-NH]—, ($^i$BuO)-Ln-C$_5$H$_3$-1-$^i$Pr-3-[(C$^t$Bu$_2$)$_2$-NH]—, ($^s$BuO)-Ln-C$_5$H$_3$-1-$^i$Pr-3-[(C$^t$Bu$_2$)$_2$-NH]—, ($^t$BuO)-Ln-C$_5$H$_3$-1-$^i$Pr-3-[(C$^t$Bu$_2$)$_2$-NH]—, (H$_2$N)-Ln-C$_5$H$_3$-1-$^i$Pr-3-[(C$^t$Bu$_2$)$_2$-NMe]-, (Me$_2$N)-Ln-C$_5$H$_3$-1-$^i$Pr-3-[(C$^t$Bu$_2$)$_2$-NMe]-, (Et$_2$N)-Ln-C$_5$H$_3$-1-$^i$Pr-3-[(C$^t$Bu$_2$)$_2$-NMe]-, ($^n$Pr$_2$N)-Ln-C$_5$H$_3$-1-$^i$Pr-3-[(C$^t$Bu$_2$)$_2$-NMe]-, ($^i$Pr$_2$N)-Ln-C$_5$H$_3$-1-$^i$Pr-3-[(C$^t$Bu$_2$)$_2$-NMe]-, ($^n$Bu$_2$N)-Ln-C$_5$H$_3$-1-$^i$Pr-3-[(C$^t$Bu$_2$)$_2$-NMe]-, ($^i$Bu$_2$N)-Ln-C$_5$H$_3$-1-$^i$Pr-3-[(C$^t$Bu$_2$)$_2$-NMe]-, ($^s$Bu$_2$N)-Ln-C$_5$H$_3$-1-$^i$Pr-3-[(C$^t$Bu$_2$)$_2$-NMe]-, ($^t$Bu$_2$N)-Ln-C$_5$H$_3$-1-$^i$Pr-3-[(C$^t$Bu$_2$)$_2$-NMe]-, (Cp)-Ln-C$_5$H$_3$-1-$^i$Pr-3-[(C$^t$Bu$_2$)$_2$-NMe]-, (HO)-Ln-C$_5$H$_3$-1-$^i$Pr-3-[(C$^t$Bu$_2$)$_2$-NMe]-, (MeO)-Ln-C$_5$H$_3$-1-$^i$Pr-3-[(C$^t$Bu$_2$)$_2$-NMe]-, (EtO)-Ln-C$_5$H$_3$-1-$^i$Pr-3-[(C$^t$Bu$_2$)$_2$-NMe]-, ($^n$PrO)-Ln-C$_5$H$_3$-1-$^i$Pr-3-[(C$^t$Bu$_2$)$_2$-NMe]-, ($^i$PrO)-Ln-C$_5$H$_3$-1-$^i$Pr-3-[(C$^t$Bu$_2$)$_2$-NMe]-, ($^n$BuO)-Ln-C$_5$H$_3$-1-$^i$Pr-3-[(C$^t$Bu$_2$)$_2$-NMe]-, ($^i$BuO)-Ln-C$_5$H$_3$-1-$^i$Pr-3-[(C$^t$Bu$_2$)$_2$-NMe]-, ($^s$BuO)-Ln-C$_5$H$_3$-1-$^i$Pr-3-[(C$^t$Bu$_2$)$_2$-NMe]-, ($^t$BuO)-Ln-C$_5$H$_3$-1-$^i$Pr-3-[(C$^t$Bu$_2$)$_2$-NMe]-, (H$_2$N)-Ln-C$_5$H$_3$-1-$^i$Pr-3-[(C$^t$Bu$_2$)$_2$-NEt]-, (Me$_2$N)-Ln-C$_5$H$_3$-1-$^i$Pr-3-[(C$^t$Bu$_2$)$_2$-NEt]-, (Et$_2$N)-Ln-C$_5$H$_3$-1-$^i$Pr-3-[(C$^t$Bu$_2$)$_2$-NEt]-, ($^n$Pr$_2$N)-Ln-C$_5$H$_3$-1-$^i$Pr-3-[(C$^t$Bu$_2$)$_2$-NEt]-, ($^i$Pr$_2$N)-Ln-C$_5$H$_3$-1-$^i$Pr-3-[(C$^t$Bu$_2$)$_2$-NEt]-, ($^n$Bu$_2$N)-Ln-C$_5$H$_3$-1-$^i$Pr-3-[(C$^t$Bu$_2$)$_2$-NEt]-, ($^i$Bu$_2$N)-Ln-C$_5$H$_3$-1-$^i$Pr-3-[(C$^t$Bu$_2$)$_2$-NEt]-, ($^s$Bu$_2$N)-Ln-C$_5$H$_3$-1-$^i$Pr-3-[(C$^t$Bu$_2$)$_2$-NEt]-, ($^t$Bu$_2$N)-Ln-C$_5$H$_3$-1-$^i$Pr-3-[(C$^t$Bu$_2$)$_2$-NEt]-, (Cp)-Ln-C$_5$H$_3$-1-$^i$Pr-3-[(C$^t$Bu$_2$)$_2$-NEt]-, (HO)-Ln-C$_5$H$_3$-1-$^i$Pr-3-[(C$^t$Bu$_2$)$_2$-NEt]-, (MeO)-Ln-C$_5$H$_3$-1-$^i$Pr-3-[(C$^t$Bu$_2$)$_2$-NEt]-, (EtO)-Ln-C$_5$H$_3$-1-$^i$Pr-3-[(C$^t$Bu$_2$)$_2$-NEt]-, ($^n$PrO)-Ln-C$_5$H$_3$-1-$^i$Pr-3-[(C$^t$Bu$_2$)$_2$-NEt]-, ($^i$PrO)-Ln-C$_5$H$_3$-1-$^i$Pr-3-[(C$^t$Bu$_2$)$_2$-NEt]-, ($^n$BuO)-Ln-C$_5$H$_3$-1-$^i$Pr-3-[(C$^t$Bu$_2$)$_2$-NEt]-, ($^i$BuO)-Ln-C$_5$H$_3$-1-$^i$Pr-3-[(C$^t$Bu$_2$)$_2$-NEt]-, ($^s$BuO)-Ln-C$_5$H$_3$-1-$^i$Pr-3-[(C$^t$Bu$_2$)$_2$-NEt]-, ($^t$BuO)-Ln-C$_5$H$_3$-1-$^i$Pr-3-[(C$^t$Bu$_2$)$_2$-NEt]-, (H$_2$N)-Ln-C$_5$H$_3$-1-$^i$Pr-3-[(C$^t$Bu$_2$)$_2$-N$^n$Pr]—, (Me$_2$N)-Ln-C$_5$H$_3$-1-$^i$Pr-3-[(C$^t$Bu$_2$)$_2$-N$^n$Pr]—, (Et$_2$N)-Ln-C$_5$H$_3$-1-$^i$Pr-3-[(C$^t$Bu$_2$)$_2$-N$^n$Pr]—, ($^n$Pr$_2$N)-Ln-C$_5$H$_3$-1-$^i$Pr-3-[(C$^t$Bu$_2$)$_2$-N$^n$Pr]—, ($^i$Pr$_2$N)-Ln-C$_5$H$_3$-1-$^i$Pr-3-[(C$^t$Bu$_2$)$_2$-N$^n$Pr]—, ($^n$Bu$_2$N)-Ln-C$_5$H$_3$-1-$^i$Pr-3-[(C$^t$Bu$_2$)$_2$-N$^n$Pr]—, ($^i$Bu$_2$N)-Ln-C$_5$H$_3$-1-$^i$Pr-3-[(C$^t$Bu$_2$)$_2$-N$^n$Pr]—, ($^s$Bu$_2$N)-Ln-C$_5$H$_3$-1-$^i$Pr-3-[(C$^t$Bu$_2$)$_2$-N$^n$Pr]—, ($^t$Bu$_2$N)-Ln-C$_5$H$_3$-1-$^i$Pr-3-[(C$^t$Bu$_2$)$_2$-N$^n$Pr]—, (Cp)-Ln-C$_5$H$_3$-1-$^i$Pr-3-[(C$^t$Bu$_2$)$_2$-N$^n$Pr]—, (HO)-Ln-C$_5$H$_3$-1-$^i$Pr-3-[(C$^t$Bu$_2$)$_2$-N$^n$Pr]—, (MeO)-Ln-C$_5$H$_3$-1-$^i$Pr-3-[(C$^t$Bu$_2$)$_2$-N$^n$Pr]—, (EtO)-Ln-C$_5$H$_3$-1-$^i$Pr-3-[(C$^t$Bu$_2$)$_2$-N$^n$Pr]—, ($^n$PrO)-Ln-C$_5$H$_3$-1-$^i$Pr-3-[(C$^t$Bu$_2$)$_2$-N$^n$Pr]—, ($^i$PrO)-Ln-C$_5$H$_3$-1-$^i$Pr-3-[(C$^t$Bu$_2$)$_2$-N$^n$Pr]—, ($^n$BuO)-Ln-C$_5$H$_3$-1-$^i$Pr-3-[(C$^t$Bu$_2$)$_2$-N$^n$Pr]—, ($^i$BuO)-Ln-C$_5$H$_3$-1-$^i$Pr-3-[(C$^t$Bu$_2$)$_2$-N$^n$Pr]—, ($^s$BuO)-Ln-C$_5$H$_3$-1-$^i$Pr-3-[(C$^t$Bu$_2$)$_2$-N$^n$Pr]—, ($^t$BuO)-Ln-C$_5$H$_3$-1-$^i$Pr-3-[(C$^t$Bu$_2$)$_2$-N$^n$Pr]—, (H$_2$N)-Ln-C$_5$H$_3$-1-$^i$Pr-3-[(C$^t$Bu$_2$)$_2$-N$^i$Pr]—, (Me$_2$N)-Ln-C$_5$H$_3$-1-$^i$Pr-3-[(C$^t$Bu$_2$)$_2$-N$^i$Pr]—, (Et$_2$N)-Ln-C$_5$H$_3$-1-$^i$Pr-3-[(C$^t$Bu$_2$)$_2$-N$^i$Pr]—, ($^n$Pr$_2$N)-Ln-C$_5$H$_3$-1-$^i$Pr-3-[(C$^t$Bu$_2$)$_2$-N$^i$Pr]—, ($^i$Pr$_2$N)-Ln-C$_5$H$_3$-1-$^i$Pr-3-[(C$^t$Bu$_2$)$_2$-N$^i$Pr]—, ($^n$Bu$_2$N)-Ln-C$_5$H$_3$-1-$^i$Pr-3-[(C$^t$Bu$_2$)$_2$-N$^i$Pr]—, ($^i$Bu$_2$N)-Ln-C$_5$H$_3$-1-$^i$Pr-3-[(C$^t$Bu$_2$)$_2$-N$^i$Pr]—, ($^s$Bu$_2$N)-Ln-C$_5$H$_3$-1-$^i$Pr-3-[(C$^t$Bu$_2$)$_2$-N$^i$Pr]—, ($^t$Bu$_2$N)-Ln-C$_5$H$_3$-1-$^i$Pr-3-[(C$^t$Bu$_2$)$_2$-N$^i$Pr]—, (Cp)-Ln-C$_5$H$_3$-1-$^i$Pr-3-[(C$^t$Bu$_2$)$_2$-N$^i$Pr]—, (HO)-Ln-C$_5$H$_3$-1-$^i$Pr-3-[(C$^t$Bu$_2$)$_2$-N$^i$Pr]—, (MeO)-Ln-C$_5$H$_3$-1-$^i$Pr-3-[(C$^t$Bu$_2$)$_2$-N$^i$Pr]—, (EtO)-Ln-C$_5$H$_3$-1-$^i$Pr-3-[(C$^t$Bu$_2$)$_2$-N$^i$Pr]—, ($^n$PrO)-Ln-C$_5$H$_3$-1-$^i$Pr-3-[(C$^t$Bu$_2$)$_2$-N$^i$Pr]—, ($^i$PrO)-Ln-C$_5$H$_3$-1-$^i$Pr-3-[(C$^t$Bu$_2$)$_2$-N$^i$Pr]—, ($^n$BuO)-Ln-C$_5$H$_3$-1-$^i$Pr-3-[(C$^t$Bu$_2$)$_2$-N$^i$Pr]—, ($^i$BuO)-Ln-C$_5$H$_3$-1-$^i$Pr-3-[(C$^t$Bu$_2$)$_2$-N$^i$Pr]—, ($^s$BuO)-Ln-C$_5$H$_3$-1-$^i$Pr-3-[(C$^t$Bu$_2$)$_2$-N$^i$Pr]—, ($^t$BuO)-Ln-C$_5$H$_3$-1-$^i$Pr-3-[(C$^t$Bu$_2$)$_2$-N$^i$Pr]—, (H$_2$N)-Ln-C$_5$H$_3$-1-$^i$Pr-3-[(C$^t$Bu$_2$)$_2$-N$^n$Bu]-, (Me$_2$N)-Ln-C$_5$H$_3$-1-$^i$Pr-3-[(C$^t$Bu$_2$)$_2$-N$^n$Bu]-, (Et$_2$N)-Ln-C$_5$H$_3$-1-$^i$Pr-3-[(C$^t$Bu$_2$)$_2$-N$^n$Bu]-, ($^n$Pr$_2$N)-Ln-C$_5$H$_3$-1-$^i$Pr-3-[(C$^t$Bu$_2$)$_2$-N$^n$Bu]-, ($^i$Pr$_2$N)-Ln-C$_5$H$_3$-1-$^i$Pr-3-[(C$^t$Bu$_2$)$_2$-N$^n$Bu]-, ($^n$Bu$_2$N)-Ln-C$_5$H$_3$-1-$^i$Pr-3-[(C$^t$Bu$_2$)$_2$-N$^n$Bu]-, ($^i$Bu$_2$N)-Ln-C$_5$H$_3$-1-$^i$Pr-3-[(C$^t$Bu$_2$)$_2$-N$^n$Bu]-, ($^s$Bu$_2$N)-Ln-C$_5$H$_3$-1-$^i$Pr-3-[(C$^t$Bu$_2$)$_2$-N$^n$Bu]-, ($^t$Bu$_2$N)-Ln-C$_5$H$_3$-1-$^i$Pr-3-[(C$^t$Bu$_2$)$_2$-N$^n$Bu]-, (Cp)-Ln-C$_5$H$_3$-1-$^i$Pr-3-[(C$^t$Bu$_2$)$_2$-N$^n$Bu]-, (HO)-Ln-C$_5$H$_3$-1-$^i$Pr-3-[(C$^t$Bu$_2$)$_2$-N$^n$Bu]-, (MeO)-Ln-C$_5$H$_3$-1-$^i$Pr-3-[(C$^t$Bu$_2$)$_2$-N$^n$Bu]-, (EtO)-Ln-C$_5$H$_3$-1-$^i$Pr-3-[(C$^t$Bu$_2$)$_2$-N$^n$Bu]-, ($^n$PrO)-Ln-C$_5$H$_3$-1-$^i$Pr-3-[(C$^t$Bu$_2$)$_2$-N$^n$Bu]-, ($^i$PrO)-Ln-C$_5$H$_3$-1-$^i$Pr-3-[(C$^t$Bu$_2$)$_2$-N$^n$Bu]-, ($^n$BuO)-Ln-C$_5$H$_3$-1-$^i$Pr-3-[(C$^t$Bu$_2$)$_2$-N$^n$Bu]-, ($^i$BuO)-Ln-C$_5$H$_3$-1-$^i$Pr-3-[(C$^t$Bu$_2$)$_2$-N$^n$Bu]-, ($^s$BuO)-Ln-C$_5$H$_3$-1-$^i$Pr-3-[(C$^t$Bu$_2$)$_2$-N$^n$Bu]-, ($^t$BuO)-Ln-C$_5$H$_3$-1-$^i$Pr-3-[(C$^t$Bu$_2$)$_2$-N$^n$Bu]-, (H$_2$N)-Ln-C$_5$H$_3$-1-$^i$Pr-3-[(C$^t$Bu$_2$)$_2$-N$^i$Bu]-, (Me$_2$N)-Ln-C$_5$H$_3$-1-$^i$Pr-3-[(C$^t$Bu$_2$)$_2$-N$^i$Bu]-, (Et$_2$N)-Ln-C$_5$H$_3$-1-$^i$Pr-3-[(C$^t$Bu$_2$)$_2$-N$^i$Bu]-, ($^n$Pr$_2$N)-Ln-C$_5$H$_3$-1-$^i$Pr-3-[(C$^t$Bu$_2$)$_2$-N$^i$Bu]-, ($^i$Pr$_2$N)-Ln-C$_5$H$_3$-1-$^i$Pr-3-[(C$^t$Bu$_2$)$_2$-N$^i$Bu]-, ($^n$Bu$_2$N)-Ln-C$_5$H$_3$-1-$^i$Pr-3-[(C$^t$Bu$_2$)$_2$-N$^i$Bu]-, ($^i$Bu$_2$N)-Ln-C$_5$H$_3$-1-$^i$Pr-3-[(C$^t$Bu$_2$)$_2$-N$^i$Bu]-, ($^s$Bu$_2$N)-Ln-C$_5$H$_3$-1-$^i$Pr-3-[(C$^t$Bu$_2$)$_2$-N$^i$Bu]-, ($^t$Bu$_2$N)-Ln-C$_5$H$_3$-1-$^i$Pr-3-[(C$^t$Bu$_2$)$_2$-N$^i$Bu]-, (Cp)-Ln-C$_5$H$_3$-1-$^i$Pr-3-[(C$^t$Bu$_2$)$_2$-N$^i$Bu]-, (HO)-Ln-C$_5$H$_3$-1-$^i$Pr-3-[(C$^t$Bu$_2$)$_2$-N$^i$Bu]-, (MeO)-Ln-C$_5$H$_3$-1-$^i$Pr-3-[(C$^t$Bu$_2$)$_2$-N$^i$Bu]-, (EtO)-Ln-C$_5$H$_3$-1-$^i$Pr-3-[(C$^t$Bu$_2$)$_2$-N$^i$Bu]-, ($^n$PrO)-Ln-C$_5$H$_3$-1-$^i$Pr-3-[(C$^t$Bu$_2$)$_2$-N$^i$Bu]-, ($^i$PrO)-Ln-C$_5$H$_3$-1-$^i$Pr-3-[(C$^t$Bu$_2$)$_2$-N$^i$Bu]-, ($^n$BuO)-Ln-C$_5$H$_3$-1-$^i$Pr-3-[(C$^t$Bu$_2$)$_2$-N$^i$Bu]-, ($^i$BuO)-Ln-C$_5$H$_3$-1-$^i$Pr-3-[(C$^t$Bu$_2$)$_2$-N$^i$Bu]-, ($^s$BuO)-Ln-C$_5$H$_3$-1-$^i$Pr-3-[(C$^t$Bu$_2$)$_2$-N$^i$Bu]-, (H$_2$N)-Ln-C$_5$H$_3$-1-$^i$Pr-3-[(C$^t$Bu$_2$)$_2$-N$^s$Bu]-, (Me$_2$N)-Ln-C$_5$H$_3$-1-$^i$Pr-3-[(C$^t$Bu$_2$)$_2$-N$^s$Bu]-, (Et$_2$N)-Ln-C$_5$H$_3$-1-$^i$Pr-3-[(C$^t$Bu$_2$)$_2$-N$^s$Bu]-, ($^n$Pr$_2$N)-Ln-C$_5$H$_3$-1-$^i$Pr-3-[(C$^t$Bu$_2$)$_2$-N$^s$Bu]-, ($^i$Pr$_2$N)-Ln-C$_5$H$_3$-1-$^i$Pr-3-[(C$^t$Bu$_2$)$_2$-N$^s$Bu]-, ($^n$Bu$_2$N)-Ln-C$_5$H$_3$-1-$^i$Pr-3-[(C$^t$Bu$_2$)$_2$-N$^s$Bu]-, ($^i$Bu$_2$N)-Ln-C$_5$H$_3$-1-$^i$Pr-3-[(C$^t$Bu$_2$)$_2$-N$^s$Bu]-, ($^s$Bu$_2$N)-Ln-C$_5$H$_3$-1-$^i$Pr-3-[(C$^t$Bu$_2$)$_2$-N$^s$Bu]-, ($^t$Bu$_2$N)-Ln-C$_5$H$_3$-1-$^i$Pr-3-[(C$^t$Bu$_2$)$_2$-N$^s$Bu]-, (Cp)-Ln-C$_5$H$_3$-1-$^i$Pr-3-[(C$^t$Bu$_2$)$_2$-N$^s$Bu]-, (HO)-Ln-C$_5$H$_3$-1-$^i$Pr-3-[(C$^t$Bu$_2$)$_2$-N$^s$Bu]-, (MeO)-Ln-C$_5$H$_3$-1-$^i$Pr-3-[(C$^t$Bu$_2$)$_2$-N$^s$Bu]-, (EtO)-Ln-C$_5$H$_3$-1-$^i$Pr-3-[(C$^t$Bu$_2$)$_2$-N$^s$Bu]-, ($^n$PrO)-Ln-C$_5$H$_3$-1-$^i$Pr-3-[(C$^t$Bu$_2$)$_2$-N$^s$Bu]-, ($^i$PrO)-Ln-C$_5$H$_3$-1-$^i$Pr-3-[(C$^t$Bu$_2$)$_2$-N$^s$Bu]-, ($^n$BuO)-Ln-C$_5$H$_3$-1-$^i$Pr-3-[(C$^t$Bu$_2$)$_2$-N$^s$Bu]-, ($^i$BuO)-Ln-C$_5$H$_3$-1-$^i$Pr-3-[(C$^t$Bu$_2$)$_2$-N$^s$Bu]-, ($^s$BuO)-Ln-C$_5$H$_3$-1-$^i$Pr-3-[(C$^t$Bu$_2$)$_2$-N$^s$Bu]-, (H$_2$N)-Ln-C$_5$H$_3$-1-$^i$Pr-3-[(C$^t$Bu$_2$)$_2$-N$^s$Bu]-, (Me$_2$N)-Ln-C$_5$H$_3$-1-$^i$Pr-3-[(C$^t$Bu$_2$)$_2$-N$^t$Bu]-, (Et$_2$N)-Ln-C$_5$H$_3$-1-$^i$Pr-3-[(C$^t$Bu$_2$)$_2$-N$^t$Bu]-, ($^n$Pr$_2$N)-Ln-C$_5$H$_3$-1-$^i$Pr-3-[(C$^t$Bu$_2$)$_2$-N$^t$Bu]-, ($^i$Pr$_2$N)-Ln-C$_5$H$_3$-1-$^i$Pr-3-[(C$^t$Bu$_2$)$_2$-N$^t$Bu]-, ($^n$Bu$_2$N)-Ln-C$_5$H$_3$-1-$^i$Pr-3-[(C$^t$Bu$_2$)$_2$-N$^t$Bu]-, ($^i$Bu$_2$N)-Ln-C$_5$H$_3$-1-$^i$Pr-3-[(C$^t$Bu$_2$)$_2$-N$^t$Bu]-, ($^s$Bu$_2$N)-Ln-C$_5$H$_3$-1-$^i$Pr-3-[(C$^t$Bu$_2$)$_2$-N$^t$Bu]-, ($^t$Bu$_2$N)-Ln-C$_5$H$_3$-1-$^i$Pr-3-[(C$^t$Bu$_2$)$_2$-N$^t$Bu]-, (Cp)-Ln-C$_5$H$_3$-1-$^i$Pr-3-[(C$^t$Bu$_2$)$_2$-N$^t$Bu]-, (HO)-Ln-C$_5$H$_3$-1-$^i$Pr-3-[(C$^t$Bu$_2$)$_2$-N$^t$Bu]-, (MeO)-Ln-C$_5$H$_3$-1-$^i$Pr-3-[(C$^t$Bu$_2$)$_2$-N$^t$Bu]-, (EtO)-Ln-C$_5$H$_3$-1-$^i$Pr-3-[(C$^t$Bu$_2$)$_2$-N$^t$Bu]-, ($^n$PrO)-Ln-C$_5$H$_3$-1-$^i$Pr-3-[(C$^t$Bu$_2$)$_2$-N$^t$Bu]-, ($^i$PrO)-Ln-C$_5$H$_3$-1-$^i$Pr-3-[(C$^t$Bu$_2$)$_2$-N$^t$Bu]-, ($^n$BuO)-Ln-C$_5$H$_3$-1-$^i$Pr-3-[(C$^t$Bu$_2$)$_2$-N$^t$Bu]-, ($^i$BuO)-Ln-C$_5$H$_3$-1-$^i$Pr-3-[(C$^t$Bu$_2$)$_2$-N$^t$Bu]-, ($^s$BuO)-Ln-C$_5$H$_3$-1-$^i$Pr-3-[(C$^t$Bu$_2$)$_2$-N$^t$Bu]-, ($^t$BuO)-Ln-C$_5$H$_3$-1-$^i$Pr-3-[(C$^t$Bu$_2$)$_2$-N$^t$Bu]-, (H$_2$N)-Ln-C$_5$H$_3$-1-$^i$Pr-3-[(C$^t$Bu$_2$)$_2$-O]—, (Me$_2$N)-Ln-C$_5$H$_3$-1-$^i$Pr-3-[(C$^t$Bu$_2$)$_2$-O]—, (Et$_2$N)-Ln-C$_5$H$_3$-1-$^i$Pr-3-[(C$^t$Bu$_2$)$_2$-O]—, ($^n$Pr$_2$N)-Ln-C$_5$H$_3$-1-$^i$Pr-3-[(C$^t$Bu$_2$)$_2$-O]—, ($^i$Pr$_2$N)-Ln-C$_5$H$_3$-1-$^i$Pr-3-[(C$^t$Bu$_2$)$_2$-O]—, ($^n$Bu$_2$N)-Ln-C$_5$H$_3$-1-$^i$Pr-3-[(C$^t$Bu$_2$)$_2$-O]—, ($^i$Bu$_2$N)-Ln-C$_5$H$_3$-1-$^i$Pr-3-[(C$^t$Bu$_2$)$_2$-O]—, ($^s$Bu$_2$N)-Ln-C$_5$H$_3$-1-$^i$Pr-3-[(C$^t$Bu$_2$)$_2$-O]—, ($^t$Bu$_2$N)-Ln-C$_5$H$_3$-1-$^i$Pr-3-[(C$^t$Bu$_2$)$_2$-O]—, (Cp)-Ln-C$_5$H$_3$-1-$^i$Pr-3-[(C$^t$Bu$_2$)$_2$-O]—, (HO)-Ln-C$_5$H$_3$-1-$^i$Pr-3-[(C$^t$Bu$_2$)$_2$-O]—, (MeO)-Ln-C$_5$H$_3$-1-$^i$Pr-3-[(C$^t$Bu$_2$)$_2$-O]—, (EtO)-Ln-C$_5$H$_3$-1-$^i$Pr-3-[(C$^t$Bu$_2$)$_2$-O]—, ($^n$PrO)-Ln-C$_5$H$_3$-1-$^i$Pr-3-[(C$^t$Bu$_2$)$_2$-O]—, ($^i$PrO)-Ln-C$_5$H$_3$-1-$^i$Pr-3-[(C$^t$Bu$_2$)$_2$-O]—, ($^n$BuO)-Ln-C$_5$H$_3$-1-$^i$Pr-3-[(C$^t$Bu$_2$)$_2$-O]—, ($^i$BuO)-Ln-C$_5$H$_3$-1-$^i$Pr-3-[(C$^t$Bu$_2$)$_2$-O]—, ($^s$BuO)-Ln-C$_5$H$_3$-1-$^i$Pr-3-[(C$^t$Bu$_2$)$_2$-O]—, ($^t$BuO)-Ln-C$_5$H$_3$-1-$^i$Pr-3-[(C$^t$Bu$_2$)$_2$-O]—, (H$_2$N)-Ln-C$_4$NH$_3$-3-[(CH$_2$)$_2$—NH]—, (Me$_2$N)-Ln-C$_4$NH$_3$-3-[(CH$_2$)$_2$—NH]—, (Et$_2$N)-Ln-C$_4$NH$_3$-3-[(CH$_2$)$_2$—NH]—, ($^n$Pr$_2$N)-Ln-C$_4$NH$_3$-3-[(CH$_2$)$_2$—NH]—, ($^i$Pr$_2$N)-Ln-C$_4$NH$_3$-3-[(CH$_2$)$_2$—NH]—, ($^n$Bu$_2$N)-Ln-C$_4$NH$_3$-3-[(CH$_2$)$_2$—NH]—, ($^i$Bu$_2$N)-Ln-C$_4$NH$_3$-3-[(CH$_2$)$_2$—NH]—, ($^s$Bu$_2$N)-Ln-C$_4$NH$_3$-3-[(CH$_2$)$_2$—NH]—, ($^t$Bu$_2$N)-Ln-C$_4$NH$_3$-3-[(CH$_2$)$_2$—NH]—, (Cp)-Ln-C$_4$NH$_3$-3-[(CH$_2$)$_2$—NH]—, (HO)-Ln-C$_4$NH$_3$-3-[(CH$_2$)$_2$—NH]—, (MeO)-Ln-C$_4$NH$_3$-3-[(CH$_2$)$_2$—NH]—, (EtO)-Ln-C$_4$NH$_3$-3-[(CH$_2$)$_2$—NH]—, ($^n$PrO)-Ln-C$_4$NH$_3$-3-[(CH$_2$)$_2$—NH]—, ($^i$PrO)-Ln-C$_4$NH$_3$-3-[(CH$_2$)$_2$—NH]—, ($^n$BuO)-Ln-C$_4$NH$_3$-3-[(CH$_2$)$_2$—NH]—, ($^i$BuO)-Ln-C$_4$NH$_3$-3-[(CH$_2$)$_2$—NH]—, ($^s$BuO)-Ln-C$_4$NH$_3$-3-[(CH$_2$)$_2$—NH]—, ($^t$BuO)-Ln-C$_4$NH$_3$-3-[(CH$_2$)$_2$—NH]—, (H$_2$N)-Ln-C$_4$NH$_3$-3-[(CH$_2$)$_2$—NMe]-, (Me$_2$N)-Ln-C$_4$NH$_3$-3-[(CH$_2$)$_2$—NMe]-, (Et$_2$N)-Ln-C$_4$NH$_3$-3-[(CH$_2$)$_2$—NMe]-, ($^n$Pr$_2$N)-Ln-C$_4$NH$_3$-3-[(CH$_2$)$_2$—NMe]-, ($^i$Pr$_2$N)-Ln-C$_4$NH$_3$-3-[(CH$_2$)$_2$—NMe]-, ($^n$Bu$_2$N)-Ln-C$_4$NH$_3$-3-[(CH$_2$)$_2$—NMe]-, ($^i$Bu$_2$N)-Ln-C$_4$NH$_3$-3-[(CH$_2$)$_2$—NMe]-, ($^s$Bu$_2$N)-Ln-C$_4$NH$_3$-3-[(CH$_2$)$_2$—NMe]-, ($^t$Bu$_2$N)-Ln-C$_4$NH$_3$-3-[(CH$_2$)$_2$—NMe]-, (Cp)-Ln-C$_4$NH$_3$-3-[(CH$_2$)$_2$—NMe]-, (HO)-Ln-C$_4$NH$_3$-3-[(CH$_2$)$_2$—NMe]-, (MeO)-Ln-C$_4$NH$_3$-3-[(CH$_2$)$_2$—NMe]-, (EtO)-Ln-C$_4$NH$_3$-3-[(CH$_2$)$_2$—NMe]-, ($^n$PrO)-Ln-C$_4$NH$_3$-3-[(CH$_2$)$_2$—NMe]-, ($^i$PrO)-Ln-C$_4$NH$_3$-3-[(CH$_2$)$_2$—NMe]-, ($^n$BuO)-Ln-C$_4$NH$_3$-3-[(CH$_2$)$_2$—NMe]-, ($^i$BuO)-Ln-C$_4$NH$_3$-3-[(CH$_2$)$_2$—NMe]-, ($^s$BuO)-Ln-C$_4$NH$_3$-3-[(CH$_2$)$_2$—NMe]-, ($^t$BuO)-Ln-C$_4$NH$_3$-3-[(CH$_2$)$_2$—NMe]-, (H$_2$N)-Ln-C$_4$NH$_3$-3-[(CH$_2$)$_2$—NEt]-, (Me$_2$N)-Ln-C$_4$NH$_3$-3-[(CH$_2$)$_2$—NEt]-, (Et$_2$N)-Ln-C$_4$NH$_3$-3-[(CH$_2$)$_2$—NEt]-, ($^n$Pr$_2$N)-Ln-C$_4$NH$_3$-3-[(CH$_2$)$_2$—NEt]-, ($^i$Pr$_2$N)-Ln-C$_4$NH$_3$-3-[(CH$_2$)$_2$—NEt]-, ($^n$Bu$_2$N)-Ln-C$_4$NH$_3$-3-[(CH$_2$)$_2$—NEt]-, ($^i$Bu$_2$N)-Ln-C$_4$NH$_3$-3-[(CH$_2$)$_2$—NEt]-, ($^s$Bu$_2$N)-Ln-C$_4$NH$_3$-3-[(CH$_2$)$_2$—NEt]-, ($^t$Bu$_2$N)-Ln-C$_4$NH$_3$-3-[(CH$_2$)$_2$—NEt]-, (Cp)-Ln-C$_4$NH$_3$-3-[(CH$_2$)$_2$—NEt]-, (HO)-Ln-C$_4$NH$_3$-3-[(CH$_2$)$_2$—NEt]-, (MeO)-Ln-C$_4$NH$_3$-3-[(CH$_2$)$_2$—NEt]-, (EtO)-Ln-C$_4$NH$_3$-3-[(CH$_2$)$_2$—NEt]-, ($^n$PrO)-Ln-C$_4$NH$_3$-3-[(CH$_2$)$_2$—NEt]-, ($^i$PrO)-Ln-C$_4$NH$_3$-3-[(CH$_2$)$_2$—NEt]-, ($^n$BuO)-Ln-C$_4$NH$_3$-3-[(CH$_2$)$_2$—NEt]-, ($^i$BuO)-Ln-C$_4$NH$_3$-3-[(CH$_2$)$_2$—NEt]-, ($^s$BuO)-Ln-C$_4$NH$_3$-3-[(CH$_2$)$_2$—NEt]-, ($^t$BuO)-Ln-C$_4$NH$_3$-3-[(CH$_2$)$_2$—NEt]-, (H$_2$N)-Ln-C$_4$NH$_3$-3-[(CH$_2$)$_2$—N$^n$Pr]—, (Me$_2$N)-Ln-C$_4$NH$_3$-3-[(CH$_2$)$_2$—N$^n$Pr]—, (Et$_2$N)-Ln-C$_4$NH$_3$-3-[(CH$_2$)$_2$—N$^n$Pr]—, ($^n$Pr$_2$N)-Ln-C$_4$NH$_3$-3-[(CH$_2$)$_2$—N$^n$Pr]—, ($^i$Pr$_2$N)-Ln-C$_4$NH$_3$-3-[(CH$_2$)$_2$—N$^n$Pr]—, ($^n$Bu$_2$N)-Ln-C$_4$NH$_3$-3-[(CH$_2$)$_2$—N$^n$Pr]—, ($^i$Bu$_2$N)-Ln-C$_4$NH$_3$-3-[(CH$_2$)$_2$—N$^n$Pr]—, ($^s$Bu$_2$N)-Ln-C$_4$NH$_3$-3-[(CH$_2$)$_2$—N$^n$Pr]—, ($^t$Bu$_2$N)-Ln-C$_4$NH$_3$-3-[(CH$_2$)$_2$—N$^n$Pr]—, (Cp)-Ln-C$_4$NH$_3$-3-[(CH$_2$)$_2$—N$^n$Pr]—, (HO)-Ln-C$_4$NH$_3$-3-[(CH$_2$)$_2$—N$^n$Pr]—, (MeO)-Ln-C$_4$NH$_3$-3-[(CH$_2$)$_2$—N$^n$Pr]—, (EtO)-Ln-C$_4$NH$_3$-3-[(CH$_2$)$_2$—N$^n$Pr]—, ($^n$PrO)-Ln-C$_4$NH$_3$-3-[(CH$_2$)$_2$—N$^n$Pr]—, ($^i$PrO)-Ln-C$_4$NH$_3$-3-[(CH$_2$)$_2$—N$^n$Pr]—, ($^n$BuO)-Ln-C$_4$NH$_3$-3-[(CH$_2$)$_2$—N$^n$Pr]—, ($^i$BuO)-Ln-C$_4$NH$_3$-3-[(CH$_2$)$_2$—N$^n$Pr]—, ($^s$BuO)-Ln-C$_4$NH$_3$-3-[(CH$_2$)$_2$—N$^n$Pr]—, ($^t$BuO)-Ln-C$_4$NH$_3$-3-[(CH$_2$)$_2$—N$^n$Pr]—, (H$_2$N)-Ln-C$_4$NH$_3$-3-[(CH$_2$)$_2$—N$^i$Pr]—, (Me$_2$N)-Ln-C$_4$NH$_3$-3-[(CH$_2$)$_2$—N$^i$Pr]—, (Et$_2$N)-Ln-C$_4$NH$_3$-3-[(CH$_2$)$_2$—N$^i$Pr]—, ($^n$Pr$_2$N)-Ln-C$_4$NH$_3$-3-[(CH$_2$)$_2$—N$^i$Pr]—, ($^i$Pr$_2$N)-Ln-C$_4$NH$_3$-3-[(CH$_2$)$_2$—N$^i$Pr]—, ($^n$Bu$_2$N)-Ln-C$_4$NH$_3$-3-[(CH$_2$)$_2$—N$^i$Pr]—, ($^i$Bu$_2$N)-Ln-C$_4$NH$_3$-3-[(CH$_2$)$_2$—N$^i$Pr]—, ($^s$Bu$_2$N)-Ln-C$_4$NH$_3$-3-[(CH$_2$)$_2$—N$^i$Pr]—, ($^t$Bu$_2$N)-Ln-C$_4$NH$_3$-3-[(CH$_2$)$_2$—N$^i$Pr]—, (Cp)-Ln-C$_4$NH$_3$-3-[(CH$_2$)$_2$—N$^i$Pr]—, (HO)-Ln-C$_4$NH$_3$-3-[(CH$_2$)$_2$—N$^i$Pr]—, (MeO)-Ln-C$_4$NH$_3$-3-[(CH$_2$)$_2$—N$^i$Pr]—, (EtO)-Ln-C$_4$NH$_3$-3-[(CH$_2$)$_2$—N$^i$Pr]—, ($^n$PrO)-Ln-C$_4$NH$_3$-3-[(CH$_2$)$_2$—N$^i$Pr]—, ($^i$PrO)-Ln-C$_4$NH$_3$-3-[(CH$_2$)$_2$—N$^i$Pr]—, ($^n$BuO)-Ln-C$_4$NH$_3$-3-[(CH$_2$)$_2$—N$^i$Pr]—, ($^i$BuO)-Ln-C$_4$NH$_3$-3-[(CH$_2$)$_2$—N$^i$Pr]—, ($^s$BuO)-Ln-C$_4$NH$_3$-3-[(CH$_2$)$_2$—N$^i$Pr]—, ($^t$BuO)-Ln-C$_4$NH$_3$-3-[(CH$_2$)$_2$—N$^i$Pr]—, (H$_2$N)-Ln-C$_4$NH$_3$-3-[(CH$_2$)$_2$—N$^n$Bu]-, (Me$_2$N)-Ln-C$_4$NH$_3$-3-[(CH$_2$)$_2$—N$^n$Bu]-, (Et$_2$N)-Ln-C$_4$NH$_3$-3-[(CH$_2$)$_2$—N$^n$Bu]-, ($^n$Pr$_2$N)-Ln-C$_4$NH$_3$-3-[(CH$_2$)$_2$—N$^n$Bu]-, ($^i$Pr$_2$N)-Ln-C$_4$NH$_3$-3-[(CH$_2$)$_2$—N$^n$Bu]-, ($^n$Bu$_2$N)-Ln-C$_4$NH$_3$-3-[(CH$_2$)$_2$—N$^n$Bu]-, ($^i$Bu$_2$N)-Ln-C$_4$NH$_3$-3-[(CH$_2$)$_2$—N$^n$Bu]-, ($^s$Bu$_2$N)-Ln-C$_4$NH$_3$-3-[(CH$_2$)$_2$—N$^n$Bu]-, ($^t$Bu$_2$N)-Ln-C$_4$NH$_3$-3-[(CH$_2$)$_2$—N$^n$Bu]-, (Cp)-Ln-C$_4$NH$_3$-3-[(CH$_2$)$_2$—N$^n$Bu]-, (HO)-Ln-C$_4$NH$_3$-3-[(CH$_2$)$_2$—N$^n$Bu]-, (MeO)-Ln-C$_4$NH$_3$-3-[(CH$_2$)$_2$—N$^n$Bu]-, (EtO)-Ln-C$_4$NH$_3$-3-[(CH$_2$)$_2$—N$^n$Bu]-, ($^n$PrO)-Ln-C$_4$NH$_3$-3-[(CH$_2$)$_2$—N$^n$Bu]-, ($^i$PrO)-Ln-C$_4$NH$_3$-3-[(CH$_2$)$_2$—N$^n$Bu]-, ($^n$BuO)-Ln-C$_4$NH$_3$-3-[(CH$_2$)$_2$—N$^n$Bu]-, ($^i$BuO)-Ln-C$_4$NH$_3$-3-[(CH$_2$)$_2$—N$^n$Bu]-, ($^s$BuO)-Ln-C$_4$NH$_3$-3-[(CH$_2$)$_2$—N$^n$Bu]-, ($^t$BuO)-Ln-C$_4$NH$_3$-3-[(CH$_2$)$_2$—N$^n$Bu]-, (H$_2$N)-Ln-C$_4$NH$_3$-3-[(CH$_2$)$_2$—N$^i$Bu]-, (Me$_2$N)-Ln-C$_4$NH$_3$-3-[(CH$_2$)$_2$—N$^i$Bu]-, (Et$_2$N)-Ln-C$_4$NH$_3$-3-[(CH$_2$)$_2$—N$^i$Bu]-, ($^n$Pr$_2$N)-Ln-C$_4$NH$_3$-3-[(CH$_2$)$_2$—N$^i$Bu]-, ($^i$Pr$_2$N)-Ln-C$_4$NH$_3$-3-[(CH$_2$)$_2$—N$^i$Bu]-, ($^n$Bu$_2$N)-Ln-C$_4$NH$_3$-3-[(CH$_2$)$_2$—N$^i$Bu]-, ($^i$Bu$_2$N)-Ln-C$_4$NH$_3$-3-[(CH$_2$)$_2$—N$^i$Bu]-, ($^s$Bu$_2$N)-Ln-C$_4$NH$_3$-3-[(CH$_2$)$_2$—N$^i$Bu]-, ($^t$Bu$_2$N)-Ln-C$_4$NH$_3$-3-[(CH$_2$)$_2$—N$^i$Bu]-, (Cp)-Ln-C$_4$NH$_3$-3-[(CH$_2$)$_2$—N$^i$Bu]-, (HO)-Ln-C$_4$NH$_3$-3-[(CH$_2$)$_2$—N$^i$Bu]-, (MeO)-Ln-C$_4$NH$_3$-3-[(CH$_2$)$_2$—N$^i$Bu]-, (EtO)-Ln-C$_4$NH$_3$-3-[(CH$_2$)$_2$—N$^i$Bu]-, ($^n$PrO)-Ln-C$_4$NH$_3$-3-[(CH$_2$)$_2$—N$^i$Bu]-, ($^i$PrO)-Ln-C$_4$NH$_3$-3-[(CH$_2$)$_2$—N$^i$Bu]-, ($^n$BuO)-Ln-C$_4$NH$_3$-3-[(CH$_2$)$_2$—N$^i$Bu]-, ($^i$BuO)-Ln-C$_4$NH$_3$-3-[(CH$_2$)$_2$—N$^i$Bu]-, ($^s$BuO)-Ln-C$_4$NH$_3$-3-[(CH$_2$)$_2$—N$^i$Bu]-, ($^t$BuO)-Ln-C$_4$NH$_3$-3-[(CH$_2$)$_2$—N$^i$Bu]-, (H$_2$N)-Ln-C$_4$NH$_3$-3-[(CH$_2$)$_2$—N$^s$Bu]-, (Me$_2$N)-Ln-C$_4$NH$_3$-3-[(CH$_2$)$_2$—N$^s$Bu]-, (Et$_2$N)-Ln-C$_4$NH$_3$-3-[(CH$_2$)$_2$—N$^s$Bu]-, ($^n$Pr$_2$N)-Ln-C$_4$NH$_3$-3-[(CH$_2$)$_2$—N$^s$Bu]-, ($^i$Pr$_2$N)-Ln-C$_4$NH$_3$-3-[(CH$_2$)$_2$—N$^s$Bu]-, ($^n$Bu$_2$N)-Ln-C$_4$NH$_3$-3-[(CH$_2$)$_2$—N$^s$Bu]-, ($^i$Bu$_2$N)-Ln-C$_4$NH$_3$-3-[(CH$_2$)$_2$—N$^s$Bu]-, ($^s$Bu$_2$N)-Ln-C$_4$NH$_3$-3-[(CH$_2$)$_2$—N$^s$Bu]-, ($^t$Bu$_2$N)-Ln-C$_4$NH$_3$-3-[(CH$_2$)$_2$—N$^s$Bu]-, (Cp)-Ln-C$_4$NH$_3$-3-[(CH$_2$)$_2$—N$^s$Bu]-, (HO)-Ln-C$_4$NH$_3$-3-[(CH$_2$)$_2$—N$^s$Bu]-, (MeO)-Ln-C$_4$NH$_3$-3-[(CH$_2$)$_2$—N$^s$Bu]-, (EtO)-Ln-C$_4$NH$_3$-3-[(CH$_2$)$_2$—N$^s$Bu]-, ($^n$PrO)-Ln-C$_4$NH$_3$-3-[(CH$_2$)$_2$—N$^s$Bu]-, ($^i$PrO)-Ln-C$_4$NH$_3$-3-[(CH$_2$)$_2$—N$^s$Bu]-, ($^n$BuO)-Ln-C$_4$NH$_3$-3-[(CH$_2$)$_2$—N$^s$Bu]-, ($^i$BuO)-Ln-C$_4$NH$_3$-3-[(CH$_2$)$_2$—N$^s$Bu]-, ($^s$BuO)-Ln-C$_4$NH$_3$-3-[(CH$_2$)$_2$

—N$^s$Bu]-, ($^t$BuO)-Ln-C$_4$NH$_3$-3-[(CH$_2$)$_2$—N$^s$Bu]-, (H$_2$N)-Ln-C$_4$NH$_3$-3-[(CH$_2$)$_2$—N$^t$Bu]-, (Me$_2$N)-Ln-C$_4$NH$_3$-3-[(CH$_2$)$_2$—N$^t$Bu]-, (Et$_2$N)-Ln-C$_4$NH$_3$-3-[(CH$_2$)$_2$—N$^t$Bu]-, ($^n$Pr$_2$N)-Ln-C$_4$NH$_3$-3-[(CH$_2$)$_2$—N$^t$Bu]-, ($^i$Pr$_2$N)-Ln-C$_4$NH$_3$-3-[(CH$_2$)$_2$—N$^t$Bu]-, ($^n$Bu$_2$N)-Ln-C$_4$NH$_3$-3-[(CH$_2$)$_2$—N$^t$Bu]-, ($^i$Bu$_2$N)-Ln-C$_4$NH$_3$-3-[(CH$_2$)$_2$—N$^t$Bu]-, ($^s$Bu$_2$N)-Ln-C$_4$NH$_3$-3-[(CH$_2$)$_2$—N$^t$Bu]-, ($^t$Bu$_2$N)-Ln-C$_4$NH$_3$-3-[(CH$_2$)$_2$—N$^t$Bu]-, (Cp)-Ln-C$_4$NH$_3$-3-[(CH$_2$)$_2$—N$^t$Bu]-, (HO)-Ln-C$_4$NH$_3$-3-[(CH$_2$)$_2$—N$^t$Bu]-, (MeO)-Ln-C$_4$NH$_3$-3-[(CH$_2$)$_2$—N$^t$Bu]-, (EtO)-Ln-C$_4$NH$_3$-3-[(CH$_2$)$_2$—N$^t$Bu]-, ($^n$PrO)-Ln-C$_4$NH$_3$-3-[(CH$_2$)$_2$—N$^t$Bu]-, ($^i$PrO)-Ln-C$_4$NH$_3$-3-[(CH$_2$)$_2$—N$^t$Bu]-, ($^n$BuO)-Ln-C$_4$NH$_3$-3-[(CH$_2$)$_2$—N$^t$Bu]-, ($^i$BuO)-Ln-C$_4$NH$_3$-3-[(CH$_2$)$_2$—N$^t$Bu]-, ($^s$BuO)-Ln-C$_4$NH$_3$-3-[(CH$_2$)$_2$—N$^t$Bu]-, ($^t$BuO)-Ln-C$_4$NH$_3$-3-[(CH$_2$)$_2$—N$^t$Bu]-, (H$_2$N)-Ln-C$_4$NH$_3$-3-[(CH$_2$)$_2$—O]—, (Me$_2$N)-Ln-C$_4$NH$_3$-3-[(CH$_2$)$_2$—O]—, (Et$_2$N)-Ln-C$_4$NH$_3$-3-[(CH$_2$)$_2$—O]—, ($^n$Pr$_2$N)-Ln-C$_4$NH$_3$-3-[(CH$_2$)$_2$—O]—, ($^i$Pr$_2$N)-Ln-C$_4$NH$_3$-3-[(CH$_2$)$_2$—O]—, ($^n$Bu$_2$N)-Ln-C$_4$NH$_3$-3-[(CH$_2$)$_2$—O]—, ($^i$Bu$_2$N)-Ln-C$_4$NH$_3$-3-[(CH$_2$)$_2$—O]—, ($^s$Bu$_2$N)-Ln-C$_4$NH$_3$-3-[(CH$_2$)$_2$—O]—, ($^t$Bu$_2$N)-Ln-C$_4$NH$_3$-3-[(CH$_2$)$_2$—O]—, (Cp)-Ln-C$_4$NH$_3$-3-[(CH$_2$)$_2$—O]—, (HO)-Ln-C$_4$NH$_3$-3-[(CH$_2$)$_2$—O]—, (MeO)-Ln-C$_4$NH$_3$-3-[(CH$_2$)$_2$—O]—, (EtO)-Ln-C$_4$NH$_3$-3-[(CH$_2$)$_2$—O]—, ($^n$PrO)-Ln-C$_4$NH$_3$-3-[(CH$_2$)$_2$—O]—, ($^i$PrO)-Ln-C$_4$NH$_3$-3-[(CH$_2$)$_2$—O]—, ($^n$BuO)-Ln-C$_4$NH$_3$-3-[(CH$_2$)$_2$—O]—, ($^i$BuO)-Ln-C$_4$NH$_3$-3-[(CH$_2$)$_2$—O]—, ($^s$BuO)-Ln-C$_4$NH$_3$-3-[(CH$_2$)$_2$—O]—, ($^t$BuO)-Ln-C$_4$NH$_3$-3-[(CH$_2$)$_2$—O]—, (H$_2$N)-Ln-C$_4$NH$_3$-3-[(CMe$_2$)$_2$-NH]—, (Me$_2$N)-Ln-C$_4$NH$_3$-3-[(CMe$_2$)$_2$-NH]—, (Et$_2$N)-Ln-C$_4$NH$_3$-3-[(CMe$_2$)$_2$-NH]—, ($^n$Pr$_2$N)-Ln-C$_4$NH$_3$-3-[(CMe$_2$)$_2$-NH]—, ($^i$Pr$_2$N)-Ln-C$_4$NH$_3$-3-[(CMe$_2$)$_2$-NH]—, ($^n$Bu$_2$N)-Ln-C$_4$NH$_3$-3-[(CMe$_2$)$_2$-NH]—, ($^i$Bu$_2$N)-Ln-C$_4$NH$_3$-3-[(CMe$_2$)$_2$-NH]—, ($^s$Bu$_2$N)-Ln-C$_4$NH$_3$-3-[(CMe$_2$)$_2$-NH]—, ($^t$Bu$_2$N)-Ln-C$_4$NH$_3$-3-[(CMe$_2$)$_2$-NH]—, (Cp)-Ln-C$_4$NH$_3$-3-[(CMe$_2$)$_2$-NH]—, (HO)-Ln-C$_4$NH$_3$-3-[(CMe$_2$)$_2$-NH]—, (MeO)-Ln-C$_4$NH$_3$-3-[(CMe$_2$)$_2$-NH]—, (EtO)-Ln-C$_4$NH$_3$-3-[(CMe$_2$)$_2$-NH]—, ($^n$PrO)-Ln-C$_4$NH$_3$-3-[(CMe$_2$)$_2$-NH]—, ($^i$PrO)-Ln-C$_4$NH$_3$-3-[(CMe$_2$)$_2$-NH]—, ($^n$BuO)-Ln-C$_4$NH$_3$-3-[(CMe$_2$)$_2$-NH]—, ($^i$BuO)-Ln-C$_4$NH$_3$-3-[(CMe$_2$)$_2$-NH]—, ($^s$BuO)-Ln-C$_4$NH$_3$-3-[(CMe$_2$)$_2$-NH]—, ($^t$BuO)-Ln-C$_4$NH$_3$-3-[(CMe$_2$)$_2$-NH]—, (H$_2$N)-Ln-C$_4$NH$_3$-3-[(CMe$_2$)$_2$-NMe]-, (Me$_2$N)-Ln-C$_4$NH$_3$-3-[(CMe$_2$)$_2$-NMe]-, (Et$_2$N)-Ln-C$_4$NH$_3$-3-[(CMe$_2$)$_2$-NMe]-, ($^n$Pr$_2$N)-Ln-C$_4$NH$_3$-3-[(CMe$_2$)$_2$-NMe]-, ($^i$Pr$_2$N)-Ln-C$_4$NH$_3$-3-[(CMe$_2$)$_2$-NMe]-, ($^n$Bu$_2$N)-Ln-C$_4$NH$_3$-3-[(CMe$_2$)$_2$-NMe]-, ($^i$Bu$_2$N)-Ln-C$_4$NH$_3$-3-[(CMe$_2$)$_2$-NMe]-, ($^s$Bu$_2$N)-Ln-C$_4$NH$_3$-3-[(CMe$_2$)$_2$-NMe]-, ($^t$Bu$_2$N)-Ln-C$_4$NH$_3$-3-[(CMe$_2$)$_2$-NMe]-, (Cp)-Ln-C$_4$NH$_3$-3-[(CMe$_2$)$_2$-NMe]-, (HO)-Ln-C$_4$NH$_3$-3-[(CMe$_2$)$_2$-NMe]-, (MeO)-Ln-C$_4$NH$_3$-3-[(CMe$_2$)$_2$-NMe]-, (EtO)-Ln-C$_4$NH$_3$-3-[(CMe$_2$)$_2$-NMe]-, ($^n$PrO)-Ln-C$_4$NH$_3$-3-[(CMe$_2$)$_2$-NMe]-, ($^i$PrO)-Ln-C$_4$NH$_3$-3-[(CMe$_2$)$_2$-NMe]-, ($^n$BuO)-Ln-C$_4$NH$_3$-3-[(CMe$_2$)$_2$-NMe]-, ($^i$BuO)-Ln-C$_4$NH$_3$-3-[(CMe$_2$)$_2$-NMe]-, ($^s$BuO)-Ln-C$_4$NH$_3$-3-[(CMe$_2$)$_2$-NMe]-, ($^t$BuO)-Ln-C$_4$NH$_3$-3-[(CMe$_2$)$_2$-NMe]-, (H$_2$N)-Ln-C$_4$NH$_3$-3-[(CMe$_2$)$_2$-NEt]-, (Me$_2$N)-Ln-C$_4$NH$_3$-3-[(CMe$_2$)$_2$-NEt]-, (Et$_2$N)-Ln-C$_4$NH$_3$-3-[(CMe$_2$)$_2$-NEt]-, ($^n$Pr$_2$N)-Ln-C$_4$NH$_3$-3-[(CMe$_2$)$_2$-NEt]-, ($^i$Pr$_2$N)-Ln-C$_4$NH$_3$-3-[(CMe$_2$)$_2$-NEt]-, ($^n$Bu$_2$N)-Ln-C$_4$NH$_3$-3-[(CMe$_2$)$_2$-NEt]-, ($^i$Bu$_2$N)-Ln-C$_4$NH$_3$-3-[(CMe$_2$)$_2$-NEt]-, ($^s$Bu$_2$N)-Ln-C$_4$NH$_3$-3-[(CMe$_2$)$_2$-NEt]-, ($^t$Bu$_2$N)-Ln-C$_4$NH$_3$-3-[(CMe$_2$)$_2$-NEt]-, (Cp)-Ln-C$_4$NH$_3$-3-[(CMe$_2$)$_2$-NEt]-, (HO)-Ln-C$_4$NH$_3$-3-[(CMe$_2$)$_2$-NEt]-, (MeO)-Ln-C$_4$NH$_3$-3-[(CMe$_2$)$_2$-NEt]-, (EtO)-Ln-C$_4$NH$_3$-3-[(CMe$_2$)$_2$-NEt]-, ($^n$PrO)-Ln-C$_4$NH$_3$-3-[(CMe$_2$)$_2$-NEt]-, ($^i$PrO)-Ln-C$_4$NH$_3$-3-[(CMe$_2$)$_2$-NEt]-, ($^n$BuO)-Ln-C$_4$NH$_3$-3-[(CMe$_2$)$_2$-NEt]-, ($^i$BuO)-Ln-C$_4$NH$_3$-3-[(CMe$_2$)$_2$-NEt]-, ($^s$BuO)-Ln-C$_4$NH$_3$-3-[(CMe$_2$)$_2$-NEt]-, ($^t$BuO)-Ln-C$_4$NH$_3$-3-[(CMe$_2$)$_2$-NEt]-, (H$_2$N)-Ln-C$_4$NH$_3$-3-[(CMe$_2$)$_2$-N$^n$Pr]—, (Me$_2$N)-Ln-C$_4$NH$_3$-3-[(CMe$_2$)$_2$-N$^n$Pr]—, (Et$_2$N)-Ln-C$_4$NH$_3$-3-[(CMe$_2$)$_2$-N$^n$Pr]—, ($^n$Pr$_2$N)-Ln-C$_4$NH$_3$-3-[(CMe$_2$)$_2$-N$^n$Pr]—, ($^i$Pr$_2$N)-Ln-C$_4$NH$_3$-3-[(CMe$_2$)$_2$-N$^n$Pr]—, ($^n$Bu$_2$N)-Ln-C$_4$NH$_3$-3-[(CMe$_2$)$_2$-N$^n$Pr]—, ($^i$Bu$_2$N)-Ln-C$_4$NH$_3$-3-[(CMe$_2$)$_2$-N$^n$Pr]—, ($^s$Bu$_2$N)-Ln-C$_4$NH$_3$-3-[(CMe$_2$)$_2$-N$^n$Pr]—, ($^t$Bu$_2$N)-Ln-C$_4$NH$_3$-3-[(CMe$_2$)$_2$-N$^n$Pr]—, (Cp)-Ln-C$_4$NH$_3$-3-[(CMe$_2$)$_2$-N$^n$Pr]—, (HO)-Ln-C$_4$NH$_3$-3-[(CMe$_2$)$_2$-N$^n$Pr]—, (MeO)-Ln-C$_4$NH$_3$-3-[(CMe$_2$)$_2$-N$^n$Pr]—, (EtO)-Ln-C$_4$NH$_3$-3-[(CMe$_2$)$_2$-N$^n$Pr]—, ($^n$PrO)-Ln-C$_4$NH$_3$-3-[(CMe$_2$)$_2$-N$^n$Pr]—, ($^i$PrO)-Ln-C$_4$NH$_3$-3-[(CMe$_2$)$_2$-N$^n$Pr]—, ($^n$BuO)-Ln-C$_4$NH$_3$-3-[(CMe$_2$)$_2$-N$^n$Pr]—, ($^i$BuO)-Ln-C$_4$NH$_3$-3-[(CMe$_2$)$_2$-N$^n$Pr]—, ($^s$BuO)-Ln-C$_4$NH$_3$-3-[(CMe$_2$)$_2$-N$^n$Pr]—, ($^t$BuO)-Ln-C$_4$NH$_3$-3-[(CMe$_2$)$_2$-N$^n$Pr]—, (H$_2$N)-Ln-C$_4$NH$_3$-3-[(CMe$_2$)$_2$-N$^i$Pr]—, (Me$_2$N)-Ln-C$_4$NH$_3$-3-[(CMe$_2$)$_2$-N$^i$Pr]—, (Et$_2$N)-Ln-C$_4$NH$_3$-3-[(CMe$_2$)$_2$-N$^i$Pr]—, ($^n$Pr$_2$N)-Ln-C$_4$NH$_3$-3-[(CMe$_2$)$_2$-N$^i$Pr]—, ($^i$Pr$_2$N)-Ln-C$_4$NH$_3$-3-[(CMe$_2$)$_2$-N$^i$Pr]—, ($^n$Bu$_2$N)-Ln-C$_4$NH$_3$-3-[(CMe$_2$)$_2$-N$^i$Pr]—, ($^i$Bu$_2$N)-Ln-C$_4$NH$_3$-3-[(CMe$_2$)$_2$-N$^i$Pr]—, ($^s$Bu$_2$N)-Ln-C$_4$NH$_3$-3-[(CMe$_2$)$_2$-N$^i$Pr]—, ($^t$Bu$_2$N)-Ln-C$_4$NH$_3$-3-[(CMe$_2$)$_2$-N$^i$Pr]—, (Cp)-Ln-C$_4$NH$_3$-3-[(CMe$_2$)$_2$-N$^i$Pr]—, (HO)-Ln-C$_4$NH$_3$-3-[(CMe$_2$)$_2$-N$^i$Pr]—, (MeO)-Ln-C$_4$NH$_3$-3-[(CMe$_2$)$_2$-N$^i$Pr]—, (EtO)-Ln-C$_4$NH$_3$-3-[(CMe$_2$)$_2$-N$^i$Pr]—, ($^n$PrO)-Ln-C$_4$NH$_3$-3-[(CMe$_2$)$_2$-N$^i$Pr]—, ($^i$PrO)-Ln-C$_4$NH$_3$-3-[(CMe$_2$)$_2$-N$^i$Pr]—, ($^n$BuO)-Ln-C$_4$NH$_3$-3-[(CMe$_2$)$_2$-N$^i$Pr]—, ($^i$BuO)-Ln-C$_4$NH$_3$-3-[(CMe$_2$)$_2$-N$^i$Pr]—, ($^s$BuO)-Ln-C$_4$NH$_3$-3-[(CMe$_2$)$_2$-N$^i$Pr]—, ($^t$BuO)-Ln-C$_4$NH$_3$-3-[(CMe$_2$)$_2$-N$^i$Pr]—, (H$_2$N)-Ln-C$_4$NH$_3$-3-[(CMe$_2$)$_2$-N$^n$Bu]-, (Me$_2$N)-Ln-C$_4$NH$_3$-3-[(CMe$_2$)$_2$-N$^n$Bu]-, (Et$_2$N)-Ln-C$_4$NH$_3$-3-[(CMe$_2$)$_2$-N$^n$Bu]-, ($^n$Pr$_2$N)-Ln-C$_4$NH$_3$-3-[(CMe$_2$)$_2$-N$^n$Bu]-, ($^i$Pr$_2$N)-Ln-C$_4$NH$_3$-3-[(CMe$_2$)$_2$-N$^n$Bu]-, ($^n$Bu$_2$N)-Ln-C$_4$NH$_3$-3-[(CMe$_2$)$_2$-N$^n$Bu]-, ($^i$Bu$_2$N)-Ln-C$_4$NH$_3$-3-[(CMe$_2$)$_2$-N$^n$Bu]-, ($^s$Bu$_2$N)-Ln-C$_4$NH$_3$-3-[(CMe$_2$)$_2$-N$^n$Bu]-, ($^t$Bu$_2$N)-Ln-C$_4$NH$_3$-3-[(CMe$_2$)$_2$-N$^n$Bu]-, (Cp)-Ln-C$_4$NH$_3$-3-[(CMe$_2$)$_2$-N$^n$Bu]-, (HO)-Ln-C$_4$NH$_3$-3-[(CMe$_2$)$_2$-N$^n$Bu]-, (MeO)-Ln-C$_4$NH$_3$-3-[(CMe$_2$)$_2$-N$^n$Bu]-, (EtO)-Ln-C$_4$NH$_3$-3-[(CMe$_2$)$_2$-N$^n$Bu]-, ($^n$PrO)-Ln-C$_4$NH$_3$-3-[(CMe$_2$)$_2$-N$^n$Bu]-, ($^i$PrO)-Ln-C$_4$NH$_3$-3-[(CMe$_2$)$_2$-N$^n$Bu]-, ($^n$BuO)-Ln-C$_4$NH$_3$-3-[(CMe$_2$)$_2$-N$^n$Bu]-, ($^i$BuO)-Ln-C$_4$NH$_3$-3-[(CMe$_2$)$_2$-N$^n$Bu]-, ($^s$BuO)-Ln-C$_4$NH$_3$-3-[(CMe$_2$)$_2$-N$^n$Bu]-, ($^t$BuO)-Ln-C$_4$NH$_3$-3-[(CMe$_2$)$_2$-N$^n$Bu]-, (H$_2$N)-Ln-C$_4$NH$_3$-3-[(CMe$_2$)$_2$-N$^i$Bu]-, (Me$_2$N)-Ln-C$_4$NH$_3$-3-[(CMe$_2$)$_2$-N$^i$Bu]-, (Et$_2$N)-Ln-C$_4$NH$_3$-3-[(CMe$_2$)$_2$-N$^i$Bu]-, ($^n$Pr$_2$N)-Ln-C$_4$NH$_3$-3-[(CMe$_2$)$_2$-N$^i$Bu]-, ($^i$Pr$_2$N)-Ln-C$_4$NH$_3$-3-[(CMe$_2$)$_2$-N$^i$Bu]-, ($^n$Bu$_2$N)-Ln-C$_4$NH$_3$-3-[(CMe$_2$)$_2$-N$^i$Bu]-, ($^i$Bu$_2$N)-Ln-C$_4$NH$_3$-3-[(CMe$_2$)$_2$-N$^i$Bu]-, ($^s$Bu$_2$N)-Ln-C$_4$NH$_3$-3-[(CMe$_2$)$_2$-N$^i$Bu]-, ($^t$Bu$_2$N)-Ln-C$_4$NH$_3$-3-[(CMe$_2$)$_2$-N$^i$Bu]-, (Cp)-Ln-C$_4$NH$_3$-3-[(CMe$_2$)$_2$-N$^i$Bu]-, (HO)-Ln-C$_4$NH$_3$-3-[(CMe$_2$)$_2$-N$^i$Bu]-, (MeO)-Ln-C$_4$NH$_3$-3-[(CMe$_2$)$_2$-N$^i$Bu]-, (EtO)-Ln-C$_4$NH$_3$-3-[(CMe$_2$)$_2$-N$^i$Bu]-, ($^n$PrO)-Ln-C$_4$NH$_3$-3-[(CMe$_2$)$_2$-N$^i$Bu]-, ($^i$PrO)-Ln-C$_4$NH$_3$-3-[(CMe$_2$)$_2$-N$^i$Bu]-, ($^n$BuO)-Ln-C$_4$NH$_3$-3-[(CMe$_2$)$_2$-N$^i$Bu]-, ($^i$BuO)-Ln-C$_4$NH$_3$-3-[(CMe$_2$)$_2$-N$^i$Bu]-, ($^s$BuO)-Ln-C$_4$NH$_3$-3-[(CMe$_2$)$_2$-N$^i$Bu]-, ($^t$BuO)-Ln-C$_4$NH$_3$-3-[(CMe$_2$)$_2$-N$^i$Bu]-, (H$_2$N)-Ln-C$_4$NH$_3$-3-[(CMe$_2$)$_2$-N$^s$Bu]-, (Me$_2$N)-Ln-C$_4$NH$_3$-3-[(CMe$_2$)$_2$-N$^s$Bu]-, (Et$_2$N)-Ln-C$_4$NH$_3$-3-[(CMe$_2$)$_2$-N$^s$Bu]-, ($^n$Pr$_2$N)-Ln-C$_4$NH$_3$-3-[(CMe$_2$)$_2$-N$^s$Bu]-, ($^i$Pr$_2$N)-Ln-C$_4$NH$_3$-3-[(CMe$_2$)$_2$-N$^s$Bu]-, ($^n$Bu$_2$N)-Ln-C$_4$NH$_3$-3-[(CMe$_2$)$_2$-N$^s$Bu]-, ($^i$Bu$_2$N)-Ln-C$_4$NH$_3$-3-[(CMe$_2$)$_2$-N$^s$Bu]-, ($^s$Bu$_2$N)-Ln-C$_4$NH$_3$-3-[(CMe$_2$)$_2$-N$^s$Bu]-, ($^t$Bu$_2$N)-Ln-C$_4$NH$_3$-3-[(CMe$_2$)$_2$-N$^s$Bu]-, (Cp)-Ln-C$_4$NH$_3$-3-[(CMe$_2$)$_2$-N$^s$Bu]-, (HO)-Ln-C$_4$NH$_3$-3-[(CMe$_2$)$_2$-N$^s$Bu]-, (MeO)-Ln-C$_4$NH$_3$-3-[(CMe$_2$)$_2$-N$^s$Bu]-, (EtO)-Ln-C$_4$NH$_3$-3-[(CMe$_2$)$_2$-N$^s$Bu]-, ($^n$PrO)-Ln-C$_4$NH$_3$-3-[(CMe$_2$)$_2$-N$^s$Bu]-, ($^i$PrO)-Ln-C$_4$NH$_3$-3-[(CMe$_2$)$_2$-N$^s$Bu]-, ($^n$BuO)-Ln-C$_4$NH$_3$-3-[(CMe$_2$)$_2$-N$^s$Bu]-, ($^i$BuO)-Ln-C$_4$NH$_3$-3-[(CMe$_2$)$_2$-N$^s$Bu]-, ($^s$BuO)-Ln-C$_4$NH$_3$-3-[(CMe$_2$)$_2$-

N$^s$Bu)-, ($^t$BuO)-Ln-C$_4$NH$_3$-3-[(CMe$_2$)$_2$-N$^s$Bu]-, (H$_2$N)-Ln-C$_4$NH$_3$-3-[(CMe$_2$)$_2$-N$^t$Bu]-, (Me$_2$N)-Ln-C$_4$NH$_3$-3-[(CMe$_2$)$_2$-N$^t$Bu]-, (Et$_2$N)-Ln-C$_4$NH$_3$-3-[(CMe$_2$)$_2$-N$^t$Bu]-, ($^n$Pr$_2$N)-Ln-C$_4$NH$_3$-3-[(CMe$_2$)$_2$-N$^t$Bu]-, ($^i$Pr$_2$N)-Ln-C$_4$NH$_3$-3-[(CMe$_2$)$_2$-N$^t$Bu]-, ($^n$Bu$_2$N)-Ln-C$_4$NH$_3$-3-[(CMe$_2$)$_2$-N$^t$Bu]-, ($^i$Bu$_2$N)-Ln-C$_4$NH$_3$-3-[(CMe$_2$)$_2$-N$^t$Bu]-, ($^s$Bu$_2$N)-Ln-C$_4$NH$_3$-3-[(CMe$_2$)$_2$-N$^t$Bu]-, ($^t$Bu$_2$N)-Ln-C$_4$NH$_3$-3-[(CMe$_2$)$_2$-N$^t$Bu]-, (Cp)-Ln-C$_4$NH$_3$-3-[(CMe$_2$)$_2$-N$^t$Bu]-, (HO)-Ln-C$_4$NH$_3$-3-[(CMe$_2$)$_2$-N$^t$Bu]-, (MeO)-Ln-C$_4$NH$_3$-3-[(CMe$_2$)$_2$-N$^t$Bu]-, (EtO)-Ln-C$_4$NH$_3$-3-[(CMe$_2$)$_2$-N$^t$Bu]-, ($^n$PrO)-Ln-C$_4$NH$_3$-3-[(CMe$_2$)$_2$-N$^t$Bu]-, ($^i$PrO)-Ln-C$_4$NH$_3$-3-[(CMe$_2$)$_2$-N$^t$Bu]-, ($^n$BuO)-Ln-C$_4$NH$_3$-3-[(CMe$_2$)$_2$-N$^t$Bu]-, ($^i$BuO)-Ln-C$_4$NH$_3$-3-[(CMe$_2$)$_2$-N$^t$Bu]-, ($^s$BuO)-Ln-C$_4$NH$_3$-3-[(CMe$_2$)$_2$-N$^t$Bu]-, ($^t$BuO)-Ln-C$_4$NH$_3$-3-[(CMe$_2$)$_2$-N$^t$Bu]-, (H$_2$N)-Ln-C$_4$NH$_3$-3-[(CMe$_2$)$_2$-O]—, (Me$_2$N)-Ln-C$_4$NH$_3$-3-[(CMe$_2$)$_2$-O]—, (Et$_2$N)-Ln-C$_4$NH$_3$-3-[(CMe$_2$)$_2$-O]—, ($^n$Pr$_2$N)-Ln-C$_4$NH$_3$-3-[(CMe$_2$)$_2$-O]—, ($^i$Pr$_2$N)-Ln-C$_4$NH$_3$-3-[(CMe$_2$)$_2$-O]—, ($^n$Bu$_2$N)-Ln-C$_4$NH$_3$-3-[(CMe$_2$)$_2$-O]—, ($^i$Bu$_2$N)-Ln-C$_4$NH$_3$-3-[(CMe$_2$)$_2$-O]—, ($^s$Bu$_2$N)-Ln-C$_4$NH$_3$-3-[(CMe$_2$)$_2$-O]—, ($^t$Bu$_2$N)-Ln-C$_4$NH$_3$-3-[(CMe$_2$)$_2$-O]—, (Cp)-Ln-C$_4$NH$_3$-3-[(CMe$_2$)$_2$-O]—, (HO)-Ln-C$_4$NH$_3$-3-[(CMe$_2$)$_2$-O]—, (MeO)-Ln-C$_4$NH$_3$-3-[(CMe$_2$)$_2$-O]—, (EtO)-Ln-C$_4$NH$_3$-3-[(CMe$_2$)$_2$-O]—, ($^n$PrO)-Ln-C$_4$NH$_3$-3-[(CMe$_2$)$_2$-O]—, ($^i$PrO)-Ln-C$_4$NH$_3$-3-[(CMe$_2$)$_2$-O]—, ($^n$BuO)-Ln-C$_4$NH$_3$-3-[(CMe$_2$)$_2$-O]—, ($^i$BuO)-Ln-C$_4$NH$_3$-3-[(CMe$_2$)$_2$-O]—, ($^s$BuO)-Ln-C$_4$NH$_3$-3-[(CMe$_2$)$_2$-O]—, ($^t$BuO)-Ln-C$_4$NH$_3$-3-[(CMe$_2$)$_2$-O]—, (H$_2$N)-Ln-C$_4$NH$_3$-3-[(CEt$_2$)$_2$-NH]—, (Me$_2$N)-Ln-C$_4$NH$_3$-3-[(CEt$_2$)$_2$-NH]—, (Et$_2$N)-Ln-C$_4$NH$_3$-3-[(CEt$_2$)$_2$-NH]—, ($^n$Pr$_2$N)-Ln-C$_4$NH$_3$-3-[(CEt$_2$)$_2$-NH]—, ($^i$Pr$_2$N)-Ln-C$_4$NH$_3$-3-[(CEt$_2$)$_2$-NH]—, ($^n$Bu$_2$N)-Ln-C$_4$NH$_3$-3-[(CEt$_2$)$_2$-NH]—, ($^i$Bu$_2$N)-Ln-C$_4$NH$_3$-3-[(CEt$_2$)$_2$-NH]—, ($^s$Bu$_2$N)-Ln-C$_4$NH$_3$-3-[(CEt$_2$)$_2$-NH]—, ($^t$Bu$_2$N)-Ln-C$_4$NH$_3$-3-[(CEt$_2$)$_2$-NH]—, (Cp)-Ln-C$_4$NH$_3$-3-[(CEt$_2$)$_2$-NH]—, (HO)-Ln-C$_4$NH$_3$-3-[(CEt$_2$)$_2$-NH]—, (MeO)-Ln-C$_4$NH$_3$-3-[(CEt$_2$)$_2$-NH]—, (EtO)-Ln-C$_4$NH$_3$-3-[(CEt$_2$)$_2$-NH]—, ($^n$PrO)-Ln-C$_4$NH$_3$-3-[(CEt$_2$)$_2$-NH]—, ($^i$PrO)-Ln-C$_4$NH$_3$-3-[(CEt$_2$)$_2$-NH]—, ($^n$BuO)-Ln-C$_4$NH$_3$-3-[(CEt$_2$)$_2$-NH]—, ($^i$BuO)-Ln-C$_4$NH$_3$-3-[(CEt$_2$)$_2$-NH]—, ($^s$BuO)-Ln-C$_4$NH$_3$-3-[(CEt$_2$)$_2$-NH]—, ($^t$BuO)-Ln-C$_4$NH$_3$-3-[(CEt$_2$)$_2$-NH]—, (H$_2$N)-Ln-C$_4$NH$_3$-3-[(CEt$_2$)$_2$-NMe]-, (Me$_2$N)-Ln-C$_4$NH$_3$-3-[(CEt$_2$)$_2$-NMe]-, (Et$_2$N)-Ln-C$_4$NH$_3$-3-[(CEt$_2$)$_2$-NMe]-, ($^n$Pr$_2$N)-Ln-C$_4$NH$_3$-3-[(CEt$_2$)$_2$-NMe]-, ($^i$Pr$_2$N)-Ln-C$_4$NH$_3$-3-[(CEt$_2$)$_2$-NMe]-, ($^n$Bu$_2$N)-Ln-C$_4$NH$_3$-3-[(CEt$_2$)$_2$-NMe]-, ($^i$Bu$_2$N)-Ln-C$_4$NH$_3$-3-[(CEt$_2$)$_2$-NMe]-, ($^s$Bu$_2$N)-Ln-C$_4$NH$_3$-3-[(CEt$_2$)$_2$-NMe]-, ($^t$Bu$_2$N)-Ln-C$_4$NH$_3$-3-[(CEt$_2$)$_2$-NMe]-, (Cp)-Ln-C$_4$NH$_3$-3-[(CEt$_2$)$_2$-NMe]-, (HO)-Ln-C$_4$NH$_3$-3-[(CEt$_2$)$_2$-NMe]-, (MeO)-Ln-C$_4$NH$_3$-3-[(CEt$_2$)$_2$-NMe]-, (EtO)-Ln-C$_4$NH$_3$-3-[(CEt$_2$)$_2$-NMe]-, ($^n$PrO)-Ln-C$_4$NH$_3$-3-[(CEt$_2$)$_2$-NMe]-, ($^i$PrO)-Ln-C$_4$NH$_3$-3-[(CEt$_2$)$_2$-NMe]-, ($^n$BuO)-Ln-C$_4$NH$_3$-3-[(CEt$_2$)$_2$-NMe]-, ($^i$BuO)-Ln-C$_4$NH$_3$-3-[(CEt$_2$)$_2$-NMe]-, ($^s$BuO)-Ln-C$_4$NH$_3$-3-[(CEt$_2$)$_2$-NMe]-, ($^t$BuO)-Ln-C$_4$NH$_3$-3-[(CEt$_2$)$_2$-NMe]-, (H$_2$N)-Ln-C$_4$NH$_3$-3-[(CEt$_2$)$_2$-NEt]-, (Me$_2$N)-Ln-C$_4$NH$_3$-3-[(CEt$_2$)$_2$-NEt]-, (Et$_2$N)-Ln-C$_4$NH$_3$-3-[(CEt$_2$)$_2$-NEt]-, ($^n$Pr$_2$N)-Ln-C$_4$NH$_3$-3-[(CEt$_2$)$_2$-NEt]-, ($^i$Pr$_2$N)-Ln-C$_4$NH$_3$-3-[(CEt$_2$)$_2$-NEt]-, ($^n$Bu$_2$N)-Ln-C$_4$NH$_3$-3-[(CEt$_2$)$_2$-NEt]-, ($^i$Bu$_2$N)-Ln-C$_4$NH$_3$-3-[(CEt$_2$)$_2$-NEt]-, ($^s$Bu$_2$N)-Ln-C$_4$NH$_3$-3-[(CEt$_2$)$_2$-NEt]-, ($^t$Bu$_2$N)-Ln-C$_4$NH$_3$-3-[(CEt$_2$)$_2$-NEt]-, (Cp)-Ln-C$_4$NH$_3$-3-[(CEt$_2$)$_2$-NEt]-, (HO)-Ln-C$_4$NH$_3$-3-[(CEt$_2$)$_2$-NEt]-, (MeO)-Ln-C$_4$NH$_3$-3-[(CEt$_2$)$_2$-NEt]-, (EtO)-Ln-C$_4$NH$_3$-3-[(CEt$_2$)$_2$-NEt]-, ($^n$PrO)-Ln-C$_4$NH$_3$-3-[(CEt$_2$)$_2$-NEt]-, ($^i$PrO)-Ln-C$_4$NH$_3$-3-[(CEt$_2$)$_2$-NEt]-, ($^n$BuO)-Ln-C$_4$NH$_3$-3-[(CEt$_2$)$_2$-NEt]-, ($^i$BuO)-Ln-C$_4$NH$_3$-3-[(CEt$_2$)$_2$-NEt]-, ($^s$BuO)-Ln-C$_4$NH$_3$-3-[(CEt$_2$)$_2$-NEt]-, ($^t$BuO)-Ln-C$_4$NH$_3$-3-[(CEt$_2$)$_2$-NEt]-, (H$_2$N)-Ln-C$_4$NH$_3$-3-[(CEt$_2$)$_2$-N$^n$Pr]—, (Me$_2$N)-Ln-C$_4$NH$_3$-3-[(CEt$_2$)$_2$-N$^n$Pr]—, (Et$_2$N)-Ln-C$_4$NH$_3$-3-[(CEt$_2$)$_2$-N$^n$Pr]—, ($^n$Pr$_2$N)-Ln-C$_4$NH$_3$-3-[(CEt$_2$)$_2$-N$^n$Pr]—, ($^i$Pr$_2$N)-Ln-C$_4$NH$_3$-3-[(CEt$_2$)$_2$-N$^n$Pr]—, ($^n$Bu$_2$N)-Ln-C$_4$NH$_3$-3-[(CEt$_2$)$_2$-N$^n$Pr]—, ($^i$Bu$_2$N)-Ln-C$_4$NH$_3$-3-[(CEt$_2$)$_2$-N$^n$Pr]—, ($^s$Bu$_2$N)-Ln-C$_4$NH$_3$-3-[(CEt$_2$)$_2$-N$^n$Pr]—, ($^t$Bu$_2$N)-Ln-C$_4$NH$_3$-3-[(CEt$_2$)$_2$-N$^n$Pr]—, (Cp)-Ln-C$_4$NH$_3$-3-[(CEt$_2$)$_2$-N$^n$Pr]—, (HO)-Ln-C$_4$NH$_3$-3-[(CEt$_2$)$_2$-N$^n$Pr]—, (MeO)-Ln-C$_4$NH$_3$-3-[(CEt$_2$)$_2$-N$^n$Pr]—, (EtO)-Ln-C$_4$NH$_3$-3-[(CEt$_2$)$_2$-N$^n$Pr]—, ($^n$PrO)-Ln-C$_4$NH$_3$-3-[(CEt$_2$)$_2$-N$^n$Pr]—, ($^i$PrO)-Ln-C$_4$NH$_3$-3-[(CEt$_2$)$_2$-N$^n$Pr]—, ($^n$BuO)-Ln-C$_4$NH$_3$-3-[(CEt$_2$)$_2$-N$^n$Pr]—, ($^i$BuO)-Ln-C$_4$NH$_3$-3-[(CEt$_2$)$_2$-N$^n$Pr]—, ($^s$BuO)-Ln-C$_4$NH$_3$-3-[(CEt$_2$)$_2$-N$^n$Pr]—, ($^t$BuO)-Ln-C$_4$NH$_3$-3-[(CEt$_2$)$_2$-N$^n$Pr]—, (H$_2$N)-Ln-C$_4$NH$_3$-3-[(CEt$_2$)$_2$-N$^i$Pr]—, (Me$_2$N)-Ln-C$_4$NH$_3$-3-[(CEt$_2$)$_2$-N$^i$Pr]—, (Et$_2$N)-Ln-C$_4$NH$_3$-3-[(CEt$_2$)$_2$-N$^i$Pr]—, ($^n$Pr$_2$N)-Ln-C$_4$NH$_3$-3-[(CEt$_2$)$_2$-N$^i$Pr]—, ($^i$Pr$_2$N)-Ln-C$_4$NH$_3$-3-[(CEt$_2$)$_2$-N$^i$Pr]—, ($^n$Bu$_2$N)-Ln-C$_4$NH$_3$-3-[(CEt$_2$)$_2$-N$^i$Pr]—, ($^i$Bu$_2$N)-Ln-C$_4$NH$_3$-3-[(CEt$_2$)$_2$-N$^i$Pr]—, ($^s$Bu$_2$N)-Ln-C$_4$NH$_3$-3-[(CEt$_2$)$_2$-N$^i$Pr]—, ($^t$Bu$_2$N)-Ln-C$_4$NH$_3$-3-[(CEt$_2$)$_2$-N$^i$Pr]—, (Cp)-Ln-C$_4$NH$_3$-3-[(CEt$_2$)$_2$-N$^i$Pr]—, (HO)-Ln-C$_4$NH$_3$-3-[(CEt$_2$)$_2$-N$^i$Pr]—, (MeO)-Ln-C$_4$NH$_3$-3-[(CEt$_2$)$_2$-N$^i$Pr]—, (EtO)-Ln-C$_4$NH$_3$-3-[(CEt$_2$)$_2$-N$^i$Pr]—, ($^n$PrO)-Ln-C$_4$NH$_3$-3-[(CEt$_2$)$_2$-N$^i$Pr]—, ($^i$PrO)-Ln-C$_4$NH$_3$-3-[(CEt$_2$)$_2$-N$^i$Pr]—, ($^n$BuO)-Ln-C$_4$NH$_3$-3-[(CEt$_2$)$_2$-N$^i$Pr]—, ($^i$BuO)-Ln-C$_4$NH$_3$-3-[(CEt$_2$)$_2$-N$^i$Pr]—, ($^s$BuO)-Ln-C$_4$NH$_3$-3-[(CEt$_2$)$_2$-N$^i$Pr]—, ($^t$BuO)-Ln-C$_4$NH$_3$-3-[(CEt$_2$)$_2$-N$^i$Pr]—, (H$_2$N)-Ln-C$_4$NH$_3$-3-[(CEt$_2$)$_2$-N$^n$Bu]-, (Me$_2$N)-Ln-C$_4$NH$_3$-3-[(CEt$_2$)$_2$-N$^n$Bu]-, (Et$_2$N)-Ln-C$_4$NH$_3$-3-[(CEt$_2$)$_2$-N$^n$Bu]-, ($^n$Pr$_2$N)-Ln-C$_4$NH$_3$-3-[(CEt$_2$)$_2$-N$^n$Bu]-, ($^i$Pr$_2$N)-Ln-C$_4$NH$_3$-3-[(CEt$_2$)$_2$-N$^n$Bu]-, ($^n$Bu$_2$N)-Ln-C$_4$NH$_3$-3-[(CEt$_2$)$_2$-N$^n$Bu]-, ($^i$Bu$_2$N)-Ln-C$_4$NH$_3$-3-[(CEt$_2$)$_2$-N$^n$Bu]-, ($^s$Bu$_2$N)-Ln-C$_4$NH$_3$-3-[(CEt$_2$)$_2$-N$^n$Bu]-, ($^t$Bu$_2$N)-Ln-C$_4$NH$_3$-3-[(CEt$_2$)$_2$-N$^n$Bu]-, (Cp)-Ln-C$_4$NH$_3$-3-[(CEt$_2$)$_2$-N$^n$Bu]-, (HO)-Ln-C$_4$NH$_3$-3-[(CEt$_2$)$_2$-N$^n$Bu]-, (MeO)-Ln-C$_4$NH$_3$-3-[(CEt$_2$)$_2$-N$^n$Bu]-, (EtO)-Ln-C$_4$NH$_3$-3-[(CEt$_2$)$_2$-N$^n$Bu]-, ($^n$PrO)-Ln-C$_4$NH$_3$-3-[(CEt$_2$)$_2$-N$^n$Bu]-, ($^i$PrO)-Ln-C$_4$NH$_3$-3-[(CEt$_2$)$_2$-N$^n$Bu]-, ($^n$BuO)-Ln-C$_4$NH$_3$-3-[(CEt$_2$)$_2$-N$^n$Bu]-, ($^i$BuO)-Ln-C$_4$NH$_3$-3-[(CEt$_2$)$_2$-N$^n$Bu]-, ($^s$BuO)-Ln-C$_4$NH$_3$-3-[(CEt$_2$)$_2$-N$^n$Bu]-, ($^t$BuO)-Ln-C$_4$NH$_3$-3-[(CEt$_2$)$_2$-N$^n$Bu]-, (H$_2$N)-Ln-C$_4$NH$_3$-3-[(CEt$_2$)$_2$-N$^i$Bu]-, (Me$_2$N)-Ln-C$_4$NH$_3$-3-[(CEt$_2$)$_2$-N$^i$Bu]-, (Et$_2$N)-Ln-C$_4$NH$_3$-3-[(CEt$_2$)$_2$-N$^i$Bu]-, ($^n$Pr$_2$N)-Ln-C$_4$NH$_3$-3-[(CEt$_2$)$_2$-N$^i$Bu]-, ($^i$Pr$_2$N)-Ln-C$_4$NH$_3$-3-[(CEt$_2$)$_2$-N$^i$Bu]-, ($^n$Bu$_2$N)-Ln-C$_4$NH$_3$-3-[(CEt$_2$)$_2$-N$^i$Bu]-, ($^i$Bu$_2$N)-Ln-C$_4$NH$_3$-3-[(CEt$_2$)$_2$-N$^i$Bu]-, ($^s$Bu$_2$N)-Ln-C$_4$NH$_3$-3-[(CEt$_2$)$_2$-N$^i$Bu]-, ($^t$Bu$_2$N)-Ln-C$_4$NH$_3$-3-[(CEt$_2$)$_2$-N$^i$Bu]-, (Cp)-Ln-C$_4$NH$_3$-3-[(CEt$_2$)$_2$-N$^i$Bu]-, (HO)-Ln-C$_4$NH$_3$-3-[(CEt$_2$)$_2$-N$^i$Bu]-, (MeO)-Ln-C$_4$NH$_3$-3-[(CEt$_2$)$_2$-N$^i$Bu]-, (EtO)-Ln-C$_4$NH$_3$-3-[(CEt$_2$)$_2$-N$^i$Bu]-, ($^n$PrO)-Ln-C$_4$NH$_3$-3-[(CEt$_2$)$_2$-N$^i$Bu]-, ($^i$PrO)-Ln-C$_4$NH$_3$-3-[(CEt$_2$)$_2$-N$^i$Bu]-, ($^n$BuO)-Ln-C$_4$NH$_3$-3-[(CEt$_2$)$_2$-N$^i$Bu]-, ($^i$BuO)-Ln-C$_4$NH$_3$-3-[(CEt$_2$)$_2$-N$^i$Bu]-, ($^s$BuO)-Ln-C$_4$NH$_3$-3-[(CEt$_2$)$_2$-N$^i$Bu]-, ($^t$BuO)-Ln-C$_4$NH$_3$-3-[(CEt$_2$)$_2$-N$^i$Bu]-, (H$_2$N)-Ln-C$_4$NH$_3$-3-[(CEt$_2$)$_2$-N$^s$Bu]-, (Me$_2$N)-Ln-C$_4$NH$_3$-3-[(CEt$_2$)$_2$-N$^s$Bu]-, (Et$_2$N)-Ln-C$_4$NH$_3$-3-[(CEt$_2$)$_2$-N$^s$Bu]-, ($^n$Pr$_2$N)-Ln-C$_4$NH$_3$-3-[(CEt$_2$)$_2$-N$^s$Bu]-, ($^i$Pr$_2$N)-Ln-C$_4$NH$_3$-3-[(CEt$_2$)$_2$-N$^s$Bu]-, ($^n$Bu$_2$N)-Ln-C$_4$NH$_3$-3-[(CEt$_2$)$_2$-N$^s$Bu]-, ($^i$Bu$_2$N)-Ln-C$_4$NH$_3$-3-[(CEt$_2$)$_2$-N$^s$Bu]-, ($^s$Bu$_2$N)-Ln-C$_4$NH$_3$-3-[(CEt$_2$)$_2$-N$^s$Bu]-, ($^t$Bu$_2$N)-Ln-C$_4$NH$_3$-3-[(CEt$_2$)$_2$-N$^s$Bu]-, (Cp)-Ln-C$_4$NH$_3$-3-[(CEt$_2$)$_2$-N$^s$Bu]-, (HO)-Ln-C$_4$NH$_3$-3-[(CEt$_2$)$_2$-N$^s$Bu]-, (MeO)-Ln-C$_4$NH$_3$-3-[(CEt$_2$)$_2$-N$^s$Bu]-, (EtO)-Ln-C$_4$NH$_3$-3-[(CEt$_2$)$_2$-N$^s$Bu]-, ($^n$PrO)-Ln-C$_4$NH$_3$-3-[(CEt$_2$)$_2$-N$^s$Bu]-, ($^i$PrO)-Ln-C$_4$NH$_3$-3-[(CEt$_2$)$_2$-N$^s$Bu]-, ($^n$BuO)-Ln-C$_4$NH$_3$-3-[(CEt$_2$)$_2$-N$^s$Bu]-, ($^i$BuO)-Ln-C$_4$NH$_3$-3-[(CEt$_2$)$_2$-N$^s$Bu]-, ($^s$BuO)-Ln-C$_4$NH$_3$-3-[(CEt$_2$)$_2$-N$^s$Bu]-, ($^t$BuO)-Ln-C$_4$NH$_3$-3-[(CEt$_2$)$_2$-N$^s$Bu]-, (H$_2$N)-Ln-C$_4$NH$_3$-3-[(CEt$_2$)$_2$-N$^t$Bu]-, (Me$_2$N)-Ln-C$_4$NH$_3$-3-[(CEt$_2$)$_2$-N$^t$Bu]-, (Et$_2$N)-Ln-C$_4$NH$_3$-3-[(CEt$_2$)$_2$-N$^t$Bu]-, ($^n$Pr$_2$N)-Ln-C$_4$NH$_3$-3-[(CEt$_2$)$_2$-N$^t$Bu]-, ($^i$Pr$_2$N)-Ln-C$_4$NH$_3$-3-[(CEt$_2$)$_2$-N$^t$Bu]-, ($^n$Bu$_2$N)-Ln-C$_4$NH$_3$-3-[(CEt$_2$)$_2$-

N$^t$Bu]-, ($^t$Bu$_2$N)-Ln-C$_4$NH$_3$-3-[(CEt$_2$)$_2$-N$^t$Bu]-, ($^s$Bu$_2$N)-Ln-C$_4$NH$_3$-3-[(CEt$_2$)$_2$-N$^t$Bu]-, ($^f$Bu$_2$N)-Ln-C$_4$NH$_3$-3-[(CEt$_2$)$_2$-N$^t$Bu]-, (Cp)-Ln-C$_4$NH$_3$-3-[(CEt$_2$)$_2$-N$^t$Bu]-, (HO)-Ln-C$_4$NH$_3$-3-[(CEt$_2$)$_2$-N$^t$Bu]-, (MeO)-Ln-C$_4$NH$_3$-3-[(CEt$_2$)$_2$-N$^t$Bu]-, (EtO)-Ln-C$_4$NH$_3$-3-[(CEt$_2$)$_2$-N$^t$Bu]-, ($^n$PrO)-Ln-C$_4$NH$_3$-3-[(CEt$_2$)$_2$-N$^t$Bu]-, ($^i$PrO)-Ln-C$_4$NH$_3$-3-[(CEt$_2$)$_2$-N$^t$Bu]-, ($^n$BuO)-Ln-C$_4$NH$_3$-3-[(CEt$_2$)$_2$-N$^t$Bu]-, ($^i$BuO)-Ln-C$_4$NH$_3$-3-[(CEt$_2$)$_2$-N$^t$Bu]-, ($^s$BuO)-Ln-C$_4$NH$_3$-3-[(CEt$_2$)$_2$-N$^t$Bu]-, ($^t$BuO)-Ln-C$_4$NH$_3$-3-[(CEt$_2$)$_2$-N$^t$Bu]-, (H$_2$N)-Ln-C$_4$NH$_3$-3-[(CEt$_2$)$_2$-O]—, (Me$_2$N)-Ln-C$_4$NH$_3$-3-[(CEt$_2$)$_2$-O]—, (Et$_2$N)-Ln-C$_4$NH$_3$-3-[(CEt$_2$)$_2$-O]—, ($^n$Pr$_2$N)-Ln-C$_4$NH$_3$-3-[(CEt$_2$)$_2$-O]—, ($^i$Pr$_2$N)-Ln-C$_4$NH$_3$-3-[(CEt$_2$)$_2$-O]—, ($^n$Bu$_2$N)-Ln-C$_4$NH$_3$-3-[(CEt$_2$)$_2$-O]—, ($^i$Bu$_2$N)-Ln-C$_4$NH$_3$-3-[(CEt$_2$)$_2$-O]—, ($^s$Bu$_2$N)-Ln-C$_4$NH$_3$-3-[(CEt$_2$)$_2$-O]—, ($^t$Bu$_2$N)-Ln-C$_4$NH$_3$-3-[(CEt$_2$)$_2$-O]—, (Cp)-Ln-C$_4$NH$_3$-3-[(CEt$_2$)$_2$-O]—, (HO)-Ln-C$_4$NH$_3$-3-[(CEt$_2$)$_2$-O]—, (MeO)-Ln-C$_4$NH$_3$-3-[(CEt$_2$)$_2$-O]—, (EtO)-Ln-C$_4$NH$_3$-3-[(CEt$_2$)$_2$-O]—, ($^n$PrO)-Ln-C$_4$NH$_3$-3-[(CEt$_2$)$_2$-O]—, ($^i$PrO)-Ln-C$_4$NH$_3$-3-[(CEt$_2$)$_2$-O]—, ($^n$BuO)-Ln-C$_4$NH$_3$-3-[(CEt$_2$)$_2$-O]—, ($^i$BuO)-Ln-C$_4$NH$_3$-3-[(CEt$_2$)$_2$-O]—, ($^s$BuO)-Ln-C$_4$NH$_3$-3-[(CEt$_2$)$_2$-O]—, ($^t$BuO)-Ln-C$_4$NH$_3$-3-[(CEt$_2$)$_2$-O]—, (H$_2$N)-Ln-C$_4$NH$_3$-3-[(C$^i$Pr$_2$)$_2$—NH]—, (Me$_2$N)-Ln-C$_4$NH$_3$-3-[(C$^i$Pr$_2$)$_2$—NH]—, (Et$_2$N)-Ln-C$_4$NH$_3$-3-[(C$^i$Pr$_2$)$_2$—NH]—, ($^n$Pr$_2$N)-Ln-C$_4$NH$_3$-3-[(C$^i$Pr$_2$)$_2$—NH]—, ($^i$Pr$_2$N)-Ln-C$_4$NH$_3$-3-[(C$^i$Pr$_2$)$_2$—NH]—, ($^n$Bu$_2$N)-Ln-C$_4$NH$_3$-3-[(C$^i$Pr$_2$)$_2$—NH]—, ($^i$Bu$_2$N)-Ln-C$_4$NH$_3$-3-[(C$^i$Pr$_2$)$_2$—NH]—, ($^s$Bu$_2$N)-Ln-C$_4$NH$_3$-3-[(C$^i$Pr$_2$)$_2$—NH]—, ($^t$Bu$_2$N)-Ln-C$_4$NH$_3$-3-[(C$^i$Pr$_2$)$_2$—NH]—, (Cp)-Ln-C$_4$NH$_3$-3-[(C$^i$Pr$_2$)$_2$—NH]—, (HO)-Ln-C$_4$NH$_3$-3-[(C$^i$Pr$_2$)$_2$—NH]—, (MeO)-Ln-C$_4$NH$_3$-3-[(C$^i$Pr$_2$)$_2$—NH]—, (EtO)-Ln-C$_4$NH$_3$-3-[(C$^i$Pr$_2$)$_2$—NH]—, ($^n$PrO)-Ln-C$_4$NH$_3$-3-[(C$^i$Pr$_2$)$_2$—NH]—, ($^i$PrO)-Ln-C$_4$NH$_3$-3-[(C$^i$Pr$_2$)$_2$—NH]—, ($^n$BuO)-Ln-C$_4$NH$_3$-3-[(C$^i$Pr$_2$)$_2$—NH]—, ($^i$BuO)-Ln-C$_4$NH$_3$-3-[(C$^i$Pr$_2$)$_2$—NH]—, ($^s$BuO)-Ln-C$_4$NH$_3$-3-[(C$^i$Pr$_2$)$_2$—NH]—, ($^t$BuO)-Ln-C$_4$NH$_3$-3-[(C$^i$Pr$_2$)$_2$—NH]—, (H$_2$N)-Ln-C$_4$NH$_3$-3-[(C$^i$Pr$_2$)$_2$—NMe]-, (Me$_2$N)-Ln-C$_4$NH$_3$-3-[(C$^i$Pr$_2$)$_2$—NMe]-, (Et$_2$N)-Ln-C$_4$NH$_3$-3-[(C$^i$Pr$_2$)$_2$—NMe]-, ($^n$Pr$_2$N)-Ln-C$_4$NH$_3$-3-[(C$^i$Pr$_2$)$_2$—NMe]-, ($^i$Pr$_2$N)-Ln-C$_4$NH$_3$-3-[(C$^i$Pr$_2$)$_2$—NMe]-, ($^n$Bu$_2$N)-Ln-C$_4$NH$_3$-3-[(C$^i$Pr$_2$)$_2$—NMe]-, ($^i$Bu$_2$N)-Ln-C$_4$NH$_3$-3-[(C$^i$Pr$_2$)$_2$—NMe]-, ($^s$Bu$_2$N)-Ln-C$_4$NH$_3$-3-[(C$^i$Pr$_2$)$_2$—NMe]-, ($^t$Bu$_2$N)-Ln-C$_4$NH$_3$-3-[(C$^i$Pr$_2$)$_2$—NMe]-, (Cp)-Ln-C$_4$NH$_3$-3-[(C$^i$Pr$_2$)$_2$—NMe]-, (HO)-Ln-C$_4$NH$_3$-3-[(C$^i$Pr$_2$)$_2$—NMe]-, (MeO)-Ln-C$_4$NH$_3$-3-[(C$^i$Pr$_2$)$_2$—NMe]-, (EtO)-Ln-C$_4$NH$_3$-3-[(C$^i$Pr$_2$)$_2$—NMe]-, ($^n$PrO)-Ln-C$_4$NH$_3$-3-[(C$^i$Pr$_2$)$_2$—NMe]-, ($^i$PrO)-Ln-C$_4$NH$_3$-3-[(C$^i$Pr$_2$)$_2$—NMe]-, ($^n$BuO)-Ln-C$_4$NH$_3$-3-[(C$^i$Pr$_2$)$_2$—NMe]-, ($^i$BuO)-Ln-C$_4$NH$_3$-3-[(C$^i$Pr$_2$)$_2$—NMe]-, ($^s$BuO)-Ln-C$_4$NH$_3$-3-[(C$^i$Pr$_2$)$_2$—NMe]-, ($^t$BuO)-Ln-C$_4$NH$_3$-3-[(C$^i$Pr$_2$)$_2$—NMe]-, (H$_2$N)-Ln-C$_4$NH$_3$-3-[(C$^i$Pr$_2$)$_2$—NEt]-, (Me$_2$N)-Ln-C$_4$NH$_3$-3-[(C$^i$Pr$_2$)$_2$—NEt]-, (Et$_2$N)-Ln-C$_4$NH$_3$-3-[(C$^i$Pr$_2$)$_2$—NEt]-, ($^n$Pr$_2$N)-Ln-C$_4$NH$_3$-3-[(C$^i$Pr$_2$)$_2$—NEt]-, ($^i$Pr$_2$N)-Ln-C$_4$NH$_3$-3-[(C$^i$Pr$_2$)$_2$—NEt]-, ($^n$Bu$_2$N)-Ln-C$_4$NH$_3$-3-[(C$^i$Pr$_2$)$_2$—NEt]-, ($^i$Bu$_2$N)-Ln-C$_4$NH$_3$-3-[(C$^i$Pr$_2$)$_2$—NEt]-, ($^s$Bu$_2$N)-Ln-C$_4$NH$_3$-3-[(C$^i$Pr$_2$)$_2$—NEt]-, ($^t$Bu$_2$N)-Ln-C$_4$NH$_3$-3-[(C$^i$Pr$_2$)$_2$—NEt]-, (Cp)-Ln-C$_4$NH$_3$-3-[(C$^i$Pr$_2$)$_2$—NEt]-, (HO)-Ln-C$_4$NH$_3$-3-[(C$^i$Pr$_2$)$_2$—NEt]-, (MeO)-Ln-C$_4$NH$_3$-3-[(C$^i$Pr$_2$)$_2$—NEt]-, (EtO)-Ln-C$_4$NH$_3$-3-[(C$^i$Pr$_2$)$_2$—NEt]-, ($^n$PrO)-Ln-C$_4$NH$_3$-3-[(C$^i$Pr$_2$)$_2$—NEt]-, ($^i$PrO)-Ln-C$_4$NH$_3$-3-[(C$^i$Pr$_2$)$_2$—NEt]-, ($^n$BuO)-Ln-C$_4$NH$_3$-3-[(C$^i$Pr$_2$)$_2$—NEt]-, ($^i$BuO)-Ln-C$_4$NH$_3$-3-[(C$^i$Pr$_2$)$_2$—NEt]-, ($^s$BuO)-Ln-C$_4$NH$_3$-3-[(C$^i$Pr$_2$)$_2$—NEt]-, ($^t$BuO)-Ln-C$_4$NH$_3$-3-[(C$^i$Pr$_2$)$_2$—NEt]-, (H$_2$N)-Ln-C$_4$NH$_3$-3-[(C$^i$Pr$_2$)$_2$—N$^n$Pr]—, (Me$_2$N)-Ln-C$_4$NH$_3$-3-[(C$^i$Pr$_2$)$_2$—N$^n$Pr]—, (Et$_2$N)-Ln-C$_4$NH$_3$-3-[(C$^i$Pr$_2$)$_2$—N$^n$Pr]—, ($^n$Pr$_2$N)-Ln-C$_4$NH$_3$-3-[(C$^i$Pr$_2$)$_2$—N$^n$Pr]—, ($^i$Pr$_2$N)-Ln-C$_4$NH$_3$-3-[(C$^i$Pr$_2$)$_2$—N$^n$Pr]—, ($^n$Bu$_2$N)-Ln-C$_4$NH$_3$-3-[(C$^i$Pr$_2$)$_2$—N$^n$Pr]—, ($^i$Bu$_2$N)-Ln-C$_4$NH$_3$-3-[(C$^i$Pr$_2$)$_2$—N$^n$Pr]—, ($^s$Bu$_2$N)-Ln-C$_4$NH$_3$-3-[(C$^i$Pr$_2$)$_2$—N$^n$Pr]—, ($^t$Bu$_2$N)-Ln-C$_4$NH$_3$-3-[(C$^i$Pr$_2$)$_2$—N$^n$Pr]—, (Cp)-Ln-C$_4$NH$_3$-3-[(C$^i$Pr$_2$)$_2$—N$^n$Pr]—, (HO)-Ln-C$_4$NH$_3$-3-[(C$^i$Pr$_2$)$_2$—N$^n$Pr]—, (MeO)-Ln-C$_4$NH$_3$-3-[(C$^i$Pr$_2$)$_2$—N$^n$Pr]—, (EtO)-Ln-C$_4$NH$_3$-3-[(C$^i$Pr$_2$)$_2$—N$^n$Pr]—, ($^n$PrO)-Ln-C$_4$NH$_3$-3-[(C$^i$Pr$_2$)$_2$—N$^n$Pr]—, ($^i$PrO)-Ln-C$_4$NH$_3$-3-[(C$^i$Pr$_2$)$_2$—N$^n$Pr]—, ($^n$BuO)-Ln-C$_4$NH$_3$-3-[(C$^i$Pr$_2$)$_2$—N$^n$Pr]—, ($^i$BuO)-Ln-C$_4$NH$_3$-3-[(C$^i$Pr$_2$)$_2$—N$^n$Pr]—, ($^s$BuO)-Ln-C$_4$NH$_3$-3-[(C$^i$Pr$_2$)$_2$—N$^n$Pr]—, ($^t$BuO)-Ln-C$_4$NH$_3$-3-[(C$^i$Pr$_2$)$_2$—N$^n$Pr]—, (H$_2$N)-Ln-C$_4$NH$_3$-3-[(C$^i$Pr$_2$)$_2$—N$^i$Pr]—, (Me$_2$N)-Ln-C$_4$NH$_3$-3-[(C$^i$Pr$_2$)$_2$—N$^i$Pr]—, (Et$_2$N)-Ln-C$_4$NH$_3$-3-[(C$^i$Pr$_2$)$_2$—N$^i$Pr]—, ($^n$Pr$_2$N)-Ln-C$_4$NH$_3$-3-[(C$^i$Pr$_2$)$_2$—N$^i$Pr]—, ($^i$Pr$_2$N)-Ln-C$_4$NH$_3$-3-[(C$^i$Pr$_2$)$_2$—N$^i$Pr]—, ($^n$Bu$_2$N)-Ln-C$_4$NH$_3$-3-[(C$^i$Pr$_2$)$_2$—N$^i$Pr]—, ($^i$Bu$_2$N)-Ln-C$_4$NH$_3$-3-[(C$^i$Pr$_2$)$_2$—N$^i$Pr]—, ($^s$Bu$_2$N)-Ln-C$_4$NH$_3$-3-[(C$^i$Pr$_2$)$_2$—N$^i$Pr]—, ($^t$Bu$_2$N)-Ln-C$_4$NH$_3$-3-[(C$^i$Pr$_2$)$_2$—N$^i$Pr]—, (Cp)-Ln-C$_4$NH$_3$-3-[(C$^i$Pr$_2$)$_2$—N$^i$Pr]—, (HO)-Ln-C$_4$NH$_3$-3-[(C$^i$Pr$_2$)$_2$—N$^i$Pr]—, (MeO)-Ln-C$_4$NH$_3$-3-[(C$^i$Pr$_2$)$_2$—N$^i$Pr]—, (EtO)-Ln-C$_4$NH$_3$-3-[(C$^i$Pr$_2$)$_2$—N$^i$Pr]—, ($^n$PrO)-Ln-C$_4$NH$_3$-3-[(C$^i$Pr$_2$)$_2$—N$^i$Pr]—, ($^i$PrO)-Ln-C$_4$NH$_3$-3-[(C$^i$Pr$_2$)$_2$—N$^i$Pr]—, ($^n$BuO)-Ln-C$_4$NH$_3$-3-[(C$^i$Pr$_2$)$_2$—N$^i$Pr]—, ($^i$BuO)-Ln-C$_4$NH$_3$-3-[(C$^i$Pr$_2$)$_2$—N$^i$Pr]—, ($^s$BuO)-Ln-C$_4$NH$_3$-3-[(C$^i$Pr$_2$)$_2$—N$^i$Pr]—, ($^t$BuO)-Ln-C$_4$NH$_3$-3-[(C$^i$Pr$_2$)$_2$—N$^i$Pr]—, (H$_2$N)-Ln-C$_4$NH$_3$-3-[(C$^i$Pr$_2$)$_2$—N$^n$Bu]-, (Me$_2$N)-Ln-C$_4$NH$_3$-3-[(C$^i$Pr$_2$)$_2$—N$^n$Bu]-, (Et$_2$N)-Ln-C$_4$NH$_3$-3-[(C$^i$Pr$_2$)$_2$—N$^n$Bu]-, ($^n$Pr$_2$N)-Ln-C$_4$NH$_3$-3-[(C$^i$Pr$_2$)$_2$—N$^n$Bu]-, ($^i$Pr$_2$N)-Ln-C$_4$NH$_3$-3-[(C$^i$Pr$_2$)$_2$—N$^n$Bu]-, ($^n$Bu$_2$N)-Ln-C$_4$NH$_3$-3-[(C$^i$Pr$_2$)$_2$—N$^n$Bu]-, ($^i$Bu$_2$N)-Ln-C$_4$NH$_3$-3-[(C$^i$Pr$_2$)$_2$—N$^n$Bu]-, ($^s$Bu$_2$N)-Ln-C$_4$NH$_3$-3-[(C$^i$Pr$_2$)$_2$—N$^n$Bu]-, ($^t$Bu$_2$N)-Ln-C$_4$NH$_3$-3-[(C$^i$Pr$_2$)$_2$—N$^n$Bu]-, (Cp)-Ln-C$_4$NH$_3$-3-[(C$^i$Pr$_2$)$_2$—N$^n$Bu]-, (HO)-Ln-C$_4$NH$_3$-3-[(C$^i$Pr$_2$)$_2$—N$^n$Bu]-, (MeO)-Ln-C$_4$NH$_3$-3-[(C$^i$Pr$_2$)$_2$—N$^n$Bu]-, (EtO)-Ln-C$_4$NH$_3$-3-[(C$^i$Pr$_2$)$_2$—N$^n$Bu]-, ($^n$PrO)-Ln-C$_4$NH$_3$-3-[(C$^i$Pr$_2$)$_2$—N$^n$Bu]-, ($^i$PrO)-Ln-C$_4$NH$_3$-3-[(C$^i$Pr$_2$)$_2$—N$^n$Bu]-, ($^n$BuO)-Ln-C$_4$NH$_3$-3-[(C$^i$Pr$_2$)$_2$—N$^n$Bu]-, ($^i$BuO)-Ln-C$_4$NH$_3$-3-[(C$^i$Pr$_2$)$_2$—N$^n$Bu]-, ($^s$BuO)-Ln-C$_4$NH$_3$-3-[(C$^i$Pr$_2$)$_2$—N$^n$Bu]-, ($^t$BuO)-Ln-C$_4$NH$_3$-3-[(C$^i$Pr$_2$)$_2$—N$^n$Bu]-, (H$_2$N)-Ln-C$_4$NH$_3$-3-[(C$^i$Pr$_2$)$_2$—N$^i$Bu]-, (Me$_2$N)-Ln-C$_4$NH$_3$-3-[(C$^i$Pr$_2$)$_2$—N$^i$Bu]-, (Et$_2$N)-Ln-C$_4$NH$_3$-3-[(C$^i$Pr$_2$)$_2$—N$^i$Bu]-, ($^n$Pr$_2$N)-Ln-C$_4$NH$_3$-3-[(C$^i$Pr$_2$)$_2$—N$^i$Bu]-, ($^i$Pr$_2$N)-Ln-C$_4$NH$_3$-3-[(C$^i$Pr$_2$)$_2$—N$^i$Bu]-, ($^n$Bu$_2$N)-Ln-C$_4$NH$_3$-3-[(C$^i$Pr$_2$)$_2$—N$^i$Bu]-, ($^i$Bu$_2$N)-Ln-C$_4$NH$_3$-3-[(C$^i$Pr$_2$)$_2$—N$^i$Bu]-, ($^s$Bu$_2$N)-Ln-C$_4$NH$_3$-3-[(C$^i$Pr$_2$)$_2$—N$^i$Bu]-, ($^t$Bu$_2$N)-Ln-C$_4$NH$_3$-3-[(C$^i$Pr$_2$)$_2$—N$^i$Bu]-, (Cp)-Ln-C$_4$NH$_3$-3-[(C$^i$Pr$_2$)$_2$—N$^i$Bu]-, (HO)-Ln-C$_4$NH$_3$-3-[(C$^i$Pr$_2$)$_2$—N$^i$Bu]-, (MeO)-Ln-C$_4$NH$_3$-3-[(C$^i$Pr$_2$)$_2$—N$^i$Bu]-, (EtO)-Ln-C$_4$NH$_3$-3-[(C$^i$Pr$_2$)$_2$—N$^i$Bu]-, ($^n$PrO)-Ln-C$_4$NH$_3$-3-[(C$^i$Pr$_2$)$_2$—N$^i$Bu]-, ($^i$PrO)-Ln-C$_4$NH$_3$-3-[(C$^i$Pr$_2$)$_2$—N$^i$Bu]-, ($^n$BuO)-Ln-C$_4$NH$_3$-3-[(C$^i$Pr$_2$)$_2$—N$^i$Bu]-, ($^i$BuO)-Ln-C$_4$NH$_3$-3-[(C$^i$Pr$_2$)$_2$—N$^i$Bu]-, ($^s$BuO)-Ln-C$_4$NH$_3$-3-[(C$^i$Pr$_2$)$_2$—N$^i$Bu]-, ($^t$BuO)-Ln-C$_4$NH$_3$-3-[(C$^i$Pr$_2$)$_2$—N$^i$Bu]-, (H$_2$N)-Ln-C$_4$NH$_3$-3-[(C$^i$Pr$_2$)$_2$—N$^s$Bu]-, (Me$_2$N)-Ln-C$_4$NH$_3$-3-[(C$^i$Pr$_2$)$_2$—N$^s$Bu]-, (Et$_2$N)-Ln-C$_4$NH$_3$-3-[(C$^i$Pr$_2$)$_2$—N$^s$Bu]-, ($^n$Pr$_2$N)-Ln-C$_4$NH$_3$-3-[(C$^i$Pr$_2$)$_2$—N$^s$Bu]-, ($^i$Pr$_2$N)-Ln-C$_4$NH$_3$-3-[(C$^i$Pr$_2$)$_2$—N$^s$Bu]-, ($^n$Bu$_2$N)-Ln-C$_4$NH$_3$-3-[(C$^i$Pr$_2$)$_2$—N$^s$Bu]-, ($^i$Bu$_2$N)-Ln-C$_4$NH$_3$-3-[(C$^i$Pr$_2$)$_2$—N$^s$Bu]-, ($^s$Bu$_2$N)-Ln-C$_4$NH$_3$-3-[(C$^i$Pr$_2$)$_2$—N$^s$Bu]-, ($^t$Bu$_2$N)-Ln-C$_4$NH$_3$-3-[(C$^i$Pr$_2$)$_2$—N$^s$Bu]-, (Cp)-Ln-C$_4$NH$_3$-3-[(C$^i$Pr$_2$)$_2$—N$^s$Bu]-, (HO)-Ln-C$_4$NH$_3$-3-[(C$^i$Pr$_2$)$_2$—N$^s$Bu]-, (MeO)-Ln-C$_4$NH$_3$-3-[(C$^i$Pr$_2$)$_2$—N$^s$Bu]-, (EtO)-Ln-C$_4$NH$_3$-3-[(C$^i$Pr$_2$)$_2$—N$^s$Bu]-, ($^n$PrO)-Ln-C$_4$NH$_3$-3-[(C$^i$Pr$_2$)$_2$—N$^s$Bu]-, ($^i$PrO)-Ln-C$_4$NH$_3$-3-[(C$^i$Pr$_2$)$_2$—N$^s$Bu]-, ($^n$BuO)-Ln-C$_4$NH$_3$-3-[(C$^i$Pr$_2$)$_2$—N$^s$Bu]-, ($^i$BuO)-Ln-C$_4$NH$_3$-3-[(C$^i$Pr$_2$)$_2$—N$^s$Bu]-, ($^s$BuO)-Ln-C$_4$NH$_3$-3-[(C$^i$Pr$_2$)$_2$—N$^s$Bu]-, ($^t$BuO)-Ln-C$_4$NH$_3$-3-[(C$^i$Pr$_2$)$_2$—N$^s$Bu]-, (H$_2$N)-Ln-C$_4$NH$_3$-3-

[(C$^i$Pr$_2$)$_2$—N$^t$Bu]-, (Me$_2$N)-Ln-C$_4$NH$_3$-3-[(C$^i$Pr$_2$)$_2$—N$^t$Bu]-, (Et$_2$N)-Ln-C$_4$NH$_3$-3-[(C$^i$Pr$_2$)$_2$—N$^t$Bu]-, ($^n$Pr$_2$N)-Ln-C$_4$NH$_3$-3-[(C$^i$Pr$_2$)$_2$—N$^t$Bu]-, ($^i$Pr$_2$N)-Ln-C$_4$NH$_3$-3-[(C$^i$Pr$_2$)$_2$—N$^t$Bu]-, ($^n$Bu$_2$N)-Ln-C$_4$NH$_3$-3-[(C$^i$Pr$_2$)$_2$—N$^t$Bu]-, ($^i$Bu$_2$N)-Ln-C$_4$NH$_3$-3-[(C$^i$Pr$_2$)$_2$—N$^t$Bu]-, ($^s$Bu$_2$N)-Ln-C$_4$NH$_3$-3-[(C$^i$Pr$_2$)$_2$—N$^t$Bu]-, ($^t$Bu$_2$N)-Ln-C$_4$NH$_3$-3-[(C$^i$Pr$_2$)$_2$—N$^t$Bu]-, (Cp)-Ln-C$_4$NH$_3$-3-[(C$^i$Pr$_2$)$_2$—N$^t$Bu]-, (HO)-Ln-C$_4$NH$_3$-3-[(C$^i$Pr$_2$)$_2$—N$^t$Bu]-, (MeO)-Ln-C$_4$NH$_3$-3-[(C$^i$Pr$_2$)$_2$—N$^t$Bu]-, (EtO)-Ln-C$_4$NH$_3$-3-[(C$^i$Pr$_2$)$_2$—N$^t$Bu]-, ($^n$PrO)-Ln-C$_4$NH$_3$-3-[(C$^i$Pr$_2$)$_2$—N$^t$Bu]-, ($^i$PrO)-Ln-C$_4$NH$_3$-3-[(C$^i$Pr$_2$)$_2$—N$^t$Bu]-, ($^n$BuO)-Ln-C$_4$NH$_3$-3-[(C$^i$Pr$_2$)$_2$—N$^t$Bu]-, ($^i$BuO)-Ln-C$_4$NH$_3$-3-[(C$^i$Pr$_2$)$_2$—N$^t$Bu]-, ($^s$BuO)-Ln-C$_4$NH$_3$-3-[(C$^i$Pr$_2$)$_2$—N$^t$Bu]-, ($^t$BuO)-Ln-C$_4$NH$_3$-3-[(C$^i$Pr$_2$)$_2$—N$^t$Bu]-, (H$_2$N)-Ln-C$_4$NH$_3$-3-[(C$^i$Pr$_2$)$_2$—O]—, (Me$_2$N)-Ln-C$_4$NH$_3$-3-[(C$^i$Pr$_2$)$_2$—O]—, (Et$_2$N)-Ln-C$_4$NH$_3$-3-[(C$^i$Pr$_2$)$_2$—O]—, ($^n$Pr$_2$N)-Ln-C$_4$NH$_3$-3-[(C$^i$Pr$_2$)$_2$—O]—, ($^i$Pr$_2$N)-Ln-C$_4$NH$_3$-3-[(C$^i$Pr$_2$)$_2$—O]—, ($^n$Bu$_2$N)-Ln-C$_4$NH$_3$-3-[(C$^i$Pr$_2$)$_2$—O]—, ($^i$Bu$_2$N)-Ln-C$_4$NH$_3$-3-[(C$^i$Pr$_2$)$_2$—O]—, ($^s$Bu$_2$N)-Ln-C$_4$NH$_3$-3-[(C$^i$Pr$_2$)$_2$—O]—, ($^t$Bu$_2$N)-Ln-C$_4$NH$_3$-3-[(C$^i$Pr$_2$)$_2$—O]—, (Cp)-Ln-C$_4$NH$_3$-3-[(C$^i$Pr$_2$)$_2$—O]—, (HO)-Ln-C$_4$NH$_3$-3-[(C$^i$Pr$_2$)$_2$—O]—, (MeO)-Ln-C$_4$NH$_3$-3-[(C$^i$Pr$_2$)$_2$—O]—, (EtO)-Ln-C$_4$NH$_3$-3-[(C$^i$Pr$_2$)$_2$—O]—, ($^n$PrO)-Ln-C$_4$NH$_3$-3-[(C$^i$Pr$_2$)$_2$—O]—, ($^i$PrO)-Ln-C$_4$NH$_3$-3-[(C$^i$Pr$_2$)$_2$—O]—, ($^n$BuO)-Ln-C$_4$NH$_3$-3-[(C$^i$Pr$_2$)$_2$—O]—, ($^i$BuO)-Ln-C$_4$NH$_3$-3-[(C$^i$Pr$_2$)$_2$—O]—, ($^s$BuO)-Ln-C$_4$NH$_3$-3-[(C$^i$Pr$_2$)$_2$—O]—, ($^t$BuO)-Ln-C$_4$NH$_3$-3-[(C$^i$Pr$_2$)$_2$—O]—, (H$_2$N)-Ln-C$_4$NH$_3$-3-[(C$^t$Bu$_2$)$_2$-NH]—, (Me$_2$N)-Ln-C$_4$NH$_3$-3-[(C$^t$Bu$_2$)$_2$-NH]—, (Et$_2$N)-Ln-C$_4$NH$_3$-3-[(C$^t$Bu$_2$)$_2$-NH]—, ($^n$Pr$_2$N)-Ln-C$_4$NH$_3$-3-[(C$^t$Bu$_2$)$_2$-NH]—, ($^i$Pr$_2$N)-Ln-C$_4$NH$_3$-3-[(C$^t$Bu$_2$)$_2$-NH]—, ($^n$Bu$_2$N)-Ln-C$_4$NH$_3$-3-[(C$^t$Bu$_2$)$_2$-NH]—, ($^i$Bu$_2$N)-Ln-C$_4$NH$_3$-3-[(C$^t$Bu$_2$)$_2$-NH]—, ($^s$Bu$_2$N)-Ln-C$_4$NH$_3$-3-[(C$^t$Bu$_2$)$_2$-NH]—, ($^t$Bu$_2$N)-Ln-C$_4$NH$_3$-3-[(C$^t$Bu$_2$)$_2$-NH]—, (Cp)-Ln-C$_4$NH$_3$-3-[(C$^t$Bu$_2$)$_2$-NH]—, (HO)-Ln-C$_4$NH$_3$-3-[(C$^t$Bu$_2$)$_2$-NH]—, (MeO)-Ln-C$_4$NH$_3$-3-[(C$^t$Bu$_2$)$_2$-NH]—, (EtO)-Ln-C$_4$NH$_3$-3-[(C$^t$Bu$_2$)$_2$-NH]—, ($^n$PrO)-Ln-C$_4$NH$_3$-3-[(C$^t$Bu$_2$)$_2$-NH]—, ($^i$PrO)-Ln-C$_4$NH$_3$-3-[(C$^t$Bu$_2$)$_2$-NH]—, ($^n$BuO)-Ln-C$_4$NH$_3$-3-[(C$^t$Bu$_2$)$_2$-NH]—, ($^i$BuO)-Ln-C$_4$NH$_3$-3-[(C$^t$Bu$_2$)$_2$-NH]—, ($^s$BuO)-Ln-C$_4$NH$_3$-3-[(C$^t$Bu$_2$)$_2$-NH]—, ($^t$BuO)-Ln-C$_4$NH$_3$-3-[(C$^t$Bu$_2$)$_2$-NH]—, (H$_2$N)-Ln-C$_4$NH$_3$-3-[(C$^t$Bu$_2$)$_2$-NMe]-, (Me$_2$N)-Ln-C$_4$NH$_3$-3-[(C$^t$Bu$_2$)$_2$-NMe]-, (Et$_2$N)-Ln-C$_4$NH$_3$-3-[(C$^t$Bu$_2$)$_2$-NMe]-, ($^n$Pr$_2$N)-Ln-C$_4$NH$_3$-3-[(C$^t$Bu$_2$)$_2$-NMe]-, ($^i$Pr$_2$N)-Ln-C$_4$NH$_3$-3-[(C$^t$Bu$_2$)$_2$-NMe]-, ($^n$Bu$_2$N)-Ln-C$_4$NH$_3$-3-[(C$^t$Bu$_2$)$_2$-NMe]-, ($^i$Bu$_2$N)-Ln-C$_4$NH$_3$-3-[(C$^t$Bu$_2$)$_2$-NMe]-, ($^s$Bu$_2$N)-Ln-C$_4$NH$_3$-3-[(C$^t$Bu$_2$)$_2$-NMe]-, ($^t$Bu$_2$N)-Ln-C$_4$NH$_3$-3-[(C$^t$Bu$_2$)$_2$-NMe]-, (Cp)-Ln-C$_4$NH$_3$-3-[(C$^t$Bu$_2$)$_2$-NMe]-, (HO)-Ln-C$_4$NH$_3$-3-[(C$^t$Bu$_2$)$_2$-NMe]-, (MeO)-Ln-C$_4$NH$_3$-3-[(C$^t$Bu$_2$)$_2$-NMe]-, (EtO)-Ln-C$_4$NH$_3$-3-[(C$^t$Bu$_2$)$_2$-NMe]-, ($^n$PrO)-Ln-C$_4$NH$_3$-3-[(C$^t$Bu$_2$)$_2$-NMe]-, ($^i$PrO)-Ln-C$_4$NH$_3$-3-[(C$^t$Bu$_2$)$_2$-NMe]-, ($^n$BuO)-Ln-C$_4$NH$_3$-3-[(C$^t$Bu$_2$)$_2$-NMe]-, ($^i$BuO)-Ln-C$_4$NH$_3$-3-[(C$^t$Bu$_2$)$_2$-NMe]-, ($^s$BuO)-Ln-C$_4$NH$_3$-3-[(C$^t$Bu$_2$)$_2$-NMe]-, ($^t$BuO)-Ln-C$_4$NH$_3$-3-[(C$^t$Bu$_2$)$_2$-NMe]-, (H$_2$N)-Ln-C$_4$NH$_3$-3-[(C$^t$Bu$_2$)$_2$-NEt]-, (Me$_2$N)-Ln-C$_4$NH$_3$-3-[(C$^t$Bu$_2$)$_2$-NEt]-, (Et$_2$N)-Ln-C$_4$NH$_3$-3-[(C$^t$Bu$_2$)$_2$-NEt]-, ($^n$Pr$_2$N)-Ln-C$_4$NH$_3$-3-[(C$^t$Bu$_2$)$_2$-NEt]-, ($^i$Pr$_2$N)-Ln-C$_4$NH$_3$-3-[(C$^t$Bu$_2$)$_2$-NEt]-, ($^n$Bu$_2$N)-Ln-C$_4$NH$_3$-3-[(C$^t$Bu$_2$)$_2$-NEt]-, ($^i$Bu$_2$N)-Ln-C$_4$NH$_3$-3-[(C$^t$Bu$_2$)$_2$-NEt]-, ($^s$Bu$_2$N)-Ln-C$_4$NH$_3$-3-[(C$^t$Bu$_2$)$_2$-NEt]-, ($^t$Bu$_2$N)-Ln-C$_4$NH$_3$-3-[(C$^t$Bu$_2$)$_2$-NEt]-, (Cp)-Ln-C$_4$NH$_3$-3-[(C$^t$Bu$_2$)$_2$-NEt]-, (HO)-Ln-C$_4$NH$_3$-3-[(C$^t$Bu$_2$)$_2$-NEt]-, (MeO)-Ln-C$_4$NH$_3$-3-[(C$^t$Bu$_2$)$_2$-NEt]-, (EtO)-Ln-C$_4$NH$_3$-3-[(C$^t$Bu$_2$)$_2$-NEt]-, ($^n$PrO)-Ln-C$_4$NH$_3$-3-[(C$^t$Bu$_2$)$_2$-NEt]-, ($^i$PrO)-Ln-C$_4$NH$_3$-3-[(C$^t$Bu$_2$)$_2$-NEt]-, ($^n$BuO)-Ln-C$_4$NH$_3$-3-[(C$^t$Bu$_2$)$_2$-NEt]-, ($^i$BuO)-Ln-C$_4$NH$_3$-3-[(C$^t$Bu$_2$)$_2$-NEt]-, ($^s$BuO)-Ln-C$_4$NH$_3$-3-[(C$^t$Bu$_2$)$_2$-NEt]-, ($^t$BuO)-Ln-C$_4$NH$_3$-3-[(C$^t$Bu$_2$)$_2$-NEt]-, (H$_2$N)-Ln-C$_4$NH$_3$-3-[(C$^t$Bu$_2$)$_2$-N$^n$Pr]—, (Me$_2$N)-Ln-C$_4$NH$_3$-3-[(C$^t$Bu$_2$)$_2$-N$^n$Pr]—, (Et$_2$N)-Ln-C$_4$NH$_3$-3-[(C$^t$Bu$_2$)$_2$-N$^n$Pr]—, ($^n$Pr$_2$N)-Ln-C$_4$NH$_3$-3-[(C$^t$Bu$_2$)$_2$-N$^n$Pr]—, ($^i$Pr$_2$N)-Ln-C$_4$NH$_3$-3-[(C$^t$Bu$_2$)$_2$-N$^n$Pr]—, ($^n$Bu$_2$N)-Ln-C$_4$NH$_3$-3-[(C$^t$Bu$_2$)$_2$-N$^n$Pr]—, ($^i$Bu$_2$N)-Ln-C$_4$NH$_3$-3-[(C$^t$Bu$_2$)$_2$-N$^n$Pr]—, ($^s$Bu$_2$N)-Ln-C$_4$NH$_3$-3-[(C$^t$Bu$_2$)$_2$-N$^n$Pr]—, ($^t$Bu$_2$N)-Ln-C$_4$NH$_3$-3-[(C$^t$Bu$_2$)$_2$-N$^n$Pr]—, (Cp)-Ln-C$_4$NH$_3$-3-[(C$^t$Bu$_2$)$_2$-N$^n$Pr]—, (HO)-Ln-C$_4$NH$_3$-3-[(C$^t$Bu$_2$)$_2$-N$^n$Pr]—, (MeO)-Ln-C$_4$NH$_3$-3-[(C$^t$Bu$_2$)$_2$-N$^n$Pr]—, (EtO)-Ln-C$_4$NH$_3$-3-[(C$^t$Bu$_2$)$_2$-N$^n$Pr]—, ($^n$PrO)-Ln-C$_4$NH$_3$-3-[(C$^t$Bu$_2$)$_2$-N$^n$Pr]—, ($^i$PrO)-Ln-C$_4$NH$_3$-3-[(C$^t$Bu$_2$)$_2$-N$^n$Pr]—, ($^n$BuO)-Ln-C$_4$NH$_3$-3-[(C$^t$Bu$_2$)$_2$-N$^n$Pr]—, ($^i$BuO)-Ln-C$_4$NH$_3$-3-[(C$^t$Bu$_2$)$_2$-N$^n$Pr]—, ($^s$BuO)-Ln-C$_4$NH$_3$-3-[(C$^t$Bu$_2$)$_2$-N$^n$Pr]—, ($^t$BuO)-Ln-C$_4$NH$_3$-3-[(C$^t$Bu$_2$)$_2$-N$^n$Pr]—, (H$_2$N)-Ln-C$_4$NH$_3$-3-[(C$^t$Bu$_2$)$_2$-N$^i$Pr]—, (Me$_2$N)-Ln-C$_4$NH$_3$-3-[(C$^t$Bu$_2$)$_2$-N$^i$Pr]—, (Et$_2$N)-Ln-C$_4$NH$_3$-3-[(C$^t$Bu$_2$)$_2$-N$^i$Pr]—, ($^n$Pr$_2$N)-Ln-C$_4$NH$_3$-3-[(C$^t$Bu$_2$)$_2$-N$^i$Pr]—, ($^i$Pr$_2$N)-Ln-C$_4$NH$_3$-3-[(C$^t$Bu$_2$)$_2$-N$^i$Pr]—, ($^n$Bu$_2$N)-Ln-C$_4$NH$_3$-3-[(C$^t$Bu$_2$)$_2$-N$^i$Pr]—, ($^i$Bu$_2$N)-Ln-C$_4$NH$_3$-3-[(C$^t$Bu$_2$)$_2$-N$^i$Pr]—, ($^s$Bu$_2$N)-Ln-C$_4$NH$_3$-3-[(C$^t$Bu$_2$)$_2$-N$^i$Pr]—, ($^t$Bu$_2$N)-Ln-C$_4$NH$_3$-3-[(C$^t$Bu$_2$)$_2$-N$^i$Pr]—, (Cp)-Ln-C$_4$NH$_3$-3-[(C$^t$Bu$_2$)$_2$-N$^i$Pr]—, (HO)-Ln-C$_4$NH$_3$-3-[(C$^t$Bu$_2$)$_2$-N$^i$Pr]—, (MeO)-Ln-C$_4$NH$_3$-3-[(C$^t$Bu$_2$)$_2$-N$^i$Pr]—, (EtO)-Ln-C$_4$NH$_3$-3-[(C$^t$Bu$_2$)$_2$-N$^i$Pr]—, ($^n$PrO)-Ln-C$_4$NH$_3$-3-[(C$^t$Bu$_2$)$_2$-N$^i$Pr]—, ($^i$PrO)-Ln-C$_4$NH$_3$-3-[(C$^t$Bu$_2$)$_2$-N$^i$Pr]—, ($^n$BuO)-Ln-C$_4$NH$_3$-3-[(C$^t$Bu$_2$)$_2$-N$^i$Pr]—, ($^i$BuO)-Ln-C$_4$NH$_3$-3-[(C$^t$Bu$_2$)$_2$-N$^i$Pr]—, ($^s$BuO)-Ln-C$_4$NH$_3$-3-[(C$^t$Bu$_2$)$_2$-N$^i$Pr]—, ($^t$BuO)-Ln-C$_4$NH$_3$-3-[(C$^t$Bu$_2$)$_2$-N$^i$Pr]—, (H$_2$N)-Ln-C$_4$NH$_3$-3-[(C$^t$Bu$_2$)$_2$-N$^n$Bu]-, (Me$_2$N)-Ln-C$_4$NH$_3$-3-[(C$^t$Bu$_2$)$_2$-N$^n$Bu]-, (Et$_2$N)-Ln-C$_4$NH$_3$-3-[(C$^t$Bu$_2$)$_2$-N$^n$Bu]-, ($^n$Pr$_2$N)-Ln-C$_4$NH$_3$-3-[(C$^t$Bu$_2$)$_2$-N$^n$Bu]-, ($^i$Pr$_2$N)-Ln-C$_4$NH$_3$-3-[(C$^t$Bu$_2$)$_2$-N$^n$Bu]-, ($^n$Bu$_2$N)-Ln-C$_4$NH$_3$-3-[(C$^t$Bu$_2$)$_2$-N$^n$Bu]-, ($^i$Bu$_2$N)-Ln-C$_4$NH$_3$-3-[(C$^t$Bu$_2$)$_2$-N$^n$Bu]-, ($^s$Bu$_2$N)-Ln-C$_4$NH$_3$-3-[(C$^t$Bu$_2$)$_2$-N$^n$Bu]-, ($^t$Bu$_2$N)-Ln-C$_4$NH$_3$-3-[(C$^t$Bu$_2$)$_2$-N$^n$Bu]-, (Cp)-Ln-C$_4$NH$_3$-3-[(C$^t$Bu$_2$)$_2$-N$^n$Bu]-, (HO)-Ln-C$_4$NH$_3$-3-[(C$^t$Bu$_2$)$_2$-N$^n$Bu]-, (MeO)-Ln-C$_4$NH$_3$-3-[(C$^t$Bu$_2$)$_2$-N$^n$Bu]-, (EtO)-Ln-C$_4$NH$_3$-3-[(C$^t$Bu$_2$)$_2$-N$^n$Bu]-, ($^n$PrO)-Ln-C$_4$NH$_3$-3-[(C$^t$Bu$_2$)$_2$-N$^n$Bu]-, ($^i$PrO)-Ln-C$_4$NH$_3$-3-[(C$^t$Bu$_2$)$_2$-N$^n$Bu]-, ($^n$BuO)-Ln-C$_4$NH$_3$-3-[(C$^t$Bu$_2$)$_2$-N$^n$Bu]-, ($^i$BuO)-Ln-C$_4$NH$_3$-3-[(C$^t$Bu$_2$)$_2$-N$^n$Bu]-, ($^s$BuO)-Ln-C$_4$NH$_3$-3-[(C$^t$Bu$_2$)$_2$-N$^n$Bu]-, ($^t$BuO)-Ln-C$_4$NH$_3$-3-[(C$^t$Bu$_2$)$_2$-N$^n$Bu]-, (H$_2$N)-Ln-C$_4$NH$_3$-3-[(C$^t$Bu$_2$)$_2$-N$^i$Bu]-, (Me$_2$N)-Ln-C$_4$NH$_3$-3-[(C$^t$Bu$_2$)$_2$-N$^i$Bu]-, (Et$_2$N)-Ln-C$_4$NH$_3$-3-[(C$^t$Bu$_2$)$_2$-N$^i$Bu]-, ($^n$Pr$_2$N)-Ln-C$_4$NH$_3$-3-[(C$^t$Bu$_2$)$_2$-N$^i$Bu]-, ($^i$Pr$_2$N)-Ln-C$_4$NH$_3$-3-[(C$^t$Bu$_2$)$_2$-N$^i$Bu]-, ($^n$Bu$_2$N)-Ln-C$_4$NH$_3$-3-[(C$^t$Bu$_2$)$_2$-N$^i$Bu]-, ($^i$Bu$_2$N)-Ln-C$_4$NH$_3$-3-[(C$^t$Bu$_2$)$_2$-N$^i$Bu]-, ($^s$Bu$_2$N)-Ln-C$_4$NH$_3$-3-[(C$^t$Bu$_2$)$_2$-N$^i$Bu]-, ($^t$Bu$_2$N)-Ln-C$_4$NH$_3$-3-[(C$^t$Bu$_2$)$_2$-N$^i$Bu]-, (Cp)-Ln-C$_4$NH$_3$-3-[(C$^t$Bu$_2$)$_2$-N$^i$Bu]-, (HO)-Ln-C$_4$NH$_3$-3-[(C$^t$Bu$_2$)$_2$-N$^i$Bu]-, (MeO)-Ln-C$_4$NH$_3$-3-[(C$^t$Bu$_2$)$_2$-N$^i$Bu]-, (EtO)-Ln-C$_4$NH$_3$-3-[(C$^t$Bu$_2$)$_2$-N$^i$Bu]-, ($^n$PrO)-Ln-C$_4$NH$_3$-3-[(C$^t$Bu$_2$)$_2$-N$^i$Bu]-, ($^i$PrO)-Ln-C$_4$NH$_3$-3-[(C$^t$Bu$_2$)$_2$-N$^i$Bu]-, ($^n$BuO)-Ln-C$_4$NH$_3$-3-[(C$^t$Bu$_2$)$_2$-N$^i$Bu]-, ($^i$BuO)-Ln-C$_4$NH$_3$-3-[(C$^t$Bu$_2$)$_2$-N$^i$Bu]-, ($^s$BuO)-Ln-C$_4$NH$_3$-3-[(C$^t$Bu$_2$)$_2$-N$^i$Bu]-, ($^t$BuO)-Ln-C$_4$NH$_3$-3-[(C$^t$Bu$_2$)$_2$-N$^i$Bu]-, (H$_2$N)-Ln-C$_4$NH$_3$-3-[(C$^t$Bu$_2$)$_2$-N$^s$Bu]-, (Me$_2$N)-Ln-C$_4$NH$_3$-3-[(C$^t$Bu$_2$)$_2$-N$^s$Bu]-, (Et$_2$N)-Ln-C$_4$NH$_3$-3-[(C$^t$Bu$_2$)$_2$-N$^s$Bu]-, ($^n$Pr$_2$N)-Ln-C$_4$NH$_3$-3-[(C$^t$Bu$_2$)$_2$-N$^s$Bu]-, ($^i$Pr$_2$N)-Ln-C$_4$NH$_3$-3-[(C$^t$Bu$_2$)$_2$-N$^s$Bu]-, ($^n$Bu$_2$N)-Ln-C$_4$NH$_3$-3-[(C$^t$Bu$_2$)$_2$-N$^s$Bu]-, ($^i$Bu$_2$N)-Ln-C$_4$NH$_3$-3-[(C$^t$Bu$_2$)$_2$-N$^s$Bu]-, ($^s$Bu$_2$N)-Ln-C$_4$NH$_3$-3-[(C$^t$Bu$_2$)$_2$-N$^s$Bu]-, ($^t$Bu$_2$N)-Ln-C$_4$NH$_3$-3-[(C$^t$Bu$_2$)$_2$-N$^s$Bu]-, (Cp)-Ln-C$_4$NH$_3$-3-[(C$^t$Bu$_2$)$_2$-N$^s$Bu]-, (HO)-Ln-C$_4$NH$_3$-3-[(C$^t$Bu$_2$)$_2$-N$^s$Bu]-, (MeO)-Ln-C$_4$NH$_3$-3-[(C$^t$Bu$_2$)$_2$-N$^s$Bu]-, (EtO)-Ln-C$_4$NH$_3$-3-[(C$^t$Bu$_2$)$_2$-N$^s$Bu]-, ($^n$PrO)-Ln-C$_4$NH$_3$-3-[(C$^t$Bu$_2$)$_2$-N$^s$Bu]-, ($^i$PrO)-Ln-C$_4$NH$_3$-3-[(C$^t$Bu$_2$)$_2$-N$^s$Bu]-, ($^n$BuO)-Ln-C$_4$NH$_3$-3-[(C$^t$Bu$_2$)$_2$-N$^s$Bu]-, ($^i$BuO)-Ln-C$_4$NH$_3$-3-[(C$^t$Bu$_2$)$_2$-N$^s$Bu]-, ($^s$BuO)-Ln-C$_4$NH$_3$-3-[(C$^t$

Bu$_2$)$_2$-N$^s$Bu]-, ($^t$BuO)-Ln-C$_4$NH$_3$-3-[(C$^t$Bu$_2$)$_2$-N$^s$Bu]-, (H$_2$N)-Ln-C$_4$NH$_3$-3-[(C$^t$Bu$_2$)$_2$-N$^t$Bu]-, (Me$_2$N)-Ln-C$_4$NH$_3$-3-[(C$^t$Bu$_2$)$_2$-N$^t$Bu]-, (Et$_2$N)-Ln-C$_4$NH$_3$-3-[(C$^t$Bu$_2$)$_2$-N$^t$Bu]-, ($^n$Pr$_2$N)-Ln-C$_4$NH$_3$-3-[(C$^t$Bu$_2$)$_2$-N$^t$Bu]-, ($^i$Pr$_2$N)-Ln-C$_4$NH$_3$-3-[(C$^t$Bu$_2$)$_2$-N$^t$Bu]-, ($^n$Bu$_2$N)-Ln-C$_4$NH$_3$-3-[(C$^t$Bu$_2$)$_2$-N$^t$Bu]-, ($^i$Bu$_2$N)-Ln-C$_4$NH$_3$-3-[(C$^t$Bu$_2$)$_2$-N$^t$Bu]-, ($^s$Bu$_2$N)-Ln-C$_4$NH$_3$-3-[(C$^t$Bu$_2$)$_2$-N$^t$Bu]-, ($^t$Bu$_2$N)-Ln-C$_4$NH$_3$-3-[(C$^t$Bu$_2$)$_2$-N$^t$Bu]-, (Cp)-Ln-C$_4$NH$_3$-3-[(C$^t$Bu$_2$)$_2$-N$^t$Bu]-, (HO)-Ln-C$_4$NH$_3$-3-[(C$^t$Bu$_2$)$_2$-N$^t$Bu]-, (MeO)-Ln-C$_4$NH$_3$-3-[(C$^t$Bu$_2$)$_2$-N$^t$Bu]-, (EtO)-Ln-C$_4$NH$_3$-3-[(C$^t$Bu$_2$)$_2$-N$^t$Bu]-, ($^n$PrO)-Ln-C$_4$NH$_3$-3-[(C$^t$Bu$_2$)$_2$-N$^t$Bu]-, ($^i$PrO)-Ln-C$_4$NH$_3$-3-[(C$^t$Bu$_2$)$_2$-N$^t$Bu]-, ($^n$BuO)-Ln-C$_4$NH$_3$-3-[(C$^t$Bu$_2$)$_2$-N$^t$Bu]-, ($^i$BuO)-Ln-C$_4$NH$_3$-3-[(C$^t$Bu$_2$)$_2$-N$^t$Bu]-, ($^s$BuO)-Ln-C$_4$NH$_3$-3-[(C$^t$Bu$_2$)$_2$-N$^t$Bu]-, ($^t$BuO)-Ln-C$_4$NH$_3$-3-[(C$^t$Bu$_2$)$_2$-N$^t$Bu]-, (H$_2$N)-Ln-C$_4$NH$_3$-3-[(C$^t$Bu$_2$)$_2$-O]—, (Me$_2$N)-Ln-C$_4$NH$_3$-3-[(C$^t$Bu$_2$)$_2$-O]—, (Et$_2$N)-Ln-C$_4$NH$_3$-3-[(C$^t$Bu$_2$)$_2$-O]—, ($^n$Pr$_2$N)-Ln-C$_4$NH$_3$-3-[(C$^t$Bu$_2$)$_2$-O]—, ($^i$Pr$_2$N)-Ln-C$_4$NH$_3$-3-[(C$^t$Bu$_2$)$_2$-O]—, ($^n$Bu$_2$N)-Ln-C$_4$NH$_3$-3-[(C$^t$Bu$_2$)$_2$-O]—, ($^i$Bu$_2$N)-Ln-C$_4$NH$_3$-3-[(C$^t$Bu$_2$)$_2$-O]—, ($^s$Bu$_2$N)-Ln-C$_4$NH$_3$-3-[(C$^t$Bu$_2$)$_2$-O]—, ($^t$Bu$_2$N)-Ln-C$_4$NH$_3$-3-[(C$^t$Bu$_2$)$_2$-O]—, (Cp)-Ln-C$_4$NH$_3$-3-[(C$^t$Bu$_2$)$_2$-O]—, (HO)-Ln-C$_4$NH$_3$-3-[(C$^t$Bu$_2$)$_2$-O]—, (MeO)-Ln-C$_4$NH$_3$-3-[(C$^t$Bu$_2$)$_2$-O]—, (EtO)-Ln-C$_4$NH$_3$-3-[(C$^t$Bu$_2$)$_2$-O]—, ($^n$PrO)-Ln-C$_4$NH$_3$-3-[(C$^t$Bu$_2$)$_2$-O]—, ($^i$PrO)-Ln-C$_4$NH$_3$-3-[(C$^t$Bu$_2$)$_2$-O]—, ($^n$BuO)-Ln-C$_4$NH$_3$-3-[(C$^t$Bu$_2$)$_2$-O]—, ($^i$BuO)-Ln-C$_4$NH$_3$-3-[(C$^t$Bu$_2$)$_2$-O]—, ($^s$BuO)-Ln-C$_4$NH$_3$-3-[(C$^t$Bu$_2$)$_2$-O]—, ($^t$BuO)-Ln-C$_4$NH$_3$-3-[(C$^t$Bu$_2$)$_2$-O]—, (H$_2$N)-Ln-C$_3$(m-N$_2$)H$_2$-4-[(CH$_2$)$_2$—NH]—, (Me$_2$N)-Ln-C$_3$(m-N$_2$)H$_2$-4-[(CH$_2$)$_2$—NH]—, (Et$_2$N)-Ln-C$_3$(m-N$_2$)H$_2$-4-[(CH$_2$)$_2$—NH]—, ($^n$Pr$_2$N)-Ln-C$_3$(m-N$_2$)H$_2$-4-[(CH$_2$)$_2$—NH]—, ($^i$Pr$_2$N)-Ln-C$_3$(m-N$_2$)H$_2$-4-[(CH$_2$)$_2$—NH]—, ($^n$Bu$_2$N)-Ln-C$_3$(m-N$_2$)H$_2$-4-[(CH$_2$)$_2$—NH]—, ($^i$Bu$_2$N)-Ln-C$_3$(m-N$_2$)H$_2$-4-[(CH$_2$)$_2$—NH]—, ($^s$Bu$_2$N)-Ln-C$_3$(m-N$_2$)H$_2$-4-[(CH$_2$)$_2$—NH]—, ($^t$Bu$_2$N)-Ln-C$_3$(m-N$_2$)H$_2$-4-[(CH$_2$)$_2$—NH]—, (Cp)-Ln-C$_3$(m-N$_2$)H$_2$-4-[(CH$_2$)$_2$—NH]—, (HO)-Ln-C$_3$(m-N$_2$)H$_2$-4-[(CH$_2$)$_2$—NH]—, (MeO)-Ln-C$_3$(m-N$_2$)H$_2$-4-[(CH$_2$)$_2$—NH]—, (EtO)-Ln-C$_3$(m-N$_2$)H$_2$-4-[(CH$_2$)$_2$—NH]—, ($^n$PrO)-Ln-C$_3$(m-N$_2$)H$_2$-4-[(CH$_2$)$_2$—NH]—, ($^i$PrO)-Ln-C$_3$(m-N$_2$)H$_2$-4-[(CH$_2$)$_2$—NH]—, ($^n$BuO)-Ln-C$_3$(m-N$_2$)H$_2$-4-[(CH$_2$)$_2$—NH]—, ($^i$BuO)-Ln-C$_3$(m-N$_2$)H$_2$-4-[(CH$_2$)$_2$—NH]—, ($^s$BuO)-Ln-C$_3$(m-N$_2$)H$_2$-4-[(CH$_2$)$_2$—NH]—, ($^t$BuO)-Ln-C$_3$(m-N$_2$)H$_2$-4-[(CH$_2$)$_2$—NH]—, (H$_2$N)-Ln-C$_3$(m-N$_2$)H$_2$-4-[(CH$_2$)$_2$—NMe]-, (Me$_2$N)-Ln-C$_3$(m-N$_2$)H$_2$-4-[(CH$_2$)$_2$—NMe]-, (Et$_2$N)-Ln-C$_3$(m-N$_2$)H$_2$-4-[(CH$_2$)$_2$—NMe]-, ($^n$Pr$_2$N)-Ln-C$_3$(m-N$_2$)H$_2$-4-[(CH$_2$)$_2$—NMe]-, ($^i$Pr$_2$N)-Ln-C$_3$(m-N$_2$)H$_2$-4-[(CH$_2$)$_2$—NMe]-, ($^n$Bu$_2$N)-Ln-C$_3$(m-N$_2$)H$_2$-4-[(CH$_2$)$_2$—NMe]-, ($^i$Bu$_2$N)-Ln-C$_3$(m-N$_2$)H$_2$-4-[(CH$_2$)$_2$—NMe]-, ($^s$Bu$_2$N)-Ln-C$_3$(m-N$_2$)H$_2$-4-[(CH$_2$)$_2$—NMe]-, ($^t$Bu$_2$N)-Ln-C$_3$(m-N$_2$)H$_2$-4-[(CH$_2$)$_2$—NMe]-, (Cp)-Ln-C$_3$(m-N$_2$)H$_2$-4-[(CH$_2$)$_2$—NMe]-, (HO)-Ln-C$_3$(m-N$_2$)H$_2$-4-[(CH$_2$)$_2$—NMe]-, (MeO)-Ln-C$_3$(m-N$_2$)H$_2$-4-[(CH$_2$)$_2$—NMe]-, (EtO)-Ln-C$_3$-(m-N$_2$)H$_2$-4-[(CH$_2$)$_2$—NMe]-, ($^n$PrO)-Ln-C$_3$(m-N$_2$)H$_2$-4-[(CH$_2$)$_2$—NMe]-, ($^i$PrO)-Ln-C$_3$(m-N$_2$)H$_2$-4-[(CH$_2$)$_2$—NMe]-, ($^n$BuO)-Ln-C$_3$(m-N$_2$)H$_2$-4-[(CH$_2$)$_2$—NMe]-, ($^i$BuO)-Ln-C$_3$(m-N$_2$)H$_2$-4-[(CH$_2$)$_2$—NMe]-, ($^s$BuO)-Ln-C$_3$(m-N$_2$)H$_2$-4-[(CH$_2$)$_2$—NMe]-, ($^t$BuO)-Ln-C$_3$(m-N$_2$)H$_2$-4-[(CH$_2$)$_2$—NMe]-, (H$_2$N)-Ln-C$_3$(m-N$_2$)H$_2$-4-[(CH$_2$)$_2$—NEt]-, (Me$_2$N)-Ln-C$_3$(m-N$_2$)H$_2$-4-[(CH$_2$)$_2$—NEt]-, (Et$_2$N)-Ln-C$_3$(m-N$_2$)H$_2$-4-[(CH$_2$)$_2$—NEt]-, ($^n$Pr$_2$N)-Ln-C$_3$(m-N$_2$)H$_2$-4-[(CH$_2$)$_2$—NEt]-, ($^i$Pr$_2$N)-Ln-C$_3$(m-N$_2$)H$_2$-4-[(CH$_2$)$_2$—NEt]-, ($^n$Bu$_2$N)-Ln-C$_3$(m-N$_2$)H$_2$-4-[(CH$_2$)$_2$—NEt]-, ($^i$Bu$_2$N)-Ln-C$_3$(m-N$_2$)H$_2$-4-[(CH$_2$)$_2$—NEt]-, ($^s$Bu$_2$N)-Ln-C$_3$(m-N$_2$)H$_2$-4-[(CH$_2$)$_2$—NEt]-, ($^t$Bu$_2$N)-Ln-C$_3$(m-N$_2$)H$_2$-4-[(CH$_2$)$_2$—NEt]-, (Cp)-Ln-C$_3$(m-N$_2$)H$_2$-4-[(CH$_2$)$_2$—NEt]-, (HO)-Ln-C$_3$(m-N$_2$)H$_2$-4-[(CH$_2$)$_2$—NEt]-, (MeO)-Ln-C$_3$(m-N$_2$)H$_2$-4-[(CH$_2$)$_2$—NEt]-, (EtO)-Ln-C$_3$(m-N$_2$)H$_2$-4-[(CH$_2$)$_2$—NEt]-, ($^n$PrO)-Ln-C$_3$(m-N$_2$)H$_2$-4-[(CH$_2$)$_2$—NEt]-, ($^i$PrO)-Ln-C$_3$(m-N$_2$)H$_2$-4-[(CH$_2$)$_2$—NEt]-, ($^n$BuO)-Ln-C$_3$(m-N$_2$)H$_2$-4-[(CH$_2$)$_2$—NEt]-, ($^i$BuO)-Ln-C$_3$(m-N$_2$)H$_2$-4-[(CH$_2$)$_2$—NEt]-, ($^s$BuO)-Ln-C$_3$(m-N$_2$)H$_2$-4-[(CH$_2$)$_2$—NEt]-, ($^t$BuO)-Ln-C$_3$(m-N$_2$)H$_2$-4-[(CH$_2$)$_2$—NEt]-, (H$_2$N)-Ln-C$_3$(m-N$_2$)H$_2$-4-[(CH$_2$)$_2$—N$^n$Pr]—, (Me$_2$N)-Ln-C$_3$(m-N$_2$)H$_2$-4-[(CH$_2$)$_2$—N$^n$Pr]—, (Et$_2$N)-Ln-C$_3$(m-N$_2$)H$_2$-4-[(CH$_2$)$_2$—N$^n$Pr]—, ($^n$Pr$_2$N)-Ln-C$_3$(m-N$_2$)H$_2$-4-[(CH$_2$)$_2$—N$^n$Pr]—, ($^i$Pr$_2$N)-Ln-C$_3$(m-N$_2$)H$_2$-4-[(CH$_2$)$_2$—N$^n$Pr]—, ($^n$Bu$_2$N)-Ln-C$_3$(m-N$_2$)H$_2$-4-[(CH$_2$)$_2$—N$^n$Pr]—, ($^i$Bu$_2$N)-Ln-C$_3$(m-N$_2$)H$_2$-4-[(CH$_2$)$_2$—N$^n$Pr]—, ($^s$Bu$_2$N)-Ln-C$_3$(m-N$_2$)H$_2$-4-[(CH$_2$)$_2$—N$^n$Pr]—, ($^t$Bu$_2$N)-Ln-C$_3$(m-N$_2$)H$_2$-4-[(CH$_2$)$_2$—N$^n$Pr]—, (Cp)-Ln-C$_3$(m-N$_2$)H$_2$-4-[(CH$_2$)$_2$—N$^n$Pr]—, (HO)-Ln-C$_3$(m-N$_2$)H$_2$-4-[(CH$_2$)$_2$—N$^n$Pr]—, (MeO)-Ln-C$_3$(m-N$_2$)H$_2$-4-[(CH$_2$)$_2$—N$^n$Pr]—, (EtO)-Ln-C$_3$(m-N$_2$)H$_2$-4-[(CH$_2$)$_2$—N$^n$Pr]—, ($^n$PrO)-Ln-C$_3$(m-N$_2$)H$_2$-4-[(CH$_2$)$_2$—N$^n$Pr]—, ($^i$PrO)-Ln-C$_3$(m-N$_2$)H$_2$-4-[(CH$_2$)$_2$—N$^n$Pr]—, ($^n$BuO)-Ln-C$_3$(m-N$_2$)H$_2$-4-[(CH$_2$)$_2$—N$^n$Pr]—, ($^i$BuO)-Ln-C$_3$(m-N$_2$)H$_2$-4-[(CH$_2$)$_2$—N$^n$Pr]—, ($^s$BuO)-Ln-C$_3$(m-N$_2$)H$_2$-4-[(CH$_2$)$_2$—N$^n$Pr]—, ($^t$BuO)-Ln-C$_3$(m-N$_2$)H$_2$-4-[(CH$_2$)$_2$—N$^n$Pr]—, (H$_2$N)-Ln-C$_3$(m-N$_2$)H$_2$-4-[(CH$_2$)$_2$—N$^i$Pr]—, (Me$_2$N)-Ln-C$_3$(m-N$_2$)H$_2$-4-[(CH$_2$)$_2$—N$^i$Pr]—, (Et$_2$N)-Ln-C$_3$(m-N$_2$)H$_2$-4-[(CH$_2$)$_2$—N$^i$Pr]—, ($^n$Pr$_2$N)-Ln-C$_3$(m-N$_2$)H$_2$-4-[(CH$_2$)$_2$—N$^i$Pr]—, ($^i$Pr$_2$N)-Ln-C$_3$(m-N$_2$)H$_2$-4-[(CH$_2$)$_2$—N$^i$Pr]—, ($^n$Bu$_2$N)-Ln-C$_3$(m-N$_2$)H$_2$-4-[(CH$_2$)$_2$—N$^i$Pr]—, ($^i$Bu$_2$N)-Ln-C$_3$(m-N$_2$)H$_2$-4-[(CH$_2$)$_2$—N$^i$Pr]—, ($^s$Bu$_2$N)-Ln-C$_3$(m-N$_2$)H$_2$-4-[(CH$_2$)$_2$—N$^i$Pr]—, ($^t$Bu$_2$N)-Ln-C$_3$(m-N$_2$)H$_2$-4-[(CH$_2$)$_2$—N$^i$Pr]—, (Cp)-Ln-C$_3$(m-N$_2$)H$_2$-4-[(CH$_2$)$_2$—N$^i$Pr]—, (HO)-Ln-C$_3$(m-N$_2$)H$_2$-4-[(CH$_2$)$_2$—N$^i$Pr]—, (MeO)-Ln-C$_3$(m-N$_2$)H$_2$-4-[(CH$_2$)$_2$—N$^i$Pr]—, (EtO)-Ln-C$_3$(m-N$_2$)H$_2$-4-[(CH$_2$)$_2$—N$^i$Pr]—, ($^n$PrO)-Ln-C$_3$(m-N$_2$)H$_2$-4-[(CH$_2$)$_2$—N$^i$Pr]—, ($^i$PrO)-Ln-C$_3$(m-N$_2$)H$_2$-4-[(CH$_2$)$_2$—N$^i$Pr]—, ($^n$BuO)-Ln-C$_3$(m-N$_2$)H$_2$-4-[(CH$_2$)$_2$—N$^i$Pr]—, ($^i$BuO)-Ln-C$_3$(m-N$_2$)H$_2$-4-[(CH$_2$)$_2$—N$^i$Pr]—, ($^s$BuO)-Ln-C$_3$(m-N$_2$)H$_2$-4-[(CH$_2$)$_2$—N$^i$Pr]—, ($^t$BuO)-Ln-C$_3$(m-N$_2$)H$_2$-4-[(CH$_2$)$_2$—N$^i$Pr]—, (H$_2$N)-Ln-C$_3$(m-N$_2$)H$_2$-4-[(CH$_2$)$_2$—N$^n$Bu]-, (Me$_2$N)-Ln-C$_3$(m-N$_2$)H$_2$-4-[(CH$_2$)$_2$—N$^n$Bu]-, (Et$_2$N)-Ln-C$_3$(m-N$_2$)H$_2$-4-[(CH$_2$)$_2$—N$^n$Bu]-, ($^n$Pr$_2$N)-Ln-C$_3$(m-N$_2$)H$_2$-4-[(CH$_2$)$_2$—N$^n$Bu]-, ($^i$Pr$_2$N)-Ln-C$_3$(m-N$_2$)H$_2$-4-[(CH$_2$)$_2$—N$^n$Bu]-, ($^n$Bu$_2$N)-Ln-C$_3$(m-N$_2$)H$_2$-4-[(CH$_2$)$_2$—N$^n$Bu]-, ($^i$Bu$_2$N)-Ln-C$_3$(m-N$_2$)H$_2$-4-[(CH$_2$)$_2$—N$^n$Bu]-, ($^s$Bu$_2$N)-Ln-C$_3$(m-N$_2$)H$_2$-4-[(CH$_2$)$_2$—N$^n$Bu]-, ($^t$Bu$_2$N)-Ln-C$_3$(m-N$_2$)H$_2$-4-[(CH$_2$)$_2$—N$^n$Bu]-, (Cp)-Ln-C$_3$(m-N$_2$)H$_2$-4-[(CH$_2$)$_2$—N$^n$Bu]-, (HO)-Ln-C$_3$(m-N$_2$)H$_2$-4-[(CH$_2$)$_2$—N$^n$Bu]-, (MeO)-Ln-C$_3$(m-N$_2$)H$_2$-4-[(CH$_2$)$_2$—N$^n$Bu]-, (EtO)-Ln-C$_3$(m-N$_2$)H$_2$-4-[(CH$_2$)$_2$—N$^n$Bu]-, ($^n$PrO)-Ln-C$_3$(m-N$_2$)H$_2$-4-[(CH$_2$)$_2$—N$^n$Bu]-, ($^i$PrO)-Ln-C$_3$(m-N$_2$)H$_2$-4-[(CH$_2$)$_2$—N$^n$Bu]-, ($^n$BuO)-Ln-C$_3$(m-N$_2$)H$_2$-4-[(CH$_2$)$_2$—N$^n$Bu]-, ($^i$BuO)-Ln-C$_3$(m-N$_2$)H$_2$-4-[(CH$_2$)$_2$—N$^n$Bu]-, ($^s$BuO)-Ln-C$_3$(m-N$_2$)H$_2$-4-[(CH$_2$)$_2$—N$^n$Bu]-, ($^t$BuO)-Ln-C$_3$(m-N$_2$)H$_2$-4-[(CH$_2$)$_2$—N$^n$Bu]-, (H$_2$N)-Ln-C$_3$(m-N$_2$)H$_2$-4-[(CH$_2$)$_2$—N$^i$Bu]-, (Me$_2$N)-Ln-C$_3$(m-N$_2$)H$_2$-4-[(CH$_2$)$_2$—N$^i$Bu]-, (Et$_2$N)-Ln-C$_3$(m-N$_2$)H$_2$-4-[(CH$_2$)$_2$—N$^i$Bu]-, ($^n$Pr$_2$N)-Ln-C$_3$(m-N$_2$)H$_2$-4-[(CH$_2$)$_2$—N$^i$Bu]-, ($^i$Pr$_2$N)-Ln-C$_3$(m-N$_2$)H$_2$-4-[(CH$_2$)$_2$—N$^i$Bu]-, ($^n$Bu$_2$N)-Ln-C$_3$(m-N$_2$)H$_2$-4-[(CH$_2$)$_2$—N$^i$Bu]-, ($^i$Bu$_2$N)-Ln-C$_3$(m-N$_2$)H$_2$-4-[(CH$_2$)$_2$—N$^i$Bu]-, ($^s$Bu$_2$N)-Ln-C$_3$(m-N$_2$)H$_2$-4-[(CH$_2$)$_2$—N$^i$Bu]-, ($^t$Bu$_2$N)-Ln-C$_3$(m-N$_2$)H$_2$-4-[(CH$_2$)$_2$—N$^i$Bu]-, (Cp)-Ln-C$_3$(m-N$_2$)H$_2$-4-[(CH$_2$)$_2$—N$^i$Bu]-, (HO)-Ln-C$_3$(m-N$_2$)H$_2$-4-[(CH$_2$)$_2$—N$^i$Bu]-, (MeO)-Ln-C$_3$(m-N$_2$)H$_2$-4-[(CH$_2$)$_2$—N$^i$Bu]-, (EtO)-Ln-C$_3$(m-N$_2$)H$_2$-4-[(CH$_2$)$_2$—N$^i$Bu]-, ($^n$PrO)-Ln-C$_3$(m-N$_2$)H$_2$-4-[(CH$_2$)$_2$—N$^i$Bu]-, ($^i$PrO)-Ln-C$_3$(m-N$_2$)H$_2$-4-[(CH$_2$)$_2$—N$^i$Bu]-, ($^n$BuO)-Ln-C$_3$(m-N$_2$)H$_2$-4-[(CH$_2$)$_2$—N$^i$Bu]-, ($^i$BuO)-Ln-C$_3$(m-N$_2$)H$_2$-4-[(CH$_2$)$_2$—N$^i$Bu]-, ($^s$BuO)-Ln-C$_3$(m-N$_2$)H$_2$-4-[(CH$_2$)$_2$—N$^i$Bu]-, ($^t$BuO)-Ln-C$_3$(m-N$_2$)H$_2$-4-[(CH$_2$)$_2$—N$^i$Bu]-, (H$_2$N)-Ln-C$_3$(m-N$_2$)H$_2$-4-[(CH$_2$)$_2$—N$^s$Bu]-, (Me$_2$N)-

Ln-C$_3$(m-N$_2$)H$_2$-4-[(CH$_2$)$_2$—N$^s$Bu]-, (Et$_2$N)-Ln-C$_3$(m-N$_2$)H$_2$-4-[(CH$_2$)$_2$—N$^s$Bu]-, ($^n$Pr$_2$N)-Ln-C$_3$(m-N$_2$)H$_2$-4-[(CH$_2$)$_2$—N$^s$Bu]-, ($^i$Pr$_2$N)-Ln-C$_3$(m-N$_2$)H$_2$-4-[(CH$_2$)$_2$—N$^s$Bu]-, ($^n$Bu$_2$N)-Ln-C$_3$(m-N$_2$)H$_2$-4-[(CH$_2$)$_2$—N$^s$Bu]-, ($^i$Bu$_2$N)-Ln-C$_3$(m-N$_2$)H$_2$-4-[(CH$_2$)$_2$—N$^s$Bu]-, ($^s$Bu$_2$N)-Ln-C$_3$(m-N$_2$)H$_2$-4-[(CH$_2$)$_2$—N$^s$Bu]-, ($^t$Bu$_2$N)-Ln-C$_3$(m-N$_2$)H$_2$-4-[(CH$_2$)$_2$—N$^s$Bu]-, (Cp)-Ln-C$_3$(m-N$_2$)H$_2$-4-[(CH$_2$)$_2$—N$^s$Bu]-, (HO)-Ln-C$_3$(m-N$_2$)H$_2$-4-[(CH$_2$)$_2$—N$^s$Bu]-, (MeO)-Ln-C$_3$(m-N$_2$)H$_2$-4-[(CH$_2$)$_2$—N$^s$Bu]-, (EtO)-Ln-C$_3$(m-N$_2$)H$_2$-4-[(CH$_2$)$_2$—N$^s$Bu]-, ($^n$PrO)-Ln-C$_3$(m-N$_2$)H$_2$-4-[(CH$_2$)$_2$—N$^s$Bu]-, ($^i$PrO)-Ln-C$_3$(m-N$_2$)H$_2$-4-[(CH$_2$)$_2$—N$^s$Bu]-, ($^n$BuO)-Ln-C$_3$(m-N$_2$)H$_2$-4-[(CH$_2$)$_2$—N$^s$Bu]-, ($^i$BuO)-Ln-C$_3$(m-N$_2$)H$_2$-4-[(CH$_2$)$_2$—N$^s$Bu]-, ($^s$BuO)-Ln-C$_3$(m-N$_2$)H$_2$-4-[(CH$_2$)$_2$—N$^s$Bu]-, ($^t$BuO)-Ln-C$_3$(m-N$_2$)H$_2$-4-[(CH$_2$)$_2$—N$^s$Bu]-, (H$_2$N)-Ln-C$_3$(m-N$_2$)H$_2$-4-[(CH$_2$)$_2$—N$^t$Bu]-, (Me$_2$N)-Ln-C$_3$(m-N$_2$)H$_2$-4-[(CH$_2$)$_2$—N$^t$Bu]-, (Et$_2$N)-Ln-C$_3$(m-N$_2$)H$_2$-4-[(CH$_2$)$_2$—N$^t$Bu]-, ($^n$Pr$_2$N)-Ln-C$_3$(m-N$_2$)H$_2$-4-[(CH$_2$)$_2$—N$^t$Bu]-, ($^i$Pr$_2$N)-Ln-C$_3$(m-N$_2$)H$_2$-4-[(CH$_2$)$_2$—N$^t$Bu]-, ($^n$Bu$_2$N)-Ln-C$_3$(m-N$_2$)H$_2$-4-[(CH$_2$)$_2$—N$^t$Bu]-, ($^i$Bu$_2$N)-Ln-C$_3$(m-N$_2$)H$_2$-4-[(CH$_2$)$_2$—N$^t$Bu]-, ($^s$Bu$_2$N)-Ln-C$_3$(m-N$_2$)H$_2$-4-[(CH$_2$)$_2$—N$^t$Bu]-, ($^t$Bu$_2$N)-Ln-C$_3$(m-N$_2$)H$_2$-4-[(CH$_2$)$_2$—N$^t$Bu]-, (Cp)-Ln-C$_3$(m-N$_2$)H$_2$-4-[(CH$_2$)$_2$—N$^t$Bu]-, (HO)-Ln-C$_3$(m-N$_2$)H$_2$-4-[(CH$_2$)$_2$—N$^t$Bu]-, (MeO)-Ln-C$_3$(m-N$_2$)H$_2$-4-[(CH$_2$)$_2$—N$^t$Bu]-, (EtO)-Ln-C$_3$(m-N$_2$)H$_2$-4-[(CH$_2$)$_2$—N$^t$Bu]-, ($^n$PrO)-Ln-C$_3$(m-N$_2$)H$_2$-4-[(CH$_2$)$_2$—N$^t$Bu]-, ($^i$PrO)-Ln-C$_3$(m-N$_2$)H$_2$-4-[(CH$_2$)$_2$—N$^t$Bu]-, ($^n$BuO)-Ln-C$_3$(m-N$_2$)H$_2$-4-[(CH$_2$)$_2$—N$^t$Bu]-, ($^i$BuO)-Ln-C$_3$(m-N$_2$)H$_2$-4-[(CH$_2$)$_2$—N$^t$Bu]-, ($^s$BuO)-Ln-C$_3$(m-N$_2$)H$_2$-4-[(CH$_2$)$_2$—N$^t$Bu]-, ($^t$BuO)-Ln-C$_3$(m-N$_2$)H$_2$-4-[(CH$_2$)$_2$—N$^t$Bu]-, (H$_2$N)-Ln-C$_3$(m-N$_2$)H$_2$-4-[(CH$_2$)$_2$—O]—, (Me$_2$N)-Ln-C$_3$(m-N$_2$)H$_2$-4-[(CH$_2$)$_2$—O]—, (Et$_2$N)-Ln-C$_3$(m-N$_2$)H$_2$-4-[(CH$_2$)$_2$—O]—, ($^n$Pr$_2$N)-Ln-C$_3$(m-N$_2$)H$_2$-4-[(CH$_2$)$_2$—O]—, ($^i$Pr$_2$N)-Ln-C$_3$(m-N$_2$)H$_2$-4-[(CH$_2$)$_2$—O]—, ($^n$Bu$_2$N)-Ln-C$_3$(m-N$_2$)H$_2$-4-[(CH$_2$)$_2$—O]—, ($^i$Bu$_2$N)-Ln-C$_3$(m-N$_2$)H$_2$-4-[(CH$_2$)$_2$—O]—, ($^s$Bu$_2$N)-Ln-C$_3$(m-N$_2$)H$_2$-4-[(CH$_2$)$_2$—O]—, ($^t$Bu$_2$N)-Ln-C$_3$(m-N$_2$)H$_2$-4-[(CH$_2$)$_2$—O]—, (Cp)-Ln-C$_3$(m-N$_2$)H$_2$-4-[(CH$_2$)$_2$—O]—, (HO)-Ln-C$_3$(m-N$_2$)H$_2$-4-[(CH$_2$)$_2$—O]—, (MeO)-Ln-C$_3$(m-N$_2$)H$_2$-4-[(CH$_2$)$_2$—O]—, (EtO)-Ln-C$_3$(m-N$_2$)H$_2$-4-[(CH$_2$)$_2$—O]—, ($^n$PrO)-Ln-C$_3$(m-N$_2$)H$_2$-4-[(CH$_2$)$_2$—O]—, ($^i$PrO)-Ln-C$_3$(m-N$_2$)H$_2$-4-[(CH$_2$)$_2$—O]—, ($^n$BuO)-Ln-C$_3$(m-N$_2$)H$_2$-4-[(CH$_2$)$_2$—O]—, ($^i$BuO)-Ln-C$_3$(m-N$_2$)H$_2$-4-[(CH$_2$)$_2$—O]—, ($^s$BuO)-Ln-C$_3$(m-N$_2$)H$_2$-4-[(CH$_2$)$_2$—O]—, ($^t$BuO)-Ln-C$_3$(m-N$_2$)H$_2$-4-[(CH$_2$)$_2$—O]—, (H$_2$N)-Ln-C$_3$(m-N$_2$)H$_2$-4-[(CMe$_2$)$_2$-NH]—, (Me$_2$N)-Ln-C$_3$(m-N$_2$)H$_2$-4-[(CMe$_2$)$_2$-NH]—, (Et$_2$N)-Ln-C$_3$(m-N$_2$)H$_2$-4-[(CMe$_2$)$_2$-NH]—, ($^n$Pr$_2$N)-Ln-C$_3$(m-N$_2$)H$_2$-4-[(CMe$_2$)$_2$-NH]—, ($^i$Pr$_2$N)-Ln-C$_3$(m-N$_2$)H$_2$-4-[(CMe$_2$)$_2$-NH]—, ($^n$Bu$_2$N)-Ln-C$_3$(m-N$_2$)H$_2$-4-[(CMe$_2$)$_2$-NH]—, ($^i$Bu$_2$N)-Ln-C$_3$(m-N$_2$)H$_2$-4-[(CMe$_2$)$_2$-NH]—, ($^s$Bu$_2$N)-Ln-C$_3$(m-N$_2$)H$_2$-4-[(CMe$_2$)$_2$-NH]—, ($^t$Bu$_2$N)-Ln-C$_3$(m-N$_2$)H$_2$-4-[(CMe$_2$)$_2$-NH]—, (Cp)-Ln-C$_3$(m-N$_2$)H$_2$-4-[(CMe$_2$)$_2$-NH]—, (HO)-Ln-C$_3$(m-N$_2$)H$_2$-4-[(CMe$_2$)$_2$-NH]—, (MeO)-Ln-C$_3$(m-N$_2$)H$_2$-4-[(CMe$_2$)$_2$-NH]—, (EtO)-Ln-C$_3$(m-N$_2$)H$_2$-4-[(CMe$_2$)$_2$-NH]—, ($^n$PrO)-Ln-C$_3$(m-N$_2$)H$_2$-4-[(CMe$_2$)$_2$-NH]—, ($^i$PrO)-Ln-C$_3$(m-N$_2$)H$_2$-4-[(CMe$_2$)$_2$-NH]—, ($^n$BuO)-Ln-C$_3$(m-N$_2$)H$_2$-4-[(CMe$_2$)$_2$-NH]—, ($^i$BuO)-Ln-C$_3$(m-N$_2$)H$_2$-4-[(CMe$_2$)$_2$-NH]—, ($^s$BuO)-Ln-C$_3$(m-N$_2$)H$_2$-4-[(CMe$_2$)$_2$-NH]—, ($^t$BuO)-Ln-C$_3$(m-N$_2$)H$_2$-4-[(CMe$_2$)$_2$-NH]—, (H$_2$N)-Ln-C$_3$(m-N$_2$)H$_2$-4-[(CMe$_2$)$_2$-NMe]-, (Me$_2$N)-Ln-C$_3$(m-N$_2$)H$_2$-4-[(CMe$_2$)$_2$-NMe]-, (Et$_2$N)-Ln-C$_3$(m-N$_2$)H$_2$-4-[(CMe$_2$)$_2$-NMe]-, ($^n$Pr$_2$N)-Ln-C$_3$(m-N$_2$)H$_2$-4-[(CMe$_2$)$_2$-NMe]-, ($^i$Pr$_2$N)-Ln-C$_3$(m-N$_2$)H$_2$-4-[(CMe$_2$)$_2$-NMe]-, ($^n$Bu$_2$N)-Ln-C$_3$(m-N$_2$)H$_2$-4-[(CMe$_2$)$_2$-NMe]-, ($^i$Bu$_2$N)-Ln-C$_3$(m-N$_2$)H$_2$-4-[(CMe$_2$)$_2$-NMe]-, ($^s$Bu$_2$N)-Ln-C$_3$(m-N$_2$)H$_2$-4-[(CMe$_2$)$_2$-NMe]-, ($^t$Bu$_2$N)-Ln-C$_3$(m-N$_2$)H$_2$-4-[(CMe$_2$)$_2$-NMe]-, (Cp)-Ln-C$_3$(m-N$_2$)H$_2$-4-[(CMe$_2$)$_2$-NMe]-, (HO)-Ln-C$_3$(m-N$_2$)H$_2$-4-[(CMe$_2$)$_2$-NMe]-, (MeO)-Ln-C$_3$(m-N$_2$)H$_2$-4-[(CMe$_2$)$_2$-NMe]-, (EtO)-Ln-C$_3$(m-N$_2$)H$_2$-4-[(CMe$_2$)$_2$-NMe]-, ($^n$PrO)-Ln-C$_3$(m-N$_2$)H$_2$-4-[(CMe$_2$)$_2$-NMe]-, ($^i$PrO)-Ln-C$_3$(m-N$_2$)H$_2$-4-[(CMe$_2$)$_2$-NMe]-, ($^n$BuO)-Ln-C$_3$(m-N$_2$)H$_2$-4-[(CMe$_2$)$_2$-NMe]-, ($^i$BuO)-Ln-C$_3$(m-N$_2$)H$_2$-4-[(CMe$_2$)$_2$-NMe]-, ($^s$BuO)-Ln-C$_3$(m-N$_2$)H$_2$-4-[(CMe$_2$)$_2$-NMe]-, ($^t$BuO)-Ln-C$_3$(m-N$_2$)H$_2$-4-[(CMe$_2$)$_2$-NMe]-, (H$_2$N)-Ln-C$_3$(m-N$_2$)H$_2$-4-[(CMe$_2$)$_2$-NEt]-, (Me$_2$N)-Ln-C$_3$(m-N$_2$)H$_2$-4-[(CMe$_2$)$_2$-NEt]-, (Et$_2$N)-Ln-C$_3$(m-N$_2$)H$_2$-4-[(CMe$_2$)$_2$-NEt]-, ($^n$Pr$_2$N)-Ln-C$_3$(m-N$_2$)H$_2$-4-[(CMe$_2$)$_2$-NEt]-, ($^i$Pr$_2$N)-Ln-C$_3$(m-N$_2$)H$_2$-4-[(CMe$_2$)$_2$-NEt]-, ($^n$Bu$_2$N)-Ln-C$_3$(m-N$_2$)H$_2$-4-[(CMe$_2$)$_2$-NEt]-, ($^i$Bu$_2$N)-Ln-C$_3$(m-N$_2$)H$_2$-4-[(CMe$_2$)$_2$-NEt]-, ($^s$Bu$_2$N)-Ln-C$_3$(m-N$_2$)H$_2$-4-[(CMe$_2$)$_2$-NEt]-, ($^t$Bu$_2$N)-Ln-C$_3$(m-N$_2$)H$_2$-4-[(CMe$_2$)$_2$-NEt]-, (Cp)-Ln-C$_3$(m-N$_2$)H$_2$-4-[(CMe$_2$)$_2$-NEt]-, (HO)-Ln-C$_3$(m-N$_2$)H$_2$-4-[(CMe$_2$)$_2$-NEt]-, (MeO)-Ln-C$_3$(m-N$_2$)H$_2$-4-[(CMe$_2$)$_2$-NEt]-, (EtO)-Ln-C$_3$(m-N$_2$)H$_2$-4-[(CMe$_2$)$_2$-NEt]-, ($^n$PrO)-Ln-C$_3$(m-N$_2$)H$_2$-4-[(CMe$_2$)$_2$-NEt]-, ($^i$PrO)-Ln-C$_3$(m-N$_2$)H$_2$-4-[(CMe$_2$)$_2$-NEt]-, ($^n$BuO)-Ln-C$_3$(m-N$_2$)H$_2$-4-[(CMe$_2$)$_2$-NEt]-, ($^i$BuO)-Ln-C$_3$(m-N$_2$)H$_2$-4-[(CMe$_2$)$_2$-NEt]-, ($^s$BuO)-Ln-C$_3$(m-N$_2$)H$_2$-4-[(CMe$_2$)$_2$-NEt]-, ($^t$BuO)-Ln-C$_3$(m-N$_2$)H$_2$-4-[(CMe$_2$)$_2$-NEt]-, (H$_2$N)-Ln-C$_3$(m-N$_2$)H$_2$-4-[(CMe$_2$)$_2$-N$^n$Pr]—, (Me$_2$N)-Ln-C$_3$(m-N$_2$)H$_2$-4-[(CMe$_2$)$_2$-N$^n$Pr]—, (Et$_2$N)-Ln-C$_3$(m-N$_2$)H$_2$-4-[(CMe$_2$)$_2$-N$^n$Pr]—, ($^n$Pr$_2$N)-Ln-C$_3$(m-N$_2$)H$_2$-4-[(CMe$_2$)$_2$-N$^n$Pr]—, ($^i$Pr$_2$N)-Ln-C$_3$(m-N$_2$)H$_2$-4-[(CMe$_2$)$_2$-N$^n$Pr]—, ($^n$Bu$_2$N)-Ln-C$_3$(m-N$_2$)H$_2$-4-[(CMe$_2$)$_2$-N$^n$Pr]—, ($^i$Bu$_2$N)-Ln-C$_3$(m-N$_2$)H$_2$-4-[(CMe$_2$)$_2$-N$^n$Pr]—, ($^s$Bu$_2$N)-Ln-C$_3$(m-N$_2$)H$_2$-4-[(CMe$_2$)$_2$-N$^n$Pr]—, ($^t$Bu$_2$N)-Ln-C$_3$(m-N$_2$)H$_2$-4-[(CMe$_2$)$_2$-N$^n$Pr]—, (Cp)-Ln-C$_3$(m-N$_2$)H$_2$-4-[(CMe$_2$)$_2$-N$^n$Pr]—, (HO)-Ln-C$_3$(m-N$_2$)H$_2$-4-[(CMe$_2$)$_2$-N$^n$Pr]—, (MeO)-Ln-C$_3$(m-N$_2$)H$_2$-4-[(CMe$_2$)$_2$-N$^n$Pr]—, (EtO)-Ln-C$_3$(m-N$_2$)H$_2$-4-[(CMe$_2$)$_2$-N$^n$Pr]—, ($^n$PrO)-Ln-C$_3$(m-N$_2$)H$_2$-4-[(CMe$_2$)$_2$-N$^n$Pr]—, ($^i$PrO)-Ln-C$_3$(m-N$_2$)H$_2$-4-[(CMe$_2$)$_2$-N$^n$Pr]—, ($^n$BuO)-Ln-C$_3$(m-N$_2$)H$_2$-4-[(CMe$_2$)$_2$-N$^n$Pr]—, ($^i$BuO)-Ln-C$_3$(m-N$_2$)H$_2$-4-[(CMe$_2$)$_2$-N$^n$Pr]—, ($^s$BuO)-Ln-C$_3$(m-N$_2$)H$_2$-4-[(CMe$_2$)$_2$-N$^n$Pr]—, ($^t$BuO)-Ln-C$_3$(m-N$_2$)H$_2$-4-[(CMe$_2$)$_2$-N$^n$Pr]—, (H$_2$N)-Ln-C$_3$(m-N$_2$)H$_2$-4-[(CMe$_2$)$_2$-N$^i$Pr]—, (Me$_2$N)-Ln-C$_3$(m-N$_2$)H$_2$-4-[(CMe$_2$)$_2$-N$^i$Pr]—, (Et$_2$N)-Ln-C$_3$(m-N$_2$)H$_2$-4-[(CMe$_2$)$_2$-N$^i$Pr]—, ($^n$Pr$_2$N)-Ln-C$_3$(m-N$_2$)H$_2$-4-[(CMe$_2$)$_2$-N$^i$Pr]—, ($^i$Pr$_2$N)-Ln-C$_3$(m-N$_2$)H$_2$-4-[(CMe$_2$)$_2$-N$^i$Pr]—, ($^n$Bu$_2$N)-Ln-C$_3$(m-N$_2$)H$_2$-4-[(CMe$_2$)$_2$-N$^i$Pr]—, ($^i$Bu$_2$N)-Ln-C$_3$(m-N$_2$)H$_2$-4-[(CMe$_2$)$_2$-N$^i$Pr]—, ($^s$Bu$_2$N)-Ln-C$_3$(m-N$_2$)H$_2$-4-[(CMe$_2$)$_2$-N$^i$Pr]—, ($^t$Bu$_2$N)-Ln-C$_3$(m-N$_2$)H$_2$-4-[(CMe$_2$)$_2$-N$^i$Pr]—, (Cp)-Ln-C$_3$(m-N$_2$)H$_2$-4-[(CMe$_2$)$_2$-N$^i$Pr]—, (HO)-Ln-C$_3$(m-N$_2$)H$_2$-4-[(CMe$_2$)$_2$-N$^i$Pr]—, (MeO)-Ln-C$_3$(m-N$_2$)H$_2$-4-[(CMe$_2$)$_2$-N$^i$Pr]—, (EtO)-Ln-C$_3$(m-N$_2$)H$_2$-4-[(CMe$_2$)$_2$-N$^i$Pr]—, ($^n$PrO)-Ln-C$_3$(m-N$_2$)H$_2$-4-[(CMe$_2$)$_2$-N$^i$Pr]—, ($^i$PrO)-Ln-C$_3$(m-N$_2$)H$_2$-4-[(CMe$_2$)$_2$-N$^i$Pr]—, ($^n$BuO)-Ln-C$_3$(m-N$_2$)H$_2$-4-[(CMe$_2$)$_2$-N$^i$Pr]—, ($^i$BuO)-Ln-C$_3$(m-N$_2$)H$_2$-4-[(CMe$_2$)$_2$-N$^i$Pr]—, ($^s$BuO)-Ln-C$_3$(m-N$_2$)H$_2$-4-[(CMe$_2$)$_2$-N$^i$Pr]—, ($^t$BuO)-Ln-C$_3$(m-N$_2$)H$_2$-4-[(CMe$_2$)$_2$-N$^i$Pr]—, (H$_2$N)-Ln-C$_3$(m-N$_2$)H$_2$-4-[(CMe$_2$)$_2$-N$^n$Bu]-, (Me$_2$N)-Ln-C$_3$(m-N$_2$)H$_2$-4-[(CMe$_2$)$_2$-N$^n$Bu]-, (Et$_2$N)-Ln-C$_3$(m-N$_2$)H$_2$-4-[(CMe$_2$)$_2$-N$^n$Bu]-, ($^n$Pr$_2$N)-Ln-C$_3$(m-N$_2$)H$_2$-4-[(CMe$_2$)$_2$-N$^n$Bu]-, ($^i$Pr$_2$N)-Ln-C$_3$(m-N$_2$)H$_2$-4-[(CMe$_2$)$_2$-N$^n$Bu]-, ($^n$Bu$_2$N)-Ln-C$_3$(m-N$_2$)H$_2$-4-[(CMe$_2$)$_2$-N$^n$Bu]-, ($^i$Bu$_2$N)-Ln-C$_3$(m-N$_2$)H$_2$-4-[(CMe$_2$)$_2$-N$^n$Bu]-, ($^s$Bu$_2$N)-Ln-C$_3$(m-N$_2$)H$_2$-4-[(CMe$_2$)$_2$-N$^n$Bu]-, ($^t$Bu$_2$N)-Ln-C$_3$(m-N$_2$)H$_2$-4-[(CMe$_2$)$_2$-N$^n$Bu]-, (Cp)-Ln-C$_3$(m-N$_2$)H$_2$-4-[(CMe$_2$)$_2$-N$^n$Bu]-, (HO)-Ln-C$_3$(m-N$_2$)H$_2$-4-[(CMe$_2$)$_2$-N$^n$Bu]-, (MeO)-Ln-C$_3$(m-N$_2$)H$_2$-4-[(CMe$_2$)$_2$-N$^n$Bu]-, (EtO)-Ln-C$_3$(m-N$_2$)H$_2$-4-[(CMe$_2$)$_2$-N$^n$Bu]-, ($^n$PrO)-Ln-C$_3$(m-N$_2$)H$_2$-4-[(CMe$_2$)$_2$-N$^n$Bu]-, ($^i$PrO)-Ln-C$_3$(m-N$_2$)H$_2$-4-[(CMe$_2$)$_2$-N$^n$Bu]-, ($^n$BuO)-Ln-C$_3$(m-N$_2$)H$_2$-4-[(CMe$_2$)$_2$-N$^n$Bu]-, ($^i$BuO)-Ln-C$_3$(m-N$_2$)H$_2$-4-[(CMe$_2$)$_2$-N$^n$Bu]-, ($^s$BuO)-Ln-C$_3$(m-N$_2$)H$_2$-

4-[(CMe$_2$)$_2$-N"Bu]-, ($^t$BuO)-Ln-C$_3$(m-N$_2$)H$_2$-4-[(CMe$_2$)$_2$-N"Bu]-, (H$_2$N)-Ln-C$_3$(m-N$_2$)H$_2$-4-[(CMe$_2$)$_2$-N"Bu]-, (Me$_2$N)-Ln-C$_3$(m-N$_2$)H$_2$-4-[(CMe$_2$)$_2$-N"Bu]-, (Et$_2$N)-Ln-C$_3$(m-N$_2$)H$_2$-4-[(CMe$_2$)$_2$-N"Bu]-, ("Pr$_2$N)-Ln-C$_3$(m-N$_2$)H$_2$-4-[(CMe$_2$)$_2$-N"Bu]-, ($^i$Pr$_2$N)-Ln-C$_3$(m-N$_2$)H$_2$-4-[(CMe$_2$)$_2$-N"Bu]-, ("Bu$_2$N)-Ln-C$_3$(m-N$_2$)H$_2$-4-[(CMe$_2$)$_2$-N"Bu]-, ($^i$Bu$_2$N)-Ln-C$_3$(m-N$_2$)H$_2$-4-[(CMe$_2$)$_2$-N"Bu]-, ($^s$Bu$_2$N)-Ln-C$_3$(m-N$_2$)H$_2$-4-[(CMe$_2$)$_2$-N"Bu]-, ($^t$Bu$_2$N)-Ln-C$_3$(m-N$_2$)H$_2$-4-[(CMe$_2$)$_2$-N"Bu]-, (Cp)-Ln-C$_3$(m-N$_2$)H$_2$-4-[(CMe$_2$)$_2$-N"Bu]-, (HO)-Ln-C$_3$(m-N$_2$)H$_2$-4-[(CMe$_2$)$_2$-N"Bu]-, (MeO)-Ln-C$_3$(m-N$_2$)H$_2$-4-[(CMe$_2$)$_2$-N"Bu]-, (EtO)-Ln-C$_3$(m-N$_2$)H$_2$-4-[(CMe$_2$)$_2$-N"Bu]-, ("PrO)-Ln-C$_3$(m-N$_2$)H$_2$-4-[(CMe$_2$)$_2$-N"Bu]-, ($^i$PrO)-Ln-C$_3$(m-N$_2$)H$_2$-4-[(CMe$_2$)$_2$-N"Bu]-, ("BuO)-Ln-C$_3$(m-N$_2$)H$_2$-4-[(CMe$_2$)$_2$-N"Bu]-, ($^i$BuO)-Ln-C$_3$(m-N$_2$)H$_2$-4-[(CMe$_2$)$_2$-N"Bu]-, ($^s$BuO)-Ln-C$_3$(m-N$_2$)H$_2$-4-[(CMe$_2$)$_2$-N"Bu]-, ($^t$BuO)-Ln-C$_3$(m-N$_2$)H$_2$-4-[(CMe$_2$)$_2$-N"Bu]-, (H$_2$N)-Ln-C$_3$(m-N$_2$)H$_2$-4-[(CMe$_2$)$_2$-N$^s$Bu]-, (Me$_2$N)-Ln-C$_3$(m-N$_2$)H$_2$-4-[(CMe$_2$)$_2$-N$^s$Bu]-, (Et$_2$N)-Ln-C$_3$(m-N$_2$)H$_2$-4-[(CMe$_2$)$_2$-N$^s$Bu]-, ("Pr$_2$N)-Ln-C$_3$(m-N$_2$)H$_2$-4-[(CMe$_2$)$_2$-N$^s$Bu]-, ($^i$Pr$_2$N)-Ln-C$_3$(m-N$_2$)H$_2$-4-[(CMe$_2$)$_2$-N$^s$Bu]-, ("Bu$_2$N)-Ln-C$_3$(m-N$_2$)H$_2$-4-[(CMe$_2$)$_2$-N$^s$Bu]-, ($^i$Bu$_2$N)-Ln-C$_3$(m-N$_2$)H$_2$-4-[(CMe$_2$)$_2$-N$^s$Bu]-, ($^s$Bu$_2$N)-Ln-C$_3$(m-N$_2$)H$_2$-4-[(CMe$_2$)$_2$-N$^s$Bu]-, ($^t$Bu$_2$N)-Ln-C$_3$(m-N$_2$)H$_2$-4-[(CMe$_2$)$_2$-N$^s$Bu]-, (Cp)-Ln-C$_3$(m-N$_2$)H$_2$-4-[(CMe$_2$)$_2$-N$^s$Bu]-, (HO)-Ln-C$_3$(m-N$_2$)H$_2$-4-[(CMe$_2$)$_2$-N$^s$Bu]-, (MeO)-Ln-C$_3$(m-N$_2$)H$_2$-4-[(CMe$_2$)$_2$-N$^s$Bu]-, (EtO)-Ln-C$_3$(m-N$_2$)H$_2$-4-[(CMe$_2$)$_2$-N$^s$Bu]-, ("PrO)-Ln-C$_3$(m-N$_2$)H$_2$-4-[(CMe$_2$)$_2$-N$^s$Bu]-, ($^i$PrO)-Ln-C$_3$(m-N$_2$)H$_2$-4-[(CMe$_2$)$_2$-N$^s$Bu]-, ("BuO)-Ln-C$_3$(m-N$_2$)H$_2$-4-[(CMe$_2$)$_2$-N$^s$Bu]-, ($^i$BuO)-Ln-C$_3$(m-N$_2$)H$_2$-4-[(CMe$_2$)$_2$-N$^s$Bu]-, ($^s$BuO)-Ln-C$_3$(m-N$_2$)H$_2$-4-[(CMe$_2$)$_2$-N$^s$Bu]-, ($^t$BuO)-Ln-C$_3$(m-N$_2$)H$_2$-4-[(CMe$_2$)$_2$-N$^s$Bu]-, (H$_2$N)-Ln-C$_3$(m-N$_2$)H$_2$-4-[(CMe$_2$)$_2$-N$^t$Bu]-, (Me$_2$N)-Ln-C$_3$(m-N$_2$)H$_2$-4-[(CMe$_2$)$_2$-N$^t$Bu]-, (Et$_2$N)-Ln-C$_3$(m-N$_2$)H$_2$-4-[(CMe$_2$)$_2$-N$^t$Bu]-, ("Pr$_2$N)-Ln-C$_3$(m-N$_2$)H$_2$-4-[(CMe$_2$)$_2$-N$^t$Bu]-, ($^i$Pr$_2$N)-Ln-C$_3$(m-N$_2$)H$_2$-4-[(CMe$_2$)$_2$-N$^t$Bu]-, ("Bu$_2$N)-Ln-C$_3$(m-N$_2$)H$_2$-4-[(CMe$_2$)$_2$-N$^t$Bu]-, ($^i$Bu$_2$N)-Ln-C$_3$(m-N$_2$)H$_2$-4-[(CMe$_2$)$_2$-N$^t$Bu]-, ($^s$Bu$_2$N)-Ln-C$_3$(m-N$_2$)H$_2$-4-[(CMe$_2$)$_2$-N$^t$Bu]-, ($^t$Bu$_2$N)-Ln-C$_3$(m-N$_2$)H$_2$-4-[(CMe$_2$)$_2$-N$^t$Bu]-, (Cp)-Ln-C$_3$(m-N$_2$)H$_2$-4-[(CMe$_2$)$_2$-N$^t$Bu]-, (HO)-Ln-C$_3$(m-N$_2$)H$_2$-4-[(CMe$_2$)$_2$-N$^t$Bu]-, (MeO)-Ln-C$_3$(m-N$_2$)H$_2$-4-[(CMe$_2$)$_2$-N$^t$Bu]-, (EtO)-Ln-C$_3$(m-N$_2$)H$_2$-4-[(CMe$_2$)$_2$-N$^t$Bu]-, ("PrO)-Ln-C$_3$(m-N$_2$)H$_2$-4-[(CMe$_2$)$_2$-N$^t$Bu]-, ($^i$PrO)-Ln-C$_3$(m-N$_2$)H$_2$-4-[(CMe$_2$)$_2$-N$^t$Bu]-, ("BuO)-Ln-C$_3$(m-N$_2$)H$_2$-4-[(CMe$_2$)$_2$-N$^t$Bu]-, ($^i$BuO)-Ln-C$_3$(m-N$_2$)H$_2$-4-[(CMe$_2$)$_2$-N$^t$Bu]-, ($^s$BuO)-Ln-C$_3$(m-N$_2$)H$_2$-4-[(CMe$_2$)$_2$-N$^t$Bu]-, ($^t$BuO)-Ln-C$_3$(m-N$_2$)H$_2$-4-[(CMe$_2$)$_2$-N$^t$Bu]-, (H$_2$N)-Ln-C$_3$(m-N$_2$)H$_2$-4-[(CMe$_2$)$_2$-O]—, (Me$_2$N)-Ln-C$_3$(m-N$_2$)H$_2$-4-[(CMe$_2$)$_2$-O]—, (Et$_2$N)-Ln-C$_3$(m-N$_2$)H$_2$-4-[(CMe$_2$)$_2$-O]—, ("Pr$_2$N)-Ln-C$_3$(m-N$_2$)H$_2$-4-[(CMe$_2$)$_2$-O]—, ($^i$Pr$_2$N)-Ln-C$_3$(m-N$_2$)H$_2$-4-[(CMe$_2$)$_2$-O]—, ("Bu$_2$N)-Ln-C$_3$(m-N$_2$)H$_2$-4-[(CMe$_2$)$_2$-O]—, ($^i$Bu$_2$N)-Ln-C$_3$(m-N$_2$)H$_2$-4-[(CMe$_2$)$_2$-O]—, ($^s$Bu$_2$N)-Ln-C$_3$(m-N$_2$)H$_2$-4-[(CMe$_2$)$_2$-O]—, ($^t$Bu$_2$N)-Ln-C$_3$(m-N$_2$)H$_2$-4-[(CMe$_2$)$_2$-O]—, (Cp)-Ln-C$_3$(m-N$_2$)H$_2$-4-[(CMe$_2$)$_2$-O]—, (HO)-Ln-C$_3$(m-N$_2$)H$_2$-4-[(CMe$_2$)$_2$-O]—, (MeO)-Ln-C$_3$(m-N$_2$)H$_2$-4-[(CMe$_2$)$_2$-O]—, (EtO)-Ln-C$_3$(m-N$_2$)H$_2$-4-[(CMe$_2$)$_2$-O]—, ("PrO)-Ln-C$_3$(m-N$_2$)H$_2$-4-[(CMe$_2$)$_2$-O]—, ($^i$PrO)-Ln-C$_3$(m-N$_2$)H$_2$-4-[(CMe$_2$)$_2$-O]—, ("BuO)-Ln-C$_3$(m-N$_2$)H$_2$-4-[(CMe$_2$)$_2$-O]—, ($^i$BuO)-Ln-C$_3$(m-N$_2$)H$_2$-4-[(CMe$_2$)$_2$-O]—, ($^s$BuO)-Ln-C$_3$(m-N$_2$)H$_2$-4-[(CMe$_2$)$_2$-O]—, ($^t$BuO)-Ln-C$_3$(m-N$_2$)H$_2$-4-[(CMe$_2$)$_2$-O]—, (H$_2$N)-Ln-C$_3$(m-N$_2$)H$_2$-4-[(CEt$_2$)$_2$-NH]—, (Me$_2$N)-Ln-C$_3$(m-N$_2$)H$_2$-4-[(CEt$_2$)$_2$-NH]—, (Et$_2$N)-Ln-C$_3$(m-N$_2$)H$_2$-4-[(CEt$_2$)$_2$-NH]—, ("Pr$_2$N)-Ln-C$_3$(m-N$_2$)H$_2$-4-[(CEt$_2$)$_2$-NH]—, ($^i$Pr$_2$N)-Ln-C$_3$(m-N$_2$)H$_2$-4-[(CEt$_2$)$_2$-NH]—, ("Bu$_2$N)-Ln-C$_3$(m-N$_2$)H$_2$-4-[(CEt$_2$)$_2$-NH]—, ($^i$Bu$_2$N)-Ln-C$_3$(m-N$_2$)H$_2$-4-[(CEt$_2$)$_2$-NH]—, ($^s$Bu$_2$N)-Ln-C$_3$(m-N$_2$)H$_2$-4-[(CEt$_2$)$_2$-NH]—, ($^t$Bu$_2$N)-Ln-C$_3$(m-N$_2$)H$_2$-4-[(CEt$_2$)$_2$-NH]—, (Cp)-Ln-C$_3$(m-N$_2$)H$_2$-4-[(CEt$_2$)$_2$-NH]—, (HO)-Ln-C$_3$(m-N$_2$)H$_2$-4-[(CEt$_2$)$_2$-NH]—, (MeO)-Ln-C$_3$(m-N$_2$)H$_2$-4-[(CEt$_2$)$_2$-NH]—, (EtO)-Ln-C$_3$(m-N$_2$)H$_2$-4-[(CEt$_2$)$_2$-NH]—, ("PrO)-Ln-C$_3$(m-N$_2$)H$_2$-4-[(CEt$_2$)$_2$-NH]—, ($^i$PrO)-Ln-C$_3$(m-N$_2$)H$_2$-4-[(CEt$_2$)$_2$-NH]—, ("BuO)-Ln-C$_3$(m-N$_2$)H$_2$-4-[(CEt$_2$)$_2$-NH]—, ($^i$BuO)-Ln-C$_3$(m-N$_2$)H$_2$-4-[(CEt$_2$)$_2$-NH]—, ($^s$BuO)-Ln-C$_3$(m-N$_2$)H$_2$-4-[(CEt$_2$)$_2$-NH]—, ($^t$BuO)-Ln-C$_3$(m-N$_2$)H$_2$-4-[(CEt$_2$)$_2$-NH]—, (H$_2$N)-Ln-C$_3$(m-N$_2$)H$_2$-4-[(CEt$_2$)$_2$-NMe]-, (Me$_2$N)-Ln-C$_3$(m-N$_2$)H$_2$-4-[(CEt$_2$)$_2$-NMe]-, (Et$_2$N)-Ln-C$_3$(m-N$_2$)H$_2$-4-[(CEt$_2$)$_2$-NMe]-, ("Pr$_2$N)-Ln-C$_3$(m-N$_2$)H$_2$-4-[(CEt$_2$)$_2$-NMe]-, ($^i$Pr$_2$N)-Ln-C$_3$(m-N$_2$)H$_2$-4-[(CEt$_2$)$_2$-NMe]-, ("Bu$_2$N)-Ln-C$_3$(m-N$_2$)H$_2$-4-[(CEt$_2$)$_2$-NMe]-, ($^i$Bu$_2$N)-Ln-C$_3$(m-N$_2$)H$_2$-4-[(CEt$_2$)$_2$-NMe]-, ($^s$Bu$_2$N)-Ln-C$_3$(m-N$_2$)H$_2$-4-[(CEt$_2$)$_2$-NMe]-, ($^t$Bu$_2$N)-Ln-C$_3$(m-N$_2$)H$_2$-4-[(CEt$_2$)$_2$-NMe]-, (Cp)-Ln-C$_3$(m-N$_2$)H$_2$-4-[(CEt$_2$)$_2$-NMe]-, (HO)-Ln-C$_3$(m-N$_2$)H$_2$-4-[(CEt$_2$)$_2$-NMe]-, (MeO)-Ln-C$_3$(m-N$_2$)H$_2$-4-[(CEt$_2$)$_2$-NMe]-, (EtO)-Ln-C$_3$(m-N$_2$)H$_2$-4-[(CEt$_2$)$_2$-NMe]-, ("PrO)-Ln-C$_3$(m-N$_2$)H$_2$-4-[(CEt$_2$)$_2$-NMe]-, ($^i$PrO)-Ln-C$_3$(m-N$_2$)H$_2$-4-[(CEt$_2$)$_2$-NMe]-, ("BuO)-Ln-C$_3$(m-N$_2$)H$_2$-4-[(CEt$_2$)$_2$-NMe]-, ($^i$BuO)-Ln-C$_3$(m-N$_2$)H$_2$-4-[(CEt$_2$)$_2$-NMe]-, ($^s$BuO)-Ln-C$_3$(m-N$_2$)H$_2$-4-[(CEt$_2$)$_2$-NMe]-, ($^t$BuO)-Ln-C$_3$(m-N$_2$)H$_2$-4-[(CEt$_2$)$_2$-NMe]-, (H$_2$N)-Ln-C$_3$(m-N$_2$)H$_2$-4-[(CEt$_2$)$_2$-NEt]-, (Me$_2$N)-Ln-C$_3$(m-N$_2$)H$_2$-4-[(CEt$_2$)$_2$-NEt]-, (Et$_2$N)-Ln-C$_3$(m-N$_2$)H$_2$-4-[(CEt$_2$)$_2$-NEt]-, ("Pr$_2$N)-Ln-C$_3$(m-N$_2$)H$_2$-4-[(CEt$_2$)$_2$-NEt]-, ($^i$Pr$_2$N)-Ln-C$_3$(m-N$_2$)H$_2$-4-[(CEt$_2$)$_2$-NEt]-, ("Bu$_2$N)-Ln-C$_3$(m-N$_2$)H$_2$-4-[(CEt$_2$)$_2$-NEt]-, ($^i$Bu$_2$N)-Ln-C$_3$(m-N$_2$)H$_2$-4-[(CEt$_2$)$_2$-NEt]-, ($^s$Bu$_2$N)-Ln-C$_3$(m-N$_2$)H$_2$-4-[(CEt$_2$)$_2$-NEt]-, ($^t$Bu$_2$N)-Ln-C$_3$(m-N$_2$)H$_2$-4-[(CEt$_2$)$_2$-NEt]-, (Cp)-Ln-C$_3$(m-N$_2$)H$_2$-4-[(CEt$_2$)$_2$-NEt]-, (HO)-Ln-C$_3$(m-N$_2$)H$_2$-4-[(CEt$_2$)$_2$-NEt]-, (MeO)-Ln-C$_3$(m-N$_2$)H$_2$-4-[(CEt$_2$)$_2$-NEt]-, (EtO)-Ln-C$_3$(m-N$_2$)H$_2$-4-[(CEt$_2$)$_2$-NEt]-, ("PrO)-Ln-C$_3$(m-N$_2$)H$_2$-4-[(CEt$_2$)$_2$-NEt]-, ($^i$PrO)-Ln-C$_3$(m-N$_2$)H$_2$-4-[(CEt$_2$)$_2$-NEt]-, ("BuO)-Ln-C$_3$(m-N$_2$)H$_2$-4-[(CEt$_2$)$_2$-NEt]-, ($^i$BuO)-Ln-C$_3$(m-N$_2$)H$_2$-4-[(CEt$_2$)$_2$-NEt]-, ($^s$BuO)-Ln-C$_3$(m-N$_2$)H$_2$-4-[(CEt$_2$)$_2$-NEt]-, ($^t$BuO)-Ln-C$_3$(m-N$_2$)H$_2$-4-[(CEt$_2$)$_2$-NEt]-, (H$_2$N)-Ln-C$_3$(m-N$_2$)H$_2$-4-[(CEt$_2$)$_2$-N"Pr]—, (Me$_2$N)-Ln-C$_3$(m-N$_2$)H$_2$-4-[(CEt$_2$)$_2$-N"Pr]—, (Et$_2$N)-Ln-C$_3$(m-N$_2$)H$_2$-4-[(CEt$_2$)$_2$-N"Pr]—, ("Pr$_2$N)-Ln-C$_3$(m-N$_2$)H$_2$-4-[(CEt$_2$)$_2$-N"Pr]—, ($^i$Pr$_2$N)-Ln-C$_3$(m-N$_2$)H$_2$-4-[(CEt$_2$)$_2$-N"Pr]—, ("Bu$_2$N)-Ln-C$_3$(m-N$_2$)H$_2$-4-[(CEt$_2$)$_2$-N"Pr]—, ($^i$Bu$_2$N)-Ln-C$_3$(m-N$_2$)H$_2$-4-[(CEt$_2$)$_2$-N"Pr]—, ($^s$Bu$_2$N)-Ln-C$_3$(m-N$_2$)H$_2$-4-[(CEt$_2$)$_2$-N"Pr]—, ($^t$Bu$_2$N)-Ln-C$_3$(m-N$_2$)H$_2$-4-[(CEt$_2$)$_2$-N"Pr]—, (Cp)-Ln-C$_3$(m-N$_2$)H$_2$-4-[(CEt$_2$)$_2$-N"Pr]—, (HO)-Ln-C$_3$(m-N$_2$)H$_2$-4-[(CEt$_2$)$_2$-N"Pr]—, (MeO)-Ln-C$_3$(m-N$_2$)H$_2$-4-[(CEt$_2$)$_2$-N"Pr]—, (EtO)-Ln-C$_3$(m-N$_2$)H$_2$-4-[(CEt$_2$)$_2$-N"Pr]—, ("PrO)-Ln-C$_3$(m-N$_2$)H$_2$-4-[(CEt$_2$)$_2$-N"Pr]—, ($^i$PrO)-Ln-C$_3$(m-N$_2$)H$_2$-4-[(CEt$_2$)$_2$-N"Pr]—, ("BuO)-Ln-C$_3$(m-N$_2$)H$_2$-4-[(CEt$_2$)$_2$-N"Pr]—, ($^i$BuO)-Ln-C$_3$(m-N$_2$)H$_2$-4-[(CEt$_2$)$_2$-N"Pr]—, ($^s$BuO)-Ln-C$_3$(m-N$_2$)H$_2$-4-[(CEt$_2$)$_2$-N"Pr]—, ($^t$BuO)-Ln-C$_3$(m-N$_2$)H$_2$-4-[(CEt$_2$)$_2$-N"Pr]—, (H$_2$N)-Ln-C$_3$(m-N$_2$)H$_2$-4-[(CEt$_2$)$_2$-N$^i$Pr]—, (Me$_2$N)-Ln-C$_3$(m-N$_2$)H$_2$-4-[(CEt$_2$)$_2$-N$^i$Pr]—, (Et$_2$N)-Ln-C$_3$(m-N$_2$)H$_2$-4-[(CEt$_2$)$_2$-N$^i$Pr]—, ("Pr$_2$N)-Ln-C$_3$(m-N$_2$)H$_2$-4-[(CEt$_2$)$_2$-N$^i$Pr]—, ($^i$Pr$_2$N)-Ln-C$_3$(m-N$_2$)H$_2$-4-[(CEt$_2$)$_2$-N$^i$Pr]—, ("Bu$_2$N)-Ln-C$_3$(m-N$_2$)H$_2$-4-[(CEt$_2$)$_2$-N$^i$Pr]—, ($^i$Bu$_2$N)-Ln-C$_3$(m-N$_2$)H$_2$-4-[(CEt$_2$)$_2$-N$^i$Pr]—, ($^s$Bu$_2$N)-Ln-C$_3$(m-N$_2$)H$_2$-4-[(CEt$_2$)$_2$-N$^i$Pr]—, ($^t$Bu$_2$N)-Ln-C$_3$(m-N$_2$)H$_2$-4-[(CEt$_2$)$_2$-N$^i$Pr]—, (Cp)-Ln-C$_3$(m-N$_2$)H$_2$-4-[(CEt$_2$)$_2$-N$^i$Pr]—, (HO)-Ln-C$_3$(m-N$_2$)H$_2$-4-[(CEt$_2$)$_2$-N$^i$Pr]—, (MeO)-Ln-C$_3$(m-N$_2$)H$_2$-4-[(CEt$_2$)$_2$-N$^i$Pr]—, (EtO)-Ln-C$_3$(m-N$_2$)H$_2$-4-[(CEt$_2$)$_2$-N$^i$Pr]—, ("PrO)-Ln-C$_3$(m-N$_2$)H$_2$-4-[(CEt$_2$)$_2$-N$^i$Pr]—, ($^i$PrO)-Ln-C$_3$(m-N$_2$)H$_2$-4-[(CEt$_2$)$_2$-N$^i$Pr]—, ("BuO)-Ln-C$_3$(m-N$_2$)H$_2$-4-[(CEt$_2$)$_2$-N$^i$Pr]—, ($^t$BuO)-Ln-C$_3$(m-N$_2$)H$_2$-4-[(CEt$_2$)$_2$-N$^i$Pr]—, ($^s$BuO)-Ln-C$_3$(m-N$_2$)H$_2$-4-[(CEt$_2$)$_2$-N$^i$Pr]—, ($^t$BuO)-Ln-C$_3$(m-N$_2$)H$_2$-4-[(CEt$_2$)$_2$-N$^i$Pr]—, (H$_2$N)-Ln-C$_3$(m-N$_2$)H$_2$- 4-[(CEt$_2$)$_2$-N″Bu]-, (Me$_2$N)-Ln-C$_3$(m-N$_2$)H$_2$-4-[(CEt$_2$)$_2$-N″Bu]-, (Et$_2$N)-Ln-C$_3$(m-N$_2$)H$_2$-4-[(CEt$_2$)$_2$-N″Bu]-, (″Pr$_2$N)-Ln-C$_3$(m-N$_2$)H$_2$-4-[(CEt$_2$)$_2$-N″Bu]-, ($^i$Pr$_2$N)-Ln-C$_3$(m-N$_2$)H$_2$-4-[(CEt$_2$)$_2$-N″Bu]-, (″Bu$_2$N)-Ln-C$_3$(m-N$_2$)H$_2$-4-[(CEt$_2$)$_2$-N″Bu]-, ($^i$Bu$_2$N)-Ln-C$_3$(m-N$_2$)H$_2$-4-[(CEt$_2$)$_2$-N″Bu]-, ($^s$Bu$_2$N)-Ln-C$_3$(m-N$_2$)H$_2$-4-[(CEt$_2$)$_2$-N″Bu]-, ($^t$Bu$_2$N)-Ln-C$_3$(m-N$_2$)H$_2$-4-[(CEt$_2$)$_2$-N″Bu]-, (Cp)-Ln-C$_3$(m-N$_2$)H$_2$-4-[(CEt$_2$)$_2$-N″Bu]-, (HO)-Ln-C$_3$(m-N$_2$)H$_2$-4-[(CEt$_2$)$_2$-N″Bu]-, (MeO)-Ln-C$_3$(m-N$_2$)H$_2$-4-[(CEt$_2$)$_2$-N″Bu]-, (EtO)-Ln-C$_3$(m-N$_2$)H$_2$-4-[(CEt$_2$)$_2$-N″Bu]-, (″PrO)-Ln-C$_3$(m-N$_2$)H$_2$-4-[(CEt$_2$)$_2$-N″Bu]-, ($^i$PrO)-Ln-C$_3$(m-N$_2$)H$_2$-4-[(CEt$_2$)$_2$-N″Bu]-, (″BuO)-Ln-C$_3$(m-N$_2$)H$_2$-4-[(CEt$_2$)$_2$-N″Bu]-, ($^t$BuO)-Ln-C$_3$(m-N$_2$)H$_2$-4-[(CEt$_2$)$_2$-N″Bu]-, ($^s$BuO)-Ln-C$_3$(m-N$_2$)H$_2$-4-[(CEt$_2$)$_2$-N″Bu]-, ($^t$BuO)-Ln-C$_3$(m-N$_2$)H$_2$-4-[(CEt$_2$)$_2$-N″Bu]-, (H$_2$N)-Ln-C$_3$(m-N$_2$)H$_2$-4-[(CEt$_2$)$_2$-N$^i$Bu]-, (Me$_2$N)-Ln-C$_3$(m-N$_2$)H$_2$-4-[(CEt$_2$)$_2$-N$^i$Bu]-, (Et$_2$N)-Ln-C$_3$(m-N$_2$)H$_2$-4-[(CEt$_2$)$_2$-N$^i$Bu]-, (″Pr$_2$N)-Ln-C$_3$(m-N$_2$)H$_2$-4-[(CEt$_2$)$_2$-N$^i$Bu]-, ($^i$Pr$_2$N)-Ln-C$_3$(m-N$_2$)H$_2$-4-[(CEt$_2$)$_2$-N$^i$Bu]-, (″Bu$_2$N)-Ln-C$_3$(m-N$_2$)H$_2$-4-[(CEt$_2$)$_2$-N$^i$Bu]-, ($^i$Bu$_2$N)-Ln-C$_3$(m-N$_2$)H$_2$-4-[(CEt$_2$)$_2$-N$^i$Bu]-, ($^s$Bu$_2$N)-Ln-C$_3$(m-N$_2$)H$_2$-4-[(CEt$_2$)$_2$-N$^i$Bu]-, ($^t$Bu$_2$N)-Ln-C$_3$(m-N$_2$)H$_2$-4-[(CEt$_2$)$_2$-N$^i$Bu]-, (Cp)-Ln-C$_3$(m-N$_2$)H$_2$-4-[(CEt$_2$)$_2$-N$^i$Bu]-, (HO)-Ln-C$_3$(m-N$_2$)H$_2$-4-[(CEt$_2$)$_2$-N$^i$Bu]-, (MeO)-Ln-C$_3$(m-N$_2$)H$_2$-4-[(CEt$_2$)$_2$-N$^i$Bu]-, (EtO)-Ln-C$_3$(m-N$_2$)H$_2$-4-[(CEt$_2$)$_2$-N$^i$Bu]-, (″PrO)-Ln-C$_3$(m-N$_2$)H$_2$-4-[(CEt$_2$)$_2$-N$^i$Bu]-, ($^i$PrO)-Ln-C$_3$(m-N$_2$)H$_2$-4-[(CEt$_2$)$_2$-N$^i$Bu]-, (″BuO)-Ln-C$_3$(m-N$_2$)H$_2$-4-[(CEt$_2$)$_2$-N$^i$Bu]-, ($^t$BuO)-Ln-C$_3$(m-N$_2$)H$_2$-4-[(CEt$_2$)$_2$-N$^i$Bu]-, ($^s$BuO)-Ln-C$_3$(m-N$_2$)H$_2$-4-[(CEt$_2$)$_2$-N$^i$Bu]-, ($^t$BuO)-Ln-C$_3$(m-N$_2$)H$_2$-4-[(CEt$_2$)$_2$-N$^i$Bu]-, (H$_2$N)-Ln-C$_3$(m-N$_2$)H$_2$-4-[(CEt$_2$)$_2$-N$^s$Bu]-, (Me$_2$N)-Ln-C$_3$(m-N$_2$)H$_2$-4-[(CEt$_2$)$_2$-N$^s$Bu]-, (Et$_2$N)-Ln-C$_3$(m-N$_2$)H$_2$-4-[(CEt$_2$)$_2$-N$^s$Bu]-, (″Pr$_2$N)-Ln-C$_3$(m-N$_2$)H$_2$-4-[(CEt$_2$)$_2$-N$^s$Bu]-, ($^i$Pr$_2$N)-Ln-C$_3$(m-N$_2$)H$_2$-4-[(CEt$_2$)$_2$-N$^s$Bu]-, (″Bu$_2$N)-Ln-C$_3$(m-N$_2$)H$_2$-4-[(CEt$_2$)$_2$-N$^s$Bu]-, ($^i$Bu$_2$N)-Ln-C$_3$(m-N$_2$)H$_2$-4-[(CEt$_2$)$_2$-N$^s$Bu]-, ($^s$Bu$_2$N)-Ln-C$_3$(m-N$_2$)H$_2$-4-[(CEt$_2$)$_2$-N$^s$Bu]-, ($^t$Bu$_2$N)-Ln-C$_3$(m-N$_2$)H$_2$-4-[(CEt$_2$)$_2$-N$^s$Bu]-, (Cp)-Ln-C$_3$(m-N$_2$)H$_2$-4-[(CEt$_2$)$_2$-N$^s$Bu]-, (HO)-Ln-C$_3$(m-N$_2$)H$_2$-4-[(CEt$_2$)$_2$-N$^s$Bu]-, (MeO)-Ln-C$_3$(m-N$_2$)H$_2$-4-[(CEt$_2$)$_2$-N$^s$Bu]-, (EtO)-Ln-C$_3$(m-N$_2$)H$_2$-4-[(CEt$_2$)$_2$-N$^s$Bu]-, (″PrO)-Ln-C$_3$(m-N$_2$)H$_2$-4-[(CEt$_2$)$_2$-N$^s$Bu]-, ($^i$PrO)-Ln-C$_3$(m-N$_2$)H$_2$-4-[(CEt$_2$)$_2$-N$^s$Bu]-, (″BuO)-Ln-C$_3$(m-N$_2$)H$_2$-4-[(CEt$_2$)$_2$-N$^s$Bu]-, ($^t$BuO)-Ln-C$_3$(m-N$_2$)H$_2$-4-[(CEt$_2$)$_2$-N$^s$Bu]-, ($^s$BuO)-Ln-C$_3$(m-N$_2$)H$_2$-4-[(CEt$_2$)$_2$-N$^s$Bu]-, ($^t$BuO)-Ln-C$_3$(m-N$_2$)H$_2$-4-[(CEt$_2$)$_2$-N$^s$Bu]-, (H$_2$N)-Ln-C$_3$(m-N$_2$)H$_2$-4-[(CEt$_2$)$_2$-N$^t$Bu]-, (Me$_2$N)-Ln-C$_3$(m-N$_2$)H$_2$-4-[(CEt$_2$)$_2$-N$^t$Bu]-, (Et$_2$N)-Ln-C$_3$(m-N$_2$)H$_2$-4-[(CEt$_2$)$_2$-N$^t$Bu]-, (″Pr$_2$N)-Ln-C$_3$(m-N$_2$)H$_2$-4-[(CEt$_2$)$_2$-N$^t$Bu]-, ($^i$Pr$_2$N)-Ln-C$_3$(m-N$_2$)H$_2$-4-[(CEt$_2$)$_2$-N$^t$Bu]-, (″Bu$_2$N)-Ln-C$_3$(m-N$_2$)H$_2$-4-[(CEt$_2$)$_2$-N$^t$Bu]-, ($^i$Bu$_2$N)-Ln-C$_3$(m-N$_2$)H$_2$-4-[(CEt$_2$)$_2$-N$^t$Bu]-, ($^s$Bu$_2$N)-Ln-C$_3$(m-N$_2$)H$_2$-4-[(CEt$_2$)$_2$-N$^t$Bu]-, ($^t$Bu$_2$N)-Ln-C$_3$(m-N$_2$)H$_2$-4-[(CEt$_2$)$_2$-N$^t$Bu]-, (Cp)-Ln-C$_3$(m-N$_2$)H$_2$-4-[(CEt$_2$)$_2$-N$^t$Bu]-, (HO)-Ln-C$_3$(m-N$_2$)H$_2$-4-[(CEt$_2$)$_2$-N$^t$Bu]-, (MeO)-Ln-C$_3$(m-N$_2$)H$_2$-4-[(CEt$_2$)$_2$-N$^t$Bu]-, (EtO)-Ln-C$_3$(m-N$_2$)H$_2$-4-[(CEt$_2$)$_2$-N$^t$Bu]-, (″PrO)-Ln-C$_3$(m-N$_2$)H$_2$-4-[(CEt$_2$)$_2$-N$^t$Bu]-, ($^i$PrO)-Ln-C$_3$(m-N$_2$)H$_2$-4-[(CEt$_2$)$_2$-N$^t$Bu]-, (″BuO)-Ln-C$_3$(m-N$_2$)H$_2$-4-[(CEt$_2$)$_2$-N$^t$Bu]-, ($^t$BuO)-Ln-C$_3$(m-N$_2$)H$_2$-4-[(CEt$_2$)$_2$-N$^t$Bu]-, ($^s$BuO)-Ln-C$_3$(m-N$_2$)H$_2$-4-[(CEt$_2$)$_2$-N$^t$Bu]-, ($^t$BuO)-Ln-C$_3$(m-N$_2$)H$_2$-4-[(CEt$_2$)$_2$-N$^t$Bu]-, (H$_2$N)-Ln-C$_3$(m-N$_2$)H$_2$-4-[(CEt$_2$)$_2$-O]—, (Me$_2$N)-Ln-C$_3$(m-N$_2$)H$_2$-4-[(CEt$_2$)$_2$-O]—, (Et$_2$N)-Ln-C$_3$(m-N$_2$)H$_2$-4-[(CEt$_2$)$_2$-O]—, (″Pr$_2$N)-Ln-C$_3$(m-N$_2$)H$_2$-4-[(CEt$_2$)$_2$-O]—, ($^i$Pr$_2$N)-Ln-C$_3$(m-N$_2$)H$_2$-4-[(CEt$_2$)$_2$-O]—, (″Bu$_2$N)-Ln-C$_3$(m-N$_2$)H$_2$-4-[(CEt$_2$)$_2$-O]—, ($^i$Bu$_2$N)-Ln-C$_3$(m-N$_2$)H$_2$-4-[(CEt$_2$)$_2$-O]—, ($^s$Bu$_2$N)-Ln-C$_3$(m-N$_2$)H$_2$-4-[(CEt$_2$)$_2$-O]—, ($^t$Bu$_2$N)-Ln-C$_3$(m-N$_2$)H$_2$-4-[(CEt$_2$)$_2$-O]—, (Cp)-Ln-C$_3$(m-N$_2$)H$_2$-4-[(CEt$_2$)$_2$-O]—, (HO)-Ln-C$_3$(m-N$_2$)H$_2$-4-[(CEt$_2$)$_2$-O]—, (MeO)-Ln-C$_3$(m-N$_2$)H$_2$-4-[(CEt$_2$)$_2$-O]—, (EtO)-Ln-C$_3$(m-N$_2$)H$_2$-4-[(CEt$_2$)$_2$-O]—, (″PrO)-Ln-C$_3$(m-N$_2$)H$_2$-4-[(CEt$_2$)$_2$-O]—, ($^i$PrO)-Ln-C$_3$(m-N$_2$)H$_2$-4-[(CEt$_2$)$_2$-O]—, (″BuO)-Ln-C$_3$(m-N$_2$)H$_2$-4-[(CEt$_2$)$_2$-O]—, ($^t$BuO)-Ln-C$_3$(m-N$_2$)H$_2$-4-[(CEt$_2$)$_2$-O]—, ($^s$BuO)-Ln-C$_3$(m-N$_2$)H$_2$-4-[(CEt$_2$)$_2$-O]—, ($^t$BuO)-Ln-C$_3$(m-N$_2$)H$_2$-4-[(CEt$_2$)$_2$-O]—, (H$_2$N)-Ln-C$_3$(m-N$_2$)H$_2$-4-[(C$^i$Pr$_2$)$_2$—NH]—, (Me$_2$N)-Ln-C$_3$(m-N$_2$)H$_2$-4-[(C$^i$Pr$_2$)$_2$—NH]—, (Et$_2$N)-Ln-C$_3$(m-N$_2$)H$_2$-4-[(C$^i$Pr$_2$)$_2$—NH]—, (″Pr$_2$N)-Ln-C$_3$(m-N$_2$)H$_2$-4-[(C$^i$Pr$_2$)$_2$—NH]—, ($^i$Pr$_2$N)-Ln-C$_3$(m-N$_2$)H$_2$-4-[(C$^i$Pr$_2$)$_2$—NH]—, (″Bu$_2$N)-Ln-C$_3$(m-N$_2$)H$_2$-4-[(C$^i$Pr$_2$)$_2$—NH]—, ($^i$Bu$_2$N)-Ln-C$_3$(m-N$_2$)H$_2$-4-[(C$^i$Pr$_2$)$_2$—NH]—, ($^s$Bu$_2$N)-Ln-C$_3$(m-N$_2$)H$_2$-4-[(C$^i$Pr$_2$)$_2$—NH]—, ($^t$Bu$_2$N)-Ln-C$_3$(m-N$_2$)H$_2$-4-[(C$^i$Pr$_2$)$_2$—NH]—, (Cp)-Ln-C$_3$(m-N$_2$)H$_2$-4-[(C$^i$Pr$_2$)$_2$—NH]—, (HO)-Ln-C$_3$(m-N$_2$)H$_2$-4-[(C$^i$Pr$_2$)$_2$—NH]—, (MeO)-Ln-C$_3$(m-N$_2$)H$_2$-4-[(C$^i$Pr$_2$)$_2$—NH]—, (EtO)-Ln-C$_3$(m-N$_2$)H$_2$-4-[(C$^i$Pr$_2$)$_2$—NH]—, (″PrO)-Ln-C$_3$(m-N$_2$)H$_2$-4-[(C$^i$Pr$_2$)$_2$—NH]—, ($^i$PrO)-Ln-C$_3$(m-N$_2$)H$_2$-4-[(C$^i$Pr$_2$)$_2$—NH]—, (″BuO)-Ln-C$_3$(m-N$_2$)H$_2$-4-[(C$^i$Pr$_2$)$_2$—NH]—, ($^t$BuO)-Ln-C$_3$(m-N$_2$)H$_2$-4-[(C$^i$Pr$_2$)$_2$—NH]—, ($^s$BuO)-Ln-C$_3$(m-N$_2$)H$_2$-4-[(C$^i$Pr$_2$)$_2$—NH]—, ($^t$BuO)-Ln-C$_3$(m-N$_2$)H$_2$-4-[(C$^i$Pr$_2$)$_2$—NH]—, (H$_2$N)-Ln-C$_3$(m-N$_2$)H$_2$-4-[(C$^i$Pr$_2$)$_2$—NMe]-, (Me$_2$N)-Ln-C$_3$(m-N$_2$)H$_2$-4-[(C$^i$Pr$_2$)$_2$—NMe]-, (Et$_2$N)-Ln-C$_3$(m-N$_2$)H$_2$-4-[(C$^i$Pr$_2$)$_2$—NMe]-, (″Pr$_2$N)-Ln-C$_3$(m-N$_2$)H$_2$-4-[(C$^i$Pr$_2$)$_2$—NMe]-, ($^i$Pr$_2$N)-Ln-C$_3$(m- N$_2$)H$_2$-4-[(C$^i$Pr$_2$)$_2$—NMe]-, (″Bu$_2$N)-Ln-C$_3$(m-N$_2$)H$_2$-4-[(C$^i$Pr$_2$)$_2$—NMe]-, ($^i$Bu$_2$N)-Ln-C$_3$(m-N$_2$)H$_2$-4-[(C$^i$Pr$_2$)$_2$—NMe]-, ($^s$Bu$_2$N)-Ln-C$_3$(m-N$_2$)H$_2$-4-[(C$^i$Pr$_2$)$_2$—NMe]-, ($^t$Bu$_2$N)-Ln-C$_3$(m- N$_2$)H$_2$-4-[(C$^i$Pr$_2$)$_2$—NMe]-, (Cp)-Ln-C$_3$(m-N$_2$)H$_2$-4-[(C$^i$Pr$_2$)$_2$—NMe]-, (HO)-Ln-C$_3$(m-N$_2$)H$_2$-4-[(C$^i$Pr$_2$)$_2$—NMe]-, (MeO)-Ln-C$_3$(m-N$_2$)H$_2$-4-[(C$^i$Pr$_2$)$_2$—NMe]-, (EtO)-Ln-C$_3$(m-N$_2$)H$_2$-4-[(C$^i$Pr$_2$)$_2$—NMe]-, (″PrO)-Ln-C$_3$(m-N$_2$)H$_2$-4-[(C$^i$Pr$_2$)$_2$—NMe]-, ($^i$PrO)-Ln-C$_3$(m-N$_2$)H$_2$-4-[(C$^i$Pr$_2$)$_2$—NMe]-, (″BuO)-Ln-C$_3$(m-N$_2$)H$_2$-4-[(C$^i$Pr$_2$)$_2$—NMe]-, ($^t$BuO)-Ln-C$_3$(m-N$_2$)H$_2$-4-[(C$^i$Pr$_2$)$_2$—NMe]-, ($^s$BuO)-Ln-C$_3$(m-N$_2$)H$_2$-4-[(C$^i$Pr$_2$)$_2$—NMe]-, ($^t$BuO)-Ln-C$_3$(m-N$_2$)H$_2$-4-[(C$^i$Pr$_2$)$_2$—NMe]-, (H$_2$N)-Ln-C$_3$(m-N$_2$)H$_2$-4-[(C$^i$Pr$_2$)$_2$—NEt]-, (Me$_2$N)-Ln-C$_3$(m-N$_2$)H$_2$- 4-[(C$^i$Pr$_2$)$_2$—NEt]-, (Et$_2$N)-Ln-C$_3$(m-N$_2$)H$_2$-4-[(C$^i$Pr$_2$)$_2$—NEt]-, (″Pr$_2$N)-Ln-C$_3$(m-N$_2$)H$_2$-4-[(C$^i$Pr$_2$)$_2$—NEt]-, ($^i$Pr$_2$N)-Ln-C$_3$(m-N$_2$)H$_2$-4-[(C$^i$Pr$_2$)$_2$—NEt]-, (″Bu$_2$N)-Ln-C$_3$(m- N$_2$)H$_2$-4-[(C$^i$Pr$_2$)$_2$—NEt]-, ($^i$Bu$_2$N)-Ln-C$_3$(m-N$_2$)H$_2$-4-[(C$^i$Pr$_2$)$_2$—NEt]-, ($^s$Bu$_2$N)-Ln-C$_3$(m-N$_2$)H$_2$-4-[(C$^i$Pr$_2$)$_2$—NEt]-, ($^t$Bu$_2$N)-Ln-C$_3$(m-N$_2$)H$_2$-4-[(C$^i$Pr$_2$)$_2$—NEt]-, (Cp)-Ln-C$_3$(m-N$_2$)H$_2$- 4-[(C$^i$Pr$_2$)$_2$—NEt]-, (HO)-Ln-C$_3$(m-N$_2$)H$_2$-4-[(C$^i$Pr$_2$)$_2$—NEt]-, (MeO)-Ln-C$_3$(m-N$_2$)H$_2$-4-[(C$^i$Pr$_2$)$_2$—NEt]-, (EtO)-Ln-C$_3$(m-N$_2$)H$_2$-4-[(C$^i$Pr$_2$)$_2$—NEt]-, (″PrO)-Ln-C$_3$(m-N$_2$)H$_2$-4-[(C$^i$Pr$_2$)$_2$—NEt]-, ($^i$PrO)-Ln-C$_3$(m-N$_2$)H$_2$-4-[(C$^i$Pr$_2$)$_2$—NEt]-, (″BuO)-Ln-C$_3$(m-N$_2$)H$_2$-4-[(C$^i$Pr$_2$)$_2$—NEt]-, ($^t$BuO)-Ln-C$_3$(m-N$_2$)H$_2$-4-[(C$^i$Pr$_2$)$_2$—NEt]-, ($^s$BuO)-Ln-C$_3$(m-N$_2$)H$_2$-4-[(C$^i$Pr$_2$)$_2$—NEt]-, ($^t$BuO)-Ln-C$_3$(m-N$_2$)H$_2$-4-[(C$^i$Pr$_2$)$_2$—NEt]-, (H$_2$N)-Ln-C$_3$(m-N$_2$)H$_2$- 4-[(C$^i$Pr$_2$)$_2$—N″Pr]—, (Me$_2$N)-Ln-C$_3$(m-N$_2$)H$_2$-4-[(C$^i$Pr$_2$)$_2$—N″Pr]—, (Et$_2$N)-Ln-C$_3$(m-N$_2$)H$_2$-4-[(C$^i$Pr$_2$)$_2$—N″Pr]—, (″Pr$_2$N)-Ln-C$_3$(m-N$_2$)H$_2$-4-[(C$^i$Pr$_2$)$_2$—N″Pr]—, ($^i$Pr$_2$N)-Ln-C$_3$(m-N$_2$)H$_2$-4-[(C$^i$Pr$_2$)$_2$—N″Pr]—, (″Bu$_2$N)-Ln-C$_3$(m-N$_2$)H$_2$-4-[(C$^i$Pr$_2$)$_2$—N″Pr]—, ($^i$Bu$_2$N)-Ln-C$_3$(m-N$_2$)H$_2$-4-[(C$^i$Pr$_2$)$_2$—N″Pr]—, ($^s$Bu$_2$N)-Ln-C$_3$(m-N$_2$)H$_2$-4-[(C$^i$Pr$_2$)$_2$—N″Pr]—, ($^t$Bu$_2$N)-Ln-C$_3$(m-N$_2$)H$_2$-4-[(C$^i$Pr$_2$)$_2$—N″Pr]—, (Cp)-Ln-C$_3$(m-N$_2$)H$_2$-4-[(C$^i$Pr$_2$)$_2$—N″Pr]—, (HO)-Ln-C$_3$(m-N$_2$)H$_2$-4-[(C$^i$Pr$_2$)$_2$—N″Pr]—, (MeO)-Ln-C$_3$(m-N$_2$)H$_2$-4-[(C$^i$Pr$_2$)$_2$—N″Pr]—, (EtO)-Ln-C$_3$(m-N$_2$)H$_2$-4-[(C$^i$Pr$_2$)$_2$—N″Pr]—, (″PrO)-Ln-C$_3$(m-N$_2$)H$_2$-4-[(C$^i$Pr$_2$)$_2$—N″Pr]—, ($^i$PrO)-Ln-

C$_3$(m-N$_2$)H$_2$-4-[(C$^i$Pr$_2$)$_2$—N$^n$Pr]—, ($^n$BuO)-Ln-C$_3$(m-N$_2$)H$_2$-4-[(C$^i$Pr$_2$)$_2$—N$^n$Pr]—, ($^i$BuO)-Ln-C$_3$(m-N$_2$)H$_2$-4-[(C$^i$Pr$_2$)$_2$—N$^n$Pr]—, ($^s$BuO)-Ln-C$_3$(m-N$_2$)H$_2$-4-[(C$^i$Pr$_2$)$_2$—N$^n$Pr]—, ($^t$BuO)-Ln-C$_3$(m-N$_2$)H$_2$-4-[(C$^i$Pr$_2$)$_2$—N$^n$Pr]—, (H$_2$N)-Ln-C$_3$(m-N$_2$)H$_2$-4-[(C$^i$Pr$_2$)$_2$—N$^i$Pr]—, (Me$_2$N)-Ln-C$_3$(m-N$_2$)H$_2$-4-[(C$^i$Pr$_2$)$_2$—N$^i$Pr]—, (Et$_2$N)-Ln-C$_3$-(m-N$_2$)H$_2$-4-[(C$^i$Pr$_2$)$_2$—N$^i$Pr]—, ($^n$Pr$_2$N)-Ln- C$_3$(m-N$_2$)H$_2$-4-[(C$^i$Pr$_2$)$_2$—N$^i$Pr]—, ($^i$Pr$_2$N)-Ln-C$_3$(m-N$_2$)H$_2$-4-[(C$^i$Pr$_2$)$_2$—N$^i$Pr]—, ($^n$Bu$_2$N)-Ln-C$_3$(m-N$_2$)H$_2$-4-[(C$^i$Pr$_2$)$_2$—N$^i$Pr]—, ($^i$Bu$_2$N)-Ln-C$_3$(m-N$_2$)H$_2$-4-[(C$^i$Pr$_2$)$_2$—N$^i$Pr]—, ($^s$Bu$_2$N)-Ln-C$_3$(m-N$_2$)H$_2$-4-[(C$^i$Pr$_2$)$_2$—N$^i$Pr]—, ($^t$Bu$_2$N)-Ln-C$_3$(m-N$_2$)H$_2$-4-[(C$^i$Pr$_2$)$_2$—N$^i$Pr]—, (Cp)-Ln-C$_3$(m-N$_2$)H$_2$-4-[(C$^i$Pr$_2$)$_2$—N$^i$Pr]—, (HO)-Ln-C$_3$(m-N$_2$)H$_2$-4-[(C$^i$Pr$_2$)$_2$—N$^i$Pr]—, (MeO)-Ln-C$_3$(m-N$_2$)H$_2$-4-[(C$^i$Pr$_2$)$_2$—N$^i$Pr]—, (EtO)-Ln-C$_3$(m-N$_2$)H$_2$-4-[(C$^i$Pr$_2$)$_2$—N$^i$Pr]—, ($^n$PrO)-Ln-C$_3$(m-N$_2$)H$_2$-4-[(C$^i$Pr$_2$)$_2$—N$^i$Pr]—, ($^i$PrO)-Ln-C$_3$(m-N$_2$)H$_2$-4-[(C$^i$Pr$_2$)$_2$—N$^i$Pr]—, ($^n$BuO)-Ln-C$_3$(m-N$_2$)H$_2$-4-[(C$^i$Pr$_2$)$_2$—N$^i$Pr]—, ($^i$BuO)-Ln-C$_3$(m-N$_2$)H$_2$-4-[(C$^i$Pr$_2$)$_2$—N$^i$Pr]—, ($^s$BuO)-Ln-C$_3$(m-N$_2$)H$_2$-4-[(C$^i$Pr$_2$)$_2$—N$^i$Pr]—, ($^t$BuO)-Ln-C$_3$(m-N$_2$)H$_2$-4-[(C$^i$Pr$_2$)$_2$—N$^i$Pr]—, (H$_2$N)-Ln-C$_3$(m-N$_2$)H$_2$-4-[(C$^i$Pr$_2$)$_2$—N$^n$Bu]—, (Me$_2$N)-Ln-C$_3$(m-N$_2$)H$_2$-4-[(C$^i$Pr$_2$)$_2$—N$^n$Bu]—, (Et$_2$N)-Ln-C$_3$(m-N$_2$)H$_2$-4-[(C$^i$Pr$_2$)$_2$—N$^n$Bu]—, ($^n$Pr$_2$N)-Ln-C$_3$(m-N$_2$)H$_2$-4-[(C$^i$Pr$_2$)$_2$—N$^n$Bu]—, ($^i$Pr$_2$N)- Ln-C$_3$(m-N$_2$)H$_2$-4-[(C$^i$Pr$_2$)$_2$—N$^n$Bu]—, ($^n$Bu$_2$N)-Ln-C$_3$(m-N$_2$)H$_2$-4-[(C$^i$Pr$_2$)$_2$—N$^n$Bu]—, ($^i$Bu$_2$N)- Ln-C$_3$(m-N$_2$)H$_2$-4-[(C$^i$Pr$_2$)$_2$—N$^n$Bu]—, ($^s$Bu$_2$N)-Ln-C$_3$(m-N$_2$)H$_2$-4-[(C$^i$Pr$_2$)$_2$—N$^n$Bu]—, ($^t$Bu$_2$N)- Ln-C$_3$(m-N$_2$)H$_2$-4-[(C$^i$Pr$_2$)$_2$—N$^n$Bu]—, (Cp)-Ln-C$_3$(m-N$_2$)H$_2$-4-[(C$^i$Pr$_2$)$_2$—N$^n$Bu]—, (HO)-Ln-C$_3$(m-N$_2$)H$_2$- 4-[(C$^i$Pr$_2$)$_2$—N$^n$Bu]—, (MeO)-Ln-C$_3$(m-N$_2$)H$_2$-4-[(C$^i$Pr$_2$)$_2$—N$^n$Bu]—, (EtO)-Ln-C$_3$(m-N$_2$)H$_2$-4-[(C$^i$Pr$_2$)$_2$—N$^n$Bu]—, ($^n$PrO)-Ln-C$_3$(m-N$_2$)H$_2$-4-[(C$^i$Pr$_2$)$_2$—N$^n$Bu]—, ($^i$PrO)-Ln-C$_3$(m-N$_2$)H$_2$-4-[(C$^i$Pr$_2$)$_2$—N$^n$Bu]—, ($^n$BuO)-Ln-C$_3$(m-N$_2$)H$_2$-4-[(C$^i$Pr$_2$)$_2$—N$^n$Bu]—, ($^i$BuO)-Ln-C$_3$(m-N$_2$)H$_2$-4-[(C$^i$Pr$_2$)$_2$—N$^n$Bu]—, ($^s$BuO)-Ln-C$_3$(m-N$_2$)H$_2$-4-[(C$^i$Pr$_2$)$_2$—N$^n$Bu]—, ($^t$BuO)-Ln-C$_3$(m-N$_2$)H$_2$-4-[(C$^i$Pr$_2$)$_2$—N$^n$Bu]—, (H$_2$N)-Ln-C$_3$(m-N$_2$)H$_2$-4-[(C$^i$Pr$_2$)$_2$—N$^i$Bu]—, (Me$_2$N)-Ln-C$_3$(m-N$_2$)H$_2$-4-[(C$^i$Pr$_2$)$_2$—N$^i$Bu]—, (Et$_2$N)-Ln-C$_3$(m-N$_2$)H$_2$-4-[(C$^i$Pr$_2$)$_2$—N$^i$Bu]—, ($^n$Pr$_2$N)-Ln-C$_3$(m-N$_2$)H$_2$-4-[(C$^i$Pr$_2$)$_2$—N$^i$Bu]—, ($^i$Pr$_2$N)-Ln-C$_3$(m-N$_2$)H$_2$-4-[(C$^i$Pr$_2$)$_2$—N$^i$Bu]—, ($^n$Bu$_2$N)- Ln-C$_3$(m-N$_2$)H$_2$-4-[(C$^i$Pr$_2$)$_2$—N$^i$Bu]—, ($^i$Bu$_2$N)-Ln-C$_3$(m-N$_2$)H$_2$-4-[(C$^i$Pr$_2$)$_2$—N$^i$Bu]—, ($^s$Bu$_2$N)- Ln-C$_3$(m-N$_2$)H$_2$-4-[(C$^i$Pr$_2$)$_2$—N$^i$Bu]—, ($^t$Bu$_2$N)-Ln-C$_3$(m-N$_2$)H$_2$-4-[(C$^i$Pr$_2$)$_2$—N$^i$Bu]—, (Cp)-Ln-C$_3$(m-N$_2$)H$_2$-4-[(C$^i$Pr$_2$)$_2$—N$^i$Bu]—, (HO)-Ln-C$_3$(m-N$_2$)H$_2$-4-[(C$^i$Pr$_2$)$_2$—N$^i$Bu]—, (MeO)-Ln-C$_3$(m-N$_2$)H$_2$- 4-[(C$^i$Pr$_2$)$_2$—N$^i$Bu]—, (EtO)-Ln-C$_3$(m-N$_2$)H$_2$-4-[(C$^i$Pr$_2$)$_2$—N$^i$Bu]—, ($^n$PrO)-Ln-C$_3$(m-N$_2$)H$_2$-4-[(C$^i$Pr$_2$)$_2$—N$^i$Bu]—, ($^i$PrO)-Ln-C$_3$(m-N$_2$)H$_2$-4-[(C$^i$Pr$_2$)$_2$—N$^i$Bu]—, ($^n$BuO)-Ln-C$_3$(m-N$_2$)H$_2$-4-[(C$^i$Pr$_2$)$_2$—N$^i$Bu]—, ($^i$BuO)-Ln-C$_3$(m-N$_2$)H$_2$-4-[(C$^i$Pr$_2$)$_2$—N$^i$Bu]—, ($^s$BuO)-Ln-C$_3$(m-N$_2$)H$_2$-4-[(C$^i$Pr$_2$)$_2$—N$^i$Bu]—, ($^t$BuO)-Ln-C$_3$(m-N$_2$)H$_2$-4-[(C$^i$Pr$_2$)$_2$—N$^i$Bu]—, (H$_2$N)-Ln-C$_3$(m-N$_2$)H$_2$-4-[(C$^i$Pr$_2$)$_2$—N$^s$Bu]—, (Me$_2$N)-Ln-C$_3$(m-N$_2$)H$_2$-4-[(C$^i$Pr$_2$)$_2$—N$^s$Bu]—, (Et$_2$N)-Ln-C$_3$(m-N$_2$)H$_2$-4-[(C$^i$Pr$_2$)$_2$—N$^s$Bu]—, ($^n$Pr$_2$N)-Ln-C$_3$(m-N$_2$)H$_2$-4-[(C$^i$Pr$_2$)$_2$—N$^s$Bu]—, ($^i$Pr$_2$N)- Ln-C$_3$(m-N$_2$)H$_2$-4-[(C$^i$Pr$_2$)$_2$—N$^s$Bu]—, ($^n$Bu$_2$N)-Ln-C$_3$(m-N$_2$)H$_2$-4-[(C$^i$Pr$_2$)$_2$—N$^s$Bu]—, ($^i$Bu$_2$N)- Ln-C$_3$(m-N$_2$)H$_2$-4-[(C$^i$Pr$_2$)$_2$—N$^s$Bu]—, ($^s$Bu$_2$N)-Ln-C$_3$(m-N$_2$)H$_2$-4-[(C$^i$Pr$_2$)$_2$—N$^s$Bu]—, ($^t$Bu$_2$N)- Ln-C$_3$(m-N$_2$)H$_2$-4-[(C$^i$Pr$_2$)$_2$—N$^s$Bu]—, (Cp)-Ln-C$_3$(m-N$_2$)H$_2$-4-[(C$^i$Pr$_2$)$_2$—N$^s$Bu]—, (HO)-Ln-C$_3$(m-N$_2$)H$_2$- 4-[(C$^i$Pr$_2$)$_2$—N$^s$Bu]—, (MeO)-Ln-C$_3$(m-N$_2$)H$_2$-4-[(C$^i$Pr$_2$)$_2$—N$^s$Bu]—, (EtO)-Ln-C$_3$(m-N$_2$)H$_2$-4-[(C$^i$Pr$_2$)$_2$—N$^s$Bu]—, ($^n$PrO)-Ln-C$_3$(m-N$_2$)H$_2$-4-[(C$^i$Pr$_2$)$_2$—N$^s$Bu]—, ($^i$PrO)-Ln-C$_3$(m-N$_2$)H$_2$-4-[(C$^i$Pr$_2$)$_2$—N$^s$Bu]—, ($^n$BuO)-Ln-C$_3$(m-N$_2$)H$_2$-4-[(C$^i$Pr$_2$)$_2$—N$^s$Bu]—, ($^i$BuO)-Ln-C$_3$(m-N$_2$)H$_2$-4-[(C$^i$Pr$_2$)$_2$—N$^s$Bu]—, ($^s$BuO)-Ln-C$_3$(m-N$_2$)H$_2$-4-[(C$^i$Pr$_2$)$_2$—N$^s$Bu]—, ($^t$BuO)-Ln-C$_3$(m-N$_2$)H$_2$-4-[(C$^i$Pr$_2$)$_2$—N$^s$Bu]—, (H$_2$N)-Ln-C$_3$(m-N$_2$)H$_2$-4-[(C$^i$Pr$_2$)$_2$—N$^t$Bu]—, (Me$_2$N)-Ln-C$_3$(m-N$_2$)H$_2$-4-[(C$^i$Pr$_2$)$_2$—N$^t$Bu]—, (Et$_2$N)-Ln-C$_3$(m-N$_2$)H$_2$-4-[(C$^i$Pr$_2$)$_2$—N$^t$Bu]—, ($^n$Pr$_2$N)-Ln-C$_3$(m-N$_2$)H$_2$-4-[(C$^i$Pr$_2$)$_2$—N$^t$Bu]—, ($^i$Pr$_2$N)-Ln-C$_3$(m-N$_2$)H$_2$-4-[(C$^i$Pr$_2$)$_2$—N$^t$Bu]—, ($^n$Bu$_2$N)- Ln-C$_3$(m-N$_2$)H$_2$-4-[(C$^i$Pr$_2$)$_2$—N$^t$Bu]—, ($^i$Bu$_2$N)-Ln-C$_3$(m-N$_2$)H$_2$-4-[(C$^i$Pr$_2$)$_2$—N$^t$Bu]—, ($^s$Bu$_2$N)- Ln-C$_3$(m-N$_2$)H$_2$-4-[(C$^i$Pr$_2$)$_2$—N$^t$Bu]—, ($^t$Bu$_2$N)-Ln-C$_3$(m-N$_2$)H$_2$-4-[(C$^i$Pr$_2$)$_2$—N$^t$Bu]—, (Cp)-Ln-C$_3$(m-N$_2$)H$_2$-4-[(C$^i$Pr$_2$)$_2$—N$^t$Bu]—, (HO)-Ln-C$_3$(m-N$_2$)H$_2$-4-[(C$^i$Pr$_2$)$_2$—N$^t$Bu]—, (MeO)-Ln-C$_3$(m-N$_2$)H$_2$- 4-[(C$^i$Pr$_2$)$_2$—N$^t$Bu]—, (EtO)-Ln-C$_3$(m-N$_2$)H$_2$-4-[(C$^i$Pr$_2$)$_2$—N$^t$Bu]—, ($^n$PrO)-Ln-C$_3$(m-N$_2$)H$_2$-4-[(C$^i$Pr$_2$)$_2$—N$^t$Bu]—, ($^i$PrO)-Ln-C$_3$(m-N$_2$)H$_2$-4-[(C$^i$Pr$_2$)$_2$—N$^t$Bu]—, ($^n$BuO)-Ln-C$_3$(m- N$_2$)H$_2$-4-[(C$^i$Pr$_2$)$_2$—N$^t$Bu]—, ($^i$BuO)-Ln-C$_3$(m-N$_2$)H$_2$-4-[(C$^i$Pr$_2$)$_2$—N$^t$Bu]—, ($^s$BuO)-Ln-C$_3$(m- N$_2$)H$_2$-4-[(C$^i$Pr$_2$)$_2$—N$^t$Bu]—, ($^t$BuO)-Ln-C$_3$(m-N$_2$)H$_2$-4-[(C$^i$Pr$_2$)$_2$—N$^t$Bu]—, (H$_2$N)-Ln-C$_3$(m-N$_2$)H$_2$-4-[(C$^i$Pr$_2$)$_2$—O]—, (Me$_2$N)-Ln-C$_3$(m-N$_2$)H$_2$-4-[(C$^i$Pr$_2$)$_2$—O]—, (Et$_2$N)-Ln-C$_3$(m-N$_2$)H$_2$-4-[(C$^i$Pr$_2$)$_2$—O]—, ($^n$Pr$_2$N)-Ln-C$_3$(m-N$_2$)H$_2$-4-[(C$^i$Pr$_2$)$_2$—O]—, ($^i$Pr$_2$N)-Ln-C$_3$(m- N$_2$)H$_2$-4-[(C$^i$Pr$_2$)$_2$—O]—, ($^n$Bu$_2$N)-Ln-C$_3$(m-N$_2$)H$_2$-4-[(C$^i$Pr$_2$)$_2$—O]—, ($^i$Bu$_2$N)-Ln-C$_3$(m- N$_2$)H$_2$-4-[(C$^i$Pr$_2$)$_2$ —O]—, ($^s$Bu$_2$N)-Ln-C$_3$(m-N$_2$)H$_2$-4-[(C$^i$Pr$_2$)$_2$—O]—, ($^t$Bu$_2$N)-Ln-C$_3$(m- N$_2$)H$_2$-4-[(C$^i$Pr$_2$)$_2$—O]—, (Cp)-Ln-C$_3$(m-N$_2$)H$_2$-4-[(C$^i$Pr$_2$)$_2$—O]—, (HO)-Ln-C$_3$(m-N$_2$)H$_2$- 4-[(C$^i$Pr$_2$)$_2$—O]—, (MeO)-Ln-C$_3$(m-N$_2$)H$_2$-4-[(C$^i$Pr$_2$)$_2$—O]—, (EtO)-Ln-C$_3$(m-N$_2$)H$_2$-4-[(C$^i$Pr$_2$)$_2$—O]—, ($^n$PrO)-Ln-C$_3$(m-N$_2$)H$_2$-4-[(C$^i$Pr$_2$)$_2$—O]—, ($^i$PrO)-Ln-C$_3$(m-N$_2$)H$_2$-4-[(C$^i$Pr$_2$)$_2$—O]—, ($^n$BuO)-Ln-C$_3$(m-N$_2$)H$_2$-4-[(C$^i$Pr$_2$)$_2$—O]—, ($^i$BuO)-Ln-C$_3$(m-N$_2$)H$_2$-4-[(C$^i$Pr$_2$)$_2$—O]—, ($^s$BuO)-Ln-C$_3$(m-N$_2$)H$_2$-4-[(C$^i$Pr$_2$)$_2$—O]—, ($^t$BuO)-Ln-C$_3$(m-N$_2$)H$_2$-4-[(C$^i$Pr$_2$)$_2$—O]—, (H$_2$N)-Ln-C$_3$(m-N$_2$)H$_2$-4-[(C$^t$Bu$_2$)$_2$-NH]—, (Me$_2$N)-Ln-C$_3$(m-N$_2$)H$_2$-4-[(C$^t$Bu$_2$)$_2$-NH]—, (Et$_2$N)-Ln-C$_3$(m-N$_2$)H$_2$-4-[(C$^t$Bu$_2$)$_2$-NH]—, ($^n$Pr$_2$N)-Ln-C$_3$(m-N$_2$)H$_2$-4-[(C$^t$Bu$_2$)$_2$-NH]—, ($^i$Pr$_2$N)-Ln-C$_3$(m-N$_2$)H$_2$-4-[(C$^t$Bu$_2$)$_2$-NH]—, ($^n$Bu$_2$N)-Ln-C$_3$(m-N$_2$)H$_2$-4-[(C$^t$Bu$_2$)$_2$-NH]—, ($^i$Bu$_2$N)-Ln-C$_3$(m-N$_2$)H$_2$-4-[(C$^t$Bu$_2$)$_2$-NH]—, ($^s$Bu$_2$N)-Ln-C$_3$(m-N$_2$)H$_2$-4-[(C$^t$Bu$_2$)$_2$-NH]—, ($^t$Bu$_2$N)-Ln-C$_3$(m-N$_2$)H$_2$-4-[(C$^t$Bu$_2$)$_2$-NH]—, (Cp)-Ln-C$_3$(m-N$_2$)H$_2$-4-[(C$^t$Bu$_2$)$_2$-NH]—, (HO)-Ln-C$_3$(m-N$_2$)H$_2$-4-[(C$^t$Bu$_2$)$_2$-NH]—, (MeO)-Ln-C$_3$(m-N$_2$)H$_2$-4-[(C$^t$Bu$_2$)$_2$-NH]—, (EtO)-Ln-C$_3$(m-N$_2$)H$_2$-4-[(C$^t$Bu$_2$)$_2$-NH]—, ($^n$PrO)-Ln-C$_3$(m-N$_2$)H$_2$-4-[(C$^t$Bu$_2$)$_2$-NH]—, ($^i$PrO)-Ln-C$_3$(m-N$_2$)H$_2$-4-[(C$^t$Bu$_2$)$_2$-NH]—, ($^n$BuO)-Ln-C$_3$(m-N$_2$)H$_2$-4-[(C$^t$Bu$_2$)$_2$-NH]—, ($^i$BuO)-Ln-C$_3$(m-N$_2$)H$_2$-4-[(C$^t$Bu$_2$)$_2$-NH]—, ($^s$BuO)-Ln-C$_3$(m-N$_2$)H$_2$-4-[(C$^t$Bu$_2$)$_2$-NH]—, ($^t$BuO)-Ln-C$_3$(m-N$_2$)H$_2$-4-[(C$^t$Bu$_2$)$_2$-NH]—, (H$_2$N)-Ln-C$_3$(m-N$_2$)H$_2$-4-[(C$^t$Bu$_2$)$_2$-NMe]-, (Me$_2$N)-Ln-C$_3$(m-N$_2$)H$_2$-4-[(C$^t$Bu$_2$)$_2$-NMe]-, (Et$_2$N)-Ln-C$_3$(m-N$_2$)H$_2$-4-[(C$^t$Bu$_2$)$_2$-NMe]-, ($^n$Pr$_2$N)-Ln-C$_3$(m-N$_2$)H$_2$-4-[(C$^t$Bu$_2$)$_2$-NMe]-, ($^i$Pr$_2$N)-Ln-C$_3$(m-N$_2$)H$_2$-4-[(C$^t$Bu$_2$)$_2$-NMe]-, ($^n$Bu$_2$N)-Ln-C$_3$(m-N$_2$)H$_2$-4-[(C$^t$Bu$_2$)$_2$-NMe]-, ($^i$Bu$_2$N)-Ln-C$_3$(m-N$_2$)H$_2$-4-[(C$^t$Bu$_2$)$_2$-NMe]-, ($^s$Bu$_2$N)-Ln-C$_3$(m-N$_2$)H$_2$-4-[(C$^t$Bu$_2$)$_2$-NMe]-, ($^t$Bu$_2$N)-Ln-C$_3$(m-N$_2$)H$_2$-4-[(C$^t$Bu$_2$)$_2$-NMe]-, (Cp)-Ln-C$_3$(m-N$_2$)H$_2$-4-[(C$^t$Bu$_2$)$_2$-NMe]-, (HO)-Ln-C$_3$(m-N$_2$)H$_2$-4-[(C$^t$Bu$_2$)$_2$-NMe]-, (MeO)-Ln-C$_3$(m-N$_2$)H$_2$-4-[(C$^t$Bu$_2$)$_2$-NMe]-, (EtO)-Ln-C$_3$(m-N$_2$)H$_2$-4-[(C$^t$Bu$_2$)$_2$-NMe]-, ($^n$PrO)-Ln-C$_3$(m-N$_2$)H$_2$-4-[(C$^t$Bu$_2$)$_2$-NMe]-, ($^i$PrO)-Ln-C$_3$(m-N$_2$)H$_2$-4-[(C$^t$Bu$_2$)$_2$-NMe]-, ($^n$BuO)-Ln-C$_3$(m-N$_2$)H$_2$-4-[(C$^t$Bu$_2$)$_2$-NMe]- , ($^i$BuO)-Ln-C$_3$(m-N$_2$)H$_2$-4-[(C$^t$Bu$_2$)$_2$-NMe]-, ($^s$BuO)-Ln-C$_3$(m-N$_2$)H$_2$-4-[(C$^t$Bu$_2$)$_2$-NMe]- , ($^t$BuO)-Ln-C$_3$(m-N$_2$)H$_2$-4-[(C$^t$Bu$_2$)$_2$-NMe]-, (H$_2$N)-Ln-C$_3$(m-N$_2$)H$_2$-4-[(C$^t$Bu$_2$)$_2$-NEt]-, (Me$_2$N)-Ln-C$_3$(m-N$_2$)H$_2$-4-[(C$^t$Bu$_2$)$_2$-NEt]-, (Et$_2$N)-Ln-C$_3$(m-N$_2$)H$_2$-4-[(C$^t$Bu$_2$)$_2$-NEt]- , ($^n$Pr$_2$N)-Ln-C$_3$(m-N$_2$)H$_2$-4-[(C$^t$Bu$_2$)$_2$-NEt]-, ($^i$Pr$_2$N)-Ln-C$_3$(m-N$_2$)H$_2$-4-[(C$^t$Bu$_2$)$_2$-NEt]-, ($^n$Bu$_2$N)-Ln-C$_3$(m-N$_2$)H$_2$-4-[(C$^t$Bu$_2$)$_2$-NEt]-, ($^i$Bu$_2$N)-Ln-C$_3$(m-N$_2$)H$_2$-4-[(C$^t$Bu$_2$)$_2$-NEt]-, ($^s$Bu$_2$N)-Ln-C$_3$(m-N$_2$)H$_2$-4-[(C$^t$Bu$_2$)$_2$-NEt]-, ($^t$Bu$_2$N)-Ln-C$_3$(m-N$_2$)H$_2$-

4-[(C'Bu₂)₂-NEt]-, (Cp)-Ln-C₃(m-N₂)H₂-4-[(C'Bu₂)₂-NEt]-, (HO)-Ln-C₃(m-N₂)H₂-4-[(C'Bu₂)₂-NEt]-, (MeO)-Ln-C₃(m-N₂)H₂-4-[(C'Bu₂)₂-NEt]-, (EtO)-Ln-C₃(m-N₂)H₂-4-[(C'Bu₂)₂-NEt]-, ("PrO)-Ln-C₃(m-N₂)H₂-4-[(C'Bu₂)₂-NEt]-, (ⁱPrO)-Ln-C₃(m-N₂)H₂-4-[(C'Bu₂)₂-NEt]-, ("BuO)-Ln-C₃(m-N₂)H₂-4-[(C'Bu₂)₂-NEt]-, (ⁱBuO)-Ln-C₃(m-N₂)H₂-4-[(C'Bu₂)₂-NEt]-, (ˢBuO)-Ln-C₃(m-N₂)H₂-4-[(C'Bu₂)₂-NEt]-, (ᵗBuO)-Ln-C₃(m-N₂)H₂-4-[(C'Bu₂)₂-NEt]-, (H₂N)-Ln-C₃(m-N₂)H₂-4-[(C'Bu₂)₂-N"Pr]—, (Me₂N)-Ln-C₃(m-N₂)H₂-4-[(C'Bu₂)₂-N"Pr]—, (Et₂N)-Ln-C₃(m-N₂)H₂-4-[(C'Bu₂)₂-N"Pr]—, ("Pr₂N)-Ln-C₃(m-N₂)H₂-4-[(C'Bu₂)₂-N"Pr]—, (ⁱPr₂N)-Ln-C₃(m-N₂)H₂-4-[(C'Bu₂)₂-N"Pr]—, ("Bu₂N)-Ln-C₃(m-N₂)H₂-4-[(C'Bu₂)₂-N"Pr]—, (ⁱBu₂N)-Ln-C₃(m-N₂)H₂-4-[(C'Bu₂)₂-N"Pr]—, (ˢBu₂N)-Ln-C₃(m-N₂)H₂-4-[(C'Bu₂)₂-N"Pr]—, (ᵗBu₂N)-Ln-C₃(m-N₂)H₂-4-[(C'Bu₂)₂-N"Pr]—, (Cp)-Ln-C₃(m-N₂)H₂-4-[(C'Bu₂)₂-N"Pr]—, (HO)-Ln-C₃(m-N₂)H₂-4-[(C'Bu₂)₂-N"Pr]—, (MeO)-Ln-C₃(m-N₂)H₂-4-[(C'Bu₂)₂-N"Pr]—, (EtO)-Ln-C₃(m-N₂)H₂-4-[(C'Bu₂)₂-N"Pr]—, ("PrO)-Ln-C₃(m-N₂)H₂-4-[(C'Bu₂)₂-N"Pr]—, (ⁱPrO)-Ln-C₃(m-N₂)H₂-4-[(C'Bu₂)₂-N"Pr]—, ("BuO)-Ln-C₃(m-N₂)H₂-4-[(C'Bu₂)₂-N"Pr]—, (ⁱBuO)-Ln-C₃(m-N₂)H₂-4-[(C'Bu₂)₂-N"Pr]—, (ˢBuO)-Ln-C₃(m-N₂)H₂-4-[(C'Bu₂)₂-N"Pr]—, (ᵗBuO)-Ln-C₃(m-N₂)H₂-4-[(C'Bu₂)₂-N"Pr]—, (H₂N)-Ln-C₃(m-N₂)H₂-4-[(C'Bu₂)₂-NⁱPr]—, (Me₂N)-Ln-C₃(m-N₂)H₂-4-[(C'Bu₂)₂-NⁱPr]—, (Et₂N)-Ln-C₃(m-N₂)H₂-4-[(C'Bu₂)₂-NⁱPr]—, ("Pr₂N)-Ln-C₃(m-N₂)H₂-4-[(C'Bu₂)₂-NⁱPr]—, (ⁱPr₂N)-Ln-C₃(m-N₂)H₂-4-[(C'Bu₂)₂-NⁱPr]—, ("Bu₂N)-Ln-C₃(m-N₂)H₂-4-[(C'Bu₂)₂-NⁱPr]—, (ⁱBu₂N)-Ln-C₃(m-N₂)H₂-4-[(C'Bu₂)₂-NⁱPr]—, (ˢBu₂N)-Ln-C₃(m-N₂)H₂-4-[(C'Bu₂)₂-NⁱPr]—, (ᵗBu₂N)-Ln-C₃(m-N₂)H₂-4-[(C'Bu₂)₂-NⁱPr]—, (Cp)-Ln-C₃(m-N₂)H₂-4-[(C'Bu₂)₂-NⁱPr]—, (HO)-Ln-C₃(m-N₂)H₂-4-[(C'Bu₂)₂-NⁱPr]—, (MeO)-Ln-C₃(m-N₂)H₂-4-[(C'Bu₂)₂-NⁱPr]—, (EtO)-Ln-C₃(m-N₂)H₂-4-[(C'Bu₂)₂-NⁱPr]—, ("PrO)-Ln-C₃(m-N₂)H₂-4-[(C'Bu₂)₂-NⁱPr]—, (ⁱPrO)-Ln-C₃(m-N₂)H₂-4-[(C'Bu₂)₂-NⁱPr]—, ("BuO)-Ln-C₃(m-N₂)H₂-4-[(C'Bu₂)₂-NⁱPr]—, (ⁱBuO)-Ln-C₃(m-N₂)H₂-4-[(C'Bu₂)₂-NⁱPr]—, (ˢBuO)-Ln-C₃(m-N₂)H₂-4-[(C'Bu₂)₂-NⁱPr]—, (ᵗBuO)-Ln-C₃(m-N₂)H₂-4-[(C'Bu₂)₂-NⁱPr]—, (H₂N)-Ln-C₃(m-N₂)H₂-4-[(C'Bu₂)₂-N"Bu]-, (Me₂N)-Ln-C₃(m-N₂)H₂-4-[(C'Bu₂)₂-N"Bu]-, (Et₂N)-Ln-C₃(m-N₂)H₂-4-[(C'Bu₂)₂-N"Bu]-, ("Pr₂N)-Ln-C₃(m-N₂)H₂-4-[(C'Bu₂)₂-N"Bu]-, (ⁱPr₂N)-Ln-C₃(m-N₂)H₂-4-[(C'Bu₂)₂-N"Bu]-, ("Bu₂N)-Ln-C₃(m-N₂)H₂-4-[(C'Bu₂)₂-N"Bu]-, (ⁱBu₂N)-Ln-C₃(m-N₂)H₂-4-[(C'Bu₂)₂-N"Bu]-, (ˢBu₂N)-Ln-C₃(m-N₂)H₂-4-[(C'Bu₂)₂-N"Bu]-, (ᵗBu₂N)-Ln-C₃(m-N₂)H₂-4-[(C'Bu₂)₂-N"Bu]-, (Cp)-Ln-C₃(m-N₂)H₂-4-[(C'Bu₂)₂- N"Bu]-, (HO)-Ln-C₃(m-N₂)H₂-4-[(C'Bu₂)₂-N"Bu]-, (MeO)-Ln-C₃(m-N₂)H₂-4-[(C'Bu₂)₂-N"Bu]-, (EtO)-Ln-C₃(m-N₂)H₂-4-[(C'Bu₂)₂-N"Bu]-, ("PrO)-Ln-C₃(m-N₂)H₂-4-[(C'Bu₂)₂-N"Bu]-, (ⁱPrO)-Ln-C₃(m-N₂)H₂-4-[(C'Bu₂)₂-N"Bu]-, ("BuO)-Ln-C₃(m-N₂)H₂-4-[(C'Bu₂)₂-N"Bu]-, (ⁱBuO)-Ln-C₃(m-N₂)H₂-4-[(C'Bu₂)₂-N"Bu]-, (ˢBuO)-Ln-C₃(m-N₂)H₂-4-[(C'Bu₂)₂-N"Bu]-, (ᵗBuO)-Ln-C₃(m-N₂)H₂-4-[(C'Bu₂)₂-N"Bu]-, (H₂N)-Ln-C₃(m-N₂)H₂-4-[(C'Bu₂)₂- NⁱBu]-, (Me₂N)-Ln-C₃(m-N₂)H₂-4-[(C'Bu₂)₂-NⁱBu]-, (Et₂N)-Ln-C₃(m-N₂)H₂-4-[(C'Bu₂)₂-NⁱBu]-, ("Pr₂N)-Ln-C₃(m-N₂)H₂-4-[(C'Bu₂)₂-NⁱBu]-, (ⁱPr₂N)-Ln-C₃(m-N₂)H₂-4-[(C'Bu₂)₂-NⁱBu]-, ("Bu₂N)-Ln-C₃(m-N₂)H₂-4-[(C'Bu₂)₂-NⁱBu]-, (ⁱBu₂N)-Ln-C₃(m-N₂)H₂-4-[(C'Bu₂)₂-NⁱBu]-, (ˢBu₂N)-Ln-C₃(m-N₂)H₂-4-[(C'Bu₂)₂-NⁱBu]-, (ᵗBu₂N)-Ln-C₃(m-N₂)H₂-4-[(C'Bu₂)₂-NⁱBu]-, (Cp)-Ln-C₃(m-N₂)H₂-4-[(C'Bu₂)₂-NⁱBu]-, (HO)-Ln-C₃(m-N₂)H₂-4-[(C'Bu₂)₂-NⁱBu]-, (MeO)-Ln-C₃(m-N₂)H₂-4-[(C'Bu₂)₂-NⁱBu]-, (EtO)-Ln-C₃(m-N₂)H₂-4-[(C'Bu₂)₂-NⁱBu]-, ("PrO)-Ln-C₃(m-N₂)H₂-4-[(C'Bu₂)₂-NⁱBu]-, (ⁱPrO)-Ln-C₃(m-N₂)H₂-4-[(C'Bu₂)₂-NⁱBu]-, ("BuO)-Ln-C₃(m-N₂)H₂-4-[(C'Bu₂)₂-NⁱBu]-, (ⁱBuO)-Ln-C₃(m-N₂)H₂-4-[(C'Bu₂)₂-NⁱBu]-, (ˢBuO)-Ln-C₃(m-N₂)H₂-4-[(C'Bu₂)₂-NⁱBu]-, (ᵗBuO)-Ln-C₃(m-N₂)H₂-4-[(C'Bu₂)₂-NⁱBu]-, (H₂N)-Ln-C₃(m-N₂)H₂-4-[(C'Bu₂)₂-NˢBu]-, (Me₂N)-Ln-C₃(m-N₂)H₂-4-[(C'Bu₂)₂-NˢBu]-, (Et₂N)-Ln-C₃(m-N₂)H₂-4-[(C'Bu₂)₂- NˢBu]-, ("Pr₂N)-Ln-C₃(m-N₂)H₂-4-[(C'Bu₂)₂-NˢBu]-, (ⁱPr₂N)-Ln-C₃(m-N₂)H₂-4-[(C'Bu₂)₂-NˢBu]-, ("Bu₂N)-Ln-C₃(m-N₂)H₂-4-[(C'Bu₂)₂-NˢBu]-, (ⁱBu₂N)-Ln-C₃(m-N₂)H₂-4-[(C'Bu₂)₂-NˢBu]-, (ˢBu₂N)-Ln-C₃(m-N₂)H₂-4-[(C'Bu₂)₂-NˢBu]-, (ᵗBu₂N)-Ln-C₃(m-N₂)H₂-4-[(C'Bu₂)₂-NˢBu]-, (Cp)-Ln-C₃(m-N₂)H₂-4-[(C'Bu₂)₂-NˢBu]-, (HO)-Ln-C₃(m-N₂)H₂-4-[(C'Bu₂)₂-NˢBu]-, (MeO)-Ln-C₃(m-N₂)H₂-4-[(C'Bu₂)₂-NˢBu]-, (EtO)-Ln-C₃(m-N₂)H₂-4-[(C'Bu₂)₂-NˢBu]-, ("PrO)-Ln-C₃(m-N₂)H₂-4-[(C'Bu₂)₂-NˢBu]-, (ⁱPrO)-Ln-C₃(m-N₂)H₂-4-[(C'Bu₂)₂-NˢBu]-, ("BuO)-Ln-C₃(m-N₂)H₂-4-[(C'Bu₂)₂-NˢBu]-, (ⁱBuO)-Ln-C₃(m-N₂)H₂-4-[(C'Bu₂)₂-NˢBu]-, (ˢBuO)-Ln-C₃(m-N₂)H₂-4-[(C'Bu₂)₂-NˢBu]-, (ᵗBuO)-Ln-C₃(m-N₂)H₂-4-[(C'Bu₂)₂-NˢBu]-, (H₂N)-Ln-C₃(m-N₂)H₂-4-[(C'Bu₂)₂-NᵗBu]-, (Me₂N)-Ln-C₃(m-N₂)H₂-4-[(C'Bu₂)₂-NᵗBu]-, (Et₂N)-Ln-C₃(m-N₂)H₂-4-[(C'Bu₂)₂-NᵗBu]-, (ⁱPr₂N)-Ln-C₃(m-N₂)H₂-4-[(C'Bu₂)₂-NᵗBu]-, (ⁱPr₂N)-Ln-C₃(m-N₂)H₂-4-[(C'Bu₂)₂-NᵗBu]-, ("Bu₂N)-Ln-C₃(m-N₂)H₂-4-[(C'Bu₂)₂-NᵗBu]-, (ⁱBu₂N)-Ln-C₃(m-N₂)H₂-4-[(C'Bu₂)₂-NᵗBu]-, (ˢBu₂N)-Ln-C₃(m-N₂)H₂-4-[(C'Bu₂)₂-NᵗBu]-, (ᵗBu₂N)-Ln-C₃(m-N₂)H₂-4-[(C'Bu₂)₂-NᵗBu]-, (Cp)-Ln-C₃(m-N₂)H₂-4-[(C'Bu₂)₂-NᵗBu]-, (HO)-Ln-C₃(m-N₂)H₂-4-[(C'Bu₂)₂-NᵗBu]-, (MeO)-Ln-C₃(m-N₂)H₂-4-[(C'Bu₂)₂-NᵗBu]-, (EtO)-Ln-C₃(m-N₂)H₂-4-[(C'Bu₂)₂-NᵗBu]-, ("PrO)-Ln-C₃(m-N₂)H₂-4-[(C'Bu₂)₂-NᵗBu]-, (ⁱPrO)-Ln-C₃(m-N₂)H₂-4-[(C'Bu₂)₂-NᵗBu]-, ("BuO)-Ln-C₃(m-N₂)H₂-4-[(C'Bu₂)₂-NᵗBu]-, (ⁱBuO)-Ln-C₃(m-N₂)H₂-4-[(C'Bu₂)₂-NᵗBu]-, (ˢBuO)-Ln-C₃(m-N₂)H₂-4-[(C'Bu₂)₂-NᵗBu]-, (ᵗBuO)-Ln-C₃(m-N₂)H₂-4-[(C'Bu₂)₂-NᵗBu]-, (H₂N)-Ln-C₃(m-N₂)H₂-4-[(C'Bu₂)₂-O]—, (Me₂N)-Ln-C₃(m-N₂)H₂-4-[(C'Bu₂)₂-O]—, (Et₂N)-Ln-C₃(m-N₂)H₂-4-[(C'Bu₂)₂-O]—, ("Pr₂N)-Ln-C₃(m-N₂)H₂-4-[(C'Bu₂)₂-O]—, (ⁱPr₂N)-Ln-C₃(m-N₂)H₂-4-[(C'Bu₂)₂-O]—, ("Bu₂N)-Ln-C₃(m-N₂)H₂-4-[(C'Bu₂)₂-O]—, (ⁱBu₂N)-Ln-C₃(m-N₂)H₂-4-[(C'Bu₂)₂-O]—, (ˢBu₂N)-Ln-C₃(m-N₂)H₂-4-[(C'Bu₂)₂-O]—, (ᵗBu₂N)-Ln-C₃(m-N₂)H₂-4-[(C'Bu₂)₂-O]—, (Cp)-Ln-C₃(m-N₂)H₂-4-[(C'Bu₂)₂-O]—, (HO)-Ln-C₃(m-N₂)H₂-4-[(C'Bu₂)₂-O]—, (MeO)-Ln-C₃(m-N₂)H₂-4-[(C'Bu₂)₂-O]—, (EtO)-Ln-C₃(m-N₂)H₂-4-[(C'Bu₂)₂-O]—, ("PrO)-Ln-C₃(m-N₂)H₂-4-[(C'Bu₂)₂-O]—, (ⁱPrO)-Ln-C₃(m-N₂)H₂-4-[(C'Bu₂)₂-O]—, ("BuO)-Ln-C₃(m-N₂)H₂-4-[(C'Bu₂)₂-O]—, (ⁱBuO)-Ln-C₃(m-N₂)H₂-4-[(C'Bu₂)₂-O]—, (ˢBuO)-Ln-C₃(m-N₂)H₂-4-[(C'Bu₂)₂-O]—, and (ᵗBuO)-Ln-C₃(m-N₂)H₂-4-[(C'Bu₂)₂-O]—, wherein Ln is selected from Lanthanide elements consisting of La, Y, Sc, Ce, Pr, Nd, Sm, Eu, Gd, Tb, Dy, Ho, Er, Tm, Yb and Lu bonded in an η⁵ bonding mode to the aromatic group; N may be replaced with Si, B, P, or O; and bridged C may be replaced with Si, B or P.

Preferred Lanthanide precursors include (Me₂N)-Ln-C₅H₃-1-Me-3-(CH₂—CH₂)—NMe)- and (Me₂N)-Ln-C₅H₃-1-Me-3-(CH₂—CH₂—O)—, corresponding to the following structure formula, respectively:

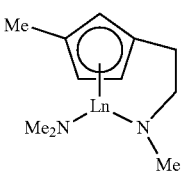 and 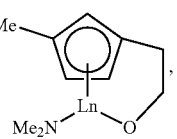

wherein Ln is selected from Lantanide elements consisting of La, Y, Sc, Ce, Pr, Nd, Sm, Eu, Gd, Tb, Dy, Ho, Er, Tm, Yb and Lu bonded in an $\eta^5$ bonding mode to the aromatic group. Specific compounds include:
($Me_2N$)—La—$C_5H_3$-1-Me-3-[($CH_2$)$_2$—NMe]—,
($Me_2N$)—Y—$C_5H_3$-1-Me-3-[($CH_2$)$_2$—NMe]-,
($Me_2N$)—Sc—$C_5H_3$-1-Me-3-[($CH_2$)$_2$—NMe]-,
($Me_2N$)—Ce—$C_5H_3$-1-Me-3-[($CH_2$)$_2$—NMe]-,
($Me_2N$)—Pr—$C_5H_3$-1-Me-3-[($CH_2$)$_2$—NMe]-,
($Me_2N$)—Nd—$C_5H_3$-1-Me-3-[($CH_2$)$_2$—NMe]-,
($Me_2N$)—Sm—$C_5H_3$-1-Me-3-[($CH_2$)$_2$—NMe]-,
($Me_2N$)—Eu—$C_5H_3$-1-Me-3-[($CH_2$)$_2$—NMe]-,
($Me_2N$)—Gd—$C_5H_3$-1-Me-3-[($CH_2$)$_2$—NMe]-,
($Me_2N$)—Tb—$C_5H_3$-1-Me-3-[($CH_2$)$_2$—NMe]-,
($Me_2N$)—Dy—$C_5H_3$-1-Me-3-[($CH_2$)$_2$—NMe]-,
($Me_2N$)—Ho—$C_5H_3$-1-Me-3-[($CH_2$)$_2$—NMe]-,
($Me_2N$)—Er—$C_5H_3$-1-Me-3-[($CH_2$)$_2$—NMe]-,
($Me_2N$)—Tm—$C_5H_3$-1-Me-3-[($CH_2$)$_2$—NMe]-,
($Me_2N$)—Yb—$C_5H_3$-1-Me-3-[($CH_2$)$_2$—NMe]-,
($Me_2N$)—Lu—$C_5H_3$-1-Me-3-[($CH_2$)$_2$—NMe]-,
($Me_2N$)—La—$C_5H_3$-1-Me-3-[($CH_2$)$_2$—O]—, ($Me_2N$)—Y—$C_5H_3$-1-Me-3-[($CH_2$)$_2$—O]—, ($Me_2N$)—Sc—$C_5H_3$-1-Me-3-[($CH_2$)$_2$—O]—, ($Me_2N$)—Ce—$C_5H_3$-1-Me-3-[($CH_2$)$_2$—O]—, ($Me_2N$)—Pr—$C_5H_3$-1-Me-3-[($CH_2$)$_2$—O]—, ($Me_2N$)—Nd—$C_5H_3$-1-Me-3-[($CH_2$)$_2$—O]—, ($Me_2N$)—Sm—$C_5H_3$-1-Me-3-[($CH_2$)$_2$—O]—, ($Me_2N$)—Eu—$C_5H_3$-1-Me-3-[($CH_2$)$_2$—O]—, ($Me_2N$)—Gd—$C_5H_3$-1-Me-3-[($CH_2$)$_2$—O]—, ($Me_2N$)—Tb—$C_5H_3$-1-Me-3-[($CH_2$)$_2$—O]—, ($Me_2N$)—Dy—$C_5H_3$-1-Me-3-[($CH_2$)$_2$—O]—, ($Me_2N$)—Ho—$C_5H_3$-1-Me-3-[($CH_2$)$_2$—O]—, ($Me_2N$)—Er—$C_5H_3$-1-Me-3-[($CH_2$)$_2$—O]—, ($Me_2N$)—Tm—$C_5H_3$-1-Me-3-[($CH_2$)$_2$—O]—, ($Me_2N$)—Yb—$C_5H_3$-1-Me-3-[($CH_2$)$_2$—O]—, and ($Me_2N$)—Lu—$C_5H_3$-1-Me-3-[($CH_2$)$_2$—O]—.

Alternatively, the compounds include Cp-La—$C_5H_3$-1-Me-3-[($CH_2$)$_2$—NMe]-; Cp-Y—$C_5H_3$-1-Me-3-[($CH_2$)$_2$—NMe]-; Cp-Sc—$C_5H_3$-1-Me-3-[($CH_2$)$_2$—NMe]-; Cp-Ce—$C_5H_3$-1-Me- 3-[($CH_2$)$_2$—NMe]-; Cp-Pr—$C_5H_3$-1-Me-3-[($CH_2$)$_2$—NMe]-; Cp-Nd—$C_5H_3$-1-Me-3-[($CH_2$)$_2$—NMe]-; Cp-Sm—$C_5H_3$-1-Me-3-[($CH_2$)$_2$—NMe]-; Cp-Eu—$C_5H_3$-1-Me-3-[($CH_2$)$_2$—NMe]-; Cp-Gd—$C_5H_3$-1-Me-3-[($CH_2$)$_2$—NMe]-; Cp-Tb—$C_5H_3$-1-Me-3-[($CH_2$)$_2$—NMe]-; Cp-Dy—$C_5H_3$-1-Me-3-[($CH_2$)$_2$—NMe]-; Cp-Ho—$C_5H_3$-1-Me-3-[($CH_2$)$_2$—NMe]-; Cp-Er—$C_5H_3$-1-Me-3-[($CH_2$)$_2$—NMe]-; Cp-Tm—$C_5H_3$-1-Me-3-[($CH_2$)$_2$—NMe]-; Cp-Yb—$C_5H_3$-1-Me-3-[($CH_2$)$_2$—NMe]-; Cp-Lu—$C_5H_3$-1-Me-3-[($CH_2$)$_2$—NMe]-; Cp-La—$C_5H_3$-1-Me-3-[($CH_2$)$_2$—O]—; Cp-Y—$C_5H_3$-1-Me-3-[($CH_2$)$_2$—O]—; Cp-Sc—$C_5H_3$-1-Me-3-[($CH_2$)$_2$—O]—; Cp-Ce—$C_5H_3$-1- Me-3-[($CH_2$)$_2$—O]—; Cp-Pr—$C_5H_3$-1-Me-3-[($CH_2$)$_2$—O]—; Cp-Nd—$C_5H_3$-1-Me-3-[($CH_2$)$_2$—O]—; Cp-Sm—$C_5H_3$-1-Me-3-[($CH_2$)$_2$—O]—; Cp-Eu—$C_5H_3$-1-Me-3-[($CH_2$)$_2$—O]—; Cp-Gd—$C_5H_3$-1- Me-3-[($CH_2$)$_2$—O]—; Cp-Tb—$C_5H_3$-1-Me-3-[($CH_2$)$_2$—O]—; Cp-Dy—$C_5H_3$-1-Me-3-[($CH_2$)$_2$—O]—; Cp-Ho—$C_5H_3$-1-Me-3-[($CH_2$)$_2$—O]—; Cp-Er—$C_5H_3$-1-Me-3-[($CH_2$)$_2$—O]—; Cp-Tm—$C_5H_3$-1- Me-3-[($CH_2$)$_2$—O]—; Cp-Yb—$C_5H_3$-1-Me-3-[($CH_2$)$_2$—O]—; and Cp-Lu—$C_5H_3$-1-Me-3-[($CH_2$)$_2$—O]—.

The inventors recognize that the disclosed Lanthanide-containing precursors having the above structures, i.e., having one aromatic group with asymmetric structure may be liquid and less or not viscous. With smaller ligands the disclosed Lanthanide-containing precursors having the above structures may have high vapor pressure and may be used in direct liquid injection (DLI) where the precursor is fed in a liquid state and then vaporized before it is introduced into a reactor. In addition, bridged aromatic groups, for example, cyclopentadienyl (Cp)/amino or bridged Cp/alkoxy, may help to stabilize the compounds.

The Lanthanide precursors offer unique physical and chemical properties when compared to their corresponding homoleptic compounds, which include tris-substituted cyclopentadienyl Lanthanum compounds, La(RCp)$_3$, tris-acetamidinate compounds, La(R—N—C(R')—N—R)$_3$, or tris-formamidinate compounds, La(R—N—C(H)—N—R)$_3$. Such properties include better control of steric crowding around the metal center, which in turn controls the surface reaction on the substrate and the reaction with a second reactant (such as an oxygen source). Independently fine tuning the substituents on the ligands increases volatility and thermal stability and decreases melting point to yield either liquids or low melting solids.

In order to synthesize stable Lanthanide precursors with properties suited for the vapor deposition process (i.e., a volatile, yet thermally stable, liquid or low melting solid (having a melting point below about 105° C.)), a direct correlation between the properties of the central metal ion (coordination number) and ligands (steric effect, ratio of two heteroleptic ligands) has been observed. Preferably, the metal compound has a 3+ charge and coordination number of 6. Preferably m is 2 and n is 1. Preferably the Lanthanide precursor has a melting point below about 105° C., preferably below about 80° C., more preferably below about 70° C., and even more preferably below about 40° C.

The synthesis of the lanthanide precursors may be carried out by following methods:

Method A

By reacting at low temperature Ln(RCp)$_2$X (X=Cl, Br or I) with the corresponding alkanolamine and/or alkylamine in a suitable solvent, such as dichloromethane, THF or ether, where R is defined above. The alkanolamine and alkylamine are commercially available. After completion of the addition, the mixture warms to room temperature with stirring. The solvent is removed under vacuum. The residue is dissolved in a solvent, such as toluene. The resulting mixture is filtered. Removal of the solvent produces the lanthanide precursor.

Method B

By reacting Ln(RCp)$_3$ at low temperature with the corresponding alkanolamine in a suitable solvent, such as heptanes, dichloromethane, THF or ether, where R is defined above. The alkanolamine is commercially available. After completion of the addition, the mixture warms to room temperature with stirring. The solvent is removed under vacuum to produce the lanthanide precursor.

Method C

In-situ reacting LnX$_3$ (where X=Cl, Br, I) (in a stepwise reaction without isolation of intermediate products) with a stoichiometric amount of RCpM (where R is selected from H or a $C_1$-$C_4$ alkyl chain; and M=Li, Na, K) followed by filtration, and reacting the filtrate with alkanolamine and/or alkylamine to result in lanthanide precursor.

A portion of the disclosed precursor compounds (hereinafter the "Lanthanide precursor") may be deposited to form Lanthanide-containing films using any vapor deposition methods known to those of skill in the art. Examples of suitable vapor deposition methods include without limitation, conventional chemical vapor deposition (CVD), atomic layer deposition (ALD), or other types of vapor depositions that are variations thereof, such as plasma enhanced ALD (PEALD), plasma enhanced CVD (PECVD), low pressure CVD (LPCVD), pulsed chemical vapor deposition (P-CVD), low pressure CVD (LPCVD), sub-atmospheric CVD (SACVD), atmospheric pressure CVD (APCVD), hot-wire CVD (HWCVD, also known as cat-CVD, in which a hot wire serves as an energy source for the deposition process), thermal ALD, thermal CVD, spatial ALD, hot-wire ALD (HWALD), radicals incorporated deposition, and super critical fluid deposition, or combinations thereof. The deposition method is preferably ALD, PE-ALD, or spatial ALD in order to provide suitable step coverage and film thickness control.

The type of substrate upon which the Lanthanide-containing film will be deposited will vary depending on the final use intended. In some embodiments, the substrate may be chosen from oxides which are used as dielectric materials in MIM, DRAM, FeRam technologies or gate dielectrics in CMOS technologies (for example, $HfO_2$ based materials, $TiO_2$ based materials, $GeO_2$ based materials, $ZrO_2$ based materials, rare earth oxide based materials, ternary oxide based materials, etc.) or from nitride-based films (for example, TaN) that are used as an oxygen barrier between copper and the low-k layer. Other substrates may be used in the manufacture of semiconductors, photovoltaics, LCD-TFT, or flat panel devices. Examples of such substrates include, but are not limited to, solid substrates such as metal substrates (for example, Au, Pd, Rh, Ru, W, Al, Ni, Ti, Co, Pt and metal silicides, such as $TiSi_2$, $CoSi_2$, and $NiSi_2$); metal nitride containing substrates (for example, TaN, TiN, WN, TaCN, TiCN, TaSiN, and TiSiN); semiconductor materials (for example, Si, SiGe, GaAs, InP, diamond, GaN, and SiC); insulators (for example, $SiO_2$, $Si_3N_4$, SiON, $HfO_2$, $Ta_2O_5$, $ZrO_2$, $TiO_2$, $Al_2O_3$, and barium strontium titanate); or other substrates that include any number of combinations of these materials. Plastic substrates, such as poly(3,4-ethylenedioxythiophene)poly(styrenesulfonte) [PEDOT:PSS], may also be used. The actual substrate utilized may also depend upon the specific precursor embodiment utilized. In many instances though, the preferred substrate utilized will be selected from TiN, Ru, and Si type substrates.

The vapor of the Lanthanide precursor is introduced into a reactor containing at least one substrate. The temperature and the pressure within the reactor and the temperature of the substrate are held at conditions suitable for vapor deposition of at least part of the Lanthanide precursor onto the substrate. In other words, after introduction of the vaporized precursor into the reactor, conditions within the chamber are such that at least part of the vaporized precursor is deposited onto the substrate to form the Lanthanide-containing film. The reactor may be any enclosure or chamber of a device in which deposition methods take place, such as, without limitation, a parallel-plate type reactor, a cold-wall type reactor, a hot-wall type reactor, a single-wafer reactor, a multi-wafer reactor, or other such types of deposition systems.

The reactor may be maintained at a pressure ranging from about 0.5 mTorr to about 20 Torr. In addition, the temperature within the reactor may range from about 250° C. to about 600° C. One of ordinary skill in the art will recognize that the temperature may be optimized through mere experimentation to achieve the desired result.

The substrate may be heated to a sufficient temperature to obtain the desired Lanthanide-containing film at a sufficient growth rate and with desired physical state and composition. A non-limiting exemplary temperature range to which the substrate may be heated includes from 150° C. to 600° C. Preferably, the temperature of the substrate remains less than or equal to 450° C.

The Lanthanide precursor may be fed in liquid state to a vaporizer where it is vaporized before it is introduced into the reactor. Prior to its vaporization, the Lanthanide precursor may optionally be mixed with one or more solvents, one or more metal sources, and a mixture of one or more solvents and one or more metal sources. The solvents may be selected from the group consisting of toluene, ethyl benzene, xylene, mesitylene, decane, dodecane, octane, hexane, pentane, or others. The resulting concentration may range from approximately 0.05 M to approximately 2 M. The metal source may include any metal precursors now known or later developed.

Alternatively, the Lanthanide precursor may be vaporized by passing a carrier gas into a container containing the Lanthanide precursor or by bubbling the carrier gas into the Lanthanide precursor. Again, the carrier gas may include, but is not limited to, Ar, He, $N_2$, and mixtures thereof. The carrier gas and Lanthanide precursor are then introduced into the reactor. If necessary, the container may be heated to a temperature that permits the Lanthanide precursor to be in its liquid phase and to have a sufficient vapor pressure. The carrier gas may include, but is not limited to, Ar, He, $N_2$, and mixtures thereof. The Lanthanide precursor may optionally be mixed in the container with a solvent, another precursor, or a mixture thereof. The container may be maintained at temperatures in the range of, for example, 0-100° C. Those skilled in the art recognize that the temperature of the container may be adjusted in a known manner to control the amount of Lanthanide precursor vaporized.

In addition to the optional mixing of the Lanthanide precursor with solvents, metal precursors, and stabilizers prior to introduction into the reactor, the Lanthanide precursor may be mixed with reactant species inside the reactor. Exemplary reactant species include, without limitation, $H_2$, metal precursors such as TMA or other aluminum-containing precursors, other Lanthanide precursors, TBTDET, TATDMAE, PET, TBTDEN, PEN, and any combination thereof.

When the desired Lanthanide-containing film also contains oxygen, such as, for example and without limitation, lanthanum oxide, the reactant species may include an oxygen source which is selected from, but not limited to, $O_2$, $O_3$, $H_2O$, $H_2O_2$, acetic acid, formalin, para-formaldehyde, and combinations thereof.

When the desired Lanthanide-containing film also contains nitrogen, such as, for example and without limitation, lanthanum nitride or lanthanum carbo-nitride, the reactant species may include a nitrogen source which is selected from, but not limited to, nitrogen ($N_2$), ammonia and alkyl derivatives thereof, hydrazine and alkyl derivatives thereof, N-containing radicals (for instance N., NH., $NH_2$.) NO, $N_2O$, $NO_2$, amines, and any combination thereof.

When the desired Lanthanide-containing film also contains carbon, such as, for example and without limitation, Lanthanum carbide or Lanthanum carbo-nitride, the reactant species may include a carbon source which is selected from, but not limited to, methane, ethane, propane, butane, ethylene, propylene, t-butylene, isobutylene, $CCl_4$, and any combination thereof.

When the desired Lanthanide-containing film also contains silicon, such as, for example and without limitation, Lanthanum silicide, Lanthanum silica-nitride, Lanthanum silicate, Lanthanum silica-carbo-nitride, the reactant species may include a silicon source which is selected from, but not limited to, $SiH_4$, $Si_2H_6$, $Si_3H_8$, TriDMAS, BDMAS, BDEAS, TDEAS, TDMAS, TEMAS, $(SiH_3)_3N$, $(SiH_3)_2O$, trisilylamine, disiloxane, trisilylamine, disilane, trisilane, an alkoxysilane $SiH_x(OR^1)_{4-x}$, a silanol $Si(OH)_x(OR^1)_{4-x}$ (preferably $Si(OH)(OR^1)_3$; more preferably $Si(OH)(OtBu)_3$ an aminosilane $SiH_x(NR^1R^2)_{4-x}$ (where x is 1, 2, 3, or 4; $R^1$ and $R^2$ are independently H or a linear, branched or cyclic C1-C6 carbon chain; preferably TriDMAS, BTBAS, and/or BDEAS), and any combination thereof. The targeted film may alternatively contain Germanium (Ge), in which case the above-mentioned Si-containing reactant species could be replaced by Ge-containing reactant species.

When the desired Lanthanide-containing film also contains another element, such as, for example and without limitation, Ge, Ti, Ta, Hf, Zr, Nb, Mg, Al, Sr, Y, Ba, Ca, As, Sb, Bi, Sn, Pb, or combinations thereof, the reactant species may include a precursor which is selected from, but not limited to, alkyls such as $SbR^{i'}_3$ or $SnR^{i'}_4$ (wherein each $R^{i'}$ is independently H or a linear, branched, or cyclic C1-C6 carbon chain), alkoxides such as $Sb(OR^i)_3$ or $Sn(OR^i)_4$ (where each $R^i$ is independently H or a linear, branched, or cyclic C1-C6 carbon chain), and amines such as $Sb(NR^1R^2)(NR^3R^4)(NR^5R^6)$ or $Ge(NR^1R^2)(NR^3R^4)(NR^5R^6)(NR^7R^8)$ (where each $R^1$, $R^2$, $R^3$, $R^4$, $R^5$, $R^6$, $R^7$, and $R^8$ is independently H, a C1-C6 carbon chain, or a trialkylsilyl group, the carbon chain and trialkylsilyl group each being linear, branched, or cyclic), and any combination thereof.

The Lanthanide precursor and one or more reactant species may be introduced into the reactor simultaneously (chemical vapor deposition), sequentially (atomic layer deposition), or in other combinations. For example, the Lanthanide precursor may be introduced in one pulse and two additional metal sources may be introduced together in a separate pulse [modified atomic layer deposition]. Alternatively, the reactor may already contain the reactant species prior to introduction of the Lanthanide precursor. The reactant species may be passed through a plasma system localized remotely from the reactor, and decomposed to radicals. Alternatively, the Lanthanide precursor may be introduced to the reactor continuously while other reactant species are introduced by pulse (pulsed-chemical vapor deposition). In each example, a pulse may be followed by a purge or evacuation step to remove excess amounts of the component introduced. In each example, the pulse may last for a time period ranging from about 0.01 s to about 10 s, alternatively from about 0.3 s to about 3 s, alternatively from about 0.5 s to about 2 s.

In one non-limiting exemplary atomic layer deposition type process, the vapor phase of a Lanthanide precursor is introduced into the reactor, where at least part of the Lanthanide precursor reacts with a suitable substrate in a self-limiting manner. Excess Lanthanide precursor may then be removed from the reactor by purging and/or evacuating the reactor. An oxygen source, such as ozone, is introduced into the reactor where it reacts with the absorbed Lanthanide precursor. Any excess oxygen source is removed from the reactor by purging and/or evacuating the reactor. If the desired film is a Lanthanide oxide film, this two-step process may provide the desired film thickness or may be repeated until a film having the necessary thickness has been obtained.

$LaGeO_x$, wherein x is a number ranging from 1 to 5 inclusive, may spontaneously form when the ALD LaO film is deposited on a Ge or $GeO_2$ substrate. The $LaGeO_x$ film may serve as a channel material in metal oxide semiconductor (MOS) devices due to high hole mobility and low dopant activation temperatures.

Alternatively, the $LaO_x$ film may be deposited as a capping layer on an $HfO_x$ or $ZrO_x$ high k gate dielectric film, with x being a number ranging from 1 to 5 inclusive. The $LaO_x$ capping layer reduces Fermi level pinning effects between the gate dielectric layer and a metal gate.

In another alternative, if the desired film is a Lanthanide oxide film containing another element, the two-step process above may be followed by introduction of the vapor of a precursor into the reactor. The precursor will be selected based on the nature of the Lanthanide metal oxide film being deposited and may include a different Lanthanide precursor. After introduction into the reactor, the precursor is contacted with the substrate. Any excess precursor is removed from the reactor by purging and/or evacuating the reactor. Once again, an oxygen source may be introduced into the reactor to react with the precursor. Excess oxygen source is removed from the reactor by purging and/or evacuating the reactor. If a desired film thickness has been achieved, the process may be terminated. However, if a thicker film is desired, the entire four-step process may be repeated. By alternating the provision of the Lanthanide precursor, precursor, and oxygen source, a film of desired composition and thickness can be deposited.

The Lanthanide-containing films or Lanthanide-containing layers resulting from the processes discussed above may include $La_2O_3$, $(LaLn)O_3$, $La_2O_3$-$Ln_2O_3$, $LaSi_xO_y$, $LaGe_xO_y$, $(Al, Ga, Mn)LnO_3$, $HfLaO_x$ or $ZrLaO_x$, $LaSrCoO_4$, $LaSrMnO_4$ where Ln is a different Lanthanide and x is 1 to 5 inclusive. Preferably, the Lanthanide-containing film may include $HfLaO_x$ or $ZrLaO_x$. One of ordinary skill in the art will recognize that by judicial selection of the appropriate Lanthanide precursor and reactant species, the desired film composition may be obtained.

Upon obtaining a desired film thickness, the film may be subject to further processing, such as thermal annealing, furnace-annealing, rapid thermal annealing, UV or e-beam curing, and/or plasma gas exposure. Those skilled in the art recognize the systems and methods utilized to perform these additional processing steps. For example, the lanthanum-containing film may be exposed to a temperature ranging from approximately 200° C. and approximately 1000° C. for a time ranging from approximately 0.1 second to approximately 7200 seconds under an inert atmosphere, an H-containing atmosphere, a N-containing atmosphere, an O-containing atmosphere, or combinations thereof. Most preferably, the temperature is 350° C. for 1800 seconds under an inert atmosphere of Argon. The resulting film may contain fewer impurities and therefore may have an improved density resulting in improved leakage current. The annealing step may be performed in the same reactor in which the deposition process is performed. Alternatively, the substrate may be removed from the reactor, with the annealing/flash annealing process being performed in a separate apparatus. Any of the above post-treatment methods, but especially thermal annealing, has been found effective to reduce carbon and nitrogen contamination of the Lanthanide-containing film. This in turn tends to improve the leakage current and the interface trap density ($D_{it}$) of the film.

While embodiments of this invention have been shown and described, modifications thereof can be made by one skilled in the art without departing from the spirit or teaching of this invention. The embodiments described herein are exemplary only and not limiting. Many variations and modifications of the composition and method are possible and within the scope of the invention. Accordingly the scope of protection is not limited to the embodiments described herein, but is only limited by the claims which follow, the scope of which shall include all equivalents of the subject matter of the claims.

What is claimed is:

1. A method of forming a Lanthanide-containing film on a substrate, the method comprising the steps of:
   introducing the Lanthanide precursor into a reactor having a substrate disposed therein; and
   depositing at least part of the Lanthanide precursor onto the substrate to form the Lanthanide-containing film on the substrate using a vapor deposition process, wherein the Lanthanide precursor has the general formulae:

L-Ln-C$_5$R$_4$—[(ER$_2$)$_m$-(ER$_2$)$_n$-L']-,

L-Ln-C$_4$AR$_3$-3-[(ER$_2$)$_m$-(ER$_2$)$_n$-L']-,

L-Ln-C$_3$(m-A$_2$)R$_2$-4-[(ER$_2$)$_m$-(ER$_2$)$_n$-L']-, referring to the following structure formula, respectively:

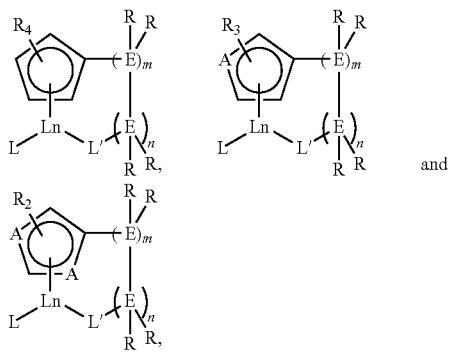

wherein Ln is selected from Lanthanide elements consisting of La, Y, Sc, Ce, Pr, Nd, Sm, Eu, Gd, Tb, Dy, Ho, Er, Tm, Yb and Lu bonded in an $\eta^5$ bonding mode to the aromatic group; A is independently N, Si, B, P or O; each E is independently C or Si; m and n are independently 0, 1 or 2; m+n>1; each R is independently an H or a C$_1$-C$_4$ hydrocarbyl group; each L is independently a −1 anionic ligand, wherein the −1 anionic ligand is selected from the group consisting of NR'$_2$, OR', Cp, Amidinate, β-diketonate, and keto-iminate, wherein R' is an H or a C$_1$-C$_4$ hydrocarbon group; each L' is independently NR", wherein R" is an H or a C$_1$-C$_4$ hydrocarbon group; and each of R$_2$, R$_3$ and R$_4$ is an H or a C$_1$-C$_4$ hydrocarbyl group.

2. The method of claim 1, further comprising introducing a reactant species into the reactor.

3. The method of claim 2, wherein the reactant species is selected from the group consisting of O$_2$, O$_3$, H$_2$O, H$_2$O$_2$, acetic acid, formalin, para-formaldehyde, and combinations thereof.

4. The method of claim 3, wherein the reactant species is ozone.

5. The method of claim 1, wherein the Lanthanide precursor is selected from the group consisting of (Me$_2$N)-La—C$_5$H$_3$-1-Me-3-(CH$_2$—CH$_2$—NMe)-, (Me$_2$N)—Y—C$_5$H$_3$-1-Me-3-(CH$_2$—CH$_2$—NMe)-, (Me$_2$N)—Sc—C$_5$H$_3$-1-Me-3-(CH$_2$—CH$_2$—NMe)-, (Me$_2$N)—Ce—C$_5$H$_3$-1-Me-3-(CH$_2$—CH$_2$—NMe)-, (Me$_2$N)—Pr—C$_5$H$_3$-1-Me-3-(CH$_2$—CH$_2$—NMe)-, (Me$_2$N)—Nd—C$_5$H$_3$-1-Me-3-(CH$_2$—CH$_2$—NMe)-, (Me$_2$N)—Sm—C$_5$H$_3$-1-Me-3-(CH$_2$—CH$_2$—NMe)-, (Me$_2$N)—Eu—C$_5$H$_3$-1-Me-3-(CH$_2$—CH$_2$—NMe)-, (Me$_2$N)—Gd—C$_5$H$_3$-1-Me-3-(CH$_2$—CH$_2$—NMe)-, (Me$_2$N)—Tb—C$_5$H$_3$-1-Me-3-(CH$_2$—CH$_2$—NMe)-, (Me$_2$N)—Dy—C$_5$H$_3$-1-Me-3-(CH$_2$—CH$_2$—NMe)-, (Me$_2$N)—Ho—C$_5$H$_3$-1-Me-3-(CH$_2$—CH$_2$—NMe)-, (Me$_2$N)—Er—C$_5$H$_3$-1-Me-3-(CH$_2$—CH$_2$—NMe)-, (Me$_2$N)—Tm—C$_5$H$_3$-1-Me-3-(CH$_2$—CH$_2$—NMe)-, (Me$_2$N)—Yb—C$_5$H$_3$-1-Me-3-(CH$_2$—CH$_2$—NMe)-, (Me$_2$N)—Lu—C$_5$H$_3$-1-Me-3-(CH$_2$—CH$_2$—NMe)-.

6. The method of claim 5, wherein the deposition process is an atomic layer deposition process.

7. The method of claim 1, further comprising introducing a precursor into the reactor, wherein the precursor is different from the Lanthanide precursor, and depositing at least part of the precursor to form the Lanthanide-containing film on the substrate.

8. The method of claim 7, wherein the precursor contains an element selected from the group consisting of Hf, Si, Al, Ga, Mn, Ti, Ta, Bi, Zr, Pb, Nb, Mg, Sr, Ba, Ca, and combinations thereof.

9. The method of claim 1, wherein the deposition process is a chemical vapor deposition process.

10. The method of claim 1, wherein the deposition process is an atomic layer deposition process.

* * * * *